United States Patent
Timofejevs et al.

(10) Patent No.: US 12,327,182 B2
(45) Date of Patent: Jun. 10, 2025

(54) OPTIMIZATIONS FOR ANALOG HARDWARE REALIZATION OF TRAINED NEURAL NETWORKS

(71) Applicant: PolyN Technology Limited, London (GB)

(72) Inventors: Aleksandrs Timofejevs, Riga (LV); Boris Maslov, Newport Beach, CA (US); Nikolai Kovshov, Moscow (RU); Dmitri Godovskiy, Moscow (RU)

(73) Assignee: PolyN Technology Limited, Bristol (GB)

( * ) Notice: Subject to any disclaimer, the term of this patent is extended or adjusted under 35 U.S.C. 154(b) by 871 days.

(21) Appl. No.: 17/199,373

(22) Filed: Mar. 11, 2021

(65) Prior Publication Data
US 2021/0406664 A1    Dec. 30, 2021

Related U.S. Application Data

(63) Continuation of application No. 17/189,109, filed on Mar. 1, 2021, which is a continuation of application
(Continued)

(51) Int. Cl.
*G06N 3/065* (2023.01)
*G06F 1/3206* (2019.01)
(Continued)

(52) U.S. Cl.
CPC ........... *G06N 3/065* (2023.01); *G06F 1/3206* (2013.01); *G06F 1/3287* (2013.01); *G06F 30/39* (2020.01);
(Continued)

(58) Field of Classification Search
CPC ........ G06N 3/065; G06N 3/082; G06N 3/045; G06N 3/044; G06N 3/048; G06F 30/39
See application file for complete search history.

(56) References Cited

U.S. PATENT DOCUMENTS 3,628,053 A * 12/1971 Weiss .................. H03K 19/086
326/90
5,047,655 A    9/1991 Chambost et al.
(Continued)

FOREIGN PATENT DOCUMENTS

EP        0432462 A1    6/1991
EP        3663988 A1    6/2020
(Continued)

OTHER PUBLICATIONS

Chen et al. (Accelerator-friendly Neural-network Training: Learning Variations and Defects in RRAM Crossbar; Design, Automation & Test in Europe Conference & Exhibition; published 2017, pp. 19-24). (Year: 2017).*
(Continued)

*Primary Examiner* — Tan H Tran
(74) *Attorney, Agent, or Firm* — SankerIP

(57) ABSTRACT

Systems and methods are provided for analog hardware realization of neural networks. The method includes obtaining a neural network topology and weights of a trained neural network. The method also includes transforming the neural network topology to an equivalent analog network of analog components including operational amplifiers and resistors. Each operational amplifier represents an analog neuron of the equivalent analog network, and each resistor represents a connection between two analog neurons. The method also includes computing a weight matrix based on the weights of the trained neural network. The method also includes generating a resistance matrix for the weight matrix. The method also includes pruning the equivalent analog network to reduce the number of operational amplifiers or the resistors, based on the resistance matrix, to obtain an optimized analog network of analog components.

19 Claims, 107 Drawing Sheets

Related U.S. Application Data

No. PCT/RU2020/000306, filed on Jun. 25, 2020, and a continuation-in-part of application No. PCT/EP2020/067800, filed on Jun. 25, 2020.

(51) Int. Cl.
*G06F 1/3287* (2019.01)
*G06F 30/39* (2020.01)
*G06N 3/044* (2023.01)
*G06N 3/049* (2023.01)
*G06N 3/0499* (2023.01)
*G06N 3/063* (2023.01)
*G06N 3/082* (2023.01)
*G06N 5/04* (2023.01)

(52) U.S. Cl.
CPC ............ *G06N 3/044* (2023.01); *G06N 3/049* (2013.01); *G06N 3/0499* (2023.01); *G06N 3/063* (2013.01); *G06N 3/082* (2013.01); *G06N 5/04* (2013.01)

(56) References Cited

U.S. PATENT DOCUMENTS

| | | | |
|---|---|---|---|
| 5,315,163 | A | 5/1994 | Karinthi |
| 5,361,327 | A | 11/1994 | Takahashi |
| 6,507,641 | B1 | 1/2003 | Kondo et al. |
| 7,966,992 | B2 | 6/2011 | Glugla et al. |
| 10,090,005 | B2 | 10/2018 | Rumberg et al. |
| 10,157,629 | B2 | 12/2018 | Van Der Made et al. |
| 10,217,512 | B1 | 2/2019 | Leobandung |
| 10,810,471 | B1 | 10/2020 | Perumalla et al. |
| 10,825,536 | B1 | 11/2020 | Yang |
| 10,970,441 | B1 | 4/2021 | Zhang |
| 11,092,130 | B2 | 8/2021 | Senda et al. |
| 2001/0000427 | A1* | 4/2001 | Miller ............... H01L 23/60 333/33 |
| 2006/0166107 | A1 | 7/2006 | Chen |
| 2010/0106044 | A1 | 4/2010 | Linderman |
| 2015/0120629 | A1 | 4/2015 | Matsuoka et al. |
| 2016/0283842 | A1 | 9/2016 | Pescianschi |
| 2016/0328642 | A1 | 11/2016 | Himebaugh et al. |
| 2017/0017879 | A1 | 1/2017 | Kataeva et al. |
| 2017/0140262 | A1 | 5/2017 | Wilson et al. |
| 2017/0169327 | A1 | 6/2017 | Nestler et al. |
| 2017/0249445 | A1 | 8/2017 | Devries et al. |
| 2018/0018553 | A1 | 1/2018 | Bach |
| 2018/0091240 | A1 | 3/2018 | Noda et al. |
| 2018/0197485 | A1 | 7/2018 | Jose et al. |
| 2018/0356771 | A1* | 12/2018 | Basu ............... G05B 13/04 |
| 2018/0357533 | A1 | 12/2018 | Inoue |
| 2019/0026625 | A1* | 1/2019 | Vorenkamp ........... G06F 30/327 |
| 2019/0034791 | A1 | 1/2019 | Busch et al. |
| 2019/0069795 | A1 | 3/2019 | Kiranya et al. |
| 2019/0104951 | A1 | 4/2019 | Valys et al. |
| 2019/0251426 | A1 | 8/2019 | Busch et al. |
| 2020/0026992 | A1 | 1/2020 | Zhang et al. |
| 2020/0043477 | A1 | 2/2020 | Busch et al. |
| 2020/0046240 | A1 | 2/2020 | Angle et al. |
| 2020/0105287 | A1 | 4/2020 | Chang et al. |
| 2020/0110991 | A1 | 4/2020 | Kataeva et al. |
| 2020/0166922 | A1 | 5/2020 | Cella et al. |
| 2020/0202206 | A1 | 6/2020 | Rummens et al. |
| 2020/0211566 | A1 | 7/2020 | Kang et al. |
| 2020/0222010 | A1 | 7/2020 | Howard |
| 2020/0311535 | A1 | 10/2020 | Shrivastava |
| 2020/0364548 | A1 | 11/2020 | Chang et al. |
| 2020/0380192 | A1 | 12/2020 | MacRae et al. |
| 2021/0125049 | A1 | 4/2021 | Khwa |
| 2021/0256988 | A1 | 8/2021 | Mauri et al. |
| 2021/0326393 | A1 | 10/2021 | Aggarwal et al. |
| 2022/0028051 | A1 | 1/2022 | Asano |
| 2022/0083865 | A1* | 3/2022 | Riazi ............... G06F 21/71 |
| 2022/0222513 | A1 | 7/2022 | Paramasivam |
| 2022/0253675 | A1* | 8/2022 | Ren ............... G06N 3/088 |
| 2023/0206036 | A1 | 6/2023 | Labreuche et al. |

FOREIGN PATENT DOCUMENTS

| | | | |
|---|---|---|---|
| JP | 2003021032 | A | 1/2003 |
| JP | 2019003464 | A | 1/2019 |
| JP | 2019016159 | A | 1/2019 |
| JP | 7371235 | B2 | 11/2022 |
| KR | 20190052587 | A | 5/2019 |
| KR | 102120756 | B1 | 6/2020 |
| KR | 102191736 | B1 | 12/2020 |
| WO | WO-2006104144 | A1 | 10/2006 |
| WO | WO-2020082080 | A1 | 4/2020 |
| WO | WO 2021170735 | A1 | 9/2021 |
| WO | WO 2021262023 | A1 | 12/2021 |
| WO | WO 2023167607 | A1 | 9/2023 |

OTHER PUBLICATIONS

Liu et al. (Training an Artificial Neural Network with Op-amp Integrators Based Analog Circuits; IEEE Csaa Guidance, Navigation and Control Conference (CGNCC); published 2018, pp. 1-6). (Year: 2018).*

Lin et al. (Learning the sparsity for ReRAM: mapping and pruning sparse neural network for ReRAM based accelerator; ASPDAC '19: Proceedings of the 24th Asia and South Pacific Design Automation Conference; published 2019, pp. 1-6). (Year: 2019).*

Chakma et al. (A Mixed-Signal Approach to Memristive Neuromorphic System Design; Published in: 2017 IEEE 60th International Midwest Symposium on Circuits and Systems (MWSCAS), pp. 1-4). (Year: 2017).*

Cadence Design Systems: "From TensorFlow to RTL in three months," Youtube, Nov. 14, 2018, XP054981600, retrieved from the Internet: URL: XP054981600, https://www.youtube.com > watch, 2 pgs.

Cadence: "Engineering Change Orders," Dec. 8, 2019, XP055789511, Retrieved from the Internet: URL:https://web.archive.org/web/20191208162944if_https://www.cadence.com/content/dam/cadence-www/global/en_US/documents/tools/digital-design-signoff/conformal-eco-designer-ds.pdf, 1 pg.

Guyue Huang et al., "Machine Learning for Electronic Design Automation: A Survey," arxiv.org, Cornell University Library, Mar. 8, 2021, arXiv:2102-03357v2, 44 pgs.

Monsen, Analog neural network-based helicopter gearbox health monitoring system, Acoustical Society of America, vol. 96, No. Dec. 6, 1995, 15 pgs.

Polyn Technology Limited, International Search Report and Written Opinion, PCT/EP2020/067800, Apr. 12, 2021, 10 pgs.

Polyn Technology Limited, International Preliminary Report on Patentability, PCT/EP2020/067800, Dec. 13, 2022, 8 pgs.

Polyn Technology Limited, International Search Report and Written Opinion, PCT/RU2020/000306, Mar. 4, 2021, 12 pgs.

Polyn Technology Limited, International Preliminary Report on Patentability, PCT/RU2020/000306, Dec. 13, 2022, 9 pgs.

Polyn Technology Limited, International Search Report and Written Opinion, PCT/US2021/058266, Feb. 18, 2022, 16 pgs.

Ronao, Charissa Ann, Human activity recognition with smartphone sensors using deep learning neural networks, Expert Systems with Applications 59, (2016) 235-244, 10 pgs.

Timofejevs, Office Action, U.S. Appl. No. 17/733,932, Apr. 21, 2023, 20 pgs.

Chapeton et al. (Effects of homeostatic constraints on associative memory storage and synaptic connectivity of cortical circuits, Frontiers in Computational Neuroscience, vol. 9, Article 74, published Jun. 18, 2015, pp. 1-14). (Year: 2015).

Himavathi et al. (Feedforward Neural Network Implementation in FPGA Using Layer Multiplexing for Effective Resource Utilization, IEEE Transactions on Neural Networks, vol. 18, No. 3, May 2007, pp. 880-888) (Year: 2007).

(56) References Cited

OTHER PUBLICATIONS

Liew et al. (Bounded activation functions for enhanced training stability of deep neural networks on visual pattern recognition problems; Neurocomputing; published 2016, pp. 718-734). (Year: 2016).
Polyn Technology Limited, International Search Report and Written Opinion, PCT/RU2021/000630, Mar. 17, 2022, 11 pgs.
Timofejevs, Office Action, U.S. Appl. No. 17/189,109, Mar. 25, 2024, 34 pgs.
Timofejevs, Office Action, U.S. Appl. No. 17/198,198, Apr. 23, 2024, 20 pgs.
Wang et al. (Prandtl-Ishlinskii Modeling for Giant Magnetostrictive Actuator Based on Internal Time-Delay Recurrent Neural Network; Published in: IEEE Transactions on Magnetics ( vol. 54, Issue: 11, Nov. 2018); pp. 1-4). (Year: 2018).
Amelia Dalton, "TensorFlow to RTL with High-Level Synthesis—Cadence Design Systems", EE Journal, Apr. 17, 2020, 1 page.
Andrew Muscat et al., "Electromagnetic Vibrational Energy Harvesters: A Review", Sensors 2022, vol. 22, No. 15, Jul. 25, 2022, 17 pgs.
Anonymous, "Thoughts on Interfacing Piezo Vibration Sensor", Aug. 22, 2013, 7 pgs., Retrieved from the Internet: https://scienceprog.com/thoughts-on-interfacing-piezo-vibration-sensor/.
Fredrik Sandin et al., "Synaptic Delays for Insect-Inspired Temporal Feature Detection in Dynamic Neuromorphic Processors", Embedded Intelligent Systems Lab (EISLAB), Frontiers in Neuroscience, vol. 14, Article 150, Feb. 28, 2020, 15 pages.
Hossam Abdelbaki et al., "Analog Hardware Implementation of the Random Neural Network Model", Neural Networks, IJCNN 2000, Proceedings of the IEEE-INNS-ENNS International Joint Conference on Jul. 24, 2000, 5 pgs.
Hyeong-Ju Kang, "Accelerator-Aware Pruning for Convolutional Neural Networks", arXiv, Sep. 5, 2020, 11 pgs.
Kaveri Mahapatra et al., "Power System Disturbance Classification with Online Event-Driven Neuromorphic Computing", arXiv, Dec. 15, 2020, 11 pgs.
Khoa Van Pham et al., "Partial-Gated Memristor Crossbar for Fast and Power-Efficient Defect-Tolerant Training", Micromachines, Apr. 13, 2019, 18 pgs., Retrieved from the Internet: www.mdpi.com/journal/micromachines.
M.V. Valueva et al., "Application of the Residue Number System to Reduce Hardware Costs of the Convolutional Neural Network Implementation", Mathematics and Computers in Simulation, vol. 177 Nov. 2020, 8 pgs.
Min Cheng et al., "Multi-Scale LSTM Model for BGP Anomaly Classification", Abstract, City University of Hong Kong, CityU Scholars, IEEE Transactions on Services Computing, Apr. 10, 2018, 2 pgs.
P. Sibi et al., "Analysis of Different Activation Functions Using Back Propagation Neural Networks", Journal of Theoretical and Applied Information Technology, Jan. 31, 2013, vol. 47, No. 3, 5 pgs.
Paul M. Solomon, "Analog Neuromorphic Computing Using Programmable Resistor Arrays", Solid State Electronics, vol. 155, May 2019, 10 pgs.
Peng Yao et al., "Fully Hardware-implemented Memristor Convolutional Neural Network", Nature, vol. 577, Jan. 30, 2020, 21 pgs.
PolyN Technology Limited, Supplementary International Search Report, PCT/RU2020/000306, Jul. 26, 2022, 15 pgs.
PolyN Technology Limited, International Preliminary Report on Patentability, PCT/US2021/058266, Sep. 12, 2023, 13 pgs.
PolyN Technology Limited, International Search Report and Written Opinion, PCT/RU2022/000064, Dec. 1, 2022, 9 pgs.
PolyN Technology Limited, International Preliminary Report on Patentability, PCT/RU2022/000064, Sep. 10, 2024, 8 pgs.
PolyN Technology Limited, International Search Report and Written Opinion, PCT/US2023/022139, Oct. 2, 2023, 13 pgs.
PolyN Technology Limited, International Preliminary Report on Patentability, PCT/US2023/022139, Nov. 7, 2024, 9 pgs.
PolyN Technology Limited, International Search Report and Written Opinion, PCT/US2024/028993, Sep. 30, 2024, 11 pgs.
PolyN Technology Limited, International Search Report and Written Opinion, PCT/US2023/031692, Dec. 6, 2023, 15 pgs.
Qiang Wang et al., "Compressive Sensing Reconstruction for Vibration Signals Based on the Improved Fast Iterative Shrinkage-Thresholding Algorithm", Measurement, vol. 142, Aug. 31, 2019, 9 pgs.
Renée St. Amant et al., "General-Purpose Code Acceleration with Limited-Precision Analog Computation", Proceedings of the 41st International Symposium on Computer Architecture, 2014, 12 pgs.
Renesas, "Introduction to Electronic Circuits: Op-Amp Comparator", Tutorial, published 2015, 22 pgs.
Sharon Shea: "What is LPWAN (Low-Power Wide Area Network) ?: Definition from Tech Target", Sep. 30, 2017, 4 pgs., Retrieved from the Internet: https://www.techtarget.com/iotagenda/definition/LPWAN-low-power-wide-area-network.
Siddharth Sharma et al., "Activation Functions in Neural Networks", International Journal of Engineering Applied Sciences and Technology, 2020, vol. 4, Issue 12, ISSN No. 2455-2143, 7 pgs.
Talha Furkan Canan et al., "4-Input NAND and NOR Gates Based on Two Ambipolar Schottky Barrier FinFETs", 2020 27th IEEE International Conference on Electronics, Circuits and Systems (ICECS), 4 pgs.
Tiago Oliveira Weber et al., "Amplifier-based MOS Analog Neural Network Implementation and Weights Optimization", 2019 32nd Symposium on Integrated Circuits and Systems Design (SBCCI), ACM, Aug. 26, 2019, 6 pgs.
Yu Sang et al., "Micro Hand Gesture Recognition System Using Ultrasonic Active Sensing", IEEE Access, vol. 6, Sep. 3, 2018, 9 pgs.
Yun Long et al., "ReRAM-Based Processing-in-Memory Architecture for Recurrent Neural Network Acceleration", Abstract, IEEE Journals & Magazine, Jul. 3, 2018, 4 pgs.

* cited by examiner

600

602

PSNN architecture

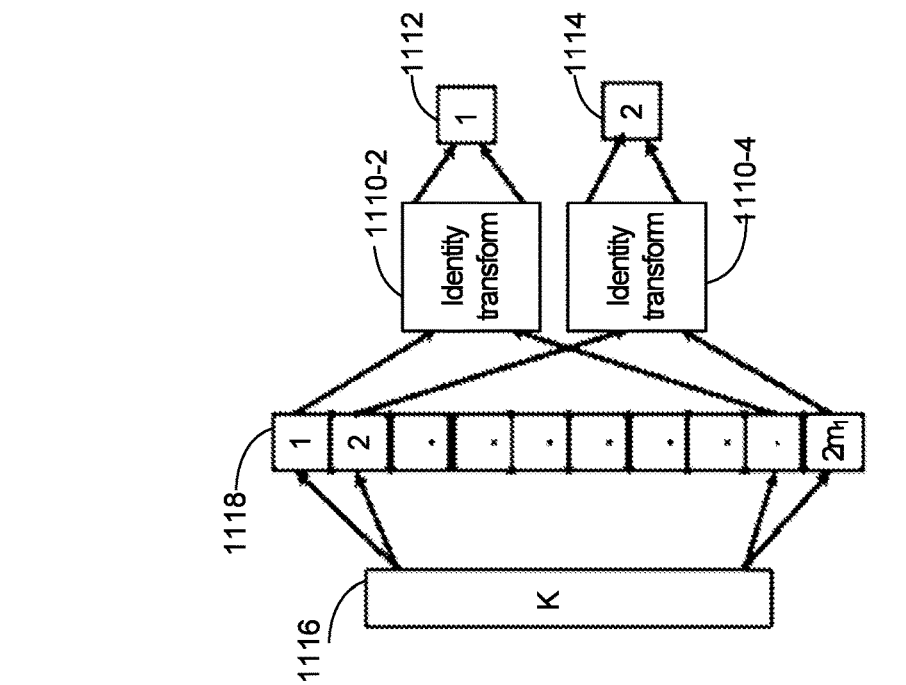
Figure 11C
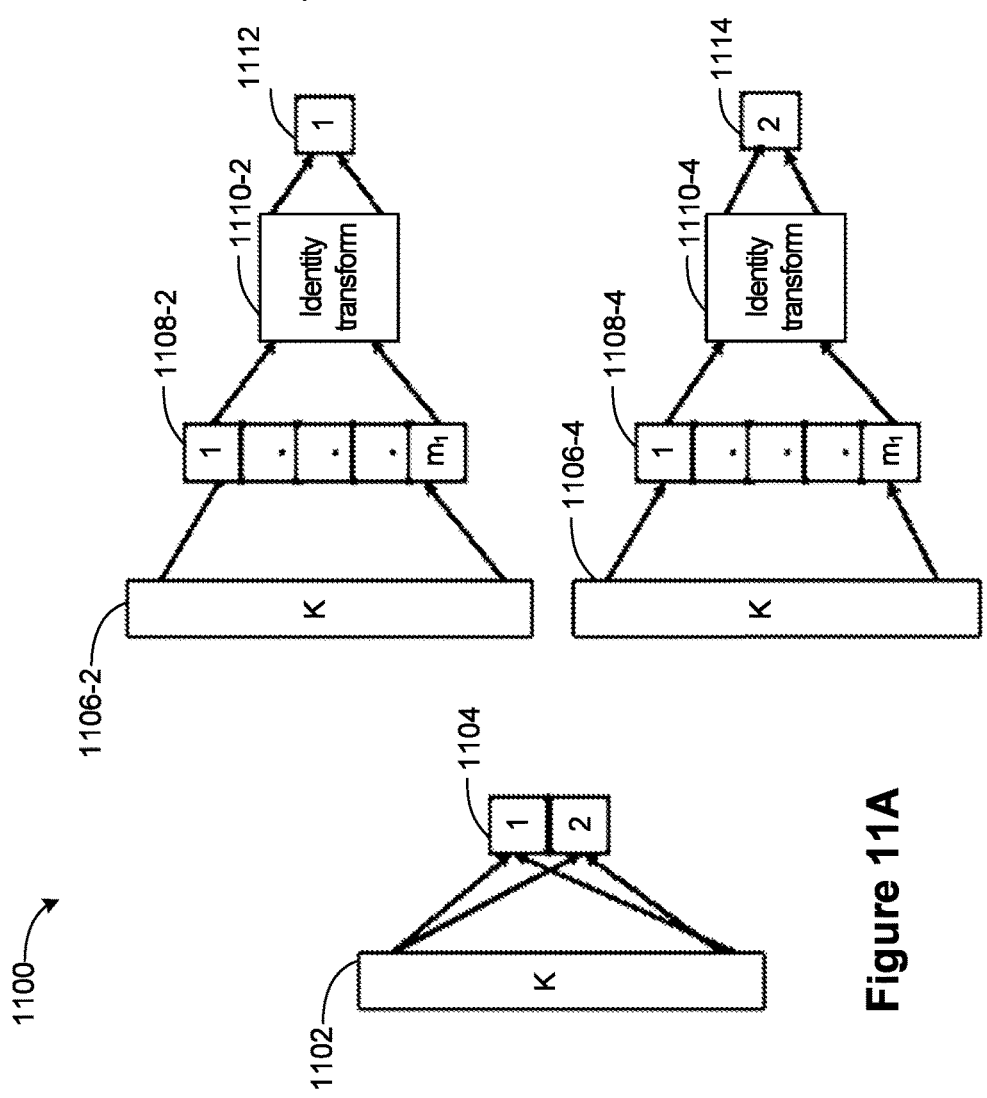
Figure 11B
Figure 11A

Description:

n – Channel MOSFET transistors with explicit substrate connection:

| The shutter ratio of Length (L) | The shutter ratio of Width (W) | Transistors |
|---|---|---|
| L = 35u | W = 175u | M1, M3 |
| L = 35u | W = 90u | M6, M11, M12 |
| L = 70u | W = 350u | M8, M10 | p – Channel MOSFET transistors with explicit substrate connection:

| The shutter ratio of Length (L) | The shutter ratio of Width (W) | Transistors |
|---|---|---|
| L = 70u | W = 180u | M2, M4, M5 |
| L = 140u | W = 90u | M7, M9 |

Description:

U1 - U12 - CMOS OpAmps

X1, X3, X4 - Modules that perform the Sigmoid function

X2, X7 - Modules that perform the Hyperbolic Tangent function

X5, X8 - Modules that perform the multiplication function

Resistor ratings:

| | | |
|---|---|---|
| Rw = 10 k | Rr = 1.25 k | Rf2 = 12*Rw |
| R_Wo4 = 5*Rw | R_Wo3 = 8*Rw | R_Uop1 = 2.6*Rw |
| R_Wo2 = 12*Rw | R_Wo1 = 4*Rw | R_Uom1 = 2.3*Rw |
| R_Wc4 = 4*Rw | R_Wc3 = 5.45*Rw | R_Ucp1 = 3*Rw |
| R_Wc2 = 12*Rw | R_Wc1 = 2.72*Rw | R_Ucm1 = 3.7*Rw |
| R_Wi4 = 4.8*Rw | R_Wi3 = 6*Rw | R_Uip1 = 2*Rw |
| R_Wi2 = 12*Rw | R_Wi1 = 3*Rw | R_Uim1 = 2.3*Rw |
| R_Wf4 = 2.2*Rw | R_Wf3 = 5*Rw | R_Wfp = 4*Rw |
| R_Wf2 = 2*Rw | R_Wf1 = 5.7*Rw | R_Wfm1 = 4.2*Rw |

Description:

U1 - U5 - CMOS OpAmps

N – Chanel MOSFET transistors with explicit substrate connection:

| The shutter ratio of Length ( L ) | The shutter ratio of Width ( W ) | Transistors |
|---|---|---|
| L = 2.4u | W = 1.26u | M1, M2, M25, M26 |
| L = 0.36u | W = 7.2u | M5, M6, M29, M30 |
| L = 0.36u | W = 199.98u | M7, M8, M31, M32 |
| L = 0.36u | W = 0.4u | M11, M12, M13, M14, M19, M20, M21, M22, M35, M36, M37, M38, M41, M42, M43, M44 |
| L = 0.36u | W = 0.72u | M17, M47, M51, M53, M57, M59, M63, M65 |

P – Chanel MOSFET transistors with explicit substrate connection:

| The shutter ratio of Length ( L ) | The shutter ratio of Width ( W ) | Transistors |
|---|---|---|
| L = 2.4u | W = 1.26u | M3, M4, M27, M28 |
| L = 0.36u | W = 7.2u | M9, M10, M33, M34 |
| L = 0.36u | W = 0.8u | M18, M48, M49, M50, M52, M54, M55, M56, M58, M60, M61, M62, M64, M66, M67, M68 |
| L = 0.36u | W = 0.72u | M15, M16, M23, M24, M39, M40, M45, M46 |

Resistor ratings:

Ro = 1 k     Rin = 1 k     Rf = 1 k
Rc4 = 2 k    Rc5 = 2 k

Figure 21J

Description: ←—2278

U1 - U8  - CMOS OpAmps

| N – Chanel MOSFET transistors | | |
|---|---|---|
| The shutter ratio of Length ( L ) | The shutter ratio of Width ( W ) | Transistors |
| L = 0.18u | W = 0.9u | M1, M2, M3 |

Figure 22B

Description: ← 2382

U1 - U8 - CMOS OpAmps

N – Chanel MOSFET transistors

| The shutter ratio of Length ( L ) | The shutter ratio of Width ( W ) | Transistors |
|---|---|---|
| L = 0.18u | W = 0.9u | M1, M2, M3 |

Figure 23B

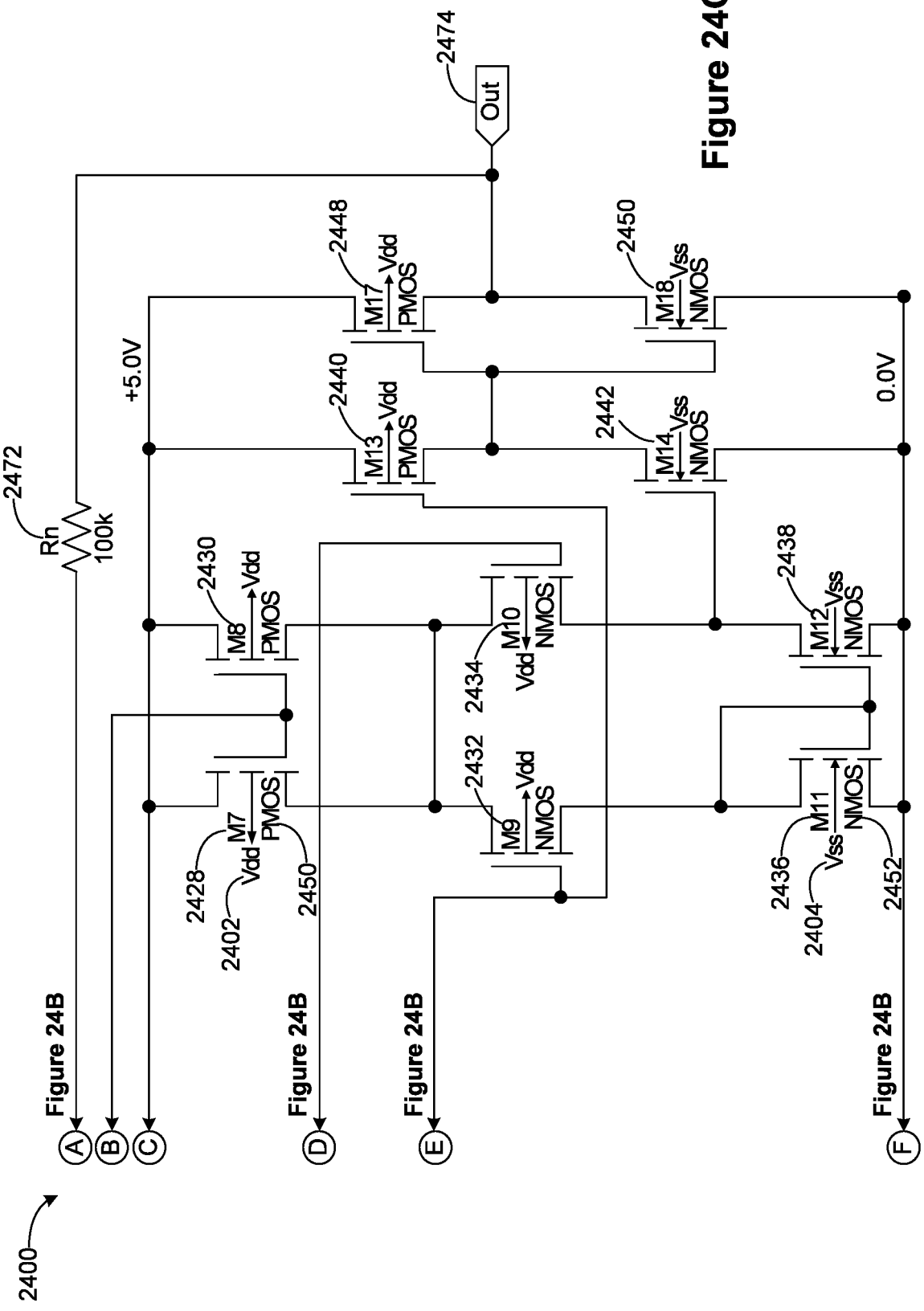

| The shutter ratio of Length (L) | The shutter ratio of Width (W) | Transistors |
|---|---|---|
| L = 0.36u<br>L = 0.36u<br>L = 0.36u | W = 3.6u<br>W = 1.8u<br>W = 18u | M2, M5<br>M3, M6, M11, M12, M14, M16<br>M18 |
| L = 0.36u<br>L = 0.36u<br>L = 0.36u | W = 3.96u<br>W = 11.88u<br>W = 39.6u | M1, M4, M7, M8, M13, M15<br>M9, M10<br>M17 |

N – Chanel MOSFET transistors with explicit substrate connection:

P – Chanel MOSFET transistors with explicit substrate connection:

Description:

(R p / R1+) - (Rn / R1-) = w1
(R p / R2+) - (Rn / R2-) = w2
(R p / R bias+) - (Rn / Rbias-) = w bias

Description:

| | The shutter ratio of Length (L) | The shutter ratio of Width (W) | Transistors |
|---|---|---|---|
| N-Chanel MOSFET transistors with explicit substrate connection: | L = 0.36u | W = 3.6u | M2, M5, M18, M21, M34, M37 |
| | L = 0.36u | W = 1.8u | M3, M6, M11, M12, M14, M16, M19, M22, M27, M28, M32, M38, M35, M38, M43, M44, M46, M48 |
| P-Chanel MOSFET transistors with explicit substrate connection: | L = 0.36u | W = 3.96u | M1, M4, M7, M8, M13, M15, M17, M20, M23, M24, M29, M31, M33, M36, M39, M40, M45, M47 |
| | L = 0.36u | W = 11.88u | M9, M10, M25, M26, M41, M42 |

Figure 25E

3116 — One or more digital to analog converters configured to generate analog input for the equivalent analog network of analog components

Figure 31B

3118 — An analog signal sampling module configured to process 1-dimensional or 2-dimensional analog inputs with a sampling frequency based on number of inferences of the integrated circuit

Figure 31C

3120 — A voltage converter module to scale down or scale up analog signals to match operational range of the plurality of operational amplifiers

Figure 31D

3122 — A tact signal processing module configured to process one or more frames obtained from a CCD camera

Figure 31E

3124 — The trained neural network is a long short-term memory (LSTM) network. One or more clock modules synchronize signal tacts and to allow time series processing

| Table 1. MobileNet Body Architecture | | |
| --- | --- | --- |
| Type/Stride 3402 | Filter Shape 3404 | Input Size 3406 |
| Conv / s2 | 3 x 3 x 3 x 32 | 224 x 224 x 3 |
| Conv dw / s1 | 3 x 3 x 32 dw | 112 x 112 x 32 |
| Conv / s1 | 1 x 1 x 32 x 64 | 112 x 112 x 32 |
| Conv dw / s2 | 3 x 3 x 64 dw | 112 x 112 x 64 |
| Conv / s1 | 1 x 1 x 64 x 128 | 56 x 56 x 64 |
| Conv dw / s1 | 3 x 3 x 128 dw | 56 x 56 x 128 |
| Conv / s1 | 1 x 1 x 128 x 256 | 56 x 56 x 128 |
| Conv dw / s2 | 3 x 3 x 256 dw | 56 x 56 x 128 |
| Conv / s1 | 1 x 1 x 256 x 256 | 28 x 28 x 128 |
| Conv dw / s1 | 3 x 3 x 256 dw | 28 x 28 x 256 |
| Conv / s1 | 1 x 1 x 256 x 256 | 28 x 28 x 256 |
| Conv dw / s2 | 3 x 3 x 256 dw | 28 x 28 x 256 |
| Conv / s1 | 1 x 1 x 256 x 512 | 14 x 14 x 256 |
| 5x   Conv dw / s1 | 3 x 3 x 512 dw | 14 x 14 x 512 |
| 5x   Conv / s1 | 1 x 1 x 512 x 512 | 14 x 14 x 512 |
| Conv dw / s2 | 3 x 3 x 512 dw | 14 x 14 x 512 |
| Conv / s1 | 1 x 1 x 512 x 1024 | 7 x 7 x 512 |
| Conv dw / s2 | 3 x 3 x 1024 dw | 7 x 7 x 1024 |
| Conv / s1 | 1 x 1 x 1024 x 1024 | 7 x 7 x 1024 |
| Avg Pool / s1 | Pool 7 x 7 | 7 x 7 x 1024 |
| FC / s1 | 1024 x 1000 | 1 x 1 x 1024 |
| Softmax / s1 | Classifier | 1 x 1 x 1000 |

Figure 34

OPTIMIZATIONS FOR ANALOG HARDWARE REALIZATION OF TRAINED NEURAL NETWORKS

CROSS-REFERENCE TO RELATED APPLICATIONS

This application is a continuation of U.S. application Ser. No. 17/189,109, filed Mar. 1, 2021, entitled "Analog Hardware Realization of Neural Networks," which is a continuation of PCT Application PCT/RU2020/000306, filed Jun. 25, 2020, entitled "Analog Hardware Realization of Neural Networks," each of which is incorporated by reference herein in its entirety. U.S. application Ser. No. 17/189,109 is also a continuation-in-part of PCT Application PCT/EP2020/067800, filed Jun. 25, 2020, entitled "Analog Hardware Realization of Neural Networks," which is incorporated by reference herein in its entirety.

TECHNICAL FIELD

The disclosed implementations relate generally to neural networks, and more specifically to systems and methods for hardware realization of neural networks.

BACKGROUND

Conventional hardware has failed to keep pace with innovation in neural networks and the growing popularity of machine learning based applications. Complexity of neural networks continues to outpace CPU and GPU computational power as digital microprocessor advances are plateauing. Neuromorphic processors based on spike neural networks, such as Loihi and True North, are limited in their applications. For GPU-like architectures, power and speed of such architectures are limited by data transmission speed. Data transmission can consume up to 80% of chip power, and can significantly impact speed of calculations. Edge applications demand low power consumption, but there are currently no known performant hardware implementations that consume less than 50 milliwatts of power.

Memristor-based architectures that use cross-bar technology remain impractical for manufacturing recurrent and feed-forward neural networks. For example, memristor-based cross-bars have a number of disadvantages, including high latency and leakage of currents during operation, that make them impractical. Also, there are reliability issues in manufacturing memristor-based cross-bars, especially when neural networks have both negative and positive weights. For large neural networks with many neurons, at high dimensions, memristor-based cross-bars cannot be used for simultaneous propagation of different signals, which in turn complicates summation of signals, when neurons are represented by operational amplifiers. Furthermore, memristor-based analog integrated circuits have a number of limitations, such as a small number of resistive states, first cycle problem when forming memristors, complexity with channel formation when training the memristors, unpredictable dependency on dimensions of the memristors, slow operations of memristors, and drift of state of resistance.

Additionally, the training process required for neural networks presents unique challenges for hardware realization of neural networks. A trained neural network is used for specific inferencing tasks, such as classification. Once a neural network is trained, a hardware equivalent is manufactured. When the neural network is retrained, the hardware manufacturing process is repeated, driving up costs. Although some reconfigurable hardware solutions exist, such hardware cannot be easily mass produced, and cost a lot more (e.g., cost 5 times more) than hardware that is not reconfigurable. Further, edge environments, such as smart-home applications, do not require re-programmability as such. For example, 85% of all applications of neural networks do not require any retraining during operation, so on-chip learning is not that useful. Furthermore, edge applications include noisy environments, that can cause reprogrammable hardware to become unreliable.

SUMMARY

Accordingly, there is a need for methods, circuits and/or interfaces that address at least some of the deficiencies identified above. Analog circuits that model trained neural networks and manufactured according to the techniques described herein, can provide improved performance per watt advantages, can be useful in implementing hardware solutions in edge environments, and can tackle a variety of applications, such as drone navigation and autonomous cars. The cost advantages provided by the proposed manufacturing methods and/or analog network architectures are even more pronounced with larger neural networks. Also, analog hardware implementations of neural networks provide improved parallelism and neuromorphism. Moreover, neuromorphic analog components are not sensitive to noise and temperature changes, when compared to digital counterparts.

Chips manufactured according to the techniques described herein provide order of magnitude improvements over conventional systems in size, power, and performance, and are ideal for edge environments, including for retraining purposes. Such analog neuromorphic chips can be used to implement edge computing applications or in Internet-of-Things (IoT) environments. Due to the analog hardware, initial processing (e.g., formation of descriptors for image recognition), that can consume over 80-90% of power, can be moved on chip, thereby decreasing energy consumption and network load that can open new markets for applications.

Various edge applications can benefit from use of such analog hardware. For example, for video processing, the techniques described herein can be used to include direct connection to CMOS sensor without digital interface. Various other video processing applications include road sign recognition for automobiles, camera-based true depth and/or simultaneous localization and mapping for robots, room access control without server connection, and always-on solutions for security and healthcare. Such chips can be used for data processing from radars and lidars, and for low-level data fusion. Such techniques can be used to implement battery management features for large battery packs, sound/voice processing without connection to data centers, voice recognition on mobile devices, wake up speech instructions for IoT sensors, translators that translate one language to another, large sensors arrays of IoT with low signal intensity, and/or configurable process control with hundreds of sensors.

Neuromorphic analog chips can be mass produced after standard software-based neural network simulations/training, according to some implementations. A client's neural network can be easily ported, regardless of the structure of the neural network, with customized chip design and production. Moreover, a library of ready to make on-chip solutions (network emulators) are provided, according to some implementations. Such solutions require only training, one lithographic mask change, following which chips can be mass produced. For example, during chip production, only part of the lithography masks need to be changed.

The techniques described herein can be used to design and/or manufacture an analog neuromorphic integrated circuit that is mathematically equivalent to a trained neural network (either feed-forward or recurrent neural networks). According to some implementations, the process begins with a trained neural network that is first converted into a transformed network comprised of standard elements. Operation of the transformed network are simulated using software with known models representing the standard elements. The software simulation is used to determine the individual resistance values for each of the resistors in the transformed network. Lithography masks are laid out based on the arrangement of the standard elements in the transformed network. Each of the standard elements are laid out in the masks using an existing library of circuits corresponding to the standard elements to simplify and speed up the process. In some implementations, the resistors are laid out in one or more masks separate from the masks including the other elements (e.g., operational amplifiers) in the transformed network. In this manner, if the neural network is retrained, only the masks containing the resistors, or other types of fixed-resistance elements, representing the new weights in the retrained neural network need to be regenerated, which simplifies and speeds up the process. The lithography masks are then sent to a fab for manufacturing the analog neuromorphic integrated circuit.

In one aspect, a method is provided for hardware realization of neural networks, according to some implementations. The method incudes obtaining a neural network topology and weights of a trained neural network. The method also includes transforming the neural network topology to an equivalent analog network of analog components. The method also includes computing a weight matrix for the equivalent analog network based on the weights of the trained neural network. Each element of the weight matrix represents a respective connection between analog components of the equivalent analog network. The method also includes generating a schematic model for implementing the equivalent analog network based on the weight matrix, including selecting component values for the analog components.

In some implementations, generating the schematic model includes generating a resistance matrix for the weight matrix. Each element of the resistance matrix corresponds to a respective weight of the weight matrix and represents a resistance value.

In some implementations, the method further includes obtaining new weights for the trained neural network, computing a new weight matrix for the equivalent analog network based on the new weights, and generating a new resistance matrix for the new weight matrix.

In some implementations, the neural network topology includes one or more layers of neurons, each layer of neurons computing respective outputs based on a respective mathematical function, and transforming the neural network topology to the equivalent analog network of analog components includes: for each layer of the one or more layers of neurons: (i) identifying one or more function blocks, based on the respective mathematical function, for the respective layer. Each function block has a respective schematic implementation with block outputs that conform to outputs of a respective mathematical function; and (ii) generating a respective multilayer network of analog neurons based on arranging the one or more function blocks. Each analog neuron implements a respective function of the one or more function blocks, and each analog neuron of a first layer of the multilayer network is connected to one or more analog neurons of a second layer of the multilayer network.

In some implementations, the one or more function blocks include one or more basic function blocks selected from the group consisting of: (i) a weighted summation block with a block output $V^{out}=\text{ReLU}(\Sigma w_i \cdot V_i^{in}+\text{bias})$. ReLU is Rectified Linear Unit (ReLU) activation function or a similar activation function, $V_i$ represents an i-th input, $w_i$ represents a weight corresponding to the i-th input, and bias represents a bias value, and $\Sigma$ is a summation operator; (ii) a signal multiplier block with a block output $V^{out}=\text{coeff} \cdot V_i \cdot V_j$. $V_i$ represents an i-th input and $V_j$ represents a j-th input, and coeff is a predetermined coefficient; (iii) a sigmoid activation block with a block output $$V^{out} = \frac{A}{1+e^{-B \cdot V}}.$$

V represents an input, and A and B are predetermined coefficient values of the sigmoid activation block; (iv) a hyperbolic tangent activation block with a block output $V^{out}=A*\tanh(B*V^{in})$. $V^{in}$ represents an input, and A and B are predetermined coefficient values; and (v) a signal delay block with a block output $U(t)=V(t-dt)$. t represents a current time-period, $V(t-dt)$ represents an output of the signal delay block for a preceding time period $t-dt$, and dt is a delay value.

In some implementations, identifying the one or more function blocks includes selecting the one or more function blocks based on a type of the respective layer.

In some implementations, the neural network topology includes one or more layers of neurons, each layer of neurons computing respective outputs based on a respective mathematical function, and transforming the neural network topology to the equivalent analog network of analog components includes: (i) decomposing a first layer of the neural network topology to a plurality of sub-layers, including decomposing a mathematical function corresponding to the first layer to obtain one or more intermediate mathematical functions. Each sub-layer implements an intermediate mathematical function; and (ii) for each sub-layer of the first layer of the neural network topology: (a) selecting one or more sub-function blocks, based on a respective intermediate mathematical function, for the respective sub-layer; and (b) generating a respective multilayer analog sub-network of analog neurons based on arranging the one or more sub-function blocks. Each analog neuron implements a respective function of the one or more sub-function blocks, and each analog neuron of a first layer of the multilayer analog sub-network is connected to one or more analog neurons of a second layer of the multilayer analog sub-network.

In some implementations, the mathematical function corresponding to the first layer includes one or more weights, and decomposing the mathematical function includes adjusting the one or more weights such that combining the one or more intermediate functions results in the mathematical function.

In some implementations, the method further includes: (i) generating equivalent digital network of digital components for one or more output layers of the neural network topology; and (ii) connecting output of one or more layers of the equivalent analog network to the equivalent digital network of digital components.

In some implementations, the analog components include a plurality of operational amplifiers and a plurality of resistors, each operational amplifier represents an analog neuron of the equivalent analog network, and each resistor represents a connection between two analog neurons.

In some implementations, selecting component values of the analog components includes performing a gradient descent method to identify possible resistance values for the plurality of resistors.

In some implementations, the neural network topology includes one or more GRU or LSTM neurons, and transforming the neural network topology includes generating one or more signal delay blocks for each recurrent connection of the one or more GRU or LSTM neurons.

In some implementations, the one or more signal delay blocks are activated at a frequency that matches a predetermined input signal frequency for the neural network topology.

In some implementations, the neural network topology includes one or more layers of neurons that perform unlimited activation functions, and transforming the neural network topology includes applying one or more transformations selected from the group consisting of: (i) replacing the unlimited activation functions with limited activation; and (ii) adjusting connections or weights of the equivalent analog network such that, for predetermined one or more inputs, difference in output between the trained neural network and the equivalent analog network is minimized.

In some implementations, the method further includes generating one or more lithographic masks for fabricating a circuit implementing the equivalent analog network of analog components based on the resistance matrix.

In some implementations, the method further includes: (i) obtaining new weights for the trained neural network; (ii) computing a new weight matrix for the equivalent analog network based on the new weights; (iii) generating a new resistance matrix for the new weight matrix; and (iv) generating a new lithographic mask for fabricating the circuit implementing the equivalent analog network of analog components based on the new resistance matrix.

In some implementations, the trained neural network is trained using software simulations to generate the weights.

In another aspect, a method for hardware realization of neural networks is provided, according to some implementations. The method includes obtaining a neural network topology and weights of a trained neural network. The method also includes calculating one or more connection constraints based on analog integrated circuit (IC) design constraints. The method also includes transforming the neural network topology to an equivalent sparsely connected network of analog components satisfying the one or more connection constraints. The method also includes computing a weight matrix for the equivalent sparsely connected network based on the weights of the trained neural network. Each element of the weight matrix represents a respective connection between analog components of the equivalent sparsely connected network.

In some implementations, transforming the neural network topology to the equivalent sparsely connected network of analog components includes deriving a possible input connection degree $N_i$ and output connection degree $N_o$, according to the one or more connection constraints.

In some implementations, the neural network topology includes at least one densely connected layer with K inputs and L outputs and a weight matrix U. In such cases, transforming the at least one densely connected layer includes constructing the equivalent sparsely connected network with K inputs, L outputs, and $\lceil \log_{N_i} K \rceil + \lceil \log_{N_o} L \rceil - 1$ layers, such that input connection degree does not exceed $N_i$, and output connection degree does not exceed $N_o$.

In some implementations, the neural network topology includes at least one densely connected layer with K inputs and L outputs and a weight matrix U. In such cases, transforming the at least one densely connected layer includes constructing the equivalent sparsely connected network with K inputs, L outputs, and $M \geq \max(\lceil \log_{N_i} L \rceil, \lceil \log_{N_o} K \rceil)$ layers. Each layer m is represented by a corresponding weight matrix $U_m$, where absent connections are represented with zeros, such that input connection degree does not exceed $N_i$, and output connection degree does not exceed $N_o$. The equation $U = \Pi_{m=1 \ldots M} U_m$ is satisfied with a predetermined precision.

In some implementations, the neural network topology includes a single sparsely connected layer with K inputs and L outputs, a maximum input connection degree of $P_i$, a maximum output connection degree of $P_o$, and a weight matrix of U, where absent connections are represented with zeros. In such cases, transforming the single sparsely connected layer includes constructing the equivalent sparsely connected network with K inputs, L outputs, $M \geq \max(\lceil \log_{N_i} P_i \rceil, \lceil \log_{N_o} P_o \rceil)$ layers, each layer m represented by a corresponding weight matrix $U_m$, where absent connections are represented with zeros, such that input connection degree does not exceed $N_i$, and output connection degree does not exceed $N_o$. The equation $U = \Pi_{m=1 \ldots M} U_m$ is satisfied with a predetermined precision.

In some implementations, the neural network topology includes a convolutional layer with K inputs and L outputs. In such cases, transforming the neural network topology to the equivalent sparsely connected network of analog components includes decomposing the convolutional layer into a single sparsely connected layer with K inputs, L outputs, a maximum input connection degree of $P_i$, and a maximum output connection degree of $P_o$. $P_L \leq N_i$ and $P_o \leq N_o$.

In some implementations, generating a schematic model for implementing the equivalent sparsely connected network utilizing the weight matrix.

In some implementations, the neural network topology includes a recurrent neural layer. In such cases, transforming the neural network topology to the equivalent sparsely connected network of analog components includes transforming the recurrent neural layer into one or more densely or sparsely connected layers with signal delay connections.

In some implementations, the neural network topology includes a recurrent neural layer. In such cases, transforming the neural network topology to the equivalent sparsely connected network of analog components includes decomposing the recurrent neural layer into several layers, where at least one of the layers is equivalent to a densely or sparsely connected layer with K inputs and L output and a weight matrix U, where absent connections are represented with zeros.

In some implementations, the neural network topology includes K inputs, a weight vector $U \in R^K$, and a single layer perceptron with a calculation neuron with an activation function F. In such cases, transforming the neural network topology to the equivalent sparsely connected network of analog components includes: (i) deriving a connection degree N for the equivalent sparsely connected network according to the one or more connection constraints; (ii) calculating a number of layers m for the equivalent sparsely connected network using the equation $m = \lceil \log_N K \rceil$; and (iii) constructing the equivalent sparsely connected network with the K inputs, m layers and the connection degree N. The equivalent sparsely connected network includes respective one or more analog neurons in each layer of them layers, each analog neuron of first m−1 layers implements identity transform, and an analog neuron of last layer implements the activation function F of the calculation neuron of the single layer perceptron. Also, in such cases, computing the weight matrix for the equivalent sparsely connected network includes calculating a weight vector W for connections of the equivalent sparsely connected network by solving a system of equations based on the weight vector U. The system of equations includes K equations with S variables, and S is computed using the equation $$S = K\left(\frac{N^m - 1}{N^{m-1}(N-1)}\right).$$

In some implementations, the neural network topology includes K inputs, a single layer perceptron with L calculation neurons, and a weight matrix V that includes a row of weights for each calculation neuron of the L calculation neurons. In such cases, transforming the neural network topology to the equivalent sparsely connected network of analog components includes: (i) deriving a connection degree N for the equivalent sparsely connected network according to the one or more connection constraints; (ii) calculating number of layers m for the equivalent sparsely connected network using the equation m=⌈$\log_N$ K⌉; (iii) decomposing the single layer perceptron into L single layer perceptron networks. Each single layer perceptron network includes a respective calculation neuron of the L calculation neurons; (iv) for each single layer perceptron network of the L single layer perceptron networks: (a) constructing a respective equivalent pyramid-like sub-network for the respective single layer perceptron network with the K inputs, the m layers and the connection degree N. The equivalent pyramid-like sub-network includes one or more respective analog neurons in each layer of the m layers, each analog neuron of first m−1 layers implements identity transform, and an analog neuron of last layer implements the activation function of the respective calculation neuron corresponding to the respective single layer perceptron; and (b) constructing the equivalent sparsely connected network by concatenating each equivalent pyramid-like sub-network including concatenating an input of each equivalent pyramid-like sub-network for the L single layer perceptron networks to form an input vector with L*K inputs. Also, in such cases, computing the weight matrix for the equivalent sparsely connected network includes, for each single layer perceptron network of the L single layer perceptron networks: (i) setting a weight vector U=$V_{t,i}$, $i^{th}$ row of the weight matrix V corresponding to the respective calculation neuron corresponding to the respective single layer perceptron network; and (ii) calculating a weight vector $W_i$ for connections of the respective equivalent pyramid-like sub-network by solving a system of equations based on the weight vector U. The system of equations includes K equations with S variables, and S is computed using the equation $$S = K\left(\frac{N^m - 1}{N^{m-1}(N-1)}\right).$$

In some implementations, the neural network topology includes K inputs, a multi-layer perceptron with S layers, each layer i of the S layers includes a corresponding set of calculation neurons $L_i$ and corresponding weight matrices $V^i$ that includes a row of weights for each calculation neuron of the $L_i$ calculation neurons. In such cases, transforming the neural network topology to the equivalent sparsely connected network of analog components includes: (i) deriving a connection degree N for the equivalent sparsely connected network according to the one or more connection constraints; (ii) decomposing the multi-layer perceptron into Q=E$_{i=1,S}$($L_i$) single layer perceptron networks. Each single layer perceptron network includes a respective calculation neuron of the Q calculation neurons. Decomposing the multi-layer perceptron includes duplicating one or more input of the K inputs that are shared by the Q calculation neurons; (iii) for each single layer perceptron network of the Q single layer perceptron networks: (a) calculating a number of layers m for a respective equivalent pyramid-like sub-network using the equation m=⌈$\log_N$ $K_{i,j}$⌉. $K_{i,j}$ is number of inputs for the respective calculation neuron in the multi-layer perceptron; and (b) constructing the respective equivalent pyramid-like sub-network for the respective single layer perceptron network with $K_{i,j}$ inputs, the m layers and the connection degree N. The equivalent pyramid-like sub-network includes one or more respective analog neurons in each layer of the m layers, each analog neuron of first m−1 layers implements identity transform, and an analog neuron of last layer implements the activation function of the respective calculation neuron corresponding to the respective single layer perceptron network; and (iv) constructing the equivalent sparsely connected network by concatenating each equivalent pyramid-like sub-network including concatenating input of each equivalent pyramid-like sub-network for the Q single layer perceptron networks to form an input vector with Q*$K_{i,j}$ inputs. Also, in such cases, computing the weight matrix for the equivalent sparsely connected network includes: for each single layer perceptron network of the Q single layer perceptron networks: (i) setting a weight vector U=$V_i^j$, the $i^{th}$ row of the weight matrix V corresponding to the respective calculation neuron corresponding to the respective single layer perceptron network, where j is the corresponding layer of the respective calculation neuron in the multi-layer perceptron; and (ii) calculating a weight vector $W_i$ for connections of the respective equivalent pyramid-like sub-network by solving a system of equations based on the weight vector U. The system of equations includes $K_{i,j}$ equations with S variables, and S is computed using the equation $$S = K_{i,j}\left(\frac{N^m - 1}{N^{m-1}(N-1)}\right).$$

In some implementations, the neural network topology includes a Convolutional Neural Network (CNN) with K inputs, S layers, each layer i of the S layers includes a corresponding set of calculation neurons $L_i$ and corresponding weight matrices $V^i$ that includes a row of weights for each calculation neuron of the $L_i$ calculation neurons. In such cases, transforming the neural network topology to the equivalent sparsely connected network of analog components includes: (i) deriving a connection degree N for the equivalent sparsely connected network according to the one or more connection constraints; (ii) decomposing the CNN into Q=$\Sigma_{i=1,S}$($L_i$) single layer perceptron networks. Each single layer perceptron network includes a respective calculation neuron of the Q calculation neurons. Decomposing the CNN includes duplicating one or more input of the K inputs that are shared by the Q calculation neurons; (iii) for each single layer perceptron network of the Q single layer perceptron networks: (a) calculating number of layers m for a respective equivalent pyramid-like sub-network using the equation $m=\lceil \log_N K_{i,j} \rceil$. j is the corresponding layer of the respective calculation neuron in the CNN, and $K_{i,j}$ is number of inputs for the respective calculation neuron in the CNN; and (b) constructing the respective equivalent pyramid-like sub-network for the respective single layer perceptron network with $K_{i,j}$ inputs, the m layers and the connection degree N. The equivalent pyramid-like sub-network includes one or more respective analog neurons in each layer of the m layers, each analog neuron of first m−1 layers implements identity transform, and an analog neuron of last layer implements the activation function of the respective calculation neuron corresponding to the respective single layer perceptron network; and (iv) constructing the equivalent sparsely connected network by concatenating each equivalent pyramid-like sub-network including concatenating input of each equivalent pyramid-like sub-network for the Q single layer perceptron networks to form an input vector with $Q*K_{i,j}$ inputs. Also, in such cases, computing the weight matrix for the equivalent sparsely connected network includes, for each single layer perceptron network of the Q single layer perceptron networks: (i) setting a weight vector $U=V_i^j$, the $i^{th}$ row of the weight matrix V corresponding to the respective calculation neuron corresponding to the respective single layer perceptron network, where j is the corresponding layer of the respective calculation neuron in the CNN; and (ii) calculating weight vector $W_i$ for connections of the respective equivalent pyramid-like sub-network by solving a system of equations based on the weight vector U. The system of equations includes $K_{i,j}$ equations with S variables, and S is computed using the equation $$S = K_{i,j}\left(\frac{N^m - 1}{N^{m-1}(N - 1)}\right).$$

In some implementations, the neural network topology includes K inputs, a layer $L_p$ with K neurons, a layer $L_n$ with L neurons, and a weight matrix $W \in R^{L \times K}$, where R is the set of real numbers, each neuron of the layer $L_p$ is connected to each neuron of the layer $L_n$, each neuron of the layer $L_n$ performs an activation function F, such that output of the layer $L_n$ is computed using the equation $Y_o = F(W \cdot x)$ for an input x. In such cases, transforming the neural network topology to the equivalent sparsely connected network of analog components includes performing a trapezium transformation that includes: (i) deriving a possible input connection degree $N_I > 1$ and a possible output connection degree $N_O > 1$, according to the one or more connection constraints; (ii) in accordance with a determination that $K \cdot L < L \cdot N_I + K \cdot N_O$, constructing a three-layered analog network that includes a layer $LA_p$ with K analog neurons performing identity activation function, a layer $LA_h$ with $$M = \left\lceil \max\left(\frac{K \cdot N_I}{N_O}, \frac{L \cdot N_O}{N_I}\right) \right\rceil$$

analog neurons performing identity activation function, and a layer $LA_o$ with L analog neurons performing the activation function F, such that each analog neuron in the layer $LA_p$ has $N_O$ outputs, each analog neuron in the layer $LA_h$ has not more than $N_I$ inputs and $N_O$ outputs, and each analog neuron in the layer $LA_o$ has $N_I$ inputs. Also, in such cases, computing the weight matrix for the equivalent sparsely connected network includes generating a sparse weight matrices $W_o$ and $W_h$ by solving a matrix equation $W_o \cdot W_h = W$ that includes K·L equations in $K \cdot N_O + L \cdot N_I$ variables, so that the total output of the layer $LA_o$ is calculated using the equation $Y_o = F(W_o \cdot W_h \cdot x)$. The sparse weight matrix $W_o \in R^{K \times M}$ represents connections between the layers $LA_p$ and $LA_h$, and the sparse weight matrix $W_h \in R^{M \times L}$ represents connections between the layers $LA_h$ and $LA_o$.

In some implementations, performing the trapezium transformation further includes: in accordance with a determination that $K \cdot L \geq L \cdot N_I + K \cdot N_O$: (i) splitting the layer $L_p$ to obtain a sub-layer $L_{p1}$ with K' neurons and a sub-layer $L_{p2}$ with (K−K') neurons such that $K' \cdot L \geq L \cdot N_I + K' \cdot N_O$; (ii) for the sub-layer $L_{p1}$ with K' neurons, performing the constructing, and generating steps; and (iii) for the sub-layer $L_{p2}$ with K−K' neurons, recursively performing the splitting, constructing, and generating steps.

In some implementations, the neural network topology includes a multilayer perceptron network. In such cases, the method further includes, for each pair of consecutive layers of the multilayer perceptron network, iteratively performing the trapezium transformation and computing the weight matrix for the equivalent sparsely connected network.

In some implementations, the neural network topology includes a recurrent neural network (RNN) that includes (i) a calculation of linear combination for two fully connected layers, (ii) element-wise addition, and (iii) a non-linear function calculation. In such cases, the method further includes performing the trapezium transformation and computing the weight matrix for the equivalent sparsely connected network, for (i) the two fully connected layers, and (ii) the non-linear function calculation.

In some implementations, the neural network topology includes a long short-term memory (LSTM) network or a gated recurrent unit (GRU) network that includes (i) a calculation of linear combination for a plurality of fully connected layers, (ii) element-wise addition, (iii) a Hadamard product, and (iv) a plurality of non-linear function calculations. In such cases, the method further includes performing the trapezium transformation and computing the weight matrix for the equivalent sparsely connected network, for (i) the plurality of fully connected layers, and (ii) the plurality of non-linear function calculations.

In some implementations, the neural network topology includes a convolutional neural network (CNN) that includes (i) a plurality of partially connected layers and (ii) one or more fully-connected layers. In such cases, the method further includes: (i) transforming the plurality of partially connected layers to equivalent fully-connected layers by inserting missing connections with zero weights; and (ii) for each pair of consecutive layers of the equivalent fully-connected layers and the one or more fully-connected layers, iteratively performing the trapezium transformation and computing the weight matrix for the equivalent sparsely connected network.

In some implementations, the neural network topology includes K inputs, L output neurons, and a weight matrix $U \in R^{L \times K}$, where R is the set of real numbers, each output neuron performs an activation function F. In such cases, transforming the neural network topology to the equivalent sparsely connected network of analog components includes performing an approximation transformation that includes: (i) deriving a possible input connection degree $N_I > 1$ and a possible output connection degree $N_O > 1$, according to the one or more connection constraints; (ii) selecting a parameter p from the set $\{0, 1, \ldots, \lceil \log_{N_f} K \rceil - 1\}$; (iii) in accordance with a determination that p>0, constructing a pyramid neural network that forms first p layers of the equivalent sparsely connected network, such that the pyramid neural network has $N_p = \lceil K/N_f^p \rceil$ neurons in its output layer. Each neuron in the pyramid neural network performs identity function; and (iv) constructing a trapezium neural network with $N_p$ inputs and L outputs. Each neuron in the last layer of the trapezium neural network performs the activation function F and all other neurons perform identity function. In such cases, computing the weight matrix for the equivalent sparsely connected network includes: (i) generating weights for the pyramid neural network including (a) setting weights of every neuron i of the first layer of the pyramid neural network according to following rule: (a) $w_{ik_i}^{(1)} = C$. C is a non-zero constant and $k_i = (i-1)N_f + 1$; and (b) $$w_{i,j}^{(1)} = \frac{1}{L} \sum_{l=1}^{L} \frac{U_{lj}}{U_{lk_i}} C,$$

for all weights j of the neuron except $k_i$; and (b) setting all other weights of the pyramid neural network to 1; and (ii) generating weights for the trapezium neural network including (a) setting weights of each neuron i of the first layer of the trapezium neural network according to the equation $$w_{ik_i}^{(p+1)} = \frac{U_{ik_i}}{C};$$

and (b) setting other weights of the trapezium neural network to 1.

In some implementations, the neural network topology includes a multilayer perceptron with the K inputs, S layers, and $L_{i=1,S}$ calculation neurons in i-th layer, and a weight matrix $U_{i=1,S} \in R^{L_i \times L_{i-1}}$ for the i-th layer, where $L_0 = K$. In such cases, transforming the neural network topology to the equivalent sparsely connected network of analog components includes: for each layer j of the S layers of the multilayer perceptron: (i) constructing a respective pyramid-trapezium network $PTNNX_j$ by performing the approximation transformation to a respective single layer perceptron consisting of $L_{j-1}$ inputs, $L_j$ output neurons, and a weight matrix $U_j$; and (ii) constructing the equivalent sparsely connected network by stacking each pyramid trapezium network.

In another aspect, a method is provided for hardware realization of neural networks, according to some implementations. The method includes obtaining a neural network topology and weights of a trained neural network. The method also includes transforming the neural network topology to an equivalent analog network of analog components including a plurality of operational amplifiers and a plurality of resistors. Each operational amplifier represents an analog neuron of the equivalent analog network, and each resistor represents a connection between two analog neurons. The method also includes computing a weight matrix for the equivalent analog network based on the weights of the trained neural network. Each element of the weight matrix represents a respective connection. The method also includes generating a resistance matrix for the weight matrix. Each element of the resistance matrix corresponds to a respective weight of the weight matrix and represents a resistance value.

In some implementations, generating the resistance matrix for the weight matrix includes: (i) obtaining a predetermined range of possible resistance values $\{R_{min}, R_{max}\}$ and selecting an initial base resistance value $R_{base}$ within the predetermined range; (ii) selecting a limited length set of resistance values, within the predetermined range, that provide most uniform distribution of possible weights $$w_{i,j} = R_{base}\left(\frac{1}{R_i} - \frac{1}{R_j}\right)$$

within the range $[-R_{base}, R_{base}]$ for all combinations of $\{R_i, R_j\}$ within the limited length set of resistance values; (iii) selecting a resistance value $R^+ = R^-$, from the limited length set of resistance values, either for each analog neuron or for each layer of the equivalent analog network, based on maximum weight of incoming connections and bias $w_{max}$ of each neuron or for each layer of the equivalent analog network, such that $R^+ = R^-$ is the closest resistor set value to $R_{base} * w_{max}$, and (iv) for each element of the weight matrix, selecting a respective first resistance value $R_1$ and a respective second resistance value $R_2$ that minimizes an error according to equation $$err = \left(\frac{R^+}{R_1} + \frac{R^-}{R_2}\right) \cdot r_{err} + \left|w - \frac{R^+}{R_1} + \frac{R^-}{R_2}\right|$$

for all possible values of $R_1$ and $R_2$ within the predetermined range of possible resistance values. w is the respective element of the weight matrix, and $r_{err}$ is a predetermined relative tolerance value for resistances.

In some implementations, the predetermined range of possible resistance values includes resistances according to nominal series E24 in the range 100 KΩ to 1 MΩ.

In some implementations, $R^+$ and $R^-$ are chosen independently for each layer of the equivalent analog network.

In some implementations, $R^+$ and $R^-$ are chosen independently for each analog neuron of the equivalent analog network.

In some implementations, a first one or more weights of the weight matrix and a first one or more inputs represent one or more connections to a first operational amplifier of the equivalent analog network. In such cases, the method further includes, prior to generating the resistance matrix: (i) modifying the first one or more weights by a first value; and (ii) configuring the first operational amplifier to multiply, by the first value, a linear combination of the first one or more weights and the first one or more inputs, before performing an activation function.

In some implementations, the method further includes: (i) obtaining a predetermined range of weights; and (ii) updating the weight matrix according to the predetermined range of weights such that the equivalent analog network produces similar output as the trained neural network for same input.

In some implementations, the trained neural network is trained so that each layer of the neural network topology has quantized weights.

In some implementations, the method further includes retraining the trained neural network to reduce sensitivity to errors in the weights or the resistance values that cause the equivalent analog network to produce different output compared to the trained neural network.

In some implementations, the method further includes retraining the trained neural network so as to minimize weight in any layer that are more than mean absolute weight for that layer by larger than a predetermined threshold.

In another aspect, a method is provided for hardware realization of neural networks, according to some implementations. The method includes obtaining a neural network topology and weights of a trained neural network. The method also includes transforming the neural network topology to an equivalent analog network of analog components including a plurality of operational amplifiers and a plurality of resistors. Each operational amplifier represents an analog neuron of the equivalent analog network, and each resistor represents a connection between two analog neurons. The method also includes computing a weight matrix for the equivalent analog network based on the weights of the trained neural network. Each element of the weight matrix represents a respective connection. The method also includes generating a resistance matrix for the weight matrix. Each element of the resistance matrix corresponds to a respective weight of the weight matrix. The method also includes pruning the equivalent analog network to reduce number of the plurality of operational amplifiers or the plurality of resistors, based on the resistance matrix, to obtain an optimized analog network of analog components.

In some implementations, pruning the equivalent analog network includes substituting, with conductors, resistors corresponding to one or more elements of the resistance matrix that have resistance values below a predetermined minimum threshold resistance value.

In some implementations, pruning the equivalent analog network includes removing one or more connections of the equivalent analog network corresponding to one or more elements of the resistance matrix that are above a predetermined maximum threshold resistance value.

In some implementations, pruning the equivalent analog network includes removing one or more connections of the equivalent analog network corresponding to one or more elements of the weight matrix that are approximately zero.

In some implementations, pruning the equivalent analog network further includes removing one or more analog neurons of the equivalent analog network without any input connections.

In some implementations, pruning the equivalent analog network includes: (i) ranking analog neurons of the equivalent analog network based on detecting use of the analog neurons when making calculations for one or more data sets; (ii) selecting one or more analog neurons of the equivalent analog network based on the ranking; and (iii) removing the one or more analog neurons from the equivalent analog network.

In some implementations, detecting use of the analog neurons includes: (i) building a model of the equivalent analog network using a modelling software; and (ii) measuring propagation of analog signals by using the model to generate calculations for the one or more data sets.

In some implementations, detecting use of the analog neurons includes: (i) building a model of the equivalent analog network using a modelling software; and (ii) measuring output signals of the model by using the model to generate calculations for the one or more data sets.

In some implementations, detecting use of the analog neurons includes: (i) building a model of the equivalent analog network using a modelling software; and (ii) measuring power consumed by the analog neurons by using the model to generate calculations for the one or more data sets.

In some implementations, the method further includes subsequent to pruning the equivalent analog network, and prior to generating one or more lithographic masks for fabricating a circuit implementing the equivalent analog network, recomputing the weight matrix for the equivalent analog network and updating the resistance matrix based on the recomputed weight matrix.

In some implementations, the method further includes, for each analog neuron of the equivalent analog network: (i) computing a respective bias value for the respective analog neuron based on the weights of the trained neural network, while computing the weight matrix; (ii) in accordance with a determination that the respective bias value is above a predetermined maximum bias threshold, removing the respective analog neuron from the equivalent analog network; and (iii) in accordance with a determination that the respective bias value is below a predetermined minimum bias threshold, replacing the respective analog neuron with a linear junction in the equivalent analog network.

In some implementations, the method further includes reducing number of neurons of the equivalent analog network, prior to generating the weight matrix, by increasing number of connections from one or more analog neurons of the equivalent analog network.

In some implementations, the method further includes pruning the trained neural network to update the neural network topology and the weights of the trained neural network, prior to transforming the neural network topology, using pruning techniques for neural networks, so that the equivalent analog network includes less than a predetermined number of analog components.

In some implementations, the pruning is performed iteratively taking into account accuracy or a level of match in output between the trained neural network and the equivalent analog network.

In some implementations, the method further includes, prior to transforming the neural network topology to the equivalent analog network, performing network knowledge extraction.

In another aspect, an integrated circuit is provided, according to some implementations. The integrated circuit includes an analog network of analog components fabricated by a method that includes: (i) obtaining a neural network topology and weights of a trained neural network; (ii) transforming the neural network topology to an equivalent analog network of analog components including a plurality of operational amplifiers and a plurality of resistors. Each operational amplifier represents a respective analog neuron, and each resistor represents a respective connection between a respective first analog neuron and a respective second analog neuron; (iii) computing a weight matrix for the equivalent analog network based on the weights of the trained neural network. Each element of the weight matrix represents a respective connection; (iv) generating a resistance matrix for the weight matrix. Each element of the resistance matrix corresponds to a respective weight of the weight matrix; (v) generating one or more lithographic masks for fabricating a circuit implementing the equivalent analog network of analog components based on the resistance matrix; and (vi) fabricating the circuit based on the one or more lithographic masks using a lithographic process.

In some implementations, the integrated circuit further includes one or more digital to analog converters configured to generate analog input for the equivalent analog network of analog components based on one or more digital.

In some implementations, the integrated circuit further includes an analog signal sampling module configured to process 1-dimensional or 2-dimensional analog inputs with a sampling frequency based on number of inferences of the integrated circuit.

In some implementations, the integrated circuit further includes a voltage converter module to scale down or scale up analog signals to match operational range of the plurality of operational amplifiers.

In some implementations, the integrated circuit further includes a tact signal processing module configured to process one or more frames obtained from a CCD camera.

In some implementations, the trained neural network is a long short-term memory (LSTM) network. In such cases, the integrated circuit further includes one or more clock modules to synchronize signal tacts and to allow time series processing.

In some implementations, the integrated circuit further includes one or more analog to digital converters configured to generate digital signal based on output of the equivalent analog network of analog components.

In some implementations, the integrated circuit further includes one or more signal processing modules configured to process 1-dimensional or 2-dimensional analog signals obtained from edge applications.

In some implementations, the trained neural network is trained, using training datasets containing signals of arrays of gas sensors on different gas mixture, for selective sensing of different gases in a gas mixture containing predetermined amounts of gases to be detected. In such cases, the neural network topology is a 1-Dimensional Deep Convolutional Neural network (1D-DCNN) designed for detecting 3 binary gas components based on measurements by 16 gas sensors, and includes 16 sensor-wise 1-D convolutional blocks, 3 shared or common 1-D convolutional blocks and 3 dense layers. In such cases, the equivalent analog network includes: (i) a maximum of 100 input and output connections per analog neuron, (ii) delay blocks to produce delay by any number of time steps, (iii) a signal limit of 5, (iv) 15 layers, (v) approximately 100,000 analog neurons, and (vi) approximately 4,900,000 connections.

In some implementations, the trained neural network is trained, using training datasets containing thermal aging time series data for different MOSFETs, for predicting remaining useful life (RUL) of a MOSFET device. In such cases, the neural network topology includes 4 LSTM layers with 64 neurons in each layer, followed by two dense layers with 64 neurons and 1 neuron, respectively. In such cases, the equivalent analog network includes: (i) a maximum of 100 input and output connections per analog neuron, (ii) a signal limit of 5, (iii) 18 layers, (iv) between 3,000 and 3,200 analog neurons, and (v) between 123,000 and 124,000 connections.

In some implementations, the trained neural network is trained, using training datasets containing time series data including discharge and temperature data during continuous usage of different commercially available Li-Ion batteries, for monitoring state of health (SOH) and state of charge (SOC) of Lithium Ion batteries to use in battery management systems (BMS). In such cases, the neural network topology includes an input layer, 2 LSTM layers with 64 neurons in each layer, followed by an output dense layer with 2 neurons for generating SOC and SOH values. In such cases, the equivalent analog network includes: (i) a maximum of 100 input and output connections per analog neuron, (ii) a signal limit of 5, (iii) 9 layers, (iv) between 1,200 and 1,300 analog neurons, and (v) between 51,000 and 52,000 connections.

In some implementations, the trained neural network is trained, using training datasets containing time series data including discharge and temperature data during continuous usage of different commercially available Li-Ion batteries, for monitoring state of health (SOH) of Lithium Ion batteries to use in battery management systems (BMS). In such cases, the neural network topology includes an input layer with 18 neurons, a simple recurrent layer with 100 neurons, and a dense layer with 1 neuron. In such cases, the equivalent analog network includes: (i) a maximum of 100 input and output connections per analog neuron, (ii) a signal limit of 5, (iii) 4 layers, (iv) between 200 and 300 analog neurons, and (v) between 2,200 and 2,400 connections.

In some implementations, the trained neural network is trained, using training datasets containing speech commands, for identifying voice commands. In such cases, the neural network topology is a Depthwise Separable Convolutional Neural Network (DS-CNN) layer with 1 neuron. In such cases, the equivalent analog network includes: (i) a maximum of 100 input and output connections per analog neuron, (ii) a signal limit of 5, (iii) 13 layers, (iv) approximately 72,000 analog neurons, and (v) approximately 2.6 million connections.

In some implementations, the trained neural network is trained, using training datasets containing photoplethysmography (PPG) data, accelerometer data, temperature data, and electrodermal response signal data for different individuals performing various physical activities for a predetermined period of times and reference heart rate data obtained from ECG sensor, for determining pulse rate during physical exercises based on PPG sensor data and 3-axis accelerometer data. In such cases, the neural network topology includes two Conv1D layers each with 16 filters and a kernel of 20, performing time series convolution, two LSTM layers each with 16 neurons, and two dense layers with 16 neurons and 1 neuron, respectively. In such cases, the equivalent analog network includes: (i) delay blocks to produce any number of time steps, (ii) a maximum of 100 input and output connections per analog neuron, (iii) a signal limit of 5, (iv) 16 layers, (v) between 700 and 800 analog neurons, and (vi) between 12,000 and 12,500 connections.

In some implementations, the trained neural network is trained to classify different objects based on pulsed Doppler radar signal. In such cases, the neural network topology includes multi-scale LSTM neural network.

In some implementations, the trained neural network is trained to perform human activity type recognition, based on inertial sensor data. In such cases, the neural network topology includes three channel-wise convolutional networks each with a convolutional layer of 12 filters and a kernel dimension of 64, and each followed by a max pooling layer, and two common dense layers of 1024 neurons and N neurons, respectively, where N is a number of classes. In such cases, the equivalent analog network includes: (i) delay blocks to produce any number of time steps, (ii) a maximum of 100 input and output connections per analog neuron, (iii) an output layer of 10 analog neurons, (iv) signal limit of 5, (v) 10 layers, (vi) between 1,200 and 1,300 analog neurons, and (vi) between 20,000 and 21,000 connections.

In some implementations, the trained neural network is further trained to detect abnormal patterns of human activity based on accelerometer data that is merged with heart rate data using a convolution operation.

In another aspect, a method is provided for generating libraries for hardware realization of neural networks. The method includes obtaining a plurality of neural network topologies, each neural network topology corresponding to a respective neural network. The method also incudes transforming each neural network topology to a respective equivalent analog network of analog components. The method also includes generating a plurality of lithographic masks for fabricating a plurality of circuits, each circuit implementing a respective equivalent analog network of analog components.

In some implementations, the method further includes obtaining a new neural network topology and weights of a trained neural network. The method also includes selecting one or more lithographic masks from the plurality of lithographic masks based on comparing the new neural network topology to the plurality of neural network topologies. The method also includes computing a weight matrix for a new equivalent analog network based on the weights. The method also includes generating a resistance matrix for the weight matrix. The method also includes generating a new lithographic mask for fabricating a circuit implementing the new equivalent analog network based on the resistance matrix and the one or more lithographic masks.

In some implementations, the new neural network topology includes a plurality of subnetwork topologies, and selecting the one or more lithographic masks is further based on comparing each subnetwork topology with each network topology of the plurality of network topologies.

In some implementations, one or more subnetwork topologies of the plurality of subnetwork topologies fails to compare with any network topology of the plurality of network topologies. In such cases, the method further includes: (i) transforming each subnetwork topology of the one or more subnetwork topologies to a respective equivalent analog subnetwork of analog components; and (ii) generating one or more lithographic masks for fabricating one or more circuits, each circuit of the one or more circuits implementing a respective equivalent analog subnetwork of analog components.

In some implementations, transforming a respective network topology to a respective equivalent analog network includes: (i) decomposing the respective network topology to a plurality of subnetwork topologies; (ii) transforming each subnetwork topology to a respective equivalent analog subnetwork of analog components; and (iii) composing each equivalent analog subnetwork to obtain the respective equivalent analog network.

In some implementations, decomposing the respective network topology includes identifying one or more layers of the respective network topology as the plurality of subnetwork topologies.

In some implementations, each circuit is obtained by: (i) generating schematics for a respective equivalent analog network of analog components; and (ii) generating a respective circuit layout design based on the schematics.

In some implementations, the method further includes combining one or more circuit layout designs prior to generating the plurality of lithographic masks for fabricating the plurality of circuits.

In another aspect, a method is provided for optimizing energy efficiency of analog neuromorphic circuits, according to some implementations. The method includes obtaining an integrated circuit implementing an analog network of analog components including a plurality of operational amplifiers and a plurality of resistors. The analog network represents a trained neural network, each operational amplifier represents a respective analog neuron, and each resistor represents a respective connection between a respective first analog neuron and a respective second analog neuron. The method also include generating inferences using the integrated circuit for a plurality of test inputs, including simultaneously transferring signals from one layer to a subsequent layer of the analog network. The method also includes, while generating inferences using the integrated circuit: (i) determining if a level of signal output of the plurality of operational amplifiers is equilibrated; and (ii) in accordance with a determination that the level of signal output is equilibrated: (a) determining an active set of analog neurons of the analog network influencing signal formation for propagation of signals; and (turning off power for one or more analog neurons of the analog network, distinct from the active set of analog neurons, for a predetermined period of time.

In some implementations, determining the active set of analog neurons is based on calculating delays of signal propagation through the analog network.

In some implementations, determining the active set of analog neurons is based on detecting the propagation of signals through the analog network.

In some implementations, the trained neural network is a feed-forward neural network, and the active set of analog neurons belong to an active layer of the analog network, and turning off power includes turning off power for one or more layers prior to the active layer of the analog network.

In some implementations, the predetermined period of time is calculated based on simulating propagation of signals through the analog network, accounting for signal delays.

In some implementations, the trained neural network is a recurrent neural network (RNN), and the analog network further includes one or more analog components other than the plurality of operational amplifiers, and the plurality of resistors. In such cases, the method further includes, in accordance with a determination that the level of signal output is equilibrated, turning off power, for the one or more analog components, for the predetermined period of time.

In some implementations, the method further includes turning on power for the one or more analog neurons of the analog network after the predetermined period of time.

In some implementations, determining if the level of signal output of the plurality of operational amplifiers is equilibrated is based on detecting if one or more operational amplifiers of the analog network is outputting more than a predetermined threshold signal level.

In some implementations, the method further includes repeating the turning off for the predetermined period of time and turning on the active set of analog neurons for the predetermined period of time, while generating the inferences.

In some implementations, the method further includes: (i) in accordance with a determination that the level of signal output is equilibrated, for each inference cycle: (a) during a first time interval, determining a first layer of analog neurons of the analog network influencing signal formation for propagation of signals; and (b) turning off power for a first one or more analog neurons of the analog network, prior to the first layer, for the predetermined period of time; and (ii) during a second time interval subsequent to the first time interval, turning off power for a second one or more analog neurons including the first layer of analog neurons and the first one or more analog neurons of the analog network, for the predetermined period.

In some implementations, the one or more analog neurons consist of analog neurons of a first one or more layers of the analog network, and the active set of analog neurons consist of analog neurons of a second layer of the analog network, and the second layer of the analog network is distinct from layers of the first one or more layers.

In some implementations, a computer system has one or more processors, memory, and a display. The one or more programs include instructions for performing any of the methods described herein.

In some implementations, a non-transitory computer readable storage medium stores one or more programs configured for execution by a computer system having one or more processors, memory, and a display. The one or more programs include instructions for performing any of the methods described herein.

Thus, methods, systems, and devices are disclosed that are used for hardware realization of trained neural networks.

BRIEF DESCRIPTION OF THE DRAWINGS

For a better understanding of the aforementioned systems, methods, and graphical user interfaces, as well as additional systems, methods, and graphical user interfaces that provide data visualization analytics and data preparation, reference should be made to the Description of Implementations below, in conjunction with the following drawings in which like reference numerals refer to corresponding parts throughout the figures.

FIGS. 11A-11C show an application of a T-transformation algorithm for a single layer neural network, according to some implementations.

FIG. 19B shows a table of description for the example circuit shown in FIG. 19A, according to some implementations.

FIG. 20F shows a table of description for the example circuit shown in FIG. 20A-20D, according to some implementations.

FIG. 21J shows a table of description for the schematic shown in FIGS. 21A-21I, according to some implementations.

FIG. 22B shows a table of description for the schematic diagram shown in FIG. 22A, according to some implementations.

FIG. 23B shows a table of description for the schematic diagram shown in FIG. 23A, according to some implementations.

FIGS. 24A-24C show a schematic diagram of a single neuron CMOS operational amplifier, according to some implementations. FIG. 24D shows a table of description for the schematic diagram shown in FIG. 24A-24C, according to some implementations.

FIG. 25E shows a table of description for the schematic diagram shown in FIG. 25A-25D, according to some implementations.

FIG. 34 shows a table describing the MobileNet v1 architecture, according to some implementations.

Reference will now be made to implementations, examples of which are illustrated in the accompanying drawings. In the following description, numerous specific details are set forth in order to provide a thorough understanding of the present invention. However, it will be apparent to one of ordinary skill in the art that the present invention may be practiced without requiring these specific details.

DESCRIPTION OF IMPLEMENTATIONS

Figure 1A:
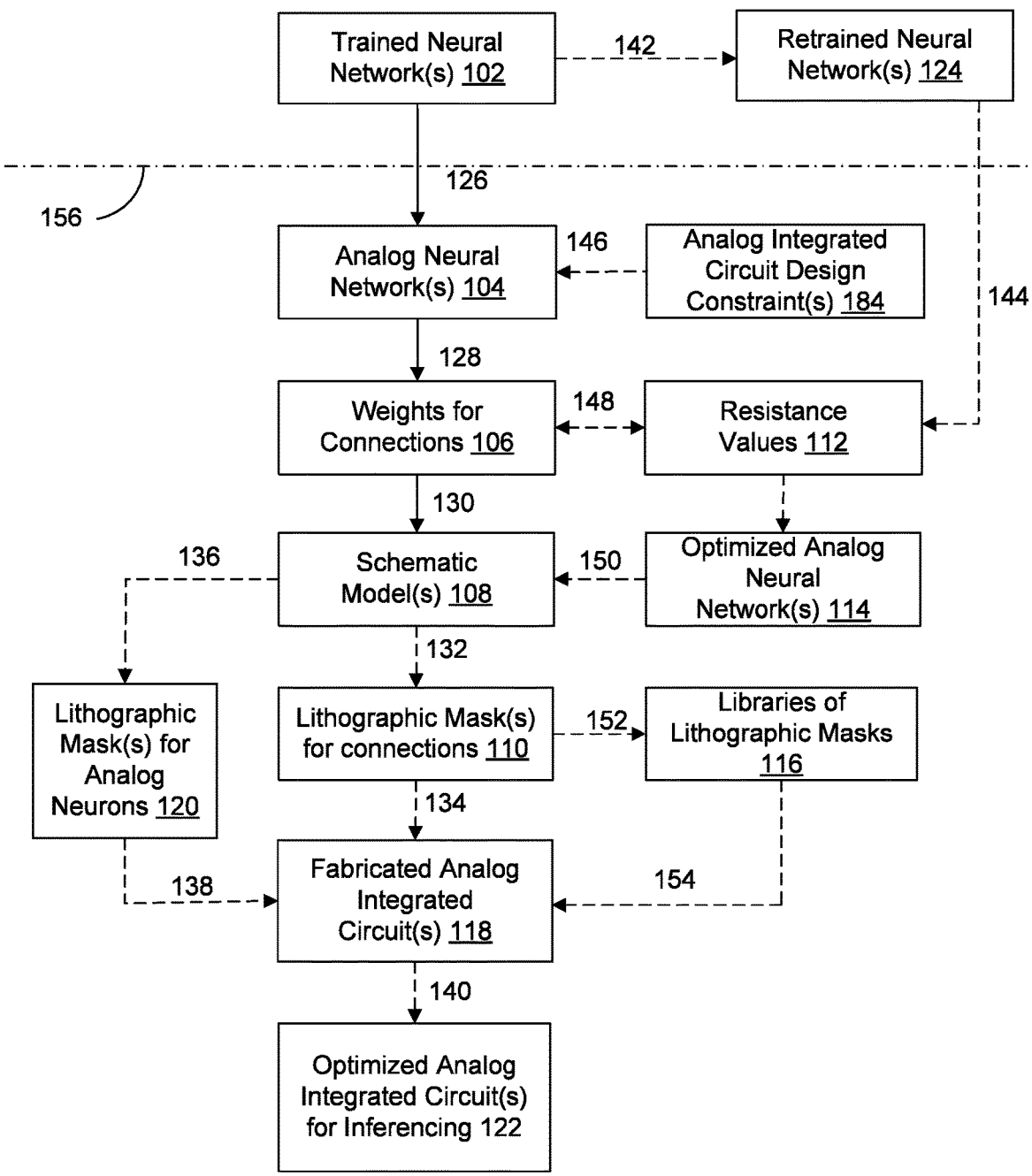
FIG. 1A is a block diagram of a system for hardware realization of trained neural networks using analog components, according to some implementations.

FIG. 1A is a block diagram of a system 100 for hardware realization of trained neural networks using analog components, according to some implementations. The system includes transforming (126) trained neural networks 102 to analog neural networks 104. In some implementations, analog integrated circuit constraints 184 constrain (146) the transformation (126) to generate the analog neural networks 104. Subsequently, the system derives (calculates or generates) weights 106 for the analog neural networks 104 by a process that is sometimes called weight quantization (128). In some implementations, the analog neural network includes a plurality of analog neuron, each analog neuron represented by an analog component, such as an operational amplifier, and each analog neuron connected to another analog neuron via a connection. In some implementations, the connections are represented using resistors that reduce the current flow between two analog neurons. In some implementations, the system transforms (148) the weights 106 to resistance values 112 for the connections. The system subsequently generates (130) one or more schematic models 108 for implementing the analog neural networks 104 based on the weights 106. In some implementations, the system optimizes resistance values 112 (or the weights 106) to form optimized analog neural networks 114 which is further used to generate (150) the schematic models 108. In some implementations, the system generates (132) lithographic masks 110 for the connections and/or generates (136) lithographic masks 120 for the analog neurons. In some implementations, the system fabricates (134 and/or 138) analog integrated circuits 118 that implement the analog neural networks 104. In some implementations, the system generates (152) libraries of lithographic masks 116 based on the lithographic masks for connections 110 and/or lithographic masks 120 for the analog neurons. In some implementations, the system uses (154) the libraries of lithographic masks 116 to fabricate the analog integrated circuits 118. In some implementations, when the trained neural networks 142 are retrained (142), the system regenerates (or recalculates) (144) the resistance values 112 (and/or the weights 106), the schematic model 108, and/or the lithographic masks for connections 110. In some implementations, the system reuses the lithographic masks 120 for the analog neurons 120. In other words, in some implementations, only the weights 106 (or the resistance values 112 corresponding to the changed weights), and/or the lithographic masks for the connections 110 are regenerated. Since only the connections, weights, the schematic model, and/or the corresponding lithographic masks for the connections are regenerated, as indicated by the dashed line 156, the process for (or the path to) fabricating analog integrated circuits for the retrained neural networks is substantially simplified, and the time to market for re-spinning hardware for neural networks is reduced, when compared to conventional techniques for hardware realization of neural networks.

Figure 1B:
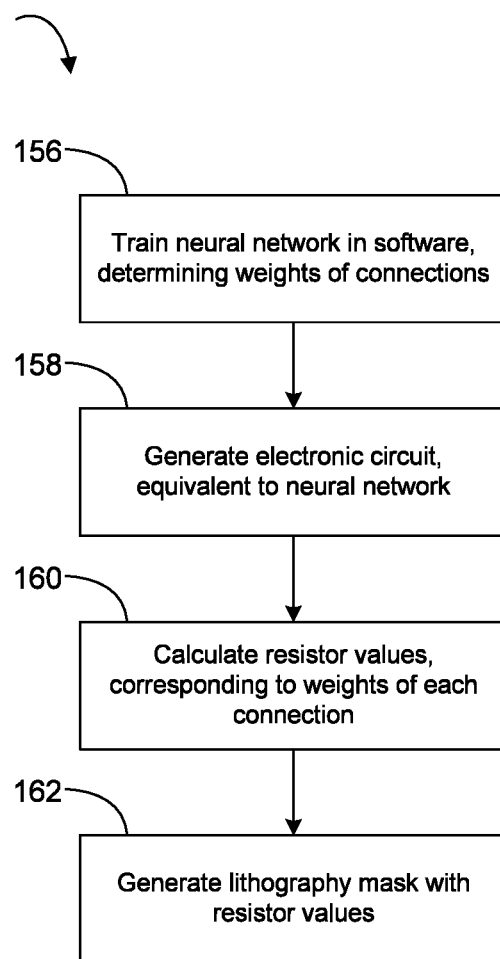
FIG. 1B is a block diagram of an alternative representation of the system of FIG. 1A for hardware realization of trained neural networks using analog components, according to some implementations.

FIG. 1B is a block diagram of an alternative representation of the system 100 for hardware realization of trained neural networks using analog components, according to some implementations. The system includes training (156) neural networks in software, determining weights of connections, generating (158) electronic circuit equivalent to the neural network, calculating (160) resistor values corresponding to weights of each connection, and subsequently generating (162) lithography mask with resistor values.

Figure 1C:
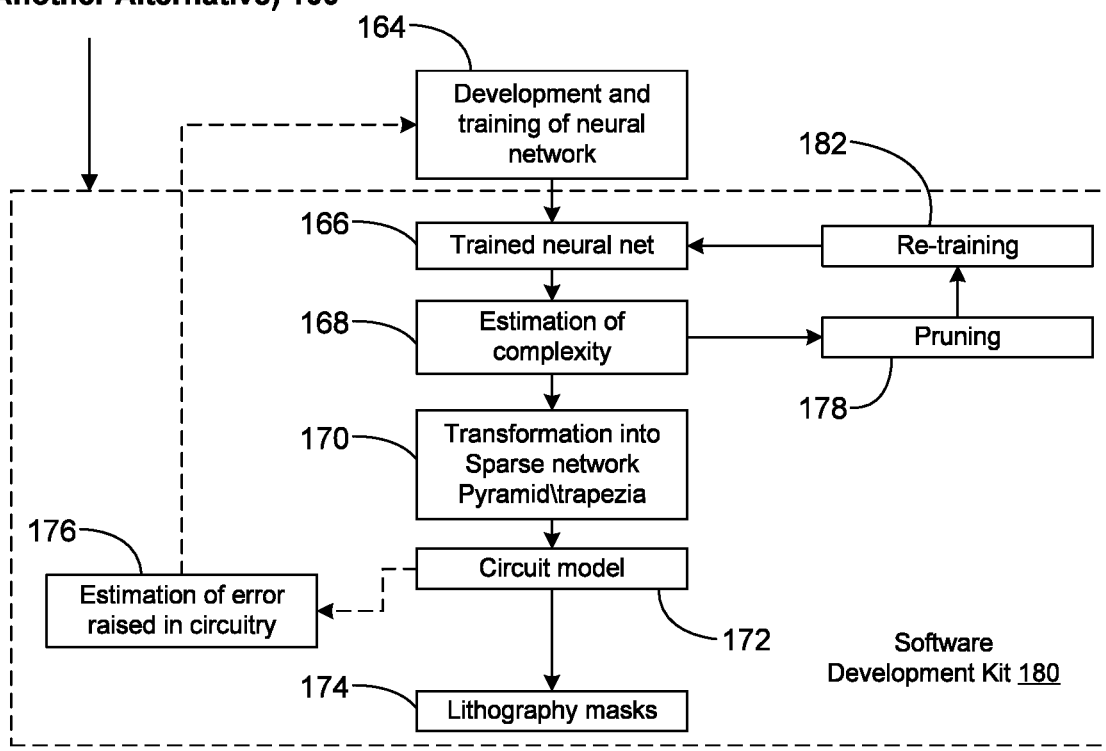
FIG. 1C is a block diagram of another representation of the system of FIG. 1A for hardware realization of trained neural networks using analog components, according to some implementations.

FIG. 1C is a block diagram of another representation of the system 100 for hardware realization of trained neural networks using analog components, according to some implementations. The system is distributed as a software development kit (SDK) 180, according to some implementations. A user develops and trains (164) a neural network and inputs the trained neural net 166 to the SDK 180. The SDK estimates (168) complexity of the trained neural net 166. If the complexity of the trained neural net can be reduced (e.g., some connections and/or neurons can be removed, some layers can be reduced, or the density of the neurons can be changed), the SDK 180 prunes (178) the trained neural net and retrains (182) the neural net to obtain an updated trained neural net 166. Once the complexity of the trained neural net is reduced, the SDK 180 transforms (170) the trained neural net 166 into a sparse network of analog components (e.g., a pyramid- or a trapezia-shaped network). The SDK 180 also generates a circuit model 172 of the analog network. In some implementations, the SDK estimates (176) a deviation in an output generated by the circuit model 172 relative to the trained neural network for a same input, using software simulations. If the estimated error exceeds a threshold error (e.g., a value set by the user), the SDK 180 prompts the user to reconfigure, redevelop, and/or retrain the neural network. In some implementations, although not shown, the SDK automatically reconfigures the trained neural net 166 so as to reduce the estimated error. This process is iterated multiple times until the error is reduced below the threshold error. In FIG. 1C, the dashed line from the block 176 ("Estimation of error raised in circuitry") to the block 164 ("Development and training of neural network") indicates a feedback loop. For example, if the pruned network did not show desired accuracy, some implementations prune the network differently, until accuracy exceeds a predetermined threshold (e.g., 98% accuracy) for a given application. In some implementations, this process includes recalculating the weights, since pruning includes retraining of the whole network.

Figure 2A:
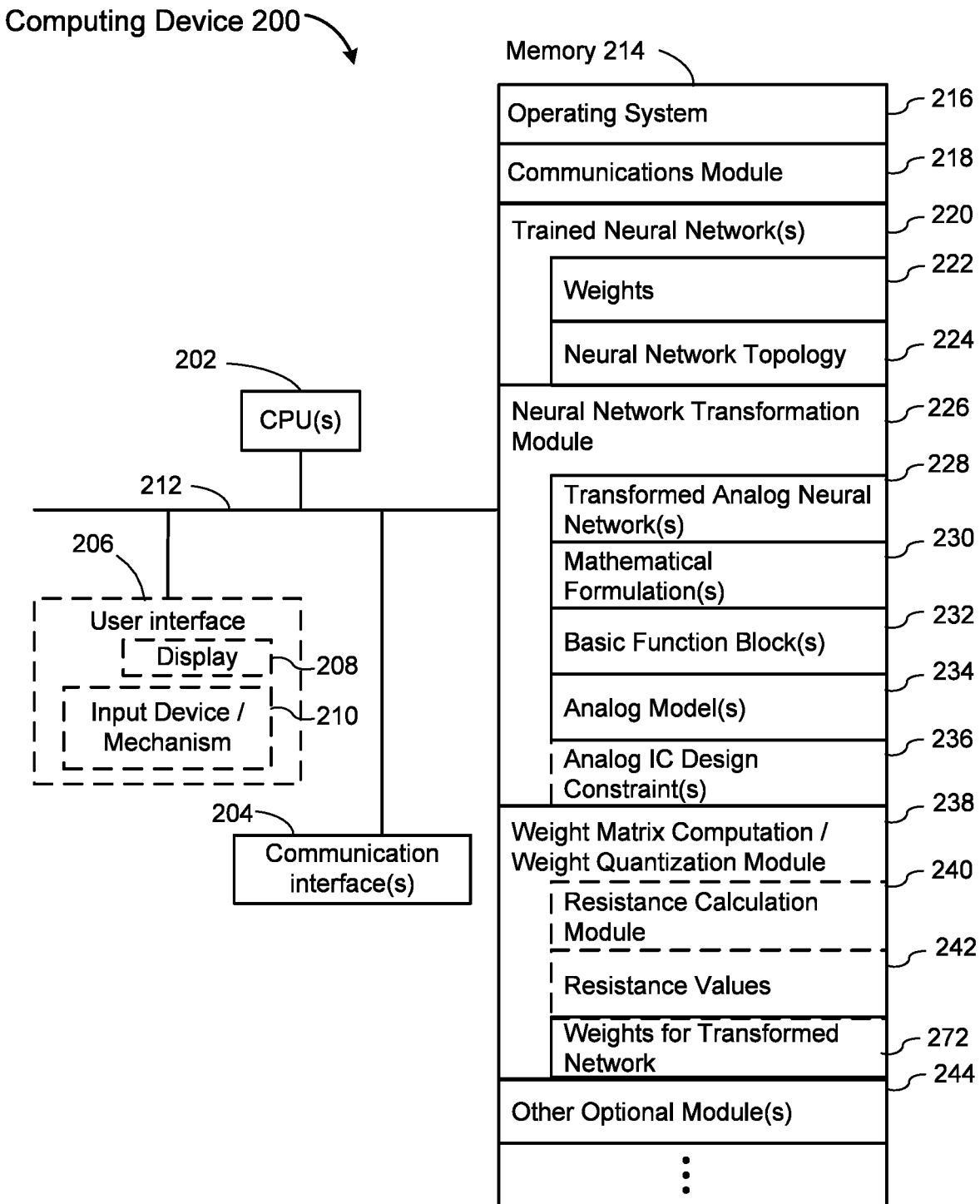
FIG. 2A is a system diagram of a computing device in accordance with some implementations.

In some implementations, components of the system 100 described above are implemented in one or more computing devices or server systems as computing modules. FIG. 2A is a system diagram of a computing device 200 in accordance with some implementations. As used herein, the term "computing device" includes both personal devices 102 and servers. A computing device 200 typically includes one or more processing units/cores (CPUs) 202 for executing modules, programs, and/or instructions stored in the memory 214 and thereby performing processing operations; one or more network or other communications interfaces 204; memory 214; and one or more communication buses 212 for interconnecting these components. The communication buses 212 may include circuitry that interconnects and controls communications between system components. A computing device 200 may include a user interface 206 comprising a display device 208 and one or more input devices or mechanisms 210. In some implementations, the input device/mechanism 210 includes a keyboard; in some implementations, the input device/mechanism includes a "soft" keyboard, which is displayed as needed on the display device 208, enabling a user to "press keys" that appear on the display 208. In some implementations, the display 208 and input device/mechanism 210 comprise a touch screen display (also called a touch sensitive display). In some implementations, the memory 214 includes high-speed random access memory, such as DRAM, SRAM, DDR RAM, or other random access solid state memory devices. In some implementations, the memory 214 includes non-volatile memory, such as one or more magnetic disk storage devices, optical disk storage devices, flash memory devices, or other non-volatile solid state storage devices. In some implementations, the memory 214 includes one or more storage devices remotely located from the CPU(s) 202. The memory 214, or alternatively the non-volatile memory device(s) within the memory 214, comprises a computer readable storage medium. In some implementations, the memory 214, or the computer readable storage medium of the memory 214, stores the following programs, modules, and data structures, or a subset thereof:

- an operating system 216, which includes procedures for handling various basic system services and for performing hardware dependent tasks;
- a communications module 218, which is used for connecting the computing device 200 to other computers and devices via the one or more communication network interfaces 204 (wired or wireless) and one or more communication networks, such as the Internet, other wide area networks, local area networks, metropolitan area networks, and so on;
- trained neural networks 220 that includes weights 222 and neural network topologies 224. Examples of input neural networks are described below in reference to FIGS. 4A-4C, FIG. 12, FIGS. 13A, and 14A, according to some implementations;
- a neural network transformation module 226 that includes transformed analog neural networks 228, mathematical formulations 230, the basic function blocks 232, analog models 234 (sometimes called neuron models), and/or analog integrated circuit (IC) design constraints 236. Example operations of the neural network transformation module 226 are described below in reference to at least FIGS. 5, 6A-6C, 7, 8, 9, 10, and 11A-11C, and the flowcharts shown in FIGS. 27A-27J, and FIGS. 28A-28S; and/or
- a weight matrix computation (sometimes called a weight quantization) module 238 that includes weights 272 of transformed networks, and optionally includes resistance calculation module 240, resistance values 242. Example operations of the weight matrix computation module 238 and/or weight quantization are described in reference to at least FIGS. 17A-17C, FIG. 18, and FIGS. 29A-29F, according to some implementations.

Figure 2B:
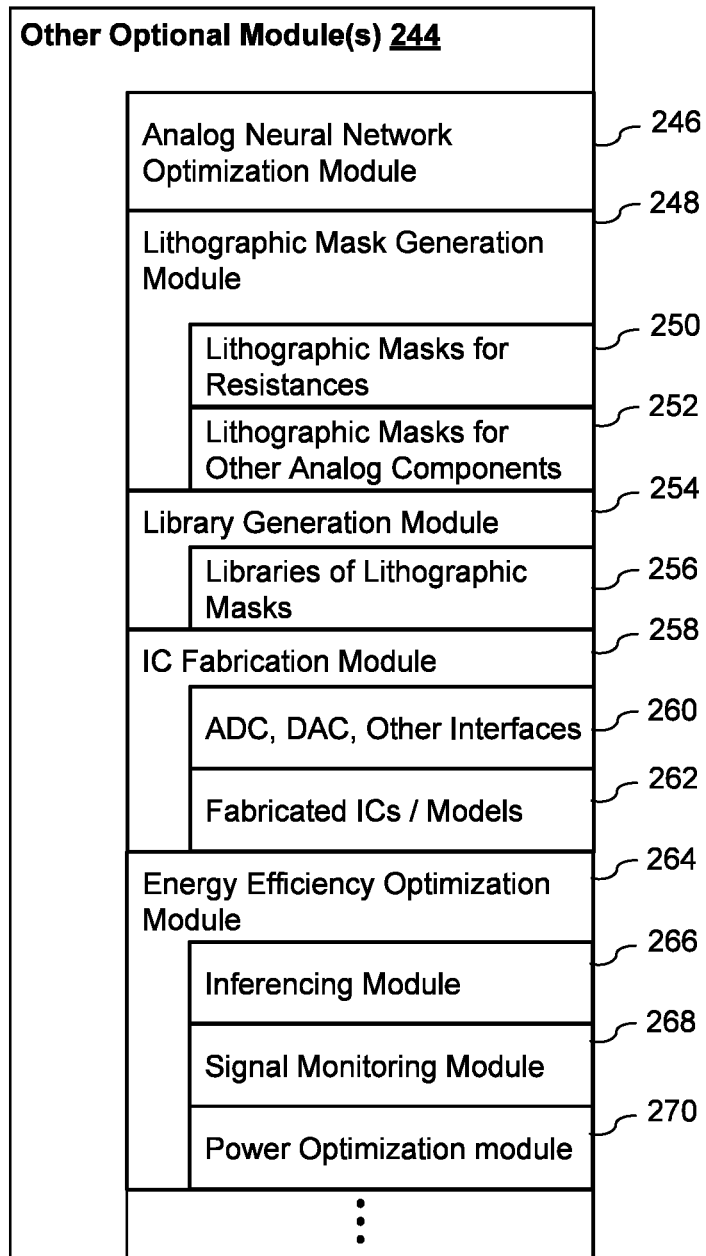
FIG. 2B shows optional modules of the computing device, according to some implementations.

Some implementations include one or more optional modules 244 as shown in FIG. 2B. Some implementations include an analog neural network optimization module 246. Examples of analog neural network optimization are described below in reference to FIGS. 30A-30M, according to some implementations.

Some implementations include a lithographic mask generation module 248 that further includes lithographic masks 250 for resistances (corresponding to connections), and/or lithographic masks for analog components (e.g., operational amplifiers, multipliers, delay blocks, etc.) other than the resistances (or connections). In some implementations, lithographic masks are generated based on chip design layout following chip design using Cadence, Synopsys, or Mentor Graphics software packages. Some implementations use a design kit from a silicon wafer manufacturing plant (sometimes called a fab). Lithographic masks are intended to be used in that particular fab that provides the design kit (e.g., TSMC 65 nm design kit). The lithographic mask files that are generated are used to fabricate the chip at the fab. In some implementations, the Cadence, Mentor Graphics, or Synopsys software packages-based chip design is generated semi-automatically from the SPICE or Fast SPICE (Mentor Graphics) software packages. In some implementations, a user with chip design skill drives the conversion from the SPICE or Fast SPICE circuit into Cadence, Mentor Graphics or Synopsis chip design. Some implementations combine Cadence design blocks for single neuron unit, establishing proper interconnects between the blocks.

Some implementations include a library generation module 254 that further includes libraries of lithographic masks 256. Examples of library generation are described below in reference to FIGS. 32A-32E, according to some implementations.

Some implementations include Integrated Circuit (IC) fabrication module 258 that further includes Analog-to-Digital Conversion (ADC), Digital-to-Analog Conversion (DAC), or similar other interfaces 260, and/or fabricated ICs or models 262. Example integrated circuits and/or related modules are described below in reference to FIGS. 31A-31Q, according to some implementations.

Some implementations include an energy efficiency optimization module 264 that further includes an inferencing module 266, a signal monitoring module 268, and/or a power optimization module 270. Examples of energy efficiency optimizations are described below in reference to FIGS. 33A-33K, according to some implementations.

Each of the above identified executable modules, applications, or sets of procedures may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise rearranged in various implementations. In some implementations, the memory 214 stores a subset of the modules and data structures identified above. Furthermore, in some implementations, the memory 214 stores additional modules or data structures not described above.

Although FIG. 2A shows a computing device 200, FIG. 2A is intended more as a functional description of the various features that may be present rather than as a structural schematic of the implementations described herein. In practice, and as recognized by those of ordinary skill in the art, items shown separately could be combined and some items could be separated.

Example Process for Generating Schematic Models of Analog Networks

Figure 3A:
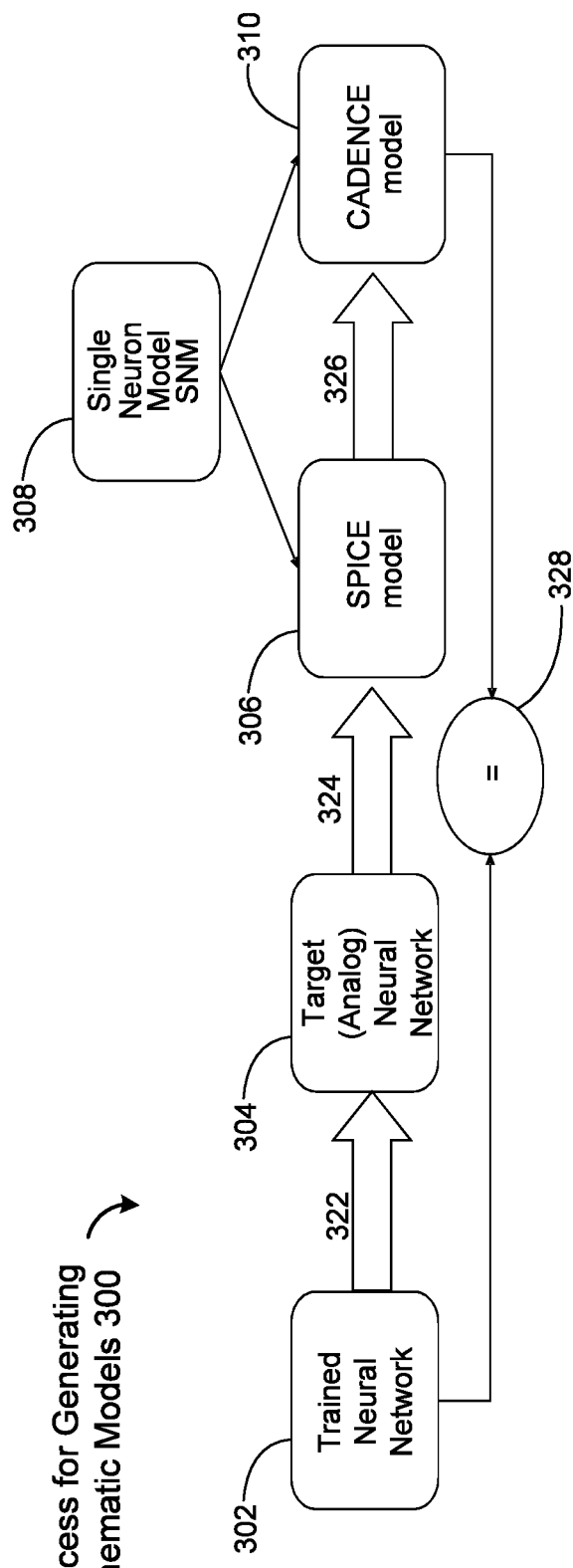
FIG. 3A shows an example process for generating schematic models of analog networks corresponding to trained neural networks, according to some implementations.

FIG. 3A shows an example process 300 for generating schematic models of analog networks corresponding to trained neural networks, according to some implementations. As shown in FIG. 3A, a trained neural network 302

(e.g., MobileNet) is converted (322) to a target or equivalent analog network 304 (using a process that is sometimes called T-transformation). The target neural network (sometimes called a T-network) 304 is exported (324) to SPICE (as a SPICE model 306) using a single neuron model (SNM), which is exported (326) from SPICE to CADENCE and full on-chip designs using a CADENCE model 308. The CADENCE model 308 is cross-validated (328) against the initial neural network for one or more validation inputs.

In the description above and below, a math neuron is a mathematical function which receives one or more weighted inputs and produces a scalar output. In some implementations, a math neuron can have memory (e.g., long short-term memory (LSTM), recurrent neuron). A trivial neuron is a math neuron that performs a function, representing an 'ideal' mathematical neuron, $V^{out}=f(\Sigma(V_i^{in} \cdot \omega_i + bias))$, where $f(x)$ is an activation function. A SNM is a schematic model with analog components (e.g., operational amplifiers, resistors $R_1, \ldots R_n$, and other components) representing a specific type of math neuron (for example, trivial neuron) in schematic form. SNM output voltage is represented by a corresponding formula that depends on K input voltages and SNM component values $V^{out}=g(V_i^{in}, \ldots, V_K^{in}, R_1 \ldots R_n)$. According to some implementations, with properly selected component values, SNM formula is equivalent to math neuron formula, with a desired weights set. In some implementations, the weights set is fully determined by resistors used in a SNM. A target (analog) neural network 304 (sometimes called a T-network) is a set of math neurons which have defined SNM representation, and weighted connections between them, forming a neural network. A T-network follows several restrictions, such as an inbound limit (a maximum limit of inbound connections for any neuron within the T-network), an outbound limit (a maximum limit of outbound connections for any neuron within the T-network), and a signal range (e.g., all signals should be inside pre-defined signal range). T-transformation (322) is a process of converting some desired neural network, such as MobileNet, to a corresponding T-network. A SPICE model 306 is a SPICE Neural Network model of a T-network 304, where each math neuron is substituted with corresponding one or more SNMs. A Cadence NN model 310 is a Cadence model of the T-network 304, where each math neuron is substituted with a corresponding one or more SNMs. Also, as described herein, two networks L and M have mathematical equivalence, if for all neuron outputs of these networks $|V_i^L - V_i^M| < eps$, where eps is relatively small (e.g., between 0.1-1% of operating voltage range). Also, two networks L and M have functional equivalence, if for a given validation input data set $\{I_1, \ldots, I_n\}$, the classification results are mostly the same, i.e., $P(L(I_k)=M(I_k))=1-eps$, where eps is relatively small.

Figure 3B:
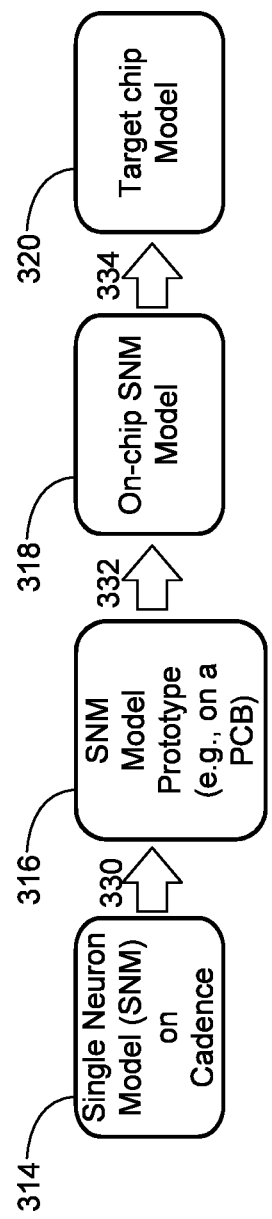
FIG. 3B shows an example manual prototyping process used for generating a target chip model, according to some implementations.

FIG. 3B shows an example manual prototyping process used for generating a target chip model 320 based on a SNM model on Cadence 314, according to some implementations. Note that although the following description uses Cadence, alternate tools from Mentor Graphic design or Synopsys (e.g., Synopsys design kit) may be used in place of Cadence tools, according to some implementations. The process includes selecting SNM limitations, including inbound and outbound limits and signal limitation, selecting analog components (e.g., resistors, including specific resistor array technology) for connections between neurons, and developing a Cadence SNM model 314. A prototype SNM model 316 (e.g., a PCB prototype) is developed (330) based on the SNM model on Cadence 314. The prototype SNM model 316 is compared with a SPICE model for equivalence. In some implementations, a neural network is selected for an on-chip prototype, when the neural network satisfies equivalence requirements. Because the neural network is small in size, the T-transformation can be hand-verified for equivalence. Subsequently, an on-chip SNM model 318 is generated (332) based on the SNM model prototype 316. The on-chip SNM model is optimized as possible, according to some implementations. In some implementations, an on-chip density for the SNM model is calculated prior to generating (334) a target chip model 320 based on the on-chip SNM model 318, after finalizing the SNM. During the prototyping process, a practitioner may iterate selecting neural network task or application and specific neural network (e.g., a neural network having in the order of 0.1 to 1.1 million neurons), performing T-transformation, building a Cadence neural network model, designing interfaces and/or the target chip model.

Example Input Neural Networks

Figure 4A:
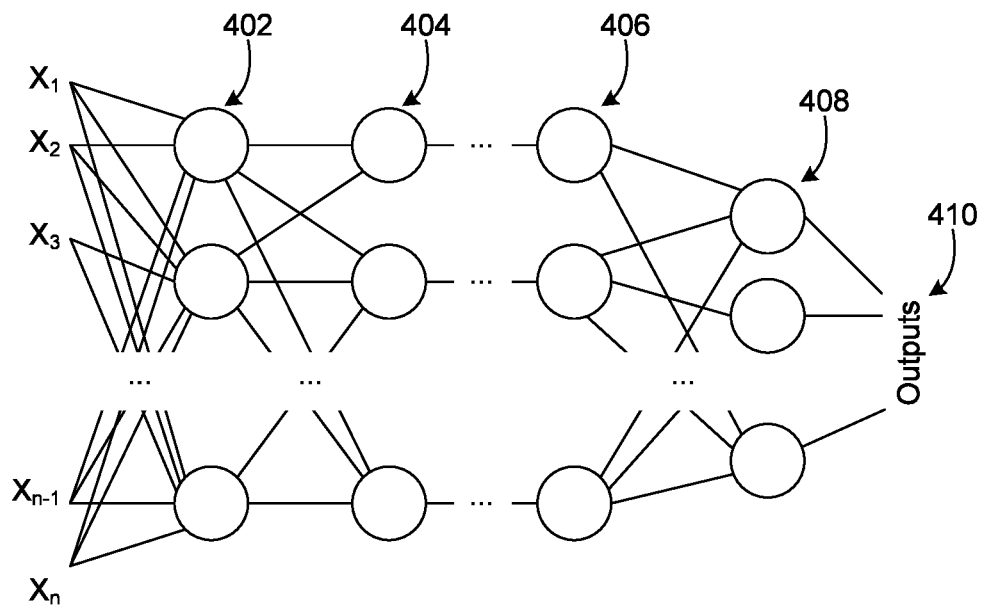
FIGS. 4A, 4B, and 4C show examples of neural networks that are transformed to mathematically equivalent analog networks, according to some implementations.
Figure 4B:
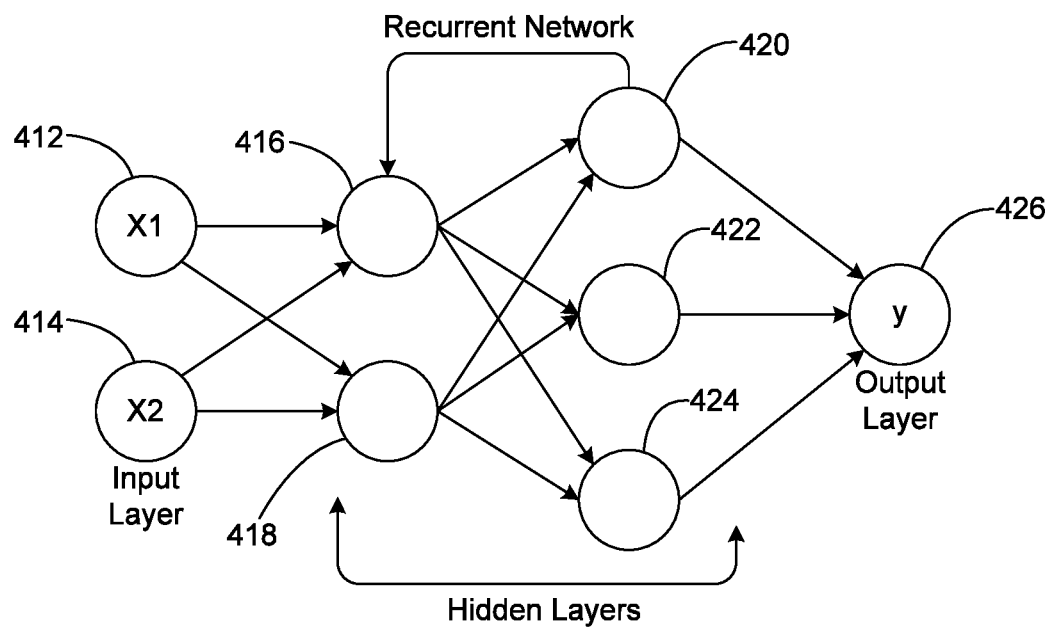
Figure 4C:
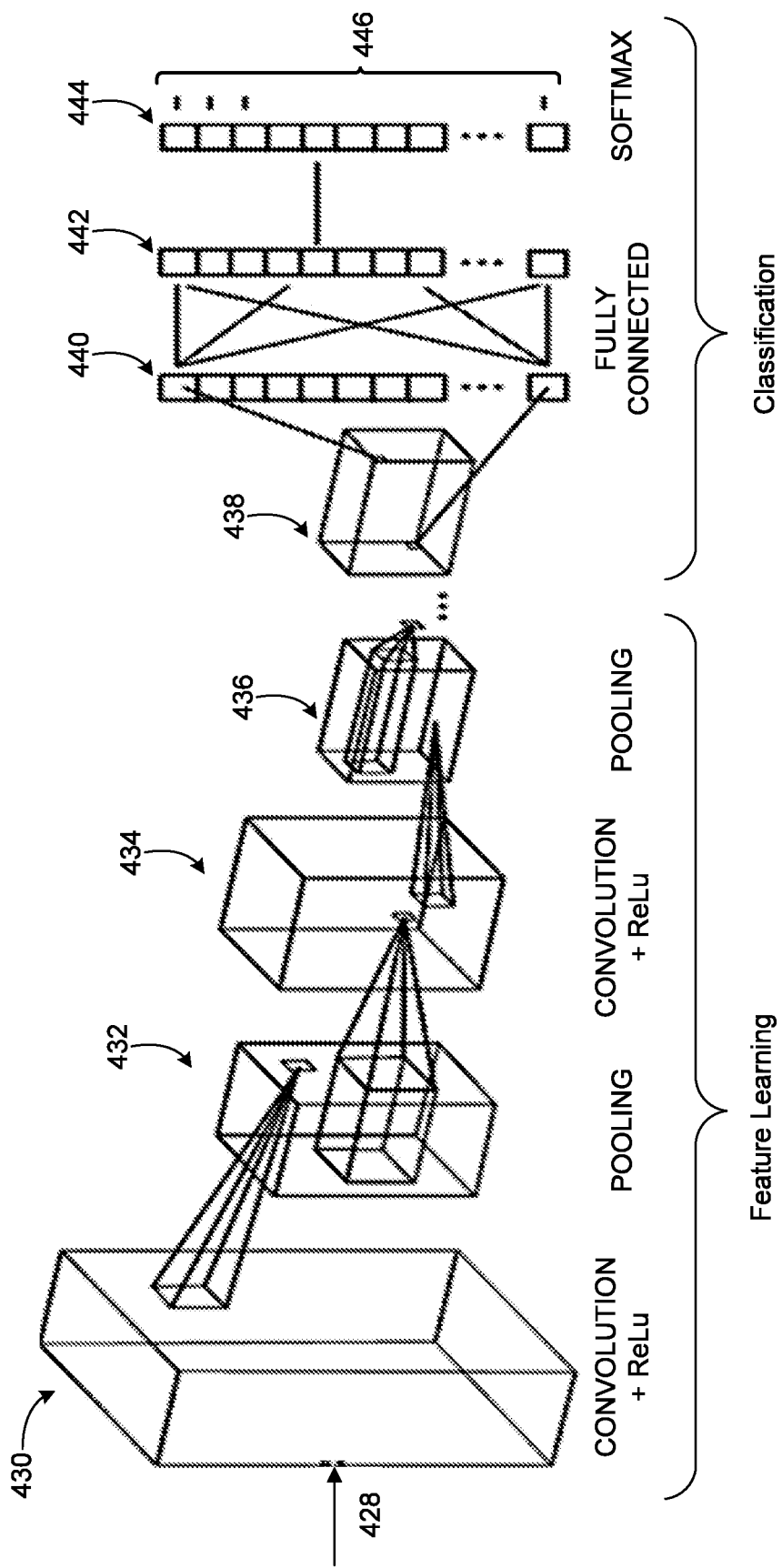

FIGS. 4A, 4B, and 4C show examples of trained neural networks (e.g., the neural networks 220) that are input to the system 100 and transformed to mathematically equivalent analog networks, according to some implementations. FIG. 4A shows an example neural network (sometimes called an artificial neural network) that are composed of artificial neurons that receive input, combine the input using an activation function, and produce one or more outputs. The input includes data, such as images, sensor data, and documents. Typically, each neural network performs a specific task, such as object recognition. The networks include connections between the neurons, each connection providing the output of a neuron as an input to another neuron. After training, each connection is assigned a corresponding weight. As shown in FIG. 4A, the neurons are typically organized into multiple layers, with each layer of neurons connected only to the immediately preceding and following layer of neurons. An input layer of neurons 402 receives external input (e.g., the input $X_1, X_2, \ldots, X_n$). The input layer 402 is followed by one or more hidden layers of neurons (e.g., the layers 404 and 406), that is followed by an output layer 408 that produces outputs 410. Various types of connection patterns connect neurons of consecutive layers, such as a fully-connected pattern that connects every neuron in one layer to all the neurons of the next layer, or a pooling pattern that connect output of a group of neurons in one layer to a single neuron in the next layer. In contrast to the neural network shown in FIG. 4A that are sometimes called feed-forward networks, the neural network shown in FIG. 4B includes one or more connections from neurons in one layer to either other neurons in the same layer or neurons in a preceding layer. The example shown in FIG. 4B is an example of a recurrent neural network, and includes two input neurons 412 (that accepts an input X1) and 414 (that accepts an input X2) in an input layer followed by two hidden layers. The first hidden layer includes neurons 416 and 418 that is fully connected with neurons in the input layer, and the neurons 420, 422, and 424 in the second hidden layer. The output of the neuron 420 in the second hidden layer is connected to the neuron 416 in the first hidden layer, providing a feedback loop. The hidden layer including the neurons 420, 422, and 424 are input to a neuron 426 in the output layer that produces an output y.

FIG. 4C shows an example of a convolutional neural network (CNN), according to some implementations. In contrast to the neural networks shown in FIGS. 4A and 4B, the example shown in FIG. 4C includes different types of neural network layers, that includes a first stage of layers for feature learning, and a second stage of layers for classification tasks, such as object recognition. The feature learning stage includes a convolution and Rectified Linear Unit (ReLU) layer 430, followed by a pooling layer 432, that is followed by another convolution and ReLU layer 434, which is in turn followed by another pooling layer 436. The first layer 430 extracts features from an input 428 (e.g., an input image or portions thereof), and performs a convolution operation on its input, and one or more non-linear operations (e.g., ReLU, tanh, or sigmoid). A pooling layer, such as the layer 432, reduces the number of parameters when the inputs are large. The output of the pooling layer 436 is flattened by the layer 438 and input to a fully connected neural network with one or more layers (e.g., the layers 440 and 442). The output of the fully-connected neural network is input to a softmax layer 444 to classify the output of the layer 442 of the fully-connected network to produce one of many different output 446 (e.g., object class or type of the input image 428).

Some implementations store the layout or the organization of the input neural networks including number of neurons in each layer, total number of neurons, operations or activation functions of each neuron, and/or connections between the neurons, in the memory 214, as the neural network topology 224.

Figure 5:
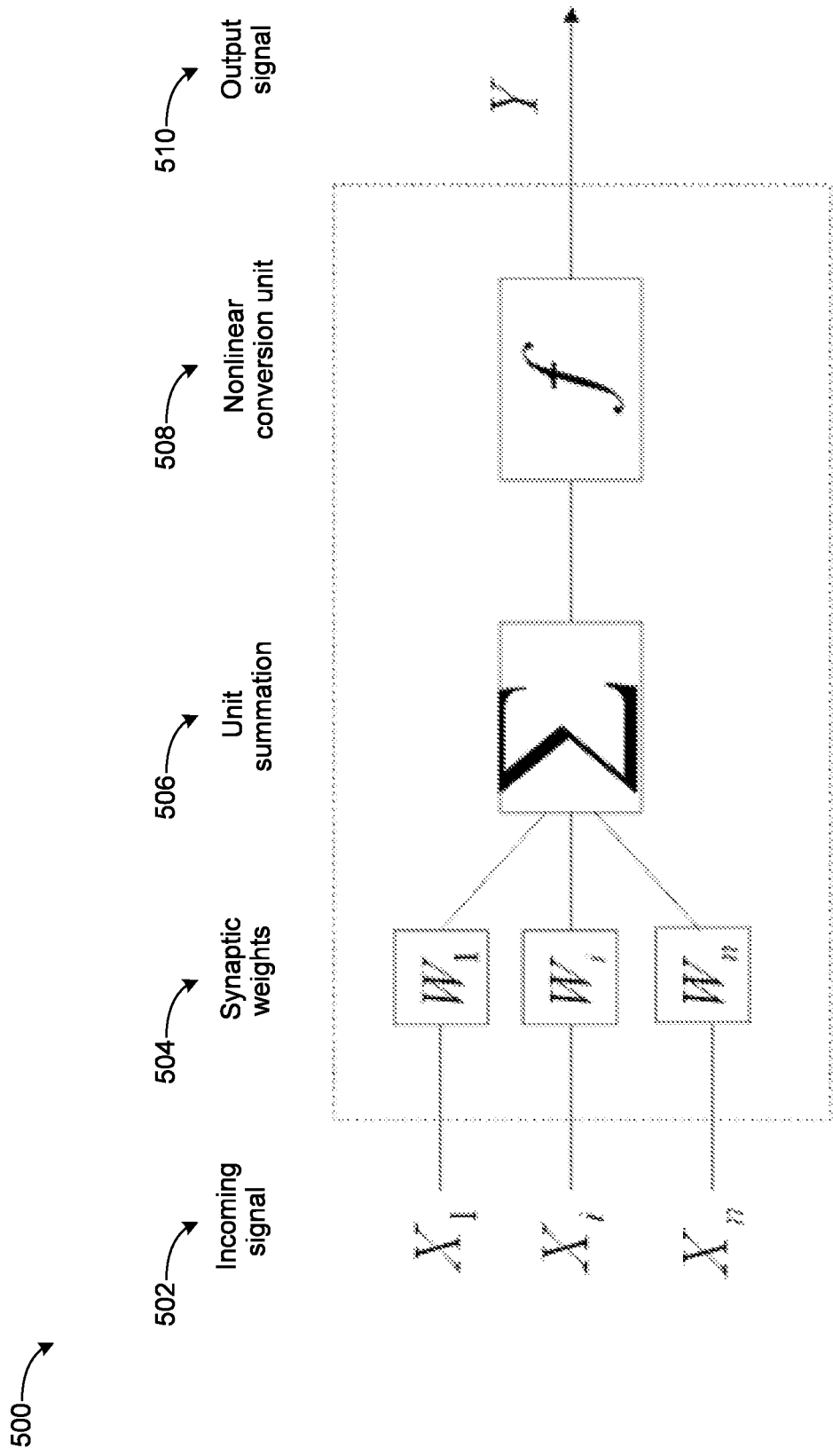
FIG. 5 shows an example of a math model for a neuron, according to some implementations.

FIG. 5 shows an example of a math model 500 for a neuron, according to some implementations. The math model includes incoming signals 502 input multiplied by synaptic weights 504 and summed by a unit summation 506. The result of the unit summation 506 is input to a nonlinear conversion unit 508 to produce an output signal 510, according to some implementations.

Figure 6A:
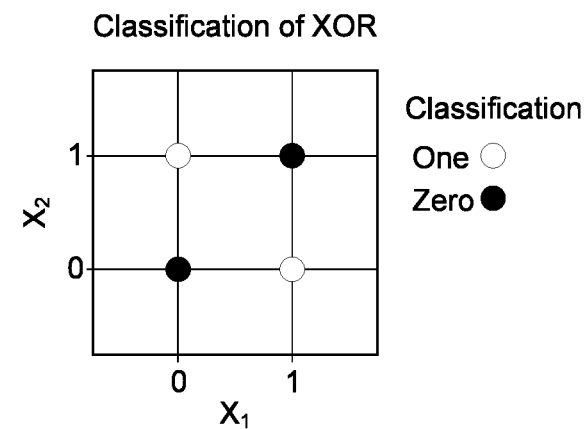
FIGS. 6A-6C illustrate an example process for analog hardware realization of a neural network for computing an XOR of input values, according to some implementations.
Figure 6B:
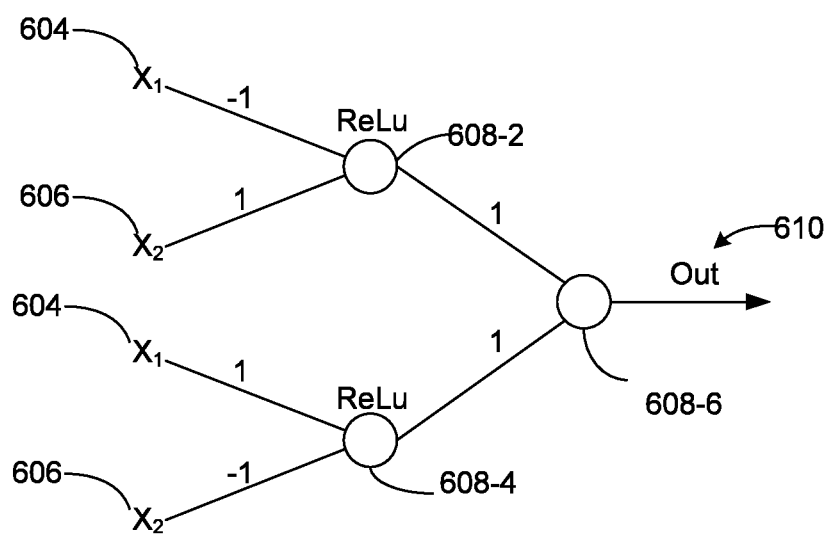
Figure 6C:
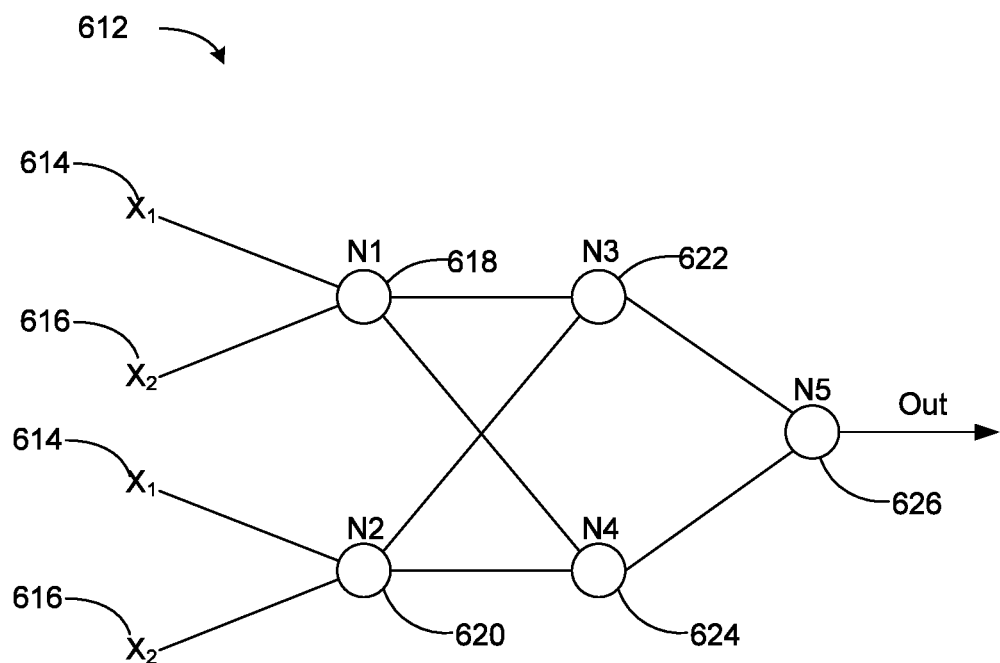

FIGS. 6A-6C illustrate an example process for analog hardware realization of a neural network for computing an XOR (classification of XOR results) of input values, according to some implementations. FIG. 6A shows a table 600 of possible input values $X_1$ and $X_2$ along x- and y-axis, respectively. The expected result values are indicated by hollow circle (represents a value of 1) and a filled or dark circle (represents a value of 0)—this is a typical XOR problem with 2 input signals and 2 classes. Only if either, not both, of the values $X_1$ and $X_2$ are 1, the expected result is 1, and 0, otherwise. Training set consists of 4 possible input signal combinations (binary values for the $X_1$ and $X_2$ inputs). FIG. 6B shows a ReLU-based neural network 602 to solve the XOR classification of FIG. 6A, according to some implementations. The neurons do not use any bias values, and use ReLU activation. Inputs 604 and 606 (that correspond to $X_1$ and $X_2$, respectively) are input to a first ReLU neuron 608-2. The inputs 604 and 606 are also input to a second ReLU neuron 608-4. The results of the two ReLU neurons 608-2 and 608-4 are input to a third neuron 608-6 that performs linear summation of the input values, to produce an output value 510 (the Out value). The neural network 602 has the weights −1 and 1 (for the input values $X_1$ and $X_2$, respectively) for the ReLU neuron 608-2, the weights 1 and −1 (for the input values $X_1$ and $X_2$, respectively) for the ReLU neuron 608-4, and the weights 1 and 1 (for the output of the RelLu neurons 608-2 and 608-4, respectively). In some implementations, the weights of trained neural networks are stored in memory 214, as the weights 222.

FIG. 6C shows an example equivalent analog network for the network 602, according to some implementations. The analog equivalent inputs 614 and 616 of the $X_1$ and $X_2$ inputs 604 and 606 are input to analog neurons N1 618 and N2 620 of a first layer. The neurons N1 and N2 are densely connected with neurons N3 and N4 of a second layer. The neurons of a second layer (i.e. neuron N3 622 and neuron N4 624) are connected with an output neuron N5 626 that produces the output Out (equivalent to the output 610 of the network 602). The neurons N1, N2, N3, N4 and N5 have ReLU (maximum value=1) activation function.

Some implementations use Keras learning that converges in approximately 1000 iterations, and results in weights for the connections. In some implementations, the weights are stored in memory 214, as part of the weights 222. In the following example, data format is 'Neuron [$1^{st}$ link weight, $2^{nd}$ link weight, bias]'.

N1 [−0.9824321, 0.976517, −0.00204677];
N2 [1.0066702, −1.0101418, −0.00045485];
N3 [1.0357606, 1.0072469, −0.00483723];
N4 [−0.07376373, −0.7682612, 0.0]; and
N5 [1.0029935, −1.1994369, −0.00147767].

Next, to compute resistor values for connections between the neurons, some implementations compute resistor range. Some implementations set resistor nominal values (R+, R−) of 1 MΩ, possible resistor range of 100 KΩ to 1 MΩ and nominal series E24. Some implementations compute w1, w2, wbias resistor values for each connection as follows. For each weight value wi (e.g., the weights 222), some implementations evaluate all possible (Ri−, Ri+) resistor pairs options within the chosen nominal series and choose a resistor pair which produces minimal error value $$err = \text{Abs}\left(w_i - \frac{1}{R_i^+} + \frac{1}{R_i^-}\right).$$

The following table provides example values for the weights w1, w2, and bias, for each connection, according to some implementations.

|         | Model value  | R− (MΩ) | R+ (MΩ) | Implemented value |
|---------|--------------|---------|---------|-------------------|
| N1_w1   | −0.9824321   | 0.36    | 0.56    | −0.992063         |
| N1_w2   | 0.976517     | 0.56    | 0.36    | 0.992063          |
| N1_bias | −0.00204677  | 0.1     | 0.1     | 0.0               |
| N2_w1   | 1.0066702    | 0.43    | 0.3     | 1.007752          |
| N2_w2   | −1.0101418   | 0.18    | 0.22    | −1.010101         |
| N2_bias | −0.00045485  | 0.1     | 0.1     | 0.0               |
| N3_w1   | 1.0357606    | 0.91    | 0.47    | 1.028758          |
| N3_w2   | 1.0072469    | 0.43    | 0.3     | 1.007752          |
| N3_bias | −0.00483723  | 0.1     | 0.1     | 0.0               |
| N4_w1   | −0.07376373  | 0.91    | 1.0     | −0.098901         |
| N4_w2   | −0.7682612   | 0.3     | 0.39    | −0.769231         |
| N4_bias | 0.0          | 0.1     | 0.1     | 0.0               |
| N5_w1   | 1.0029935    | 0.43    | 0.3     | 1.007752          |
| N5_w2   | −1.1994369   | 0.3     | 0.47    | −1.205674         |
| N5_bias | −0.00147767  | 0.1     | 0.1     | 0.0               |

Example Advantages of Transformed Neural Networks

Before describing examples of transformation, it is worth noting some of the advantages of the transformed neural networks over conventional architectures. As described herein, the input trained neural networks are transformed to pyramid- or trapezium-shaped analog networks. Some of the advantages of pyramid or trapezium over cross bars include lower latency, simultaneous analog signal propagation, possibility for manufacture using standard integrated circuit (IC) design elements, including resistors and operational amplifiers, high parallelism of computation, high accuracy (e.g., accuracy increases with the number of layers, relative to conventional methods), tolerance towards error(s) in each weight and/or at each connection (e.g., pyramids balance the errors), low RC (low Resistance Capacitance delay related to propagation of signal through network), and/or ability to manipulate biases and functions of each neuron in each layer of the transformed network. Also, pyramids are excellent computation block by itself, since it is a multi-level perceptron, which can model any neural network with one output. Networks with several outputs are implemented using different pyramids or trapezia geometry, according to some implementations. A pyramid can be thought of as a multilayer perceptron with one output and several layers (e.g., N layers), where each neuron has n inputs and 1 output. Similarly, a trapezium is a multilayer perceptron, where each neuron has n inputs and m outputs. Each trapezium is a pyramid-like network, where each neuron has n inputs and m outputs, where n and m are limited by IC analog chip design limitations, according to some implementations.

Some implementations perform lossless transformation of any trained neural network into subsystems of pyramids or trapezia. Thus, pyramids and trapezia can be used as universal building blocks for transforming any neural networks. An advantage of pyramid- or trapezia-based neural networks is the possibility to realize any neural network using standard IC analog elements (e.g., operational amplifiers, resistors, signal delay lines in case of recurrent neurons) using standard lithography techniques. It is also possible to restrict the weights of transformed networks to some interval. In other words, lossless transformation is performed with weights limited to some predefined range, according to some implementations. Another advantage of using pyramids or trapezia is the high degree of parallelism in signal processing or the simultaneous propagation of analog signals that increases the speed of calculations, providing lower latency. Moreover, many modern neural networks are sparsely connected networks and are much better (e.g., more compact, have low RC values, absence of leakage currents) when transformed into pyramids than into cross-bars, Pyramids and trapezia networks are relatively more compact than cross-bar based memristor networks.

Furthermore, analog neuromorphic trapezia-like chips possess a number of properties, not typical for analog devices. For example, signal to noise ratio is not increasing with the number of cascades in analog chip, the external noise is suppressed, and influence of temperature is greatly reduced. Such properties make trapezia-like analog neuromorphic chips analogous to digital circuits. For example, individual neurons, based on operational amplifier, level the signal and are operated with the frequencies of 20,000-100,000 Hz, and are not influenced by noise or signals with frequency higher than the operational range, according to some implementations. Trapezia-like analog neuromorphic chip also perform filtration of output signal due to peculiarities in how operational amplifiers function. Such trapezia-like analog neuromorphic chip suppresses the synphase noise. Due to low-ohmic outputs of operational amplifiers, the noise is also significantly reduced. Due to the leveling of signal at each operational amplifier output and synchronous work of amplifiers, the drift of parameters, caused by temperature does not influence the signals at final outputs. Trapezia-like analogous neuromorphic circuit is tolerant towards the errors and noise in input signals and is tolerant towards deviation of resistor values, corresponding to weight values in neural network. Trapezia-like analog neuromorphic networks are also tolerant towards any kind of systemic error, like error in resistor value settings, if such error is same for all resistors, due to the very nature of analog neuromorphic trapezia-like circuits, based on operational amplifiers.

Example Lossless Transformation (T-Transformation) of Trained Neural Networks

In some implementations, the example transformations described herein are performed by the neural network transformation module 226 that transform trained neural networks 220, based on the mathematical formulations 230, the basic function blocks 232, the analog component models 234, and/or the analog design constraints 236, to obtain the transformed neural networks 228.

Figure 7:
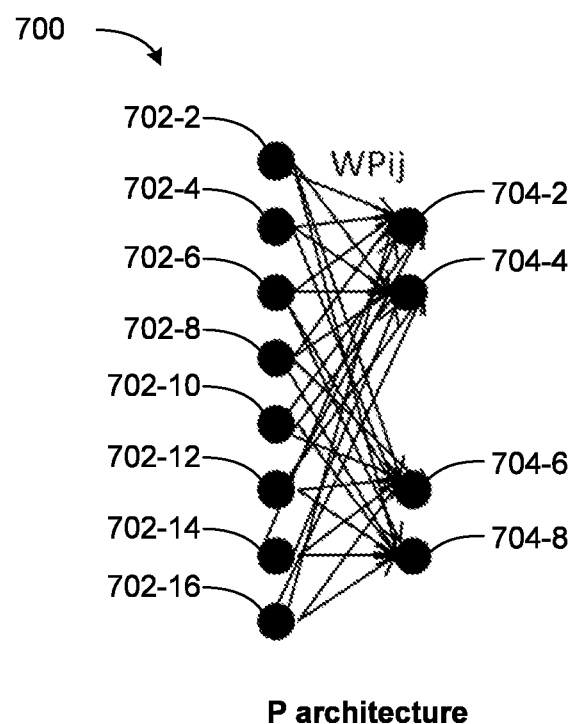
FIG. 7 shows an example perceptron, according to some implementations.

FIG. 7 shows an example perceptron 700, according to some implementations. The perceptron includes K=8 inputs and 8 neurons 702-2, . . . , 702-16 in an input layer that receives the 8 inputs. There is an output layer with 4 neurons 704-2, . . . , 704-8, in an output layer, that correspond to L=4 outputs. The neurons in the input layer are fully connected to the neurons in the output layer, making 8 times 4=32 connections. Suppose the weights of the connections are represented by a weight matrix WP (element $WP_{i,j}$ corresponds to the weight of the connection between the i-th neuron in the input layer and the j-th neuron in the output layer). Suppose further each neuron performs an activation function F.

Figure 8:
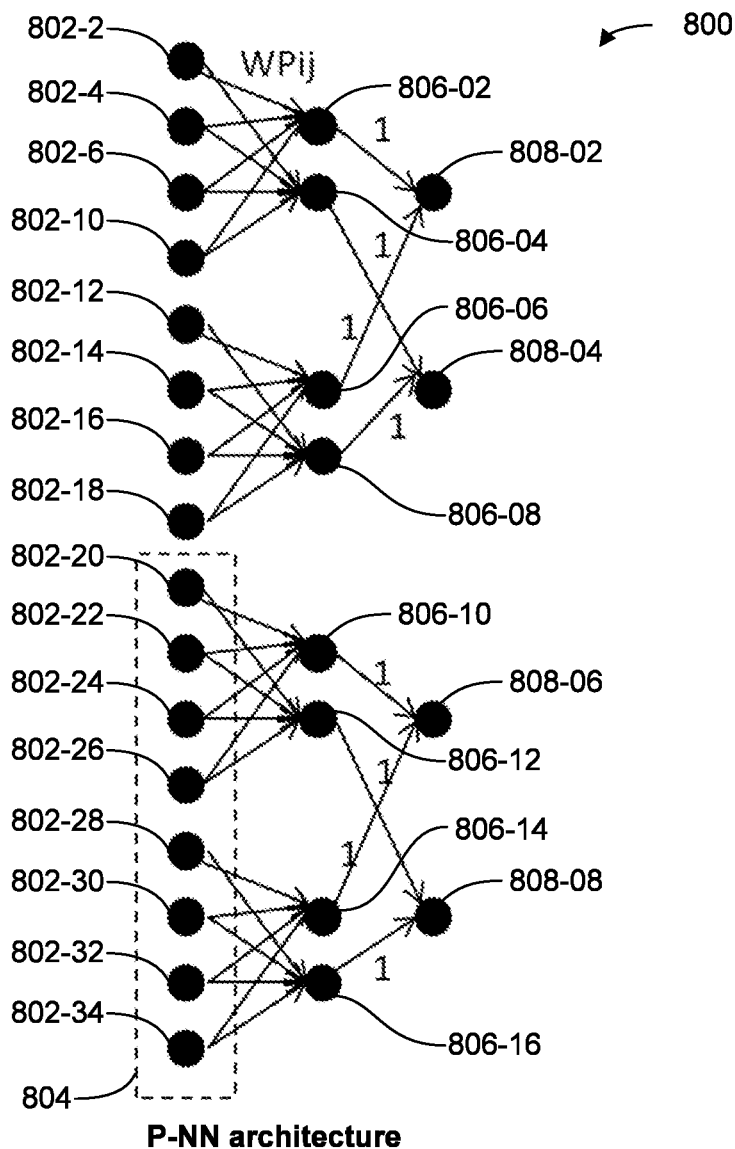
FIG. 8 shows an example Pyramid-Neural Network, according to some implementations.

FIG. 8 shows an example Pyramid-Neural Network (P-NN) 800, a type of Target-Neural Network (T-NN, or TNN), that is equivalent to the perceptron shown in FIG. 7, according to some implementations. To perform this transformation of the perceptron (FIG. 7) to the PN-NN architecture (FIG. 8), suppose, for the T-NN, that number of inputs is restricted to Ni=4 and number of outputs is restricted to No=2. The T-NN includes an input layer LTI of neurons 802-2, . . . , 802-34, that is a concatenation of two copies of the input layer of neurons 802-2, . . . , 802-16, for a total of 2 times 8=16 input neurons. The set of neurons 804, including neurons 802-20, . . . , 802-34, is a copy of the neurons 802-2, . . . , 802-18, and the input is replicated. For example, the input to the neuron 802-2 is also input to the neuron 802-20, the input 20 the neuron 802-4 is also input to the neuron 802-22, and so on. FIG. 8 also includes a hidden layer LTH1 of neurons 806-02, . . . , 806-16 (2 times 16 divided by 4=8 neurons) that are linear neurons. Each group of Ni neurons from the input layer LTI are fully connected to two neurons from the LTH1 layer. FIG. 8 also includes an output layer LTO with 2 times 8 divided by 4=4 neurons 808-02, . . . , 808-06, each neuron performing the activation function F. Each neuron in the layer LTO is connected to distinct neurons from different groups in the layer LTH1. The network shown in FIG. 8 includes 40 connections. Some implementations perform weight matrix calculation for the P-NN in FIG. 8, as follows. Weights for the hidden layer LTH1 (WTH1) are calculated from the weight matrix WP, and weights corresponding to the output layer LTO (WTO) form a sparse matrix with elements equal to 1.

Figure 9:
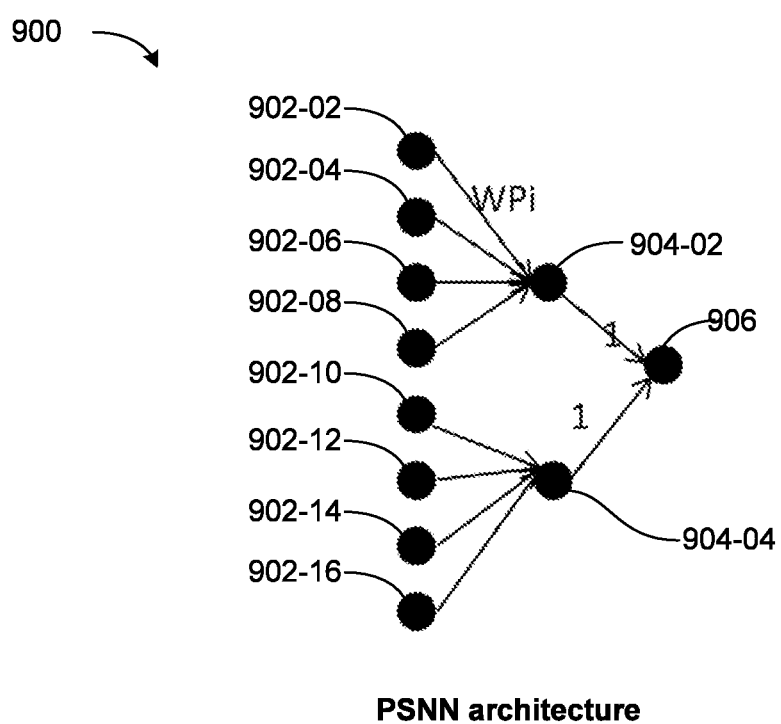
FIG. 9 shows an example Pyramid Single Neural Network, according to some implementations.

FIG. 9 shows a Pyramid Single Neural Network (PSNN) 900 corresponding to an output neuron of FIG. 8, according to some implementations. The PSNN includes a layer (LPSI) of input neurons 902-02, . . . , 902-16 (corresponding to the 8 input neurons in the network 700 of FIG. 7). A hidden layer LPSH1 includes 8 divided by 4=2 linear neurons 904-02 and 904-04, and each group of Ni neurons from LTI is connected to one neuron of the LPSH1 layer. An output layer LPSO consists of 1 neuron 906 with an activation function F, that is connected to both the neurons 904-02 and 904-04 of the hidden layer. For calculating weight matrix for the PSNN 900, some implementations compute a vector WPSH1 that is equal to the first row of WP, for the LPSH1 layer. For the LPSO layer, some implementations compute a weight vector WPSO with 2 elements, each element equal to 1. The process is repeated for the first, second, third, and fourth output neurons. A P-NN, such as the network shown in FIG. 8, is a union of the PSNNs (for the 4 output neurons). Input layer for every PSNN is a separate copy of P's input layer. For this example, the P-NN 800 includes an input layer with 8 times 4=32 inputs, a hidden layer with 2 times 4=8 neurons, and an output layer with 4 neurons.

Example Transformations with Target Neurons with N Inputs and 1 Output

In some implementations, the example transformations described herein are performed by the neural network transformation module 226 that transform trained neural networks 220, based on the mathematical formulations 230, the basic function blocks 232, the analog component models 234, and/or analog design constraints 236, to obtain the transformed neural networks 228.

Single Layer Perceptron with One Output

Suppose a single layer perceptron SLP(K,1) includes K inputs and one output neuron with activation function F. Suppose further $U \in R^K$ is a vector of weights for SLP(K,1). The following algorithm Neuron2TNN1 constructs a T-neural network from T-neurons with N inputs and 1 output (referred to as TN(N,1)).

Algorithm Neuron2TNN1

1. Construct an input layer for T-NN by including all inputs from SLP(K,1).
2. If K>N then:
   a. Divide K input neurons into $$m_1 = \lceil \frac{K}{N} \rceil$$

groups such that every group consists of no more than N inputs.
   b. Construct the first hidden layer $LTH_1$ of the T-NN from $m_1$ neurons, each neuron performing an identity activation function.
   c. Connect input neurons from every group to corresponding neuron from the next layer. So every neuron from the $LTH_1$ has no more than N input connections.
   d. Set the weights for the new connections according the following equation:

$$w_{ij} = u_j, j = (i-1)*N + 1, \ldots, i*N$$
   $$i = 1, \ldots, \lceil \frac{K}{N} \rceil$$

3. Else (i.e., if K<=N) then:
   a. Construct the output layer with 1 neuron calculating activation function F
   b. Connect input neurons to the single output neuron. It has K≤N connections.
   c. Set the weights of the new connections by means of the following equation:

$$w_j^1 = u_j, j = 1, \ldots, K$$

d. Terminate the algorithm

4. Set l=1
5. If $m_l$>N:
   a. Divide $m_l$ neurons into $$m_{l+1} = \lceil \frac{m_l}{N} \rceil$$

groups, every group consists of no more than N neurons.
   b. Construct the hidden layer $LTH_{l+1}$ of the T-NN from $m_{l+1}$ neurons, every neuron has identity activation function.
   c. Connect input neurons from every group to the corresponded neuron from the next layer.
   d. Set the weights of the new connections according the following equation:

$$w_{ij}^{l+1} = 1$$
   $$i = 1, \ldots, \lceil \frac{m_l}{N} \rceil$$

e. Set l=l+1
6. Else (if m>=N):
   a. Construct the output layer with 1 neuron calculating activation function F
   b. Connect all $LTH_l$'s neurons to the single output neuron.
   c. Set the weights of the new connections according the following equation:

$$w_j^{l+1} = 1 \qquad a.$$

d. Terminate the algorithm
7. Repeat steps 5 and 6.

Here ⌈x⌉-minimum integer number being no less than x. Number of layers in T-NN constructed by means of the algorithm Neuron2TNN1 is $h = \lceil \log_N K \rceil$. The total number of weights in T-NN is:

$$S = K \frac{N^m - 1}{N^{m-1}(N - 1)}$$

Figure 10:
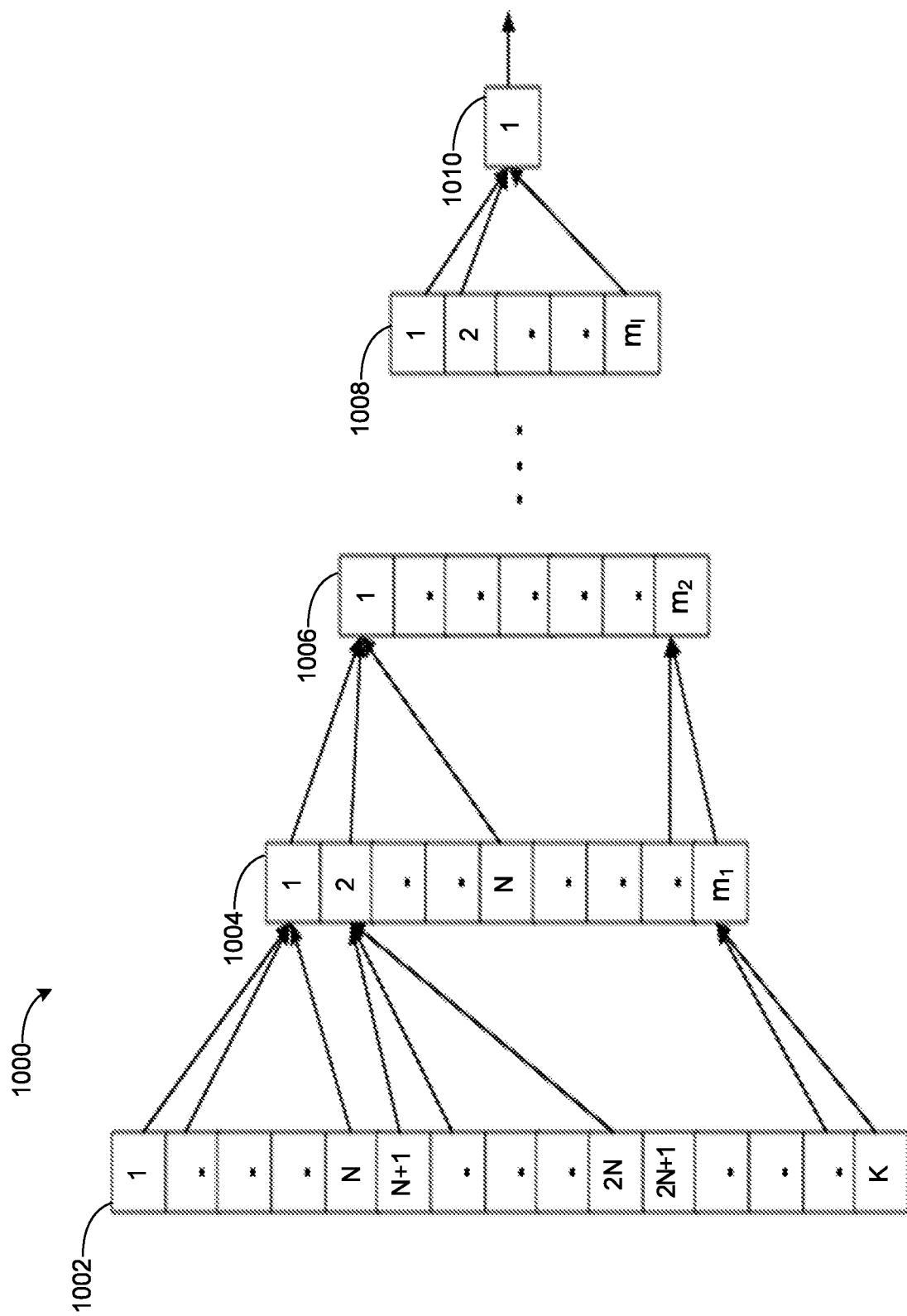
FIG. 10 shows an example of a transformed neural network, according to some implementations.

FIG. 10 shows an example of the constructed T-NN, according to some implementations. All layers except the first one perform identity transformation of their inputs. Weight matrices of the constructed T-NN have the following forms, according to some implementations.

Layer 1 (e.g., layer 1002):

$$W^1 = \begin{pmatrix} u_1 & u_2 & \ldots & u_N & 0 & 0 & \ldots & 0 & \ldots & \ldots & 0 \\ 0 & 0 & \ldots & 0 & u_{N+1} & u_{N+2} & \ldots & u_{2N} & 0 & \ldots & 0 \\ \ldots & \ldots & \ldots & \ldots & \ldots & \ldots & \ldots & \ldots & \ldots & \ldots & \ldots \\ 0 & 0 & \ldots & \ldots & \ldots & \ldots & 0 & u_{(h-1)N+1} & \ldots & u_k \end{pmatrix}$$

Layers i=2, 3, . . . , h (e.g., layers 1004, 1006, 1008, and 1010):

$$W^i = \begin{pmatrix} 1 & 1 & \ldots & 1 & 0 & 0 & \ldots & 0 & \ldots & \ldots & 0 \\ 0 & 0 & \ldots & 0 & 1 & 1 & \ldots & 1 & 0 & \ldots & 0 \\ \ldots & \ldots & \ldots & \ldots & \ldots & \ldots & \ldots & \ldots & \ldots & \ldots & \ldots \\ 0 & 0 & & \ldots & \ldots & \ldots & \ldots & 0 & 1 & \ldots & 1 \end{pmatrix}$$

Output value of the T-NN is calculated according the following formula:

$$y = F(W^m W^{m-1} \ldots W^2 W^1 x)$$

Output for the first layer is calculated as an output vector according to the following formula:

$$W^1 x = \left( \sum_{j=1}^{N} u_j x_j, \sum_{j=N+1}^{2N} u_j x_j, \ldots, \sum_{j=(m_1-1)*N+1}^{K} u_j x_j \right)^T$$

Multiplying the obtained vector by the weight matrix of the second layer:

$$W^2 W^1 x = \left( \sum_{l=1}^{N} 1 \sum_{j=(l-1)*N+1}^{lN} u_j x_j, \sum_{l=N+1}^{2N} 1 \sum_{j=(l-1)*N+1}^{lN} u_j x_j, \ldots, \right.$$
$$\left. \sum_{l=(m_2-1)*N+1}^{m_1} 1 \sum_{j=(l-1)*N+1}^{lN} u_j x_j \right)^T$$
$$= \left( \sum_{j=1}^{N^2} u_j x_j, \sum_{j=N^2+1}^{2N^2} u_j x_j, \ldots, \right.$$
$$\left. \sum_{j=(m_2-1)*N^2+1}^{K} u_j x_j \right)^T$$

Every subsequent layer outputs a vector with components equal to linear combination of some sub-vector of x.

Finally, the T-NN's output is equal to:

$$y = F(W^m W^{m-1} \ldots W^2 W^1 x) = F\left( \sum_{j=1}^{K} u_j x_j \right)$$

This is the same value as the one calculated in SLP(K,1) for the same input vector x. So output values of SLP(K,1) and constructed T-NN are equal.

Single Layer Perceptron with Several Outputs

Suppose there is a single layer perceptron SLP(K, L) with K inputs and L output neurons, each neuron performing an activation function F. Suppose further $U \in R^{L \times K}$ is a weight matrix for SLP(K, L). The following algorithm Layer2TNN1 constructs a T-neural network from neurons TN(N, 1).

Algorithm Layer2TNN1
1. For every output neuron i=1, . . . , L
   a. Apply the algorithm Neuron2TNN1 to $SLP_i(K, 1)$ consisting on K inputs, 1 output neuron and weight vector $U_{i,j}$, j=1, 2, . . . , K. A $TNN_i$ is constructed as a result.

2. Construct PTNN by composing all $TNN_i$ into one neural net:
   a. Concatenate input vectors of all $TNN_i$, so the input of PTNN has L groups of K inputs, with each group being a copy of the SLP(K, L)'s input layer.

Output of the PTNN is equal to the SLP(K, L)'s output for the same input vector because output of every pair $SLP_i(K, 1)$ and $TNN_i$ are equal.

Multilayer Perceptron

Suppose a multilayer perceptron (MLP) includes K inputs, S layers and $L_i$ calculation neurons in i-th layer, represented as MLP(K, S, $L_1$, . . . $L_S$). Suppose $U_i \in R^{L_i \times L_{i-1}}$ is a weight matrix for the i-th layer.

The following is an example algorithm to construct a T-neural network from neurons TN(N, 1), according to some implementations.

Algorithm MLP2TNN1
1. For every layer i=1, . . . , S
   a. Apply the algorithm Layer2TNN to $SLP_i(L_{i-1}, L_i)$ consisting of inputs, $L_i$ output neurons, and a weight matrix $U_i$, constructing $PTNN_i$ as a result.
2. Construct MTNN by stacking all $PTNN_i$ into one neural net; output of a $TNN_{i-1}$ is set as input for $TNN_i$.

Output of the MTNN is equal to the MLP(K, S, $L_1$, . . . $L_S$)'s output for the same input vector because output of every pair $SLP_i(L_{i-1}, L_i)$ and $PTNN_i$ are equal.

Example T-Transformations with Target Neurons with $N_I$ Inputs and $N_O$ Outputs In some implementations, the example transformations described herein are performed by the neural network transformation module 226 that transform trained neural networks 220, based on the mathematical formulations 230, the basic function blocks 232, the analog component models 234, and/or the analog design constraints 236, to obtain the transformed neural networks 228.

Example Transformation of Single Layer Perceptron with Several Outputs

Suppose a single layer perceptron SLP(K, L) includes K inputs and L output neurons, each neuron performing an activation function F. Suppose further $U \in R^{L \times K}$ is a weight matrix for SLP(K,L). The following algorithm constructs a T-neural network from neurons TN($N_I$, $N_O$), according to some implementations.

Algorithm Layer2TNNX
1. Construct a PTNN from SLP(K,L) by using the algorithm Layer2TNN$_i$ (see description above). PTNN has an input layer consisting of L groups of K inputs.
2. Compose $$\left\lceil \frac{L}{N_0} \right\rceil$$

subsets from L groups. Each subset contains no more than $N_O$ groups of input vector copies.
3. Replace groups in every subset with one copy of input vector.
4. Construct PTNNX by rebuild connections in every subset by making $N_O$ output connections from every input neuron.

According to some implementations, output of the PTNNX is calculated by means of the same formulas as for PTNN (described above), so the outputs are equal.

FIGS. 11A-11C show an application 1100 of the above algorithm for a single layer neural network (NN) with 2 output neurons and TN($N_I$, 2), according to some implementations. FIG. 11A shows an example source or input NN, according to some implementations. K inputs are input to two neurons 1 and 2 belonging to a layer 1104. FIG. 11B shows a PTNN constructed after the first step of the algorithm, according to some implementations. The PTNN consists of two parts implementing subnets corresponding to the output neuron 1 and neuron 2 of the NN shown in FIG. 11A. In FIG. 11B, the input 1102 is replicated and input to two sets of input neurons 1106-2 and 1106-4. Each set of input neurons is connected to a subsequent layer of neurons with two sets of neurons 1108-2 and 1108-4, each set of neurons including $m_1$ neurons. The input layer is followed by identity transform blocks 1110-2 and 1110-4, each block containing one or more layers with identity weight matrix. The output of the identity transform block 1110-2 is connected to the output neuron 1112 (corresponding to the output neuron 1 in FIG. 11A), and the output of the identity transform block 1110-4 is connected to the output neuron 1114 (corresponding to the output neuron 1 in FIG. 11A). FIG. 11C shows application of the final steps of the algorithm, including replacing two copies of the input vector (1106-2 and 1106-4) with one vector 1116 (step 3), and rebuilding connections in the first layer 1118 by making two output links from every input neuron: one link connects to subnet related to output 1 and another link connects to subnet for the output 2.

Example Transformation of Multilayer Perceptron

Suppose a multilayer perceptron (MLP) includes K inputs, S layers and $L_i$ calculation neurons in ith layer, represented as MLP(K, S, $L_1$, . . . $L_S$). Suppose $U_i \in R^{L_i \times L_{i-1}}$ is a weight matrix for i-th layer. The following example algorithm constructs a T-neural network from neurons $TN(N_f, N_O)$, according to some implementations.

Algorithm MLP2TNNX

1. For every layer i=1, . . . , S:
    a. Apply the algorithm Layer2TNNX to $SLP_i(L_{i-1}, L_i)$ consisting on inputs, $L_i$ output neuron and weight matrix $U_i$. $PTNNX_i$ is constructed as a result.
2. Construct MTNNX by stacking all $PTNNX_i$ into one neural net:
    a. Output of a $TNNX_{i-1}$ is set as input for $TNNX_i$.

According to some implementations. output of the MTNNX is equal to the MLP(K, S, $L_1$, . . . $L_S$)'s output for the same input vector, because output of every pair $SLP_i$ ($L_{i-1}$, $L_i$) and $PTNNX_i$ are equal.

Example Transformation of Recurrent Neural Network

Figure 12:
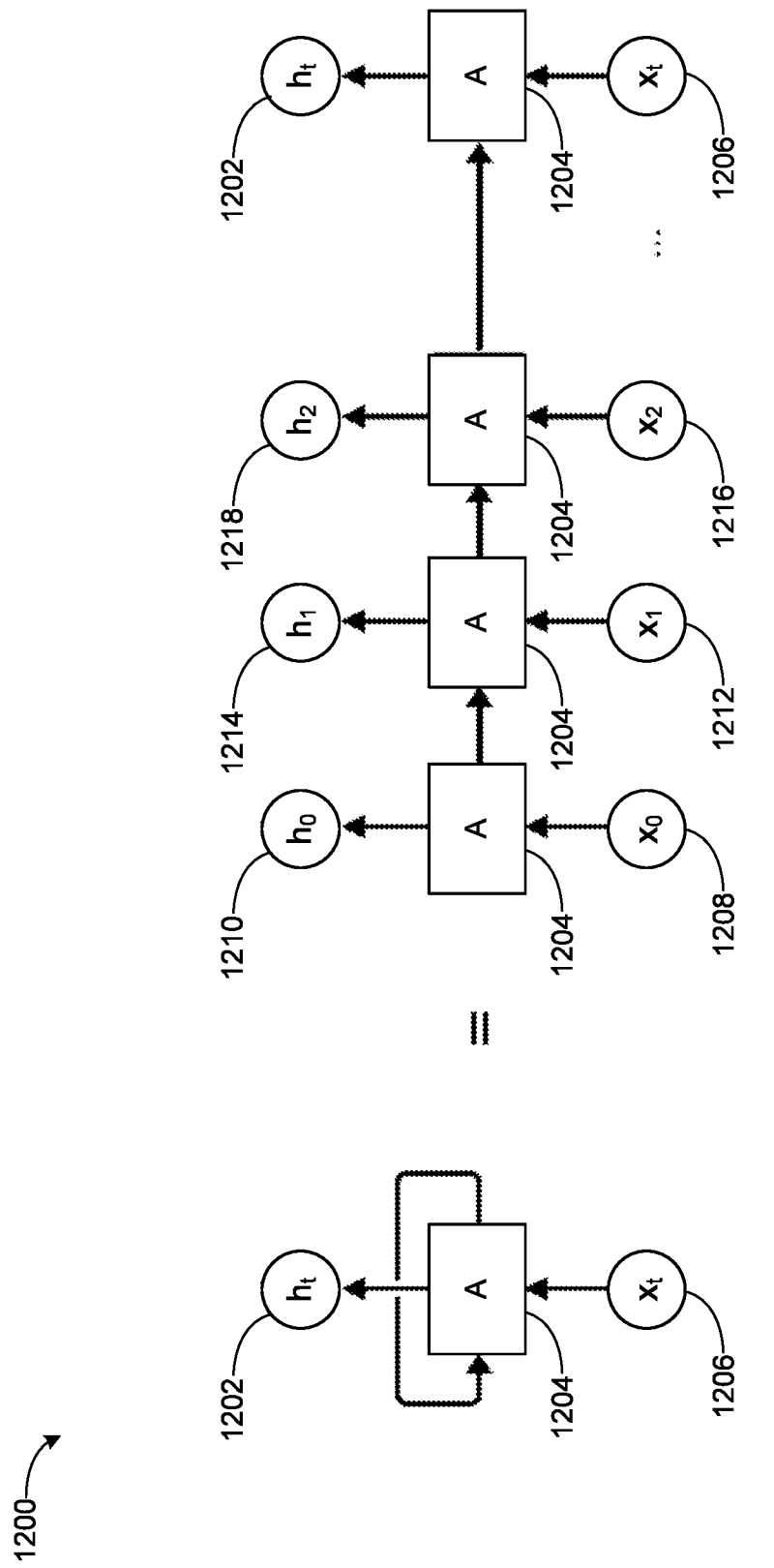
FIG. 12 shows an example Recurrent Neural Network (RNN), according to some implementations.

A Recurrent Neural Network (RNN) contains backward connection allowing saving information. FIG. 12 shows an example RNN 1200, according to some implementations. The example shows a block 1204 performing an activation function A, that accepts an input $X_t$ 1206 and performs an activation function A, and outputs a value $h_t$ 1202. The backward arrow from the block 1204 to itself indicates a backward connection, according to some implementations. An equivalent network is shown on the right up to the point in time when the activation block receives the input $X_t$ 1206. At time 0, the network accepts input $X_t$ 1208 and performs the activation function A 1204, and outputs a value $h_o$ 1210; at time 1, the network accepts input $X_1$ 1212 and the output of the network at time 0, and performs the activation function A 1204, and outputs a value $h_1$ 1214; at time 2, the network accepts input $X_2$ 1216 and the output of the network at time 1, and performs the activation function A 1204, and outputs a value $h_1$ 1218. This process continues until time t, at which time the network accepts the input $X_t$ 1206 and the output of the network at time t-1, and performs the activation function A 1204, and outputs the value $h_t$ 1202, according to some implementations.

Data processing in an RNN is performed by means of the following formula:

$$h_t = f(W^{(hh)} h_{t-1} + W^{(hx)} x_t)$$

In the equation above, $x_t$ is a current input vector, and $h_{t-1}$ is the RNN's output for the previous input vector $x_{t-1}$. This expression consists of the several operations: calculation of linear combination for two fully connected layers $W^{(hh)} h_{t-1}$ and $W^{(hx)} x_t$, element-wise addition, and non-linear function calculation (f). The first and third operations can be implemented by trapezium-based network (one fully connected layer is implemented by pyramid-based network, a special case of trapezium networks). The second operation is a common operation that can be implemented in networks of any structure.

In some implementations, the RNN's layer without recurrent connections is transformed by means of Layer2TNNX algorithm described above. After transformation is completed, recurrent links are added between related neurons. Some implementations use delay blocks described below in reference to FIG. 13B.

Example Transformation of LSTM Network

A Long Short-Term Memory (LSTM) neural network is a special case of a RNN. A LSTM network's operations are represented by the following equations:

$$f_t = \sigma(W_f[h_{t-1}, x_t] + b_f);$$

$$i_t = \sigma(W_i[h_{t-1}, x_t] + b_i);$$

$$D_t = \tanh(W_D[h_{t-1}, x_t] + b_D);$$

$$C_t = (f_t \times C_{t-1} + i_t \times D_t),$$

$$o_t = \sigma(W_o[h_{t-1}, x_t] + b_o); \text{ and}$$

$$h_t = o_t \times \tanh(C_t).$$

In the equations above, $W_f$, $W_i$, $W_D$, and $W_O$ are trainable weight matrices, $b_f$, $b_i$, $b_D$, and $b_O$ are trainable biases, $x_t$ is a current input vector, $h_{t-1}$ is an internal state of the LSTM calculated for the previous input vector $x_{t-1}$, and $o_t$ is output for the current input vector. In the equations, the subscript t denotes a time instance t, and the subscript t-1 denotes a time instance t-1.

Figure 13A:
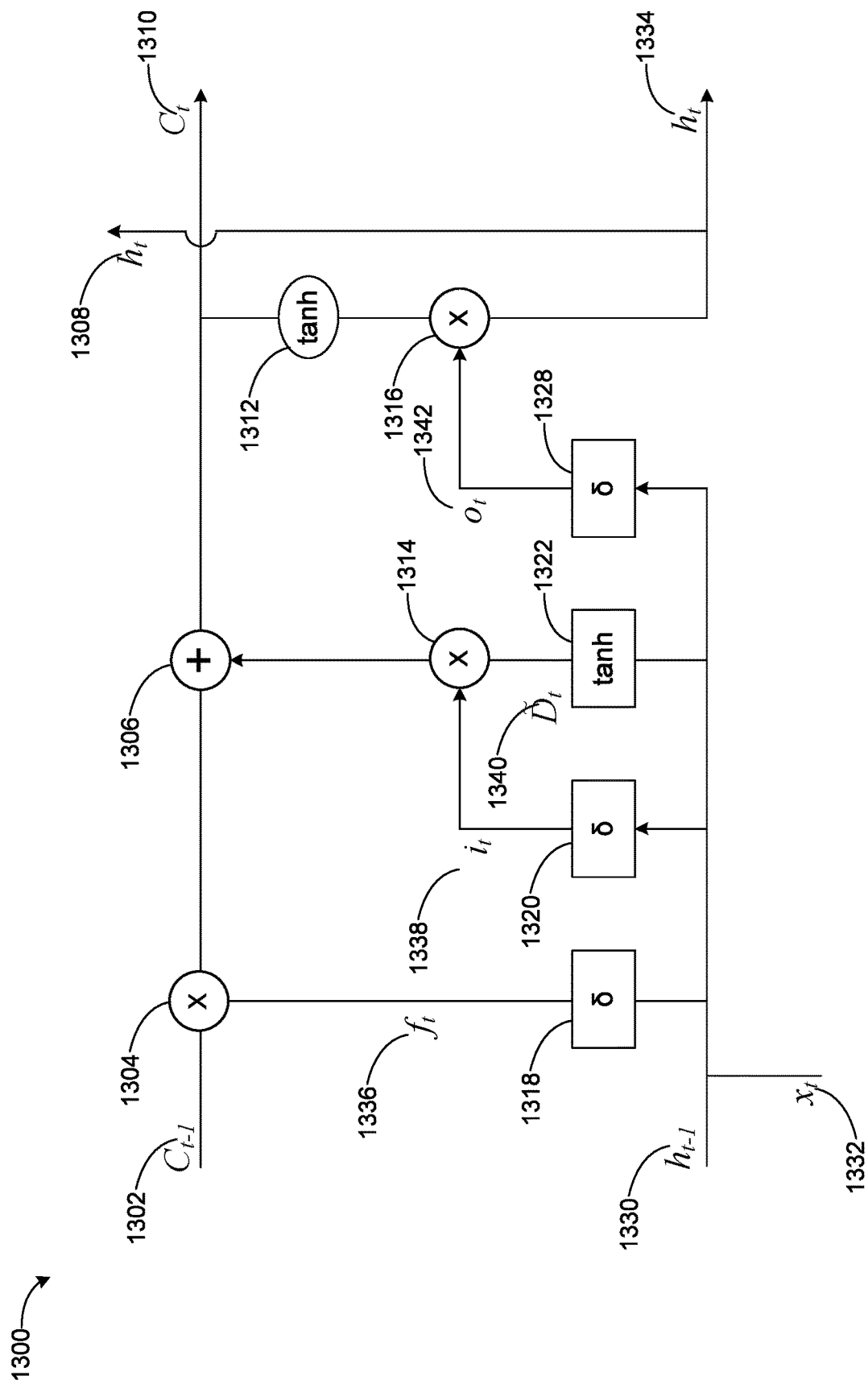
FIG. 13A is a block diagram of a LSTM neuron, according to some implementations.

FIG. 13A is a block diagram of a LSTM neuron 1300, according to some implementations. A sigmoid ($\sigma$) block 1318 processes the inputs $h_{t-1}$ 1330 and $x_t$ 1332, and produces the output $f_t$ 1336. A second sigmoid ($\sigma$) block 1320 processes the inputs $h_{t-1}$ 1330 and $x_t$ 1332, and produces the output $i_t$ 1338. A hyperbolic tangent (tanh) block 1322 processes the inputs $h_{t-1}$ 1330 and $x_t$ 1332, and produces the output $D_t$ 1340. A third sigmoid ($\sigma$) block 1328 processes the inputs $h_{t-1}$ 1330 and $x_t$ 1332, and produces the output $O_t$ 1342. A multiplier block 1304 processes $f_t$ 1336 and the output of a summing block 1306 (from a prior time instance) $C_{t-1}$ 1302 to produce an output that is in turn summed by the summing block 1306 along with the output of a second multiplier block 1314 that multiplies the outputs $i_t$ 1338 and $D_t$ 1340 to produce the output $C_t$ 1310. The output $C_t$ 1310 is input to another tanh block 1312 that produces an output that is multiplied a third multiplier block 1316 with the output $O_t$ 1342 to produce the output $h_t$ 1334.

There are several types of operations utilized in these expressions: (i) calculation of linear combination for several fully connected layers, (ii) elementwise addition, (iii) Hadamard product, and (iv) non-linear function calculation (e.g., sigmoid ($\sigma$) and hyperbolic tangent (tanh)). Some implementations implement the (i) and (iv) operations by a trapezium-based network (one fully connected layer is implemented by a pyramid-based network, a special case of trapezium networks). Some implementations use networks of various structures for the (ii) and (iii) operations which are common operations.

The layer in an LSTM layer without recurrent connections is transformed by using the Layer2TNNX algorithm described above, according to some implementations. After transformation is completed, recurrent links are added between related neurons, according to some implementations.

Figure 13B:
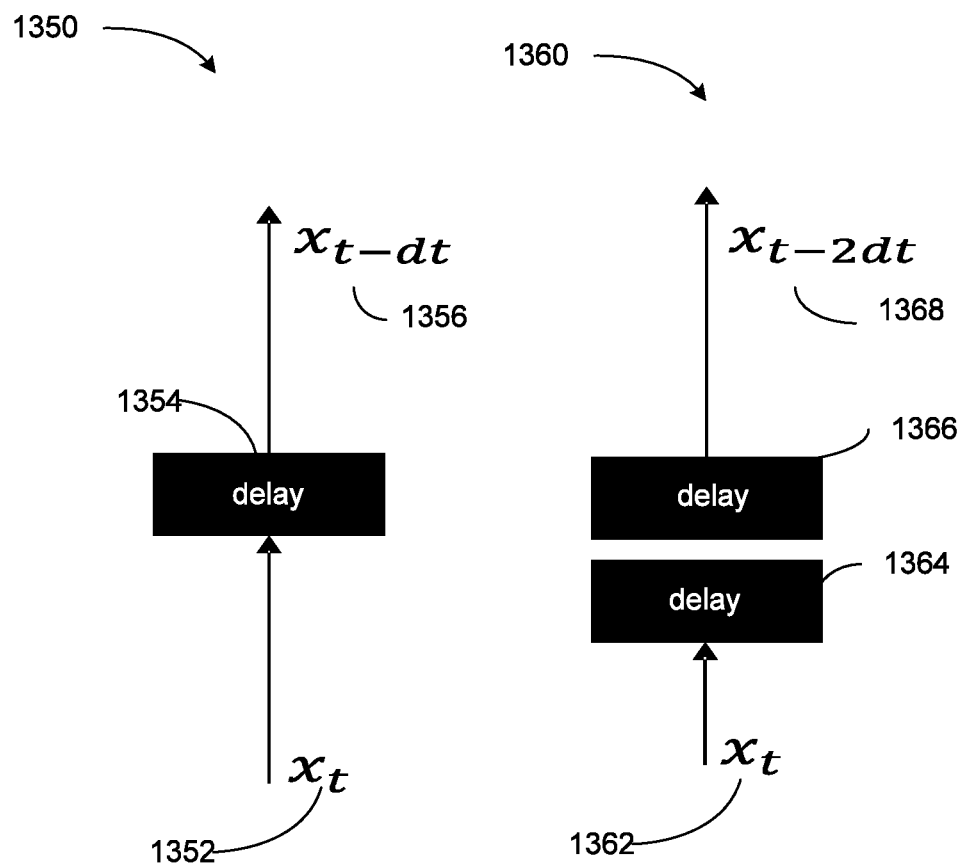
FIG. 13B shows delay blocks, according to some implementations.

FIG. 13B shows delay blocks, according to some implementations. As described above, some of the expressions in the equations for the LSTM operations depend on saving, restoring, and/or recalling an output from a previous time instance. For example, the multiplier block 1304 processes the output of the summing block 1306 (from a prior time instance) $C_{t-1}$ 1302. FIG. 13B shows two examples of delay blocks, according to some implementations. The example 1350 includes a delay block 1354 on the left accepts input $x_t$ 1352 at time t, and outputs the input after a delay of dt indicated by the output $x_{t-dt}$ 1356. The example 1360 on the right shows cascaded (or multiple) delay blocks 1364 and 1366 outputs the input $x_t$ 1362 after 2 units of time delays, indicated by the output $x_{t-2dt}$ 1368, according to some implementations.

Figure 13C:
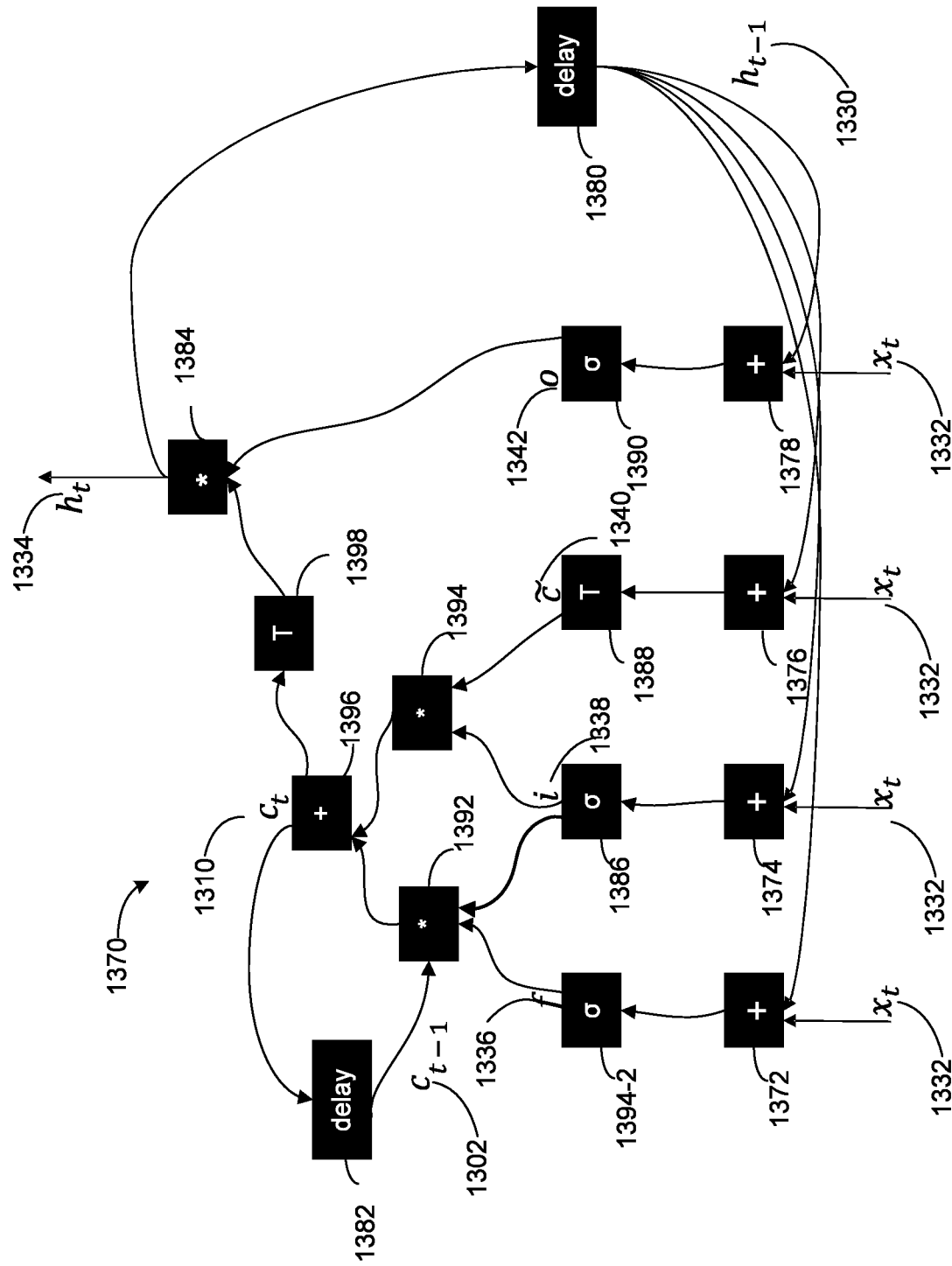
FIG. 13C is a neuron schema for a LSTM neuron, according to some implementations.

FIG. 13C is a neuron schema for a LSTM neuron, according to some implementations. The schema includes weighted summator nodes (sometimes called adder blocks) 1372, 1374, 1376, 1378, and 1396, multiplier blocks 1384, 1392, and 1394, and delay blocks 1380 and 1382. The input $x_t$ 1332 is connected to the adder blocks 1372, 1374, 1376, and 1378. The output $h_{t-1}$ 1330 for a prior input $x_{t-1}$ is also input to the adder blocks 1372, 1374, 1376, and 1378. The adder block 1372 produces an output that is input to a sigmoid block 1394-2 that produces the output $f_t$ 1336. Similarly, the adder block 1374 produces an output that is input to the sigmoid block 1386 that produces the output $i_t$ 1338. Similarly, the adder block 1376 produces an output that is input to a hyperbolic tangent block 1388 that produces the output $D_t$ 1340. Similarly, the adder block 1378 produces an output that is input to the sigmoid block 1390 that produces the output $O_t$ 1342. The multiplier block 1392 uses the outputs $i_t$ 1338, $f_t$ 1336, and output of the adder block 1396 from a prior time instance $C_{t-1}$ 1302 to produce a first output. The multiplier block 1394 uses the outputs $i_t$ 1338 and $D_t$ 1340 to produce a second output. The adder block 1396 sums the first output and second output to produce the output $C_t$ 1310. The output $C_t$ 1310 is input to a hyperbolic tangent block 1398 that produces an output that is input, along with the output of the sigmoid block 1390, $O_t$ 1342, to the multiplier block 1384 to produce the output $h_t$ 1334. The delay block 1382 is used to recall (e.g., save and restore) the output of the adder block 1396 from a prior time instance. Similarly, the delay block 1380 is used to recall or save and restore the output of the multiplier block 1384 for a prior input $x_{t-1}$ (e.g., from a prior time instance). Examples of delay blocks are described above in reference to FIG. 13B, according to some implementations.

Example Transformation of GRU Networks

A Gated Recurrent Unit) (GRU) neural network is a special case of RNN. A RNN's operations are represented by the following expressions:

$$z_t = \sigma(W_z x_t + U_z h_{t-1});$$

$$r_t = \sigma(W_r x_t + U_r h_{t-1});$$

$$j_t = \tanh(W x_t + r_t \times U h_{t-1});$$

$$h_t = z_t \times h_{t-1} + (1-z_t) \times j_t.$$

In the equations above, $x_t$ is a current input vector, and $h_{t-1}$ is an output calculated for the previous input vector $x_{t-1}$.

Figure 14A:
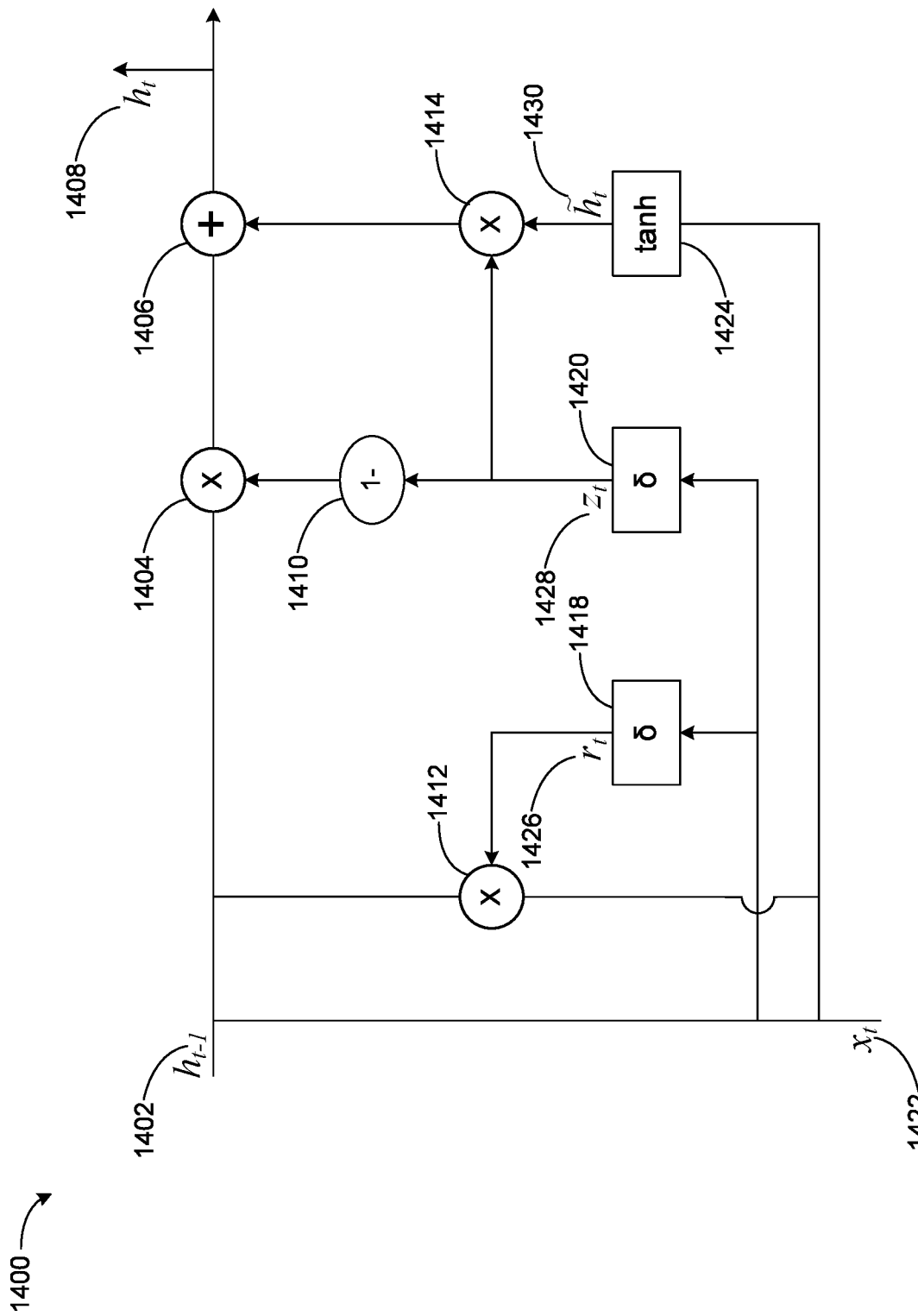
FIG. 14A is a block diagram of a GRU neuron, according to some implementations.

FIG. 14A is a block diagram of a GRU neuron, according to some implementations. A sigmoid ($\sigma$) block 1418 processes the inputs $h_{t-1}$ 1402 and $x_t$ 1422, and produces the output $r_t$ 1426. A second sigmoid ($\sigma$) block 1420 processes the inputs $h_{t-1}$ 1402 and $x_t$ 1422, and produces the output $z_t$ 1428. A multiplier block 1412 multiplies the output $r_t$ 1426 and the input $h_{t-1}$ 1402 to produce and output that is input (along with the input $x_t$ 1422) to a hyperbolic tangent (tanh) block 1424 to produce the output $j_t$ 1430. A second multiplier block 1414 multiplies the output $j_t$ 1430 and the output $z_t$ 1428 to produce a first output. The block 1410 computes 1—the output $z_t$ 1428 to produce an output that is input to a third multiplier block 1404 that multiplies the output and the input $h_{t-1}$ 1402 to produce a product that is input to an adder block 1406 along with the first output (from the multiplier block 1414) to produce the output $h_t$ 1408. The input $h_{t-1}$ 1402 is the output of the GRU neuron from a prior time interval output t–1.

Figure 14B:
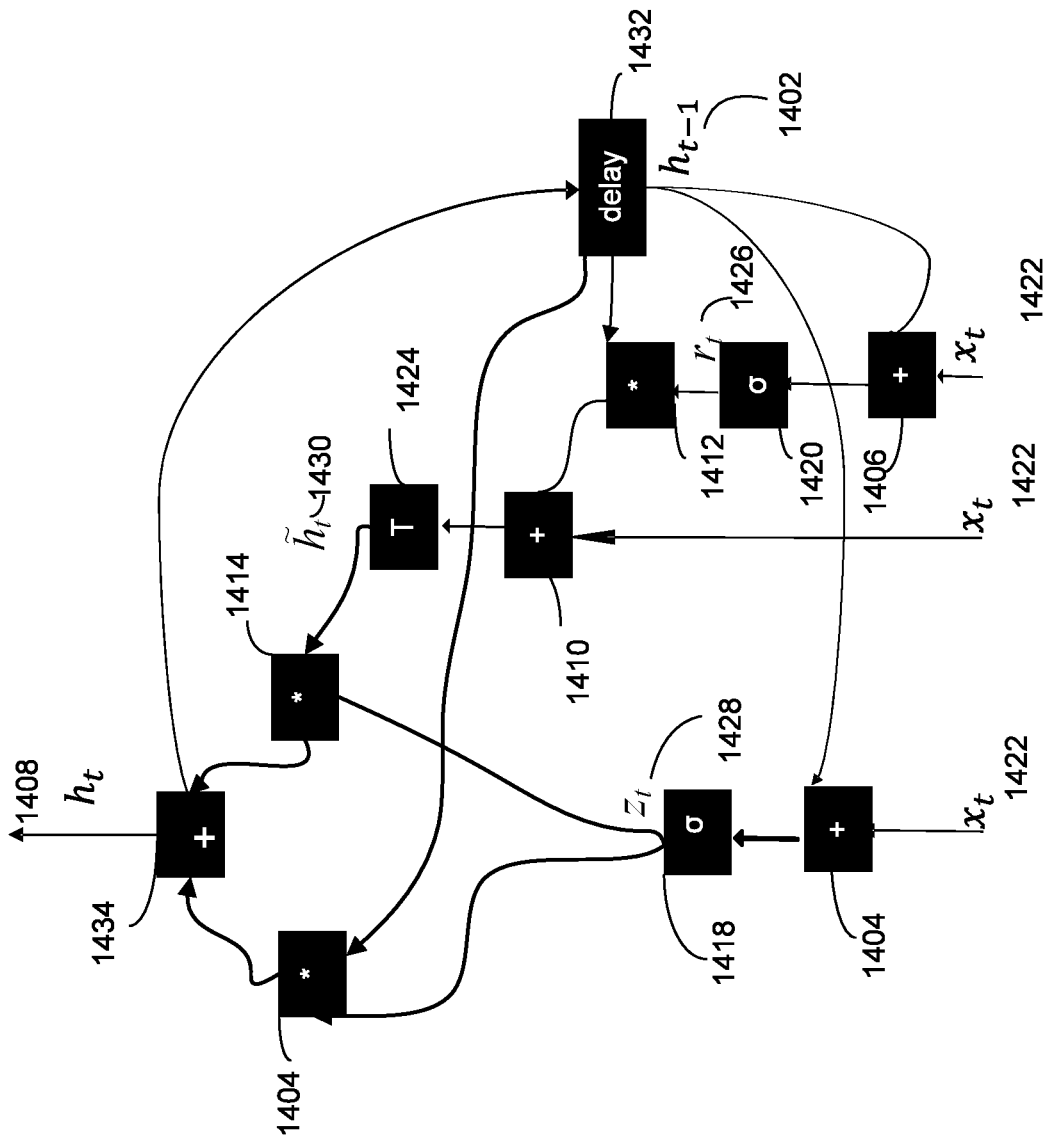
FIG. 14B is a neuron schema for a GRU neuron, according to some implementations.

FIG. 14B is a neuron schema for a GRU neuron 1440, according to some implementations. The schema includes weighted summator nodes (sometimes called adder blocks) 1404, 1406, 1410, 1406, and 1434, multiplier blocks 1404, 1412, and 1414, and delay block 1432. The input $x_t$ 1422 is connected to the adder blocks 1404, 1410, and 1406. The output $h_{t-1}$ 1402 for a prior input $x_{t-1}$ is also input to the adder blocks 1404 and 1406, and the multiplier blocks 1404 and 1412. The adder block 1404 produces an output that is input to a sigmoid block 1418 that produces the output $Z_t$ 1428. Similarly, the adder block 1406 produces an output that is input to the sigmoid block 1420 that produces the output $r_t$ 1426 that is input to the multiplier block 1412. The output of the multiplier block 1412 is input to the adder block 1410 whose output is input to a hyperbolic tangent block 1424 that produces an output 1430. The output 1430 as well as the output of the sigmoid block 1418 are input to the multiplier block 1414. The output of the sigmoid block 1418 is input to the multiplier block 1404 that multiplies that output with the input from the delay block 1432 to produce a first output. The multiplier block produces a second output. The adder block 1434 sums the first output and the second output to produce the output $h_t$ 1408. The delay block 1432 is used to recall (e.g., save and restore) the output of the adder block 1434 from a prior time instance. Examples of delay blocks are described above in reference to FIG. 13B, according to some implementations.

Operation types used in GRU are the same as the operation types for LSTM networks (described above), so GRU is transformed to trapezium-based networks following the principles described above for LSTM (e.g., using the Layer2TNNX algorithm), according to some implementations.

Example Transformation of Convolutional Neural Network

In general, Convolutional Neural Networks (CNN) include several basic operations, such as convolution (a set of linear combinations of image's (or internal map's) fragments with a kernel), activation function, and pooling (e.g., max, mean, etc.). Every calculation neuron in a CNN follows the general processing scheme of a neuron in an MLP: linear combination of some inputs with subsequent calculation of activation function. So a CNN is transformed using the MLP2TNNX algorithm described above for multilayer perceptrons, according to some implementations.

Figure 15B:
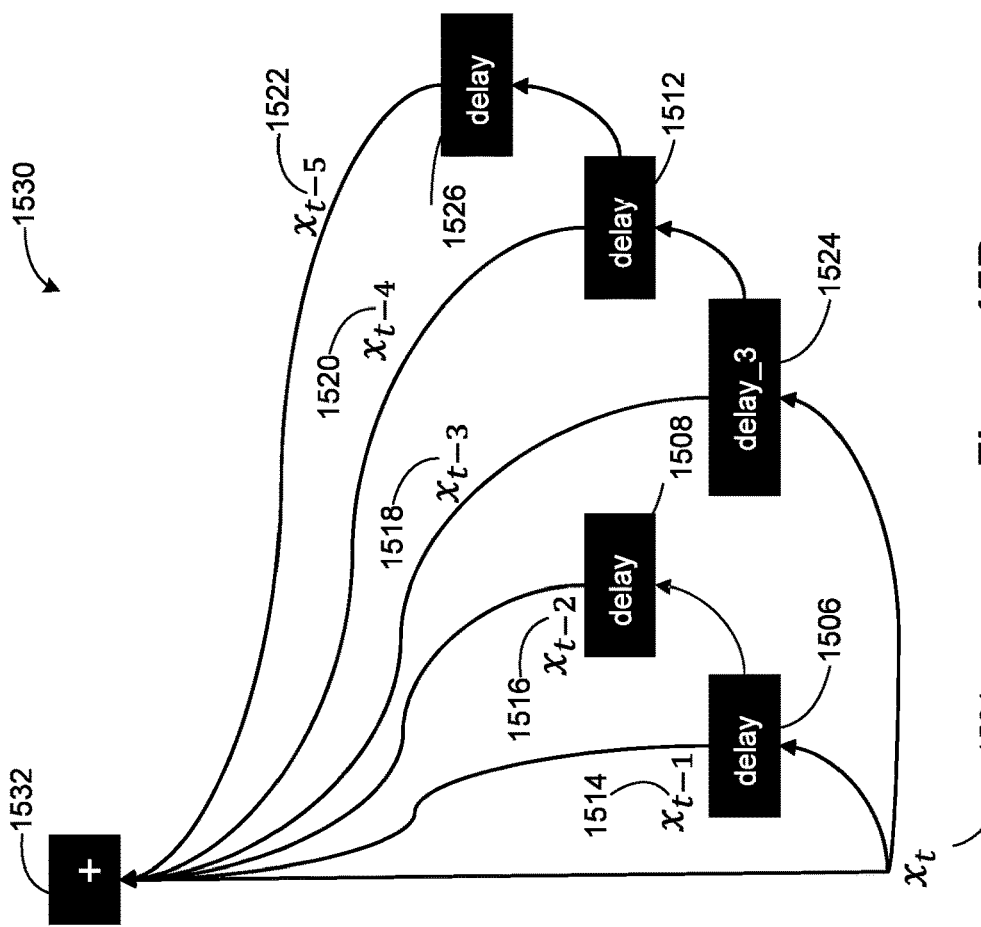
FIGS. 15A and 15B are neuron schema of variants of a single Conv1D filter, according to some implementations.
Figure 15A:
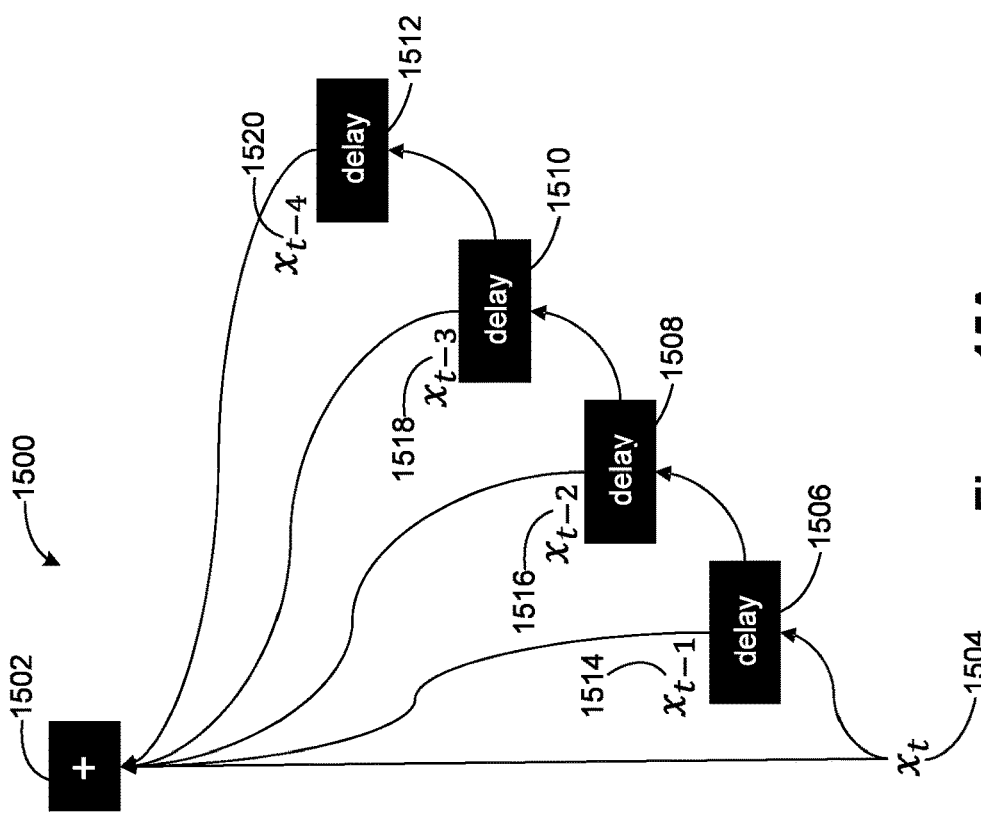

Conv1D is a convolution performed over time coordinate. FIGS. 15A and 15B are neuron schema of variants of a single Conv1D filter, according to some implementations. In FIG. 15A, a weighted summator node 1502 (sometimes called adder block, marked '+') has 5 inputs, so it corresponds to 1D convolution with a kernel of 5. The inputs are $x_t$ 1504 from time t, $x_{t-1}$ 1514 from time t−1 (obtained by inputting the input to a delay block 1506), $x_{t-2}$ 1516 from time t−2 (obtained by inputting the output of the delay block 1506 to another delay block 1508), $x_{t-3}$ 1518 from time t−3 (obtained by inputting the output of the delay block 1508 to another delay block 1510), and $x_{t-4}$ 1520 from time t−4 (obtained by inputting the output of the delay block 1510 to another delay block 1512. For large kernels, it is sometimes beneficial to utilize different frequency delay blocks, so that some of the blocks produce bigger delays. Some implementations substitute several small delay blocks for one large delay block, as shown in FIG. 15B. In addition to the delay blocks in FIG. 15A, the example uses a delay_3 block 1524 that produces $x_{t-3}$ 1518 from time t−3, and another delay block 1526 that produces the $x_{t-5}$ 1522 from time t−5. The delay_3 1524 block is an example of multiple delay blocks, according to some implementations. This operation does not decrease total number of blocks, but it may decrease total number of consequent operations performed over the input signal and reduce accumulation of errors, according to some implementations.

In some implementations, convolutional layers are represented by trapezia-like neurons and fully connected layer is represented by cross-bar of resistors. Some implementations use cross-bars, and calculate resistance matrix for the cross-bars.

Example Approximation Algorithm for Single Layer Perceptron with Multiple Outputs In some implementations, the example transformations described herein are performed by the neural network transformation module 226 that transform trained neural networks 220, and/or the analog neural network optimization module 246, based on the mathematical formulations 230, the basic function blocks 232, the analog component models 234, and/or the analog design constraints 236, to obtain the transformed neural networks 228.

Suppose a single layer perceptron SLP(K, L) includes K inputs and L output neurons, each output neuron performing an activation function F. Suppose further that $U \in R^{L \times K}$ is a weight matrix for SLP(K, L). The following is an example for constructing a T-neural network from neurons $TN(N_I, N_O)$ using an approximation algorithm Layer2TNNX_Approx, according to some implementations. The algorithm applies Layer2TNN1 algorithm (described above) at the first stage in order to decrease a number of neurons and connections, and subsequently applies Layer2TNNX to process the input of the decreased size. The outputs of the resulted neural net are calculated using shared weights of the layers constructed by the Layer2TNN1 algorithm. The number of these layers is determined by the value p, a parameter of the algorithm. If p is equal to 0 then Layer2TNNX algorithm is applied only and the transformation is equivalent. If p>0, then p layers have shared weights and the transformation is approximate.

Algorithm Layer2TNNX_Approx
1. Set the parameter p with a value from the set $\{0, 1, \ldots, \lceil \log_{N_I} K \rceil - 1\}$.
2. If p>0 apply the algorithm Layer2TNN1 with neuron $TN(N_I, 1)$ to the net SLP(K, L) and construct first p layers of the resulted subnet (PNN).
The net PNN has $$N_p = \left\lceil \frac{K}{N_I^p} \right\rceil$$

neurons in the output layer.
3. Apply the algorithm Layer2TNNX with a neuron $TN(N_I, N_O)$ and construct a neural subnet TNN with $N_p$ inputs and L outputs.
4. Set the weights of the PNN net. The weights of every neuron i of the first layer of the PNN are set according to the rule $w_{ik_i}^{(1)} = C$. Here, C is any constant not equal to zero, $k_i = (i-1)N_I + 1$, and $$w_{ij}^{(1)} = \frac{1}{L} \sum_{l=1}^{L} \frac{U_{lj}}{U_{lk_i}} C,$$

for all weights j of this neuron except $k_i$. All other weights of the PNN net are set to 1. $w_{ik_i}^{(1)}$ represents a weight for the first layer (as denoted by the superscript (1)) for the connection between the neuron i and the neuron $k_i$ in the first layer.
5. Set the weights of the TNN subnet. The weights of every neuron i of the first layer of the TNN (considering the whole net this is (p+1)th layer) are set according to the equation $$w_{ik_i}^{(p+1)} = \frac{U_{ik_i}}{C}.$$

All other weights of the TNN are set to 1.
6. Set activation functions for all neurons of the last layer of the TNN subnet as F. Activation functions of all other neurons are identity.

Figure 16:
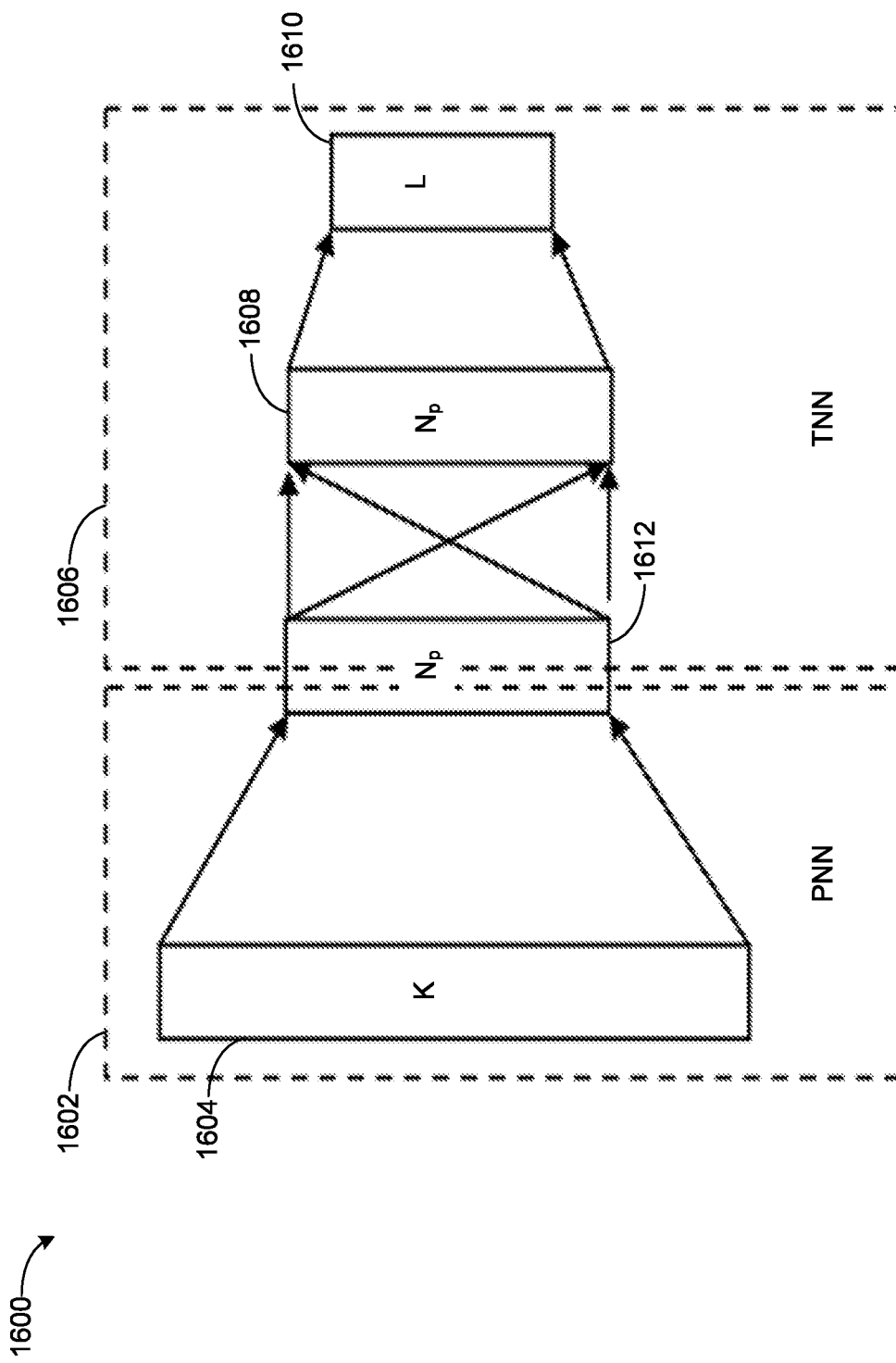
FIG. 16 shows an example architecture of a transformed neural network, according to some implementations.

FIG. 16 shows an example architecture 1600 of the resulting neural net, according to some implementations. The example includes a PNN 1602 connected to a TNN 1606. The PNN 1602 includes a layer for K inputs and produce $N_p$ outputs, that is connected as input 1612 to the TNN 1606. The TNN 1606 generates L outputs 1610, according to some implementations.

Approximation Algorithm for Multilayer Perceptron with Several Outputs

Suppose a multilayer perceptron (MLP) includes K inputs, S layers and $L_i$ calculation neurons in i-th layer, represented as MLP(K, S, $L_1, \ldots, L_S$). Suppose further $U_i \in R^{L_i \times L_{i-1}}$ is a weight matrix for the i-th layer. The following example algorithm constructs a T-neural network from neurons $TN(N_I, N_O)$, according to some implementations.

Algorithm MLP2TNNX_Approx
1. For every layer i=1, . . . , S:
   a. Apply the algorithm Layer2TNNX_Approx (described above) to $SLP_i(L_{i-1}, L_i)$ consisting of $L_{i-1}$ inputs, $L_i$ output neuron, and weight matrix $U_i$. If i=1, then $L_0 = K$. Suppose this step constructs $PTNNX_i$ as a result.
2. Construct a MTNNX (a multilayer perceptron) by stacking all $PTNNX_i$ into one neural net, where output of a $TNNX_{i-1}$ is set as input for $TNNX_i$.

Example Methods of Compression of Transformed Neural Networks

In some implementations, the example transformations described herein are performed by the neural network transformation module 226 that transform trained neural networks 220, and/or the analog neural network optimization module 246, based on the mathematical formulations 230, the basic function blocks 232, the analog component models 234, and/or the analog design constraints 236, to obtain the transformed neural networks 228.

This section describes example methods of compression of transformed neural networks, according to some implementations. Some implementations compress analog pyramid-like neural networks in order to minimize the number of operational amplifiers and resistors, necessary to realize the analog network on chip. In some implementations, the method of compression of analog neural networks is pruning, similar to pruning in software neural networks. There is nevertheless some peculiarities in compression of pyramid-like analog networks, which are realizable as IC analog chip in hardware. Since the number of elements, such as operational amplifiers and resistors, define the weights in analog based neural networks, it is crucial to minimize the number of operational amplifiers and resistors to be placed on chip. This will also help minimize the power consumption of the chip. Modern neural networks, such as convolutional neural networks, can be compressed 5-200 times without significant loss of the accuracy of the networks. Often, whole blocks in modern neural networks can be pruned without significant loss of accuracy. The transformation of dense neural networks into sparsely connected pyramid or trapezia or cross-bar like neural networks presents opportunities to prune the sparsely connected pyramid or trapezia-like analog networks, which are then represented by operational amplifiers and resistors in analog IC chips. In some implementations, such techniques are applied in addition to conventional neural network compression techniques. In some implementations, the compression techniques are applied based on the specific architecture of the input neural network and/or the transformed neural networks (e.g., pyramids versus trapezia versus cross-bars).

For example, since the networks are realized by means of analog elements, such as operational amplifiers, some implementations determine the current which flows through the operational amplifier when the standard training dataset is presented, and thereby determine if a knot (an operational amplifier) is needed for the whole chip or not. Some implementations analyze the SPICE model of the chip and determine the knots and connections, where no current is flowing and no power is consumed. Some implementations determine the current flow through the analog IC network and thus determine the knots and connections, which are then pruned. Besides, some implementations also remove the connections if the weight of connection is too high, and/or substitute resistor to direct connector if the weight of connection is too low. Some implementations prune the knot if all connections leading to this knot have weights that are lower than a predetermined threshold (e.g., close to 0), deleting the connections where an operational amplifier always provides zero at output, and/or changing an operational amplifier to a linear junction if the amplifier gives linear function without amplification.

Some implementations apply compression techniques specific to pyramid, trapezia, or cross-bar types of neural networks. Some implementations generate pyramids or trapezia with larger amount of inputs (than without the compression), thus minimizing the number of layers in pyramid or trapezia. Some implementations generate a more compact trapezia network by maximizing the number of outputs of each neuron.

Example Generation of Optimal Resistor Set

In some implementations, the example computations described herein are performed by the weight matrix computation or weight quantization module 238 (e.g., using the resistance calculation module 240) that compute the weights 272 for connections of the transformed neural networks, and/or corresponding resistance values 242 for the weights 272.

This section describes an example of generating an optimal resistor set for a trained neural network, according to some implementations. An example method is provided for converting connection weights to resistor nominals for implementing the neural network (sometimes called a NN model) on a microchip with possibly less resistor nominals and possibly higher allowed resistor variance.

Suppose a test set 'Test' includes around 10,000 values of input vector (x and y coordinates) with both coordinates varying in the range [0;1], with a step of 0.01. Suppose network NN output for given input X is given by Out=NN (X). Suppose further that input value class is found as follows: Class_nn(X)=NN(X)>0.61?1:0.

The following compares a mathematical network model M with a schematic network model S. The schematic network model includes possible resistor variance of rv and processes the 'Test' set, each time producing a different vector of output values S(Test)=Out_s. Output error is defined by the following equation:

$$Err_{Out} = \text{Mean}\left(\sum_{i=1}^{N} \frac{|S(X_i) - M(X_i)|}{N}\right)$$

Classification error is defined by the following equation:

$$Err_{class} = \text{Mean}\left(\sum_{i=1}^{N} \frac{\text{Class\_s}(X_i) \neq \text{Class\_m}(X_i)}{N}\right)$$

Some implementations set the desired classification error as no more than 1%.

Example Error Analysis

Figure 17A:
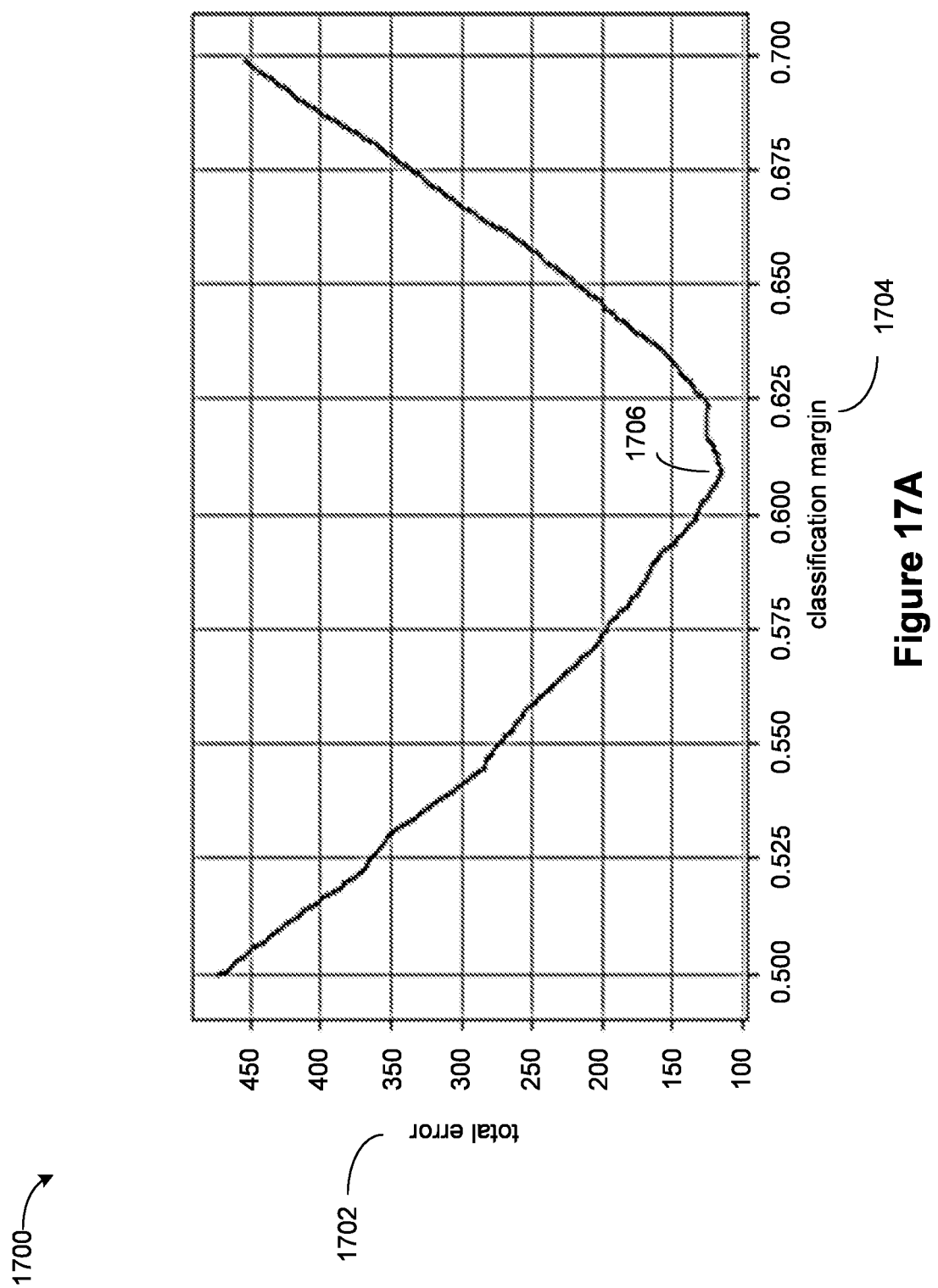
FIGS. 17A-17C provide example charts illustrating dependency between output error and classification error or weight error, according to some implementations.
Figure 17B:
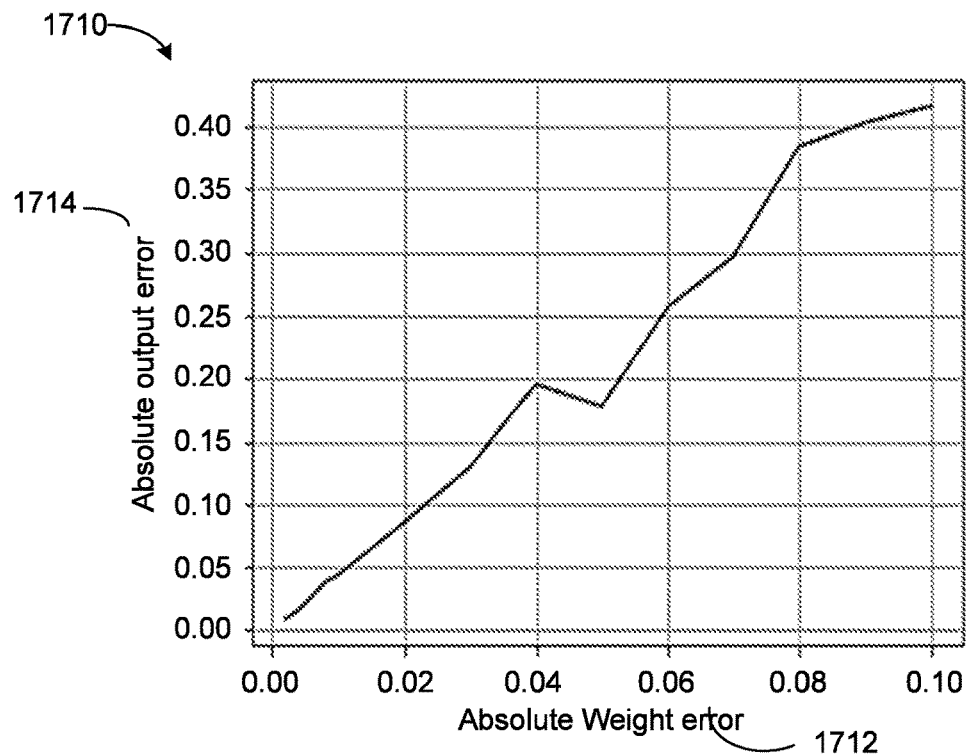
Figure 17C:
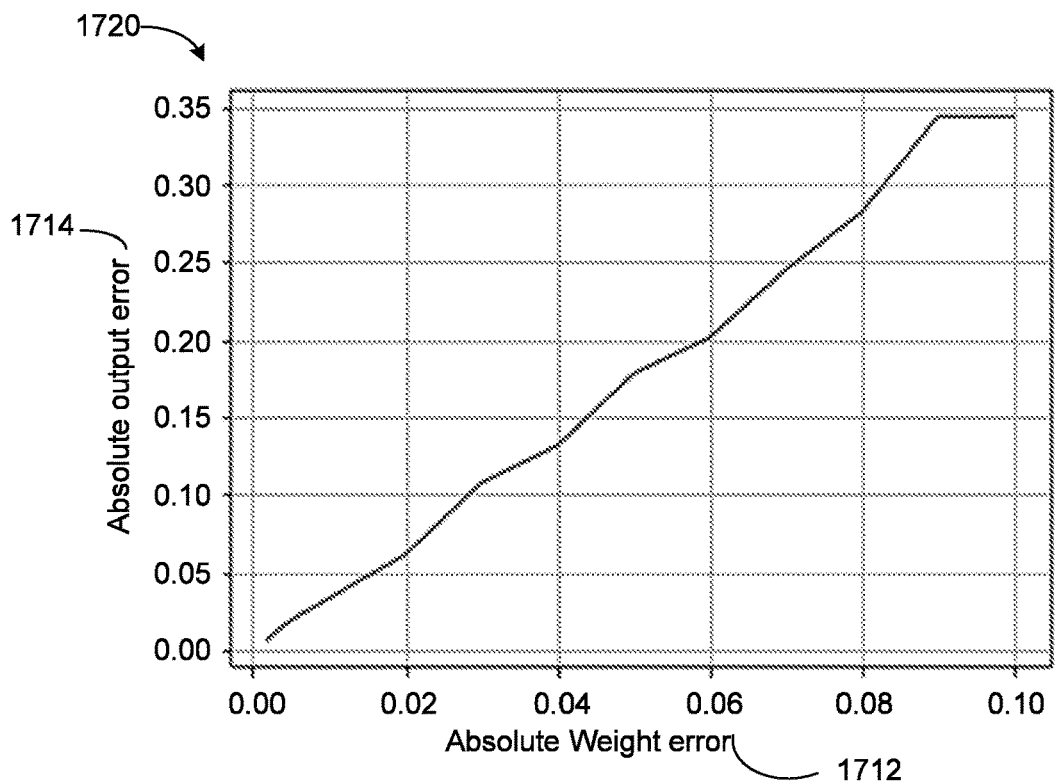

FIG. 17A shows an example chart 1700 illustrating dependency between output error and classification error on the M network, according to some implementations. In FIG. 17A, the x-axis corresponds to classification margin 1704, and the y-axis corresponds to total error 1702 (see description above). The graph shows total error (difference between output of model M and real data) for different classification margins of output signal. For this example, according to the chart, the optimal classification margin 1706 is 0.610.

Suppose another network O produces output values with a constant shift versus relevant M output values, there would be classification error between O and M. To keep the classification error below 1%, this shift should be in the range of [−0.045, 0.040]. Thus, possible output error for S is 45 mV.

Possible weight error is determined by analyzing dependency between weight/bias relative error over the whole network and output error. The charts 1710 and 1720 shown in FIGS. 17B and 17C, respectively, are obtained by averaging 20 randomly modified networks over the 'Test' set, according to some implementations. In these charts, x-axis represents the absolute weight error 1712 and y-axis represents the absolute output error 1714. As can be seen from the charts, output error limit of 45 mV (y=0.045) allows for 0.01 relative or 0.01 absolute error value (value of x) for each weight. Maximum weight modulus (maximum of absolute value of weights among all weights) for the neural network is 1.94.

Example Process for Choosing Resistor Set

A resistor set together with a {R+, R−} pair chosen from this set has a value function over the required weight range [−wlim; wlim] with some degree of resistor error r_err. In some implementations, value function of a resistor set is calculated as follows:

- Possible weight options array is calculated together with weight average error dependent on resistor error;
- The weight options in the array is limited to the required weight range [−wlim; wlim];
- Values that are worse than neighboring values in terms of weight error are removed;
- An array of distances between neighboring values is calculated; and
- The value function is a composition of square mean or maximum of the distances array.

Some implementations iteratively search for an optimal resistor set by consecutively adjusting each resistor value in the resistor set on a learning rate value. In some implementations, the learning rate changes over time. In some implementations, an initial resistor set is chosen as uniform (e.g., [1;1; . . . ; 1]), with minimum and maximum resistor values chosen to be within two orders of magnitude range (e.g., [1;100] or [0.1;10]). Some implementation choose R+=R−. In some implementations, the iterative process converges to a local minimum. In one case, the process resulted in the following set: [0.17, 1.036, 0.238, 0.21, 0.362, 1.473, 0.858, 0.69, 5.138, 1.215, 2.083, 0.275]. This is a locally optimal resistor set of 12 resistors for the weight range [−2; 2] with rmin=0.1 (minimum resistance), rmax=10 (maximum resistance), and r_err=0.001 (an estimated error in the resistance). Some implementations do not use the whole available range [rmin; rmax] for finding a good local optimum. Only part of the available range (e.g., in this case [0.17; 5.13]) is used. The resistor set values are relative, not absolute. Is this case, relative value range of 30 is enough for the resistor set.

In one instance, the following resistor set of length 20 is obtained for abovementioned parameters: [0.300, 0.461, 0.519, 0.566, 0.648, 0.655, 0.689, 0.996, 1.006, 1.048, 1.186, 1.222, 1.261, 1.435, 1.488, 1.524, 1.584, 1.763, 1.896, 2.02]. In this example, the value 1.763 is also the R−=R+ value. This set is subsequently used to produce weights for NN, producing corresponding model S. The model S's mean square output error was 11 mV given the relative resistor error is close to zero, so the set of 20 resistors is more than required. Maximum error over a set of input data was calculated to be 33 mV. In one instance, S, DAC, and ADC converters with 256 levels were analyzed as a separate model, and the result showed 14 mV mean square output error and 49 mV max output error. An output error of 45 mV on NN corresponds to a relative recognition error of 1%. The 45 mV output error value also corresponds to 0.01 relative or 0.01 absolute weight error, which is acceptable. Maximum weight modulus in NN is 1.94. In this way, the optimal (or near optimal) resistor set is determined using the iterative process, based on desired weight range [−wlim; wlim], resistors error (relative), and possible resistors range.

Typically, a very broad resistor set is not very beneficial (e.g., between 1⅕ orders of magnitude is enough) unless different precision is required within different layers or weight spectrum parts. For example, suppose weights are in the range of [0, 1], but most of the weights are in the range of [0, 0.001], then better precision is needed within that range. In the example described above, given the relative resistor error is close to zero, the set of 20 resistors is more than sufficient for quantizing the NN network, with given precision. In one instance, on a set of resistors [0.300, 0.461, 0.519, 0.566, 0.648, 0.655, 0.689, 0.996, 1.006, 1.048, 1.186, 1.222, 1.261, 1.435, 1.488, 1.524, 1.584, 1.763, 1.896, 2.02] (note values are relative), an average S output error of 11 mV was obtained.

Example Process for Quantization of Resistor Values

In some implementations, the example computations described herein are performed by the weight matrix computation or weight quantization module 238 (e.g., using the resistance calculation module 240) that compute the weights 272 for connections of the transformed neural networks, and/or corresponding resistance values 242 for the weights 272.

This section describes an example process for quantizing resistor values corresponding to weights of a trained neural network, according to some implementations. The example process substantially simplifies the process of manufacturing chips using analog hardware components for realizing neural networks. As described above, some implementations use resistors to represent neural network weights and/or biases for operational amplifiers that represent analog neurons. The example process described here specifically reduces the complexity in lithographically fabricating sets of resistors for the chip. With the procedure of quantizing the resistor values, only select values of resistances are needed for chip manufacture. In this way, the example process simplifies the overall process of chip manufacture and enables automatic resistor lithographic mask manufacturing on demand.

Figure 18:
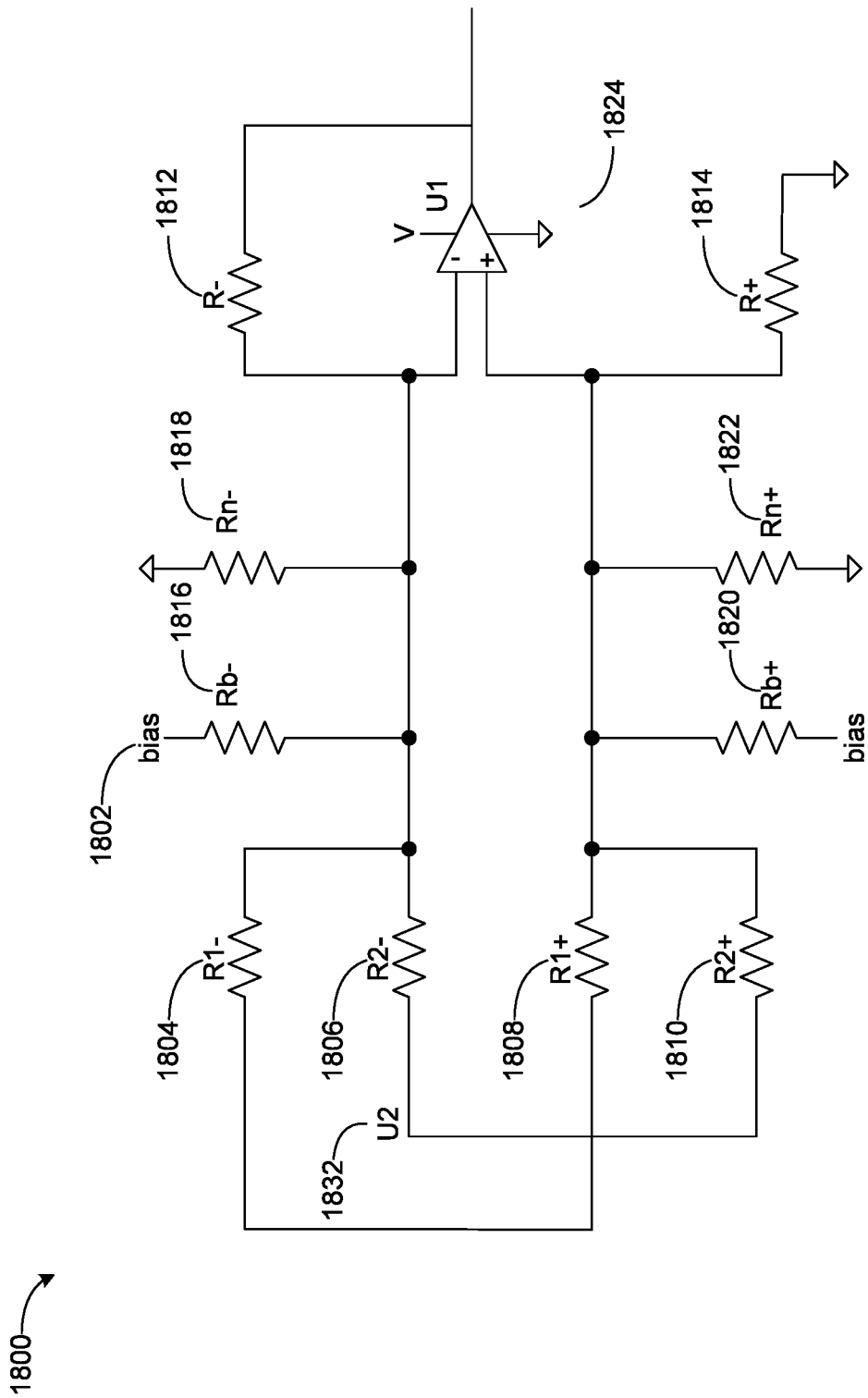
FIG. 18 provides an example scheme of a neuron model used for resistors quantization, according to some implementations.

FIG. 18 provides an example scheme of a neuron model 1800 used for resistors quantization, according to some implementations. In some implementations, the circuit is based on an operational amplifier 1824 (e.g., AD824 series precision amplifier) that receives input signals from negative weight fixing resistors (R1− 1804, R2− 1806, Rb− bias 1816, Rn− 1818, and R− 1812), and positive weight fixing resistors (R1+ 1808, R2+ 1810, Rb+ bias 1820, Rn+ 1822), and R+ 1814). The positive weight voltages are fed into direct input of the operational amplifier 1824 and negative weights voltages are fed into inverse input of the operational amplifier 1824. The operational amplifier 1824 is used to allow weighted summation operation of weighted outputs from each resistor, where negative weights are subtracted from positive weights. The operational amplifier 1824 also amplifies signal to the extent necessary for the circuit operation. In some implementations, the operational amplifier 1824 also accomplishes RELU transformation of output signal at it's output cascade.

The following equations determine the weights, based on resistor values:

Voltage at the output of neuron is determined by the following equation:

$$U_{out} = \sum_{i=1}^{N} \left( \frac{R^+}{R_i^+} - \frac{R^-}{R_i^-} \right) U_i$$

The weights of each connection are determined by following equation:

$$w_i = \frac{R^+}{R_i^+} - \frac{R^-}{R_i^-}$$

The following example optimization procedure quantizes the values of each resistance and minimize the error of neural network output, according to some implementations:
1. Obtain a set of connection weights and biases {w1, ..., wn, b}.
2. Obtain possible minimum and maximum resistor values {Rmin, Rmax}. These parameters are determined based on the technology used for manufacturing. Some implementations use TaN or Tellurium high resistivity materials. In some implementations, the minimum value of resistor is determined by minimum square that can be formed lithographically. The maximum value is determined by length, allowable for resistors (e.g., resistors made from TaN or Tellurium) to fit to the desired area, which is in turn determined by the area of an operational amplifier square on lithographic mask. In some implementations, the area of arrays of resistors is smaller than the area of one operational amplifier, since the arrays of resistors are stacked (e.g., one in BEOL, another in FEOL).
3. Assume that each resistor has r_err relative tolerance value
4. The goal is to select a set of resistor values {R1, ..., Rn} of given length N within the defined [Rmin; Rmax], based on {w1, ..., wn, b} values. An example search algorithm is provided below to find sub-optimal {R1, ..., Rn} set based on particular optimality criteria.
5. Another algorithm chooses {Rn, Rp, Rni, Rpi} for a network given that {R1 ... Rn} is determined.

Example {R1, ..., Rn} Search Algorithm

Some implementations use an iterative approach for resistor set search. Some implementations select an initial (random or uniform) set {R1, ..., Rn} within the defined range. Some implementations select one of the elements of the resistor set as a R−=R+ value. Some implementations alter each resistor within the set by a current learning rate value until such alterations produce 'better' set (according to a value function). This process is repeated for all resistors within the set and with several different learning rate values, until no further improvement is possible.

Some implementations define the value function of a resistor set as follows:
Possible weight options are calculated according to the formula (described above):

$$w_i = \frac{R^+}{R_i^+} - \frac{R^-}{R_i^-}$$

Expected error value for each weight option is estimated based on potential resistor relative error r_err determined by IC manufacturing technology.
Weight options list is limited or restricted to [−wlim; wlim] range
Some values, which have expected error beyond a high threshold (e.g., 10 times r_err), are removed
Value function is calculated as a square mean of distance between two neighboring weight options. So, value function is minimal when weight options are distributed uniformly within [−wlim; wlim] range Suppose the required weight range [−wlim; wlim] for a model is set to [−5; 5], and the other parameters include N=20, r_err=0.1%, rmin=100 KΩ, rmax=5 MΩ. Here, rmin and rmax are minimum and maximum values for resistances, respectively.

In one instance, the following resistor set of length 20 was obtained for abovementioned parameters: [0.300, 0.461, 0.519, 0.566, 0.648, 0.655, 0.689, 0.996, 1.006, 1.048, 1.186, 1.222, 1.261, 1.435, 1.488, 1.524, 1.584, 1.763, 1.896, 2.02] MΩ. R−=R+=1.763 MΩ.

Example {Rn, Rp, Rni, Rpi} Search Algorithm

Some implementations determine Rn and Rp using an iterative algorithm such as the algorithm described above. Some implementations set Rp=Rn (the tasks to determine Rn and Rp are symmetrical—the two quantities typically converge to a similar value). Then for each weight $w_i$, some implementations select a pair of resistances {Rni, Rpi} that minimizes the estimated weight error value:

$$w_{err} = \left(\frac{R^+}{R_i^+} + \frac{R^-}{R_i^-}\right) \cdot r_{err} + \left|w_i - \frac{R^+}{R_i^+} + \frac{R^-}{R_i^-}\right|$$

Some implementations subsequently use the {Rni; Rpi; Rn; Rp} values set to implement neural network schematics. In one instance, the schematics produced mean square output error (sometimes called S mean square output error, described above) of 11 mV and max error of 33 mV over a set of 10,000 uniformly distributed input data samples, according to some implementations. In one instance, S model was analyzed along with digital-to-analog converters (DAC), analog-to-digital converters (ADC), with 256 levels as a separate model. The model produced 14 mV mean square output error and 49 mV max output error on the same data set, according to some implementations. DAC and ADC have levels because they convert analog value to bit value and vice-versa. 8 bits of digital value is equal to 256 levels. Precision cannot be better than 1/256 for 8-bit ADC.

Some implementations calculate the resistance values for analog IC chips, when the weights of connections are known, based on Kirchhoff's circuit laws and basic principles of operational amplifiers (described below in reference to FIG. 19A), using Mathcad or any other similar software. In some implementations, operational amplifiers are used both for amplification of signal and for transformation according to the activation functions (e.g., ReLU, sigmoid, Tangent hyperbolic, or linear mathematical equations), Some implementations manufacture resistors in a lithography layer where resistors are formed as cylindrical holes in the SiO2 matrix and the resistance value is set by the diameter of hole. Some implementations use amorphous TaN, TiN of CrN or Tellurium as the highly resistive material to make high density resistor arrays. Some ratios of Ta to N Ti to N and Cr to N provide high resistance for making ultra-dense high resistivity elements arrays. For example, for TaN, Ta5N6, Ta3N5, the higher the N ratio to Ta, the higher is the resistivity. Some implementations use Ti2N, TiN, CrN, or Cr5N, and determine the ratios accordingly. TaN deposition is a standard procedure used in chip manufacturing and is available at all major Foundries.

Example Operational Amplifier

Figure 19A:
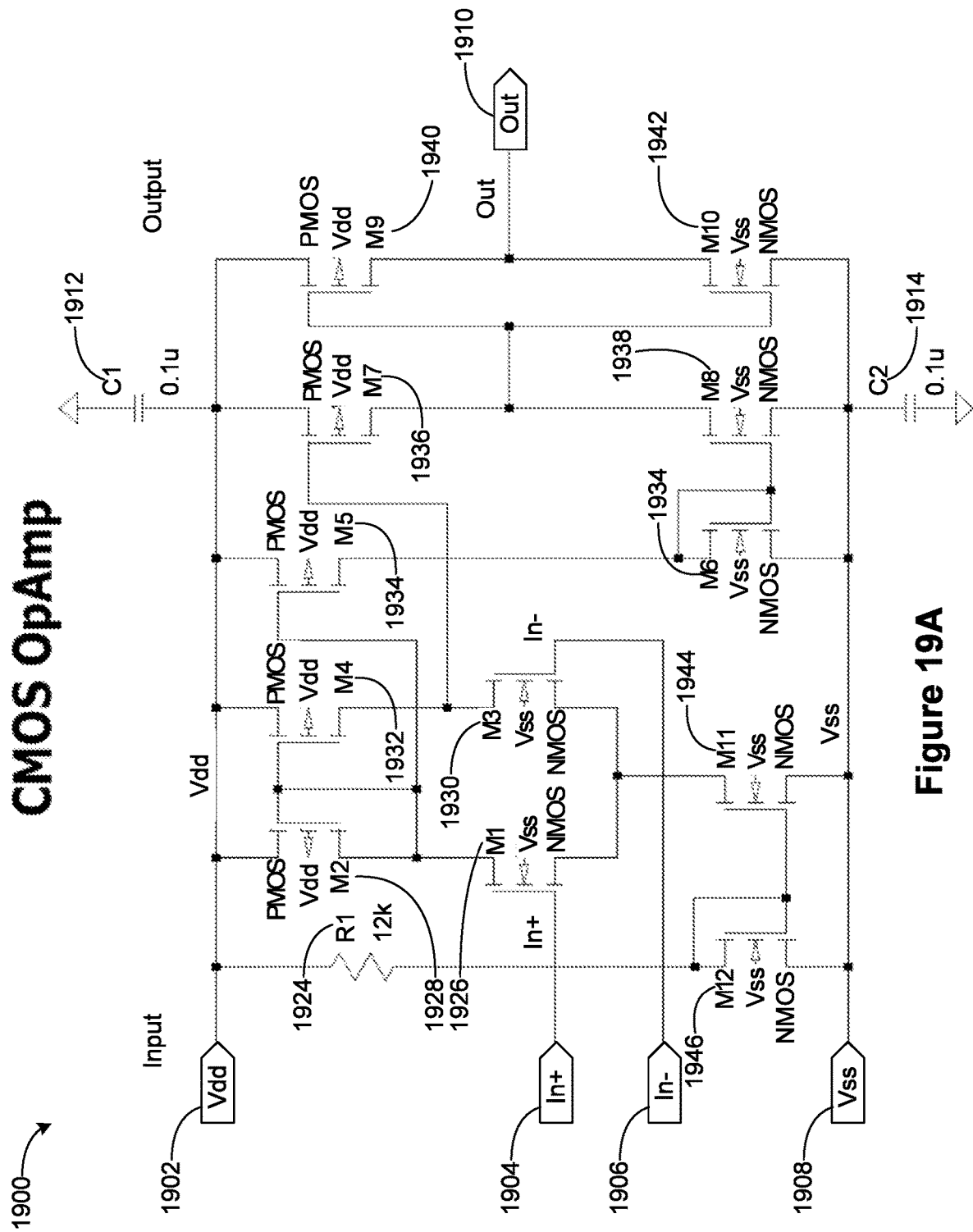
FIG. 19A shows a schematic diagram of an operational amplifier made on CMOS, according to some implementations.

FIG. 19A shows a schematic diagram of an operational amplifier made on CMOS (CMOS OpAmp) 1900, according to some implementations. In FIG. 19A, In+ (positive input or pos) 1404, and In− (negative input or neg) 1406, and Vdd− (positive supply voltage relative to GND) 1402 are contact inputs. Contact Vss− (negative supply voltage or GND) is indicated by the label 1408. The circuit output is Out 1410 (contact output). Parameters of CMOS transistors are determined by the ratio of geometric dimensions: L (the length of the gate channel) to W (the width of the gate channel), examples of which are shown in the Table shown in FIG. 19B (described below). The current mirror is made on NMOS transistors M1 11944, M1 21946, and resistor R1 1921 (with an example resistance value of 12 kΩ), and provides the offset current of the differential pair (M1 1926 and M3 1930). The differential amplifier stage (differential pair) is made on the NMOS transistors M1 1926 and M3 1930. Transistors M1, M3 are amplifying, and PMOS transistors M2 1928 and M4 1932 play the role of active current load. From the M3 transistor, the signal is input to the gate of the output PMOS transistor M7 1936. From the transistor M1, the signal is input to the PMOS transistor M5 (inverter) 1934 and the active load on the NMOS transistor M6 1934. The current flowing through the transistor M5 1934 is the setting for the NMOS transistor M8 1938. Transistors M7 1936 is included in the scheme with a common source for a positive half-wave signal. The M8 transistors 1938 are enabled by a common source circuit for a negative half-wave signal. To increase the overall load capacity of the operational amplifier, the M7 1936 and M8 1938 outputs include an inverter on the M9 1940 and M10 1942 transistors. Capacitors C1 1912 and C2 1914 are blocking.

FIG. 19B shows a table 1948 of description for the example circuit shown in FIG. 19A, according to some implementations. The values for the parameters are provided as examples, and various other configurations are possible. The transistors M1, M3, M6, M8, M10, M11, and M12 are N-Channel MOSFET transistors with explicit substrate connection. The other transistors M2, M4, M5, M7, and M9 are P-Channel MOSFET transistors with explicit substrate connection. The Table shows example shutter ratio of length (L, column 1) and width (W, column 2) are provided for each of the transistors (column 3).

In some implementations, operational amplifiers such as the example described above are used as the basic element of integrated circuits for hardware realization of neural networks. In some implementations, the operational amplifiers are of the size of 40 square microns and fabricated according to 45 nm node standard.

In some implementations, activation functions, such as ReLU, Hyperbolic Tangent, and Sigmoid functions are represented by operational amplifiers with modified output cascade. For example, RELU, Sigmoid, or Tangent function is realized as an output cascade of an operational amplifier (sometimes called OpAmp) using corresponding well-known analog schematics, according to some implementations.

In the examples described above and below, in some implementations, the operational amplifiers are substituted by inverters, current mirrors, two-quadrant or four quadrant multipliers, and/or other analog functional blocks, that allow weighted summation operation.

Example Scheme of a LSTM Block

Figure 20A:
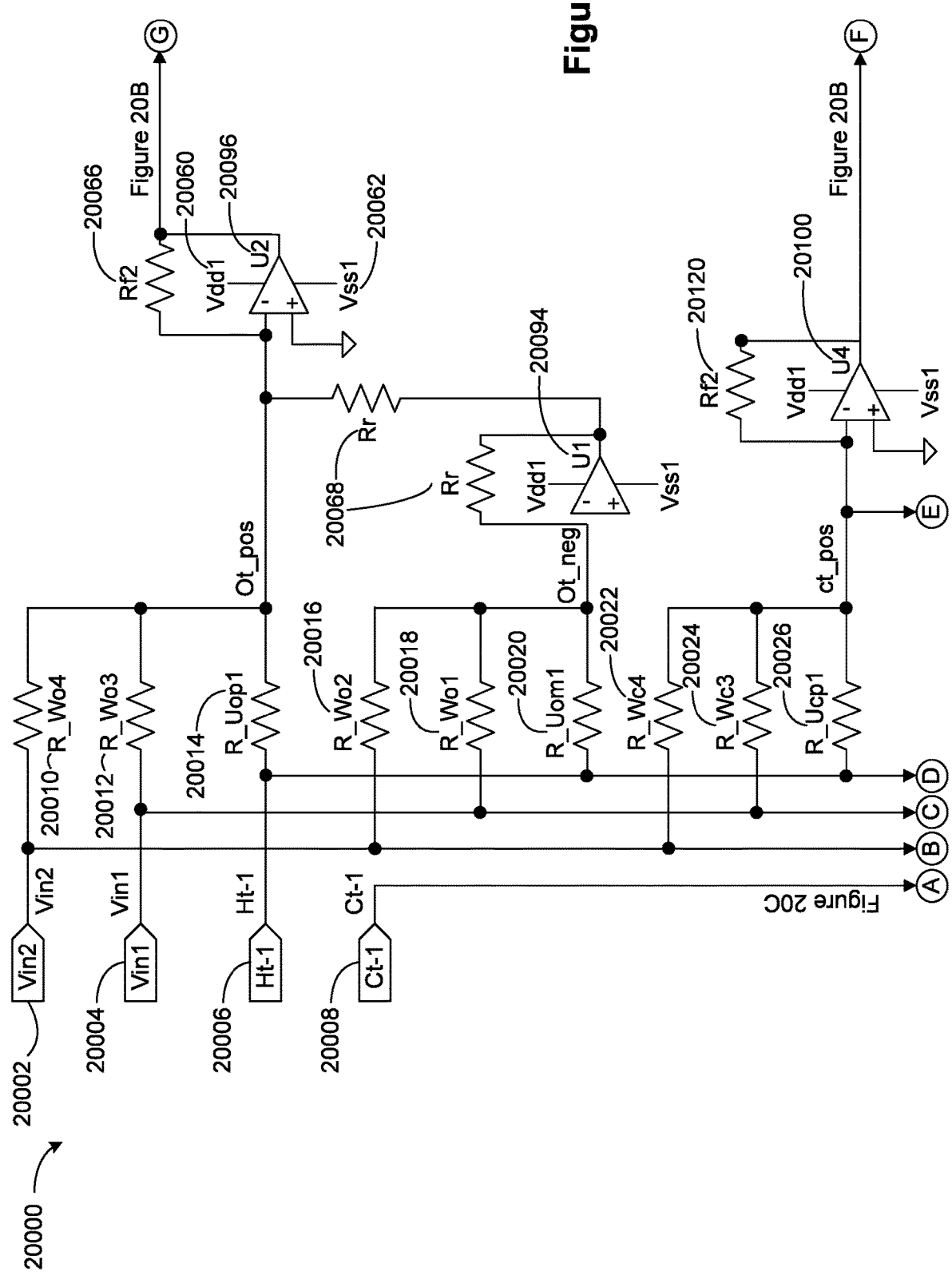
FIGS. 20A-20E show a schematic diagram of a LSTM block, according to some implementations.

FIGS. 20A-20E show a schematic diagram of a LSTM neuron 20000, according to some implementations. The inputs of the neuron are Vin1 20002 and Vin2 20004 that are values in the range [−0.1,0.1]. The LSTM neuron also input the value of the result of calculating the neuron at time H(t−1) (previous value; see description above for LST neuron) 20006 and the state vector of the neuron at time C(t−1) (previous value) 20008. Outputs of the neuron LSTM (shown in FIG. 20B) include the result of calculating the neuron at the present time H(t) 20118 and the state vector of the neuron at the present time C(t) 20120. The scheme includes:

- a "neuron O" assembled on the operational amplifiers U1 20094 and U2 20100, shown in FIG. 20A. Resistors R_Wo1 20018, R_Wo2 20016, R_Wo3 20012, R_Wo4 20010, R_Uop1 20014, R_Uom1 20020, Rr 20068 and Rf2 20066 set the weights of connections of the single "neuron O". The "neuron O" uses a sigmoid (module $X_1$ 20078, FIG. 20B) as a nonlinear function;
- a "neuron C" assembled on the operational amplifiers U3 20098 (shown in FIG. 20C) and U4 20100 (shown in FIG. 20A). Resistors R_Wc1 20030, R_Wc2 20028, R_Wc3 20024, R_Wc4 20022, R_Ucp1 20026, R_Ucm1 20032, Rr 20122, and Rf2 20120, set the weights of connections of the "neuron C". The "neuron C" uses a hyperbolic tangent (module X2 22080, FIG. 2B) as a nonlinear function;
- a "neuron I" assembled on the operational amplifiers U5 20102 and U6 20104, shown in FIG. 20C. Resistors R_Wi1 20042, R_Wi2 20040, R_Wi3 20036, and R_Wi4 20034, R_Uip1 20038, R_Uim1 20044, Rr 20124, and Rf2 20126 set the weights of connections of the "neuron I". The "neuron I" uses a sigmoid (module X3 20082) as a nonlinear function; and
- a "neuron f" assembled on the operational amplifiers U7 20106 and U8 20108, as shown in FIG. 20D. Resistors R_Wf1 20054, R_Wf2 20052, R_Wf3 20048, R_Wf4 20046, R_Ufp1 20050, R_Ufm1 20056, Rr 20128 and Rf2 20130 set the weights of connections of the "neuron f". The "neuron f" uses a sigmoid (module X4 20084) as a nonlinear function.

Figure 20B:
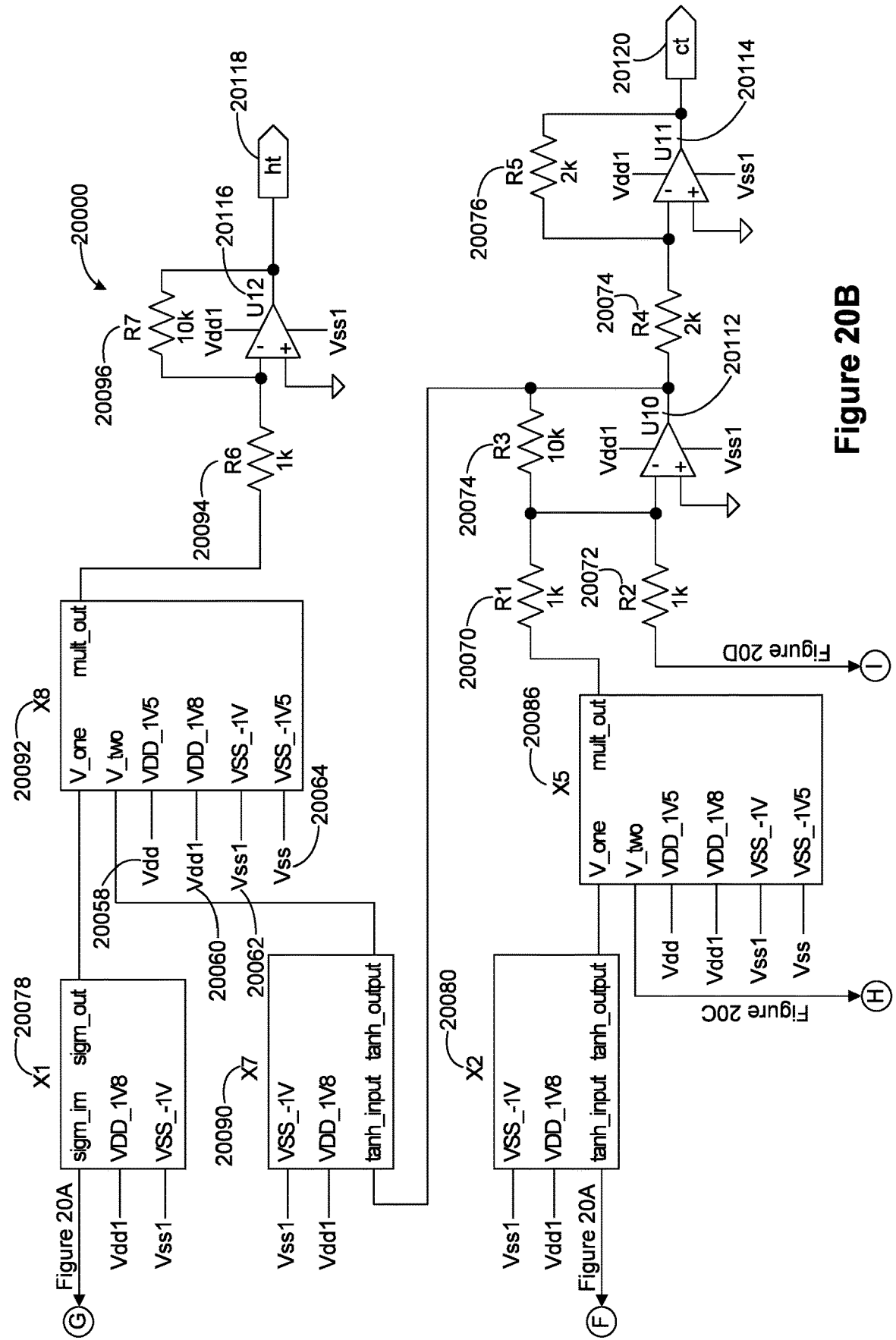
Figure 20C:
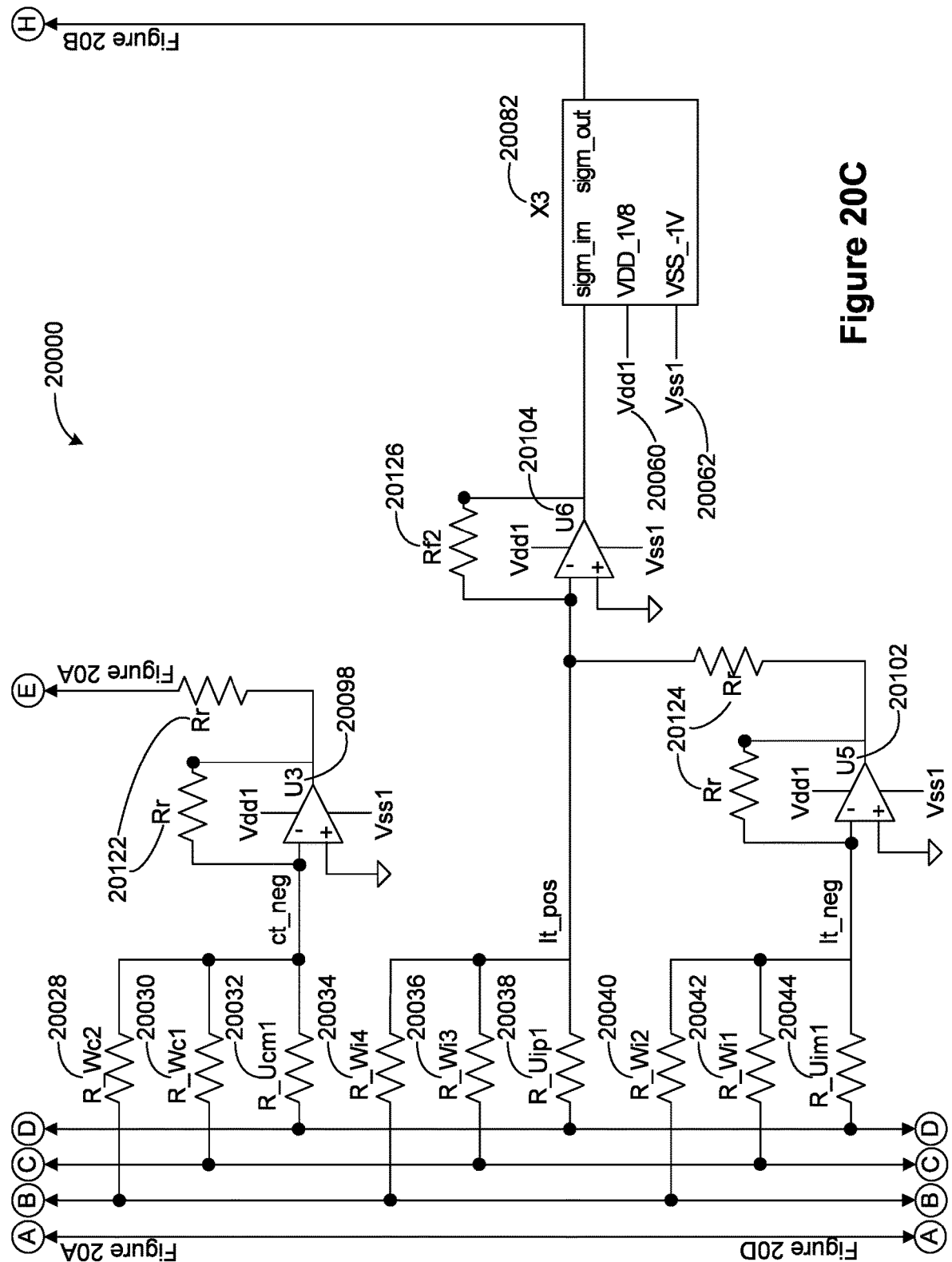
Figure 20D:
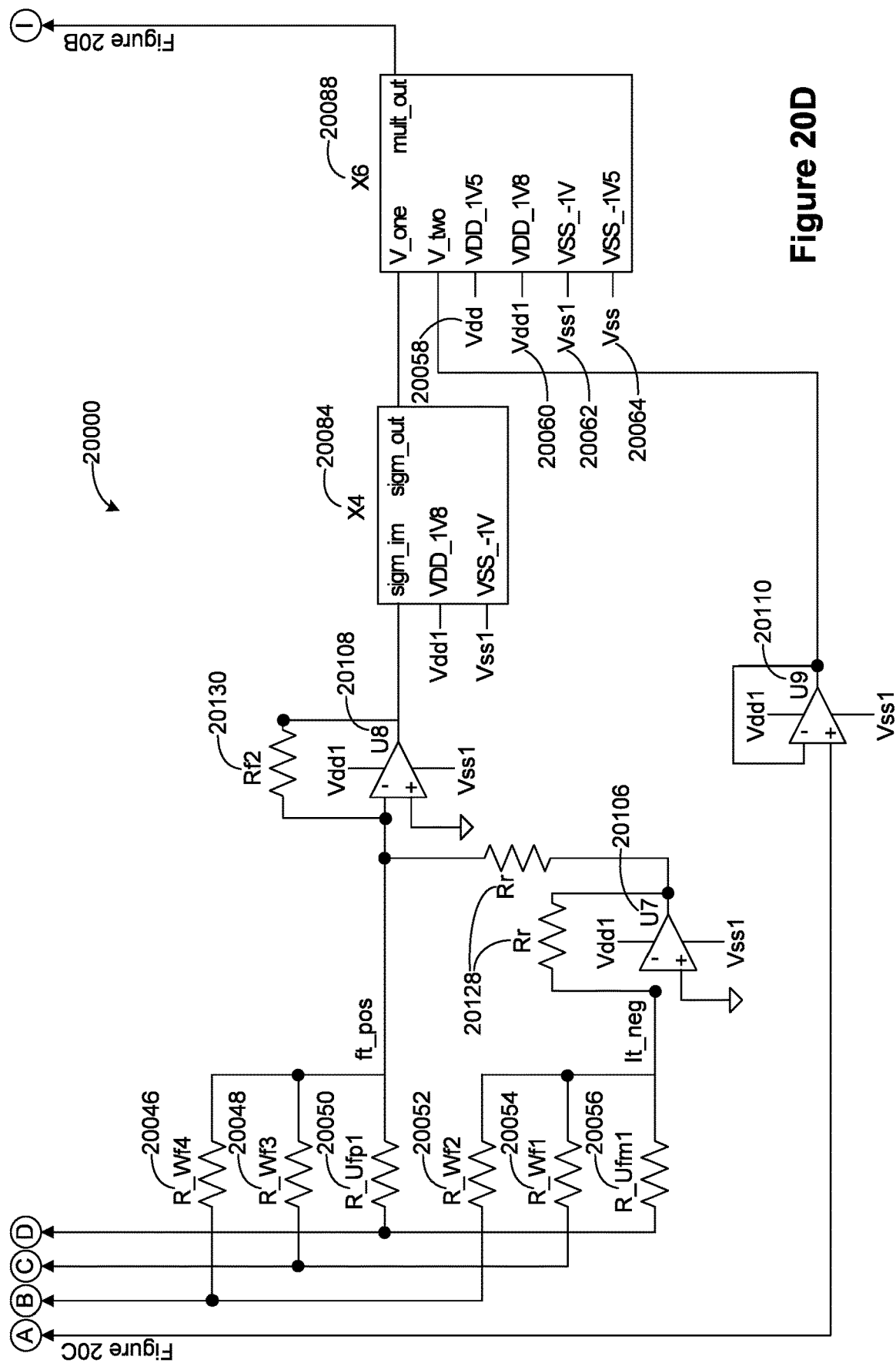

The outputs of modules X2 20080 (FIG. 20B) and X3 20082 (FIG. 20C) are input to the $X_5$ multiplier module 20086 (FIG. 20B). The outputs of modules X4 20084 (FIG. 20D) and buffer to U9 20010 are input to the multiplier module X6 20088. The outputs of the modules X5 20086 and X6 20088 are input to the adder (U10 20112). A divider 10 is assembled on the resistors R1 20070, R2 20072, and R3 20074. A nonlinear function of hyperbolic tangent (module X7 20090, FIG. 20B) is obtained with the release of the divisor signal. The output C(t) 20120 (a current state vector of the LSTM neuron) is obtained with the buffer-inverter on the U11 20114 output signal. The outputs of modules X1 20078 and X7 20090 is input to a multiplier (module X8 20092) whose output is input to a buffer divider by 10 on the U12 20116. The result of calculating the LSTM neuron at the present time H(t) 20118 is obtained from the output signal of U12 20116.

Figure 20E:
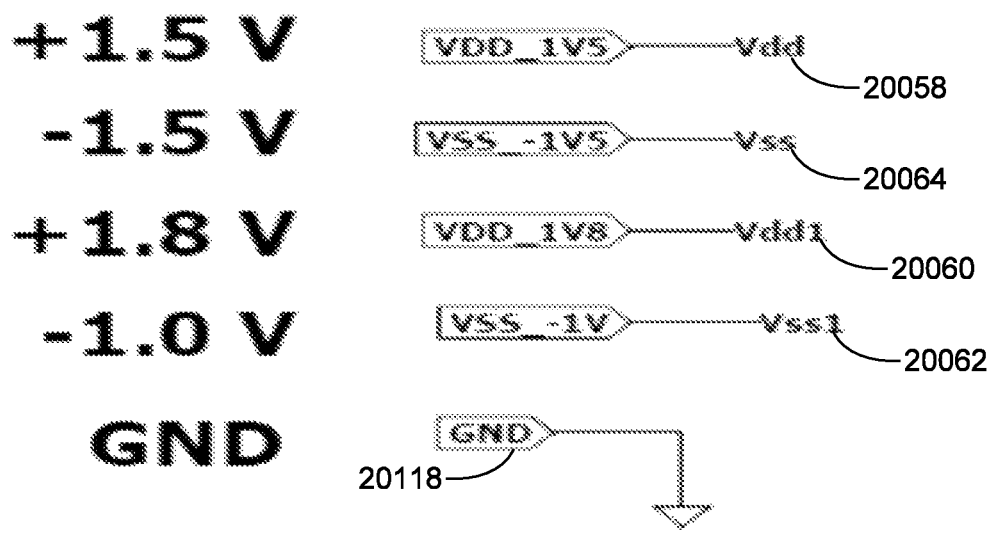

FIG. 20E shows example values for the different configurable parameters (e.g., voltages) for the circuit shown in FIGS. 20A-20D, according to some implementations. Vdd 20058 is set to +1.5V, Vss 20064 is set to −1.5V, Vdd1 20060 is set to +1.8V, Vss1 20062 is set to −1.0V, and GND 20118 is set to GND, according to some implementations.

FIG. 20F shows a table 20132 of description for the example circuit shown in FIG. 20A-20D, according to some implementations. The values for the parameters are provided as examples, and various other configurations are possible. The transistors U1-U12 are CMOS OpAmps (described above in reference to FIGS. 19A and 19B). X1, X3, and X4 are modules that perform the Sigmoid function. X2 and X7 are modules that perform the Hyperbolic Tangent function. X5 and X8 are modules that perform the multiplication function. Example resistor ratings include: Rw=10 kΩ, and Rr=1.25 kΩ The other resistor values are expressed relative to Rw. For example, Rf2=12 times Rw, R_Wo4=5 times Rw, R_Wo3=8 times Rw, R_Uop1=2.6 times Rw, R_Wo2=12 times Rw, R_W1=w times Rw, and R_Uom1=2.3 times Rw, R_wc4=4 times Rw, R_Wc3=5.45 times Rw, R_Ucp1=3 times Rw, R_Wc2=12 times Rw, R_Wc1=2.72 times Rw, R_Ucm1=3.7 times Rw, R_Wi4=4.8 times Rw, W_Wi3=6 times Rw, W_Uip1=2 times Rw, R_Wi2=12 times Rw, R_Wi1=3 times Rw, R_Uim1=2.3 times Rw, R_Wf4=2.2 times Rw, R_Wf3=5 times Rw, R_Wfp=4 times Rw, R_Wf2=2 times Rw, R_Wf1=5.7 times Rw, and Rfm1=4.2 times Rw.

Example Scheme of a Multiplier Block

FIGS. 21A-21I show a schematic diagram of a multiplier block 21000, according to some implementations. The neuron 21000 is based on the principle of a four-quadrant multiplier, assembled using operational amplifiers U1 21040 and U2 21042 (shown in FIG. 21B), U3 21044 (shown in FIG. 21H), and U4 21046 and U5 21048 (shown in FIG. 21I), and CMOS transistors M1 21052 through M68 21182. The inputs of the multiplier include V_one 21020 21006 and V_two 21008 (shown in FIG. 21B), and contact Vdd (positive supply voltage, e.g., +1.5 V relative to GND) 21004 and contact Vss (negative supply voltage, e.g., −1.5 V relative to GND) 21002. In this scheme, additional supply voltages are used: contact Input Vdd1 (positive supply voltage, e.g., +1.8 V relative to GND), contact Vss1 (negative supply voltage, e.g., −1.0 V relative to GND). The result of the circuit calculations are output at mult_out (output pin) 21170 (shown in FIG. 21I).

Figure 21A:
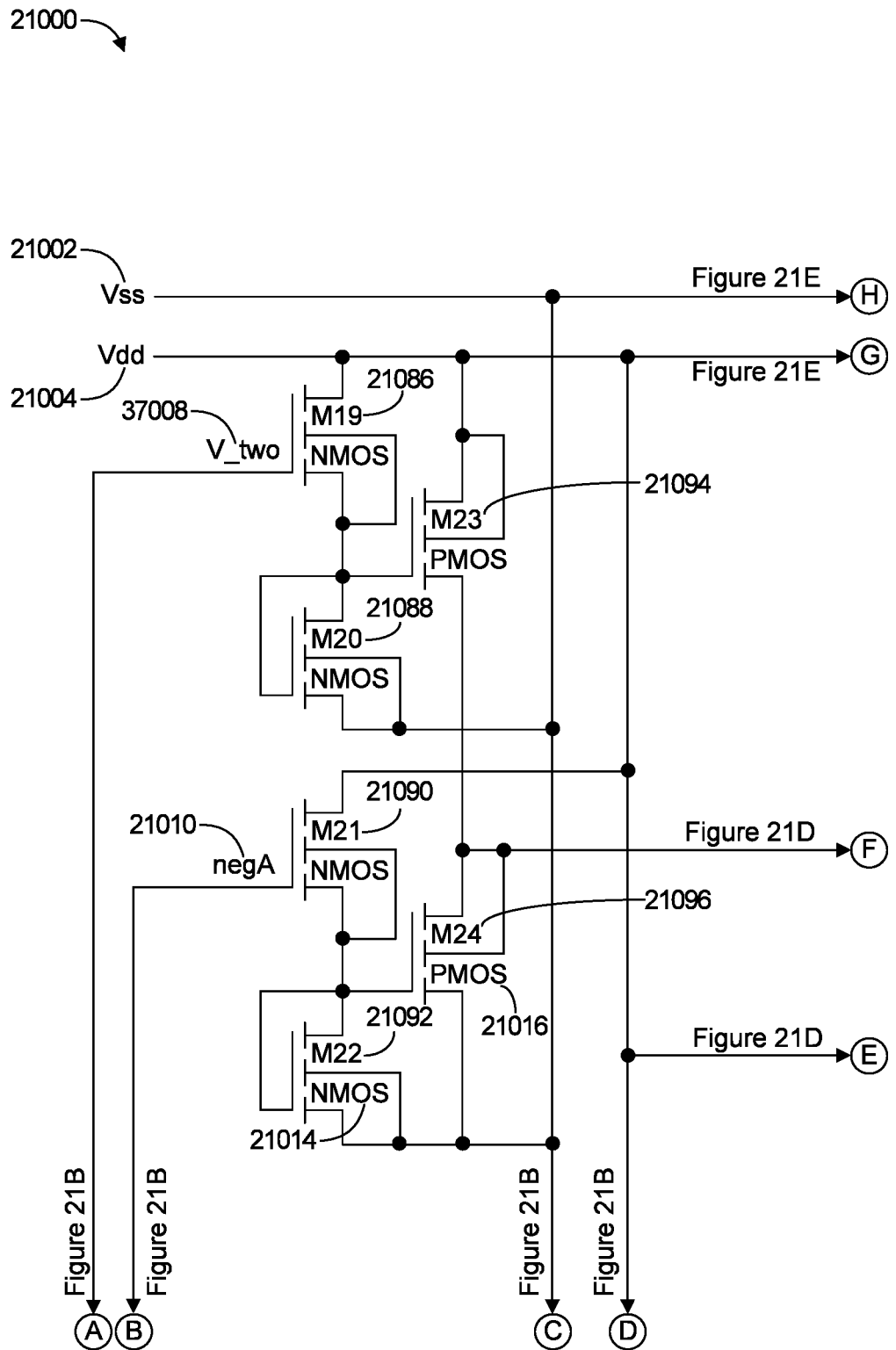
FIGS. 21A-21I show a schematic diagram of a multiplier block, according to some implementations.
Figure 21B:
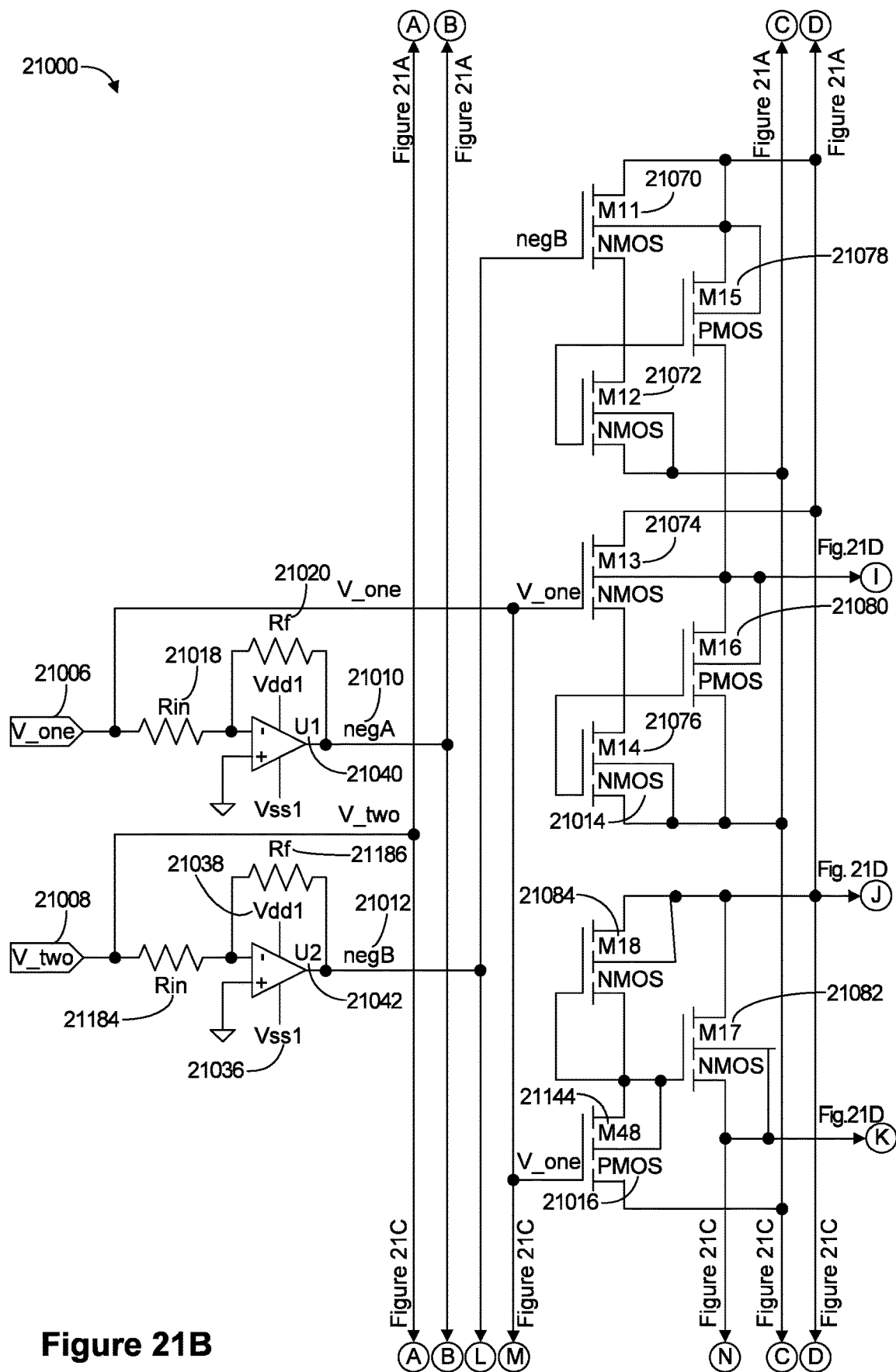
Figure 21C:
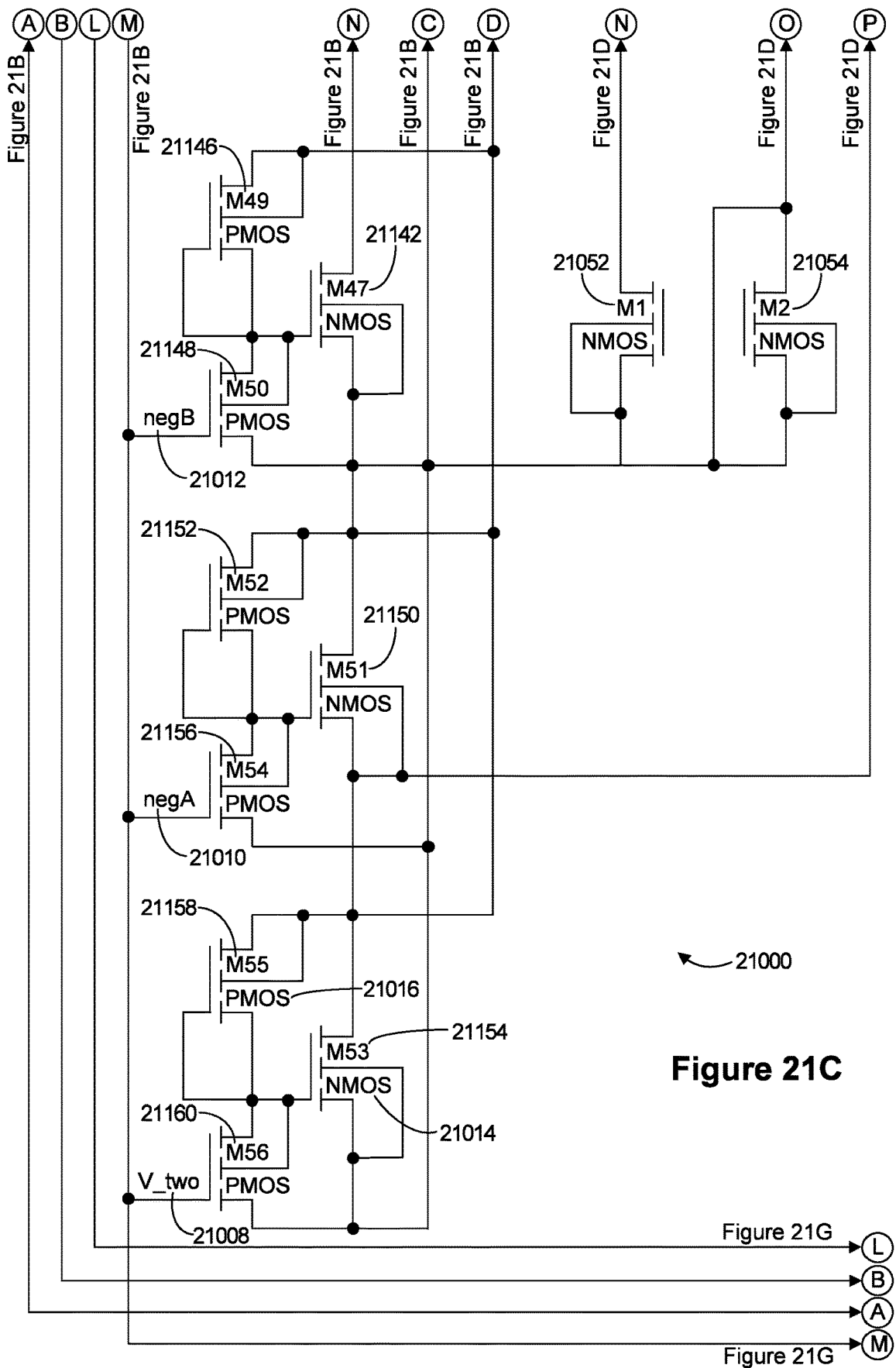

Referring to FIG. 21B, input signal (V_one) from V_one 21006 is connected to the inverter with a single gain made on U1 21040, the output of which forms a signal negA 21006, which is equal in amplitude, but the opposite sign with the signal V_one. Similarly, the signal (V_two) from the input V_two 21008 is connected to the inverter with a single gain made on U2 21042, the output of which forms a signal negB 21012 which is equal in amplitude, but the opposite sign with the signal V_two. Pairwise combinations of signals from possible combinations (V_one, V_two, negA, negB) are output to the corresponding mixers on CMOS transistors.

Figure 21D:
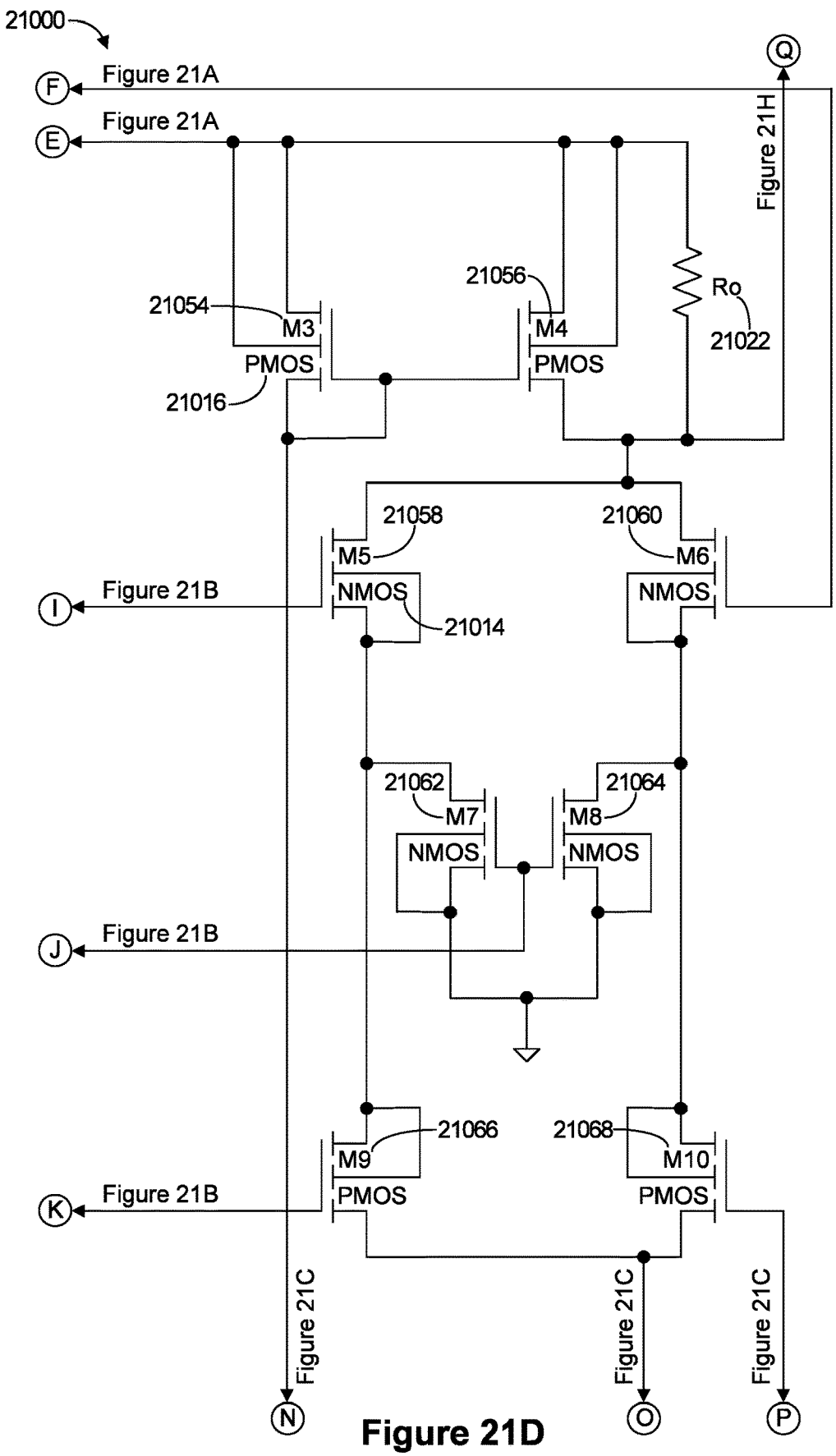
Figure 21E:
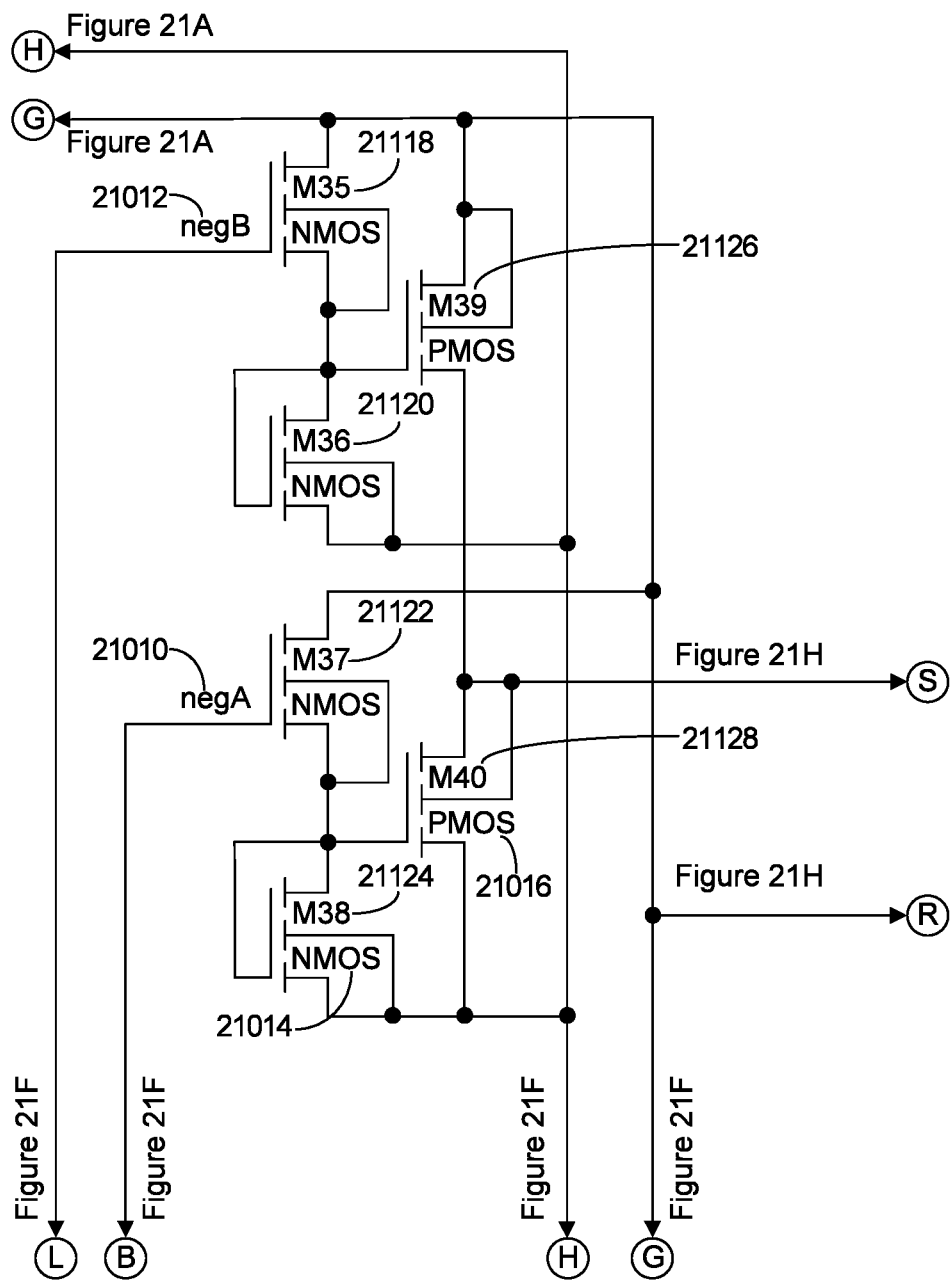
Figure 21F:
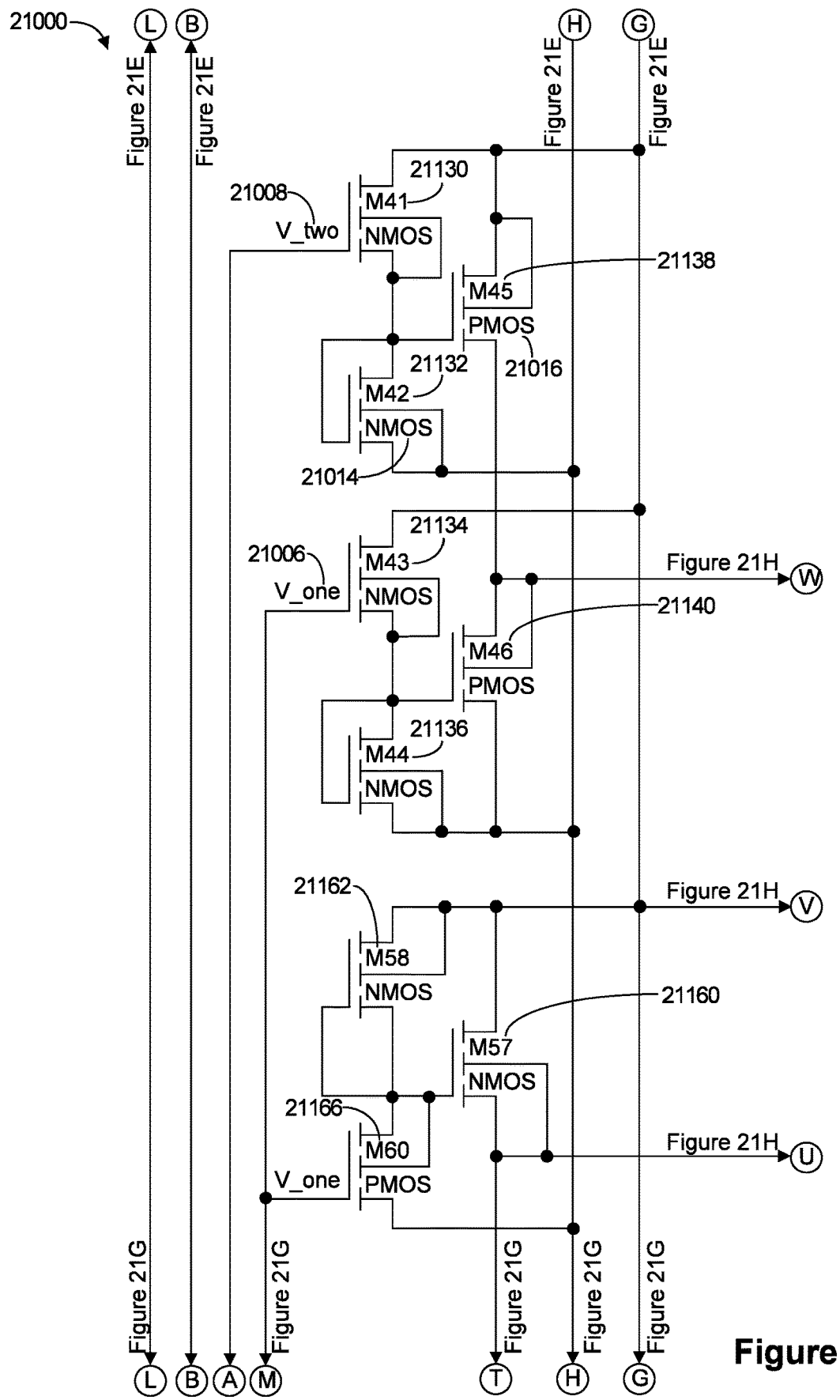
Figure 21G:
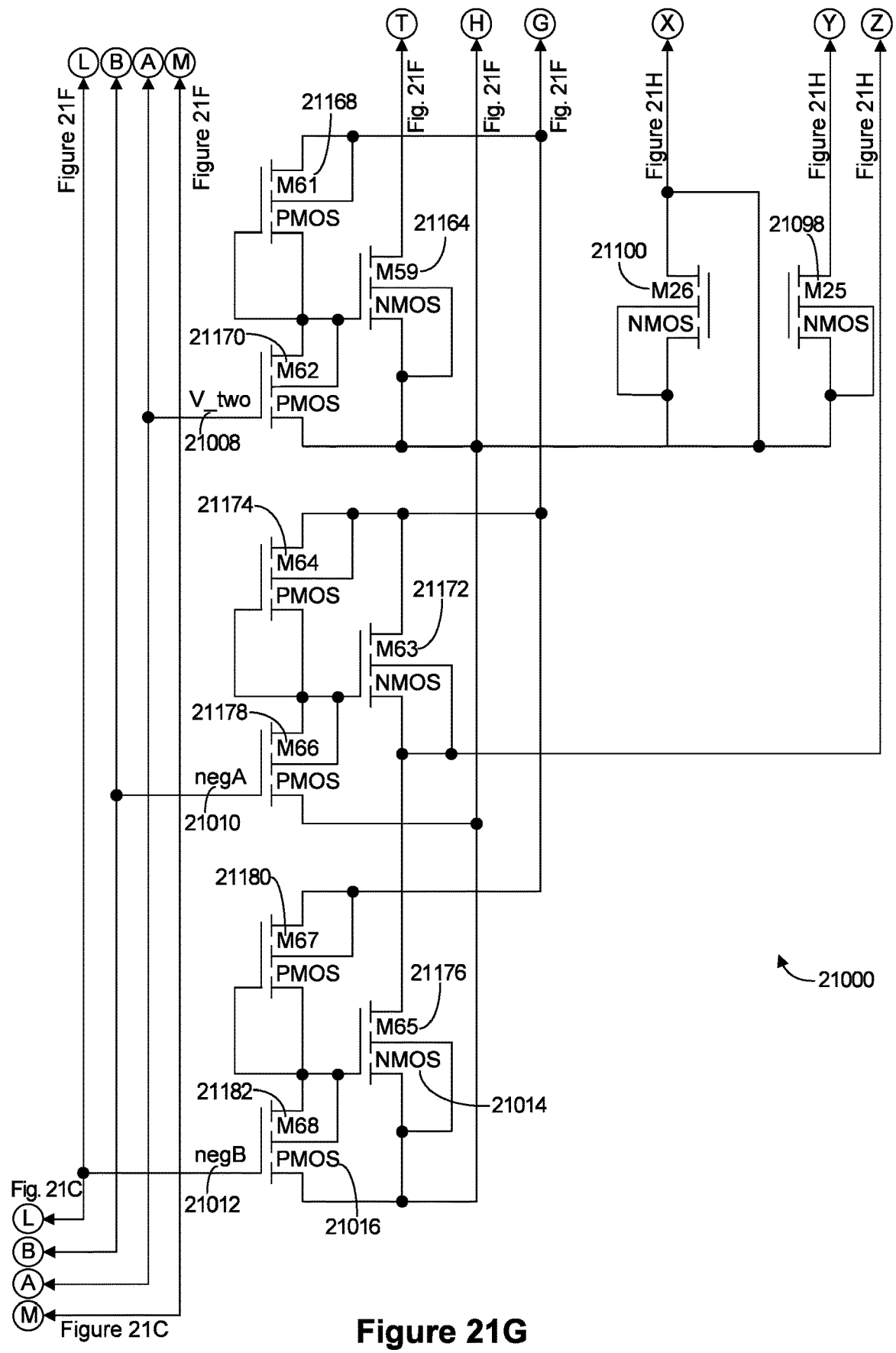
Figure 21H:
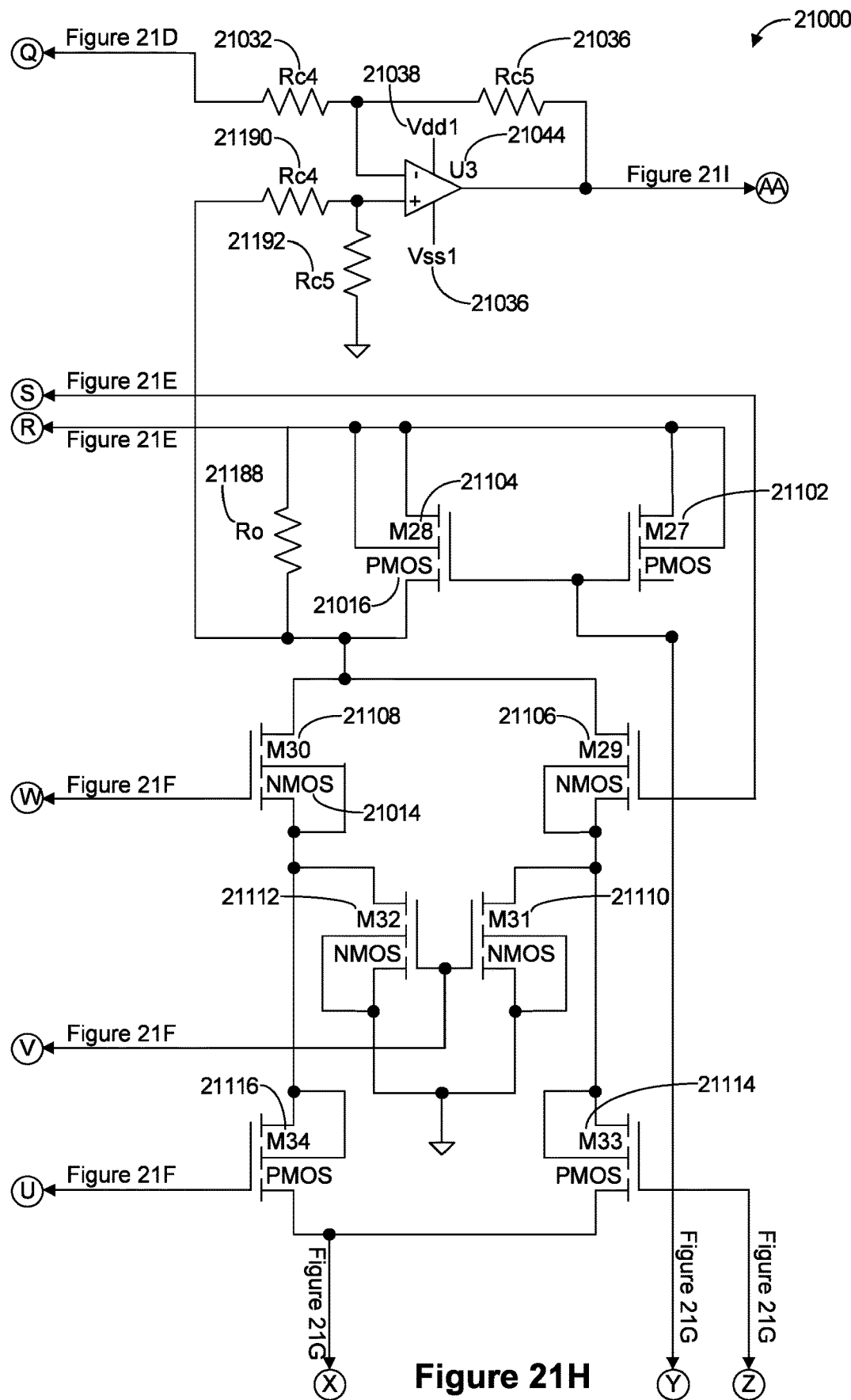

Referring back to FIG. 21A, V_two 21008 and negA 21010 are input to a multiplexer assembled on NMOS transistors M19 21086, M20 21088, M21 21090, M22 21092, and PMOS transistors M23 21094 and M24 21096. The output of this multiplexer is input to the NMOS transistor M6 21060 (FIG. 21D).

Similar transformations that occur with the signals include:
  negB 21012 and V_one 21020 are input to a multiplexer assembled on NMOS transistors M11 21070, M12 2072, M13 2074, M14 21076, and PMOS transistors M15 2078 and M16 21080. The output of this multiplexer is input to the M52 1058 NMOS transistor (shown in FIG. 21D);
  V_one 21020 and negB 21012 are input to a multiplexer assembled on PMOS transistors M18 21084, M48 21144, M49 21146, and M50 21148, and NMOS transistors M17 21082, M47 21142. The output of this multiplexer is input to the M9 PMOS transistor 21066 (shown in FIG. 21D);
  negA 21010 and V_two 21008 are input to a multiplexer assembled on PMOS transistors M52 21152, M54 21156, M55 21158, and M56 21160, and NMOS transistors M51 21150, and M53 21154. The output of this multiplexer is input to the M2 NMOS transistor 21054 (shown in FIG. 21C);
  negB 21012 and V_one 21020 are input to a multiplexer assembled on NMOS transistors M11 21070, M12 21072, M13 21074, and M14 21076, and PMOS transistors M15 21078, and M16 21080. The output of this multiplexer is input to the M10 NMOS transistor 21068 (shown in FIG. 21D);
  negB 21012 and negA 21010 are input to a multiplexer assembled on NMOS transistors M35 21118, M36 21120, M37 21122, and M38 21124, and PMOS transistors M39 21126, and M40 21128. The output of this multiplexer is input to the M27 PMOS transistor 21102 (shown in FIG. 21H);
  V_two 21008 and V_one 21020 are input to a multiplexer assembled on NMOS transistors M41 21130, M42 21132, M43 21134, and M44 21136, and PMOS transistors M45 21138, and M46 21140. The output of this multiplexer is input to the M30 NMOS transistor 21108 (shown in FIG. 21H);
  V_one 21020 and V_two 21008 are input to a multiplexer assembled on PMOS transistors M58 21162, M60 21166, M61 21168, and M62 21170, and NMOS transistors M57 21160, and M59 21164. The output of this multiplexer is input to the M34 PMOS transistor 21116 (shown in FIG. 21H); and
  negA 21010 and negB 21012 are input to a multiplexer assembled on PMOS transistors M64 21174, M66 21178, M67 21180, and M68 21182, and NMOS transistors M63 21172, and M65 21176. The output of this multiplexer is input to the PMOS transistor M33 21114 (shown in FIG. 21H).

Figure 21I:
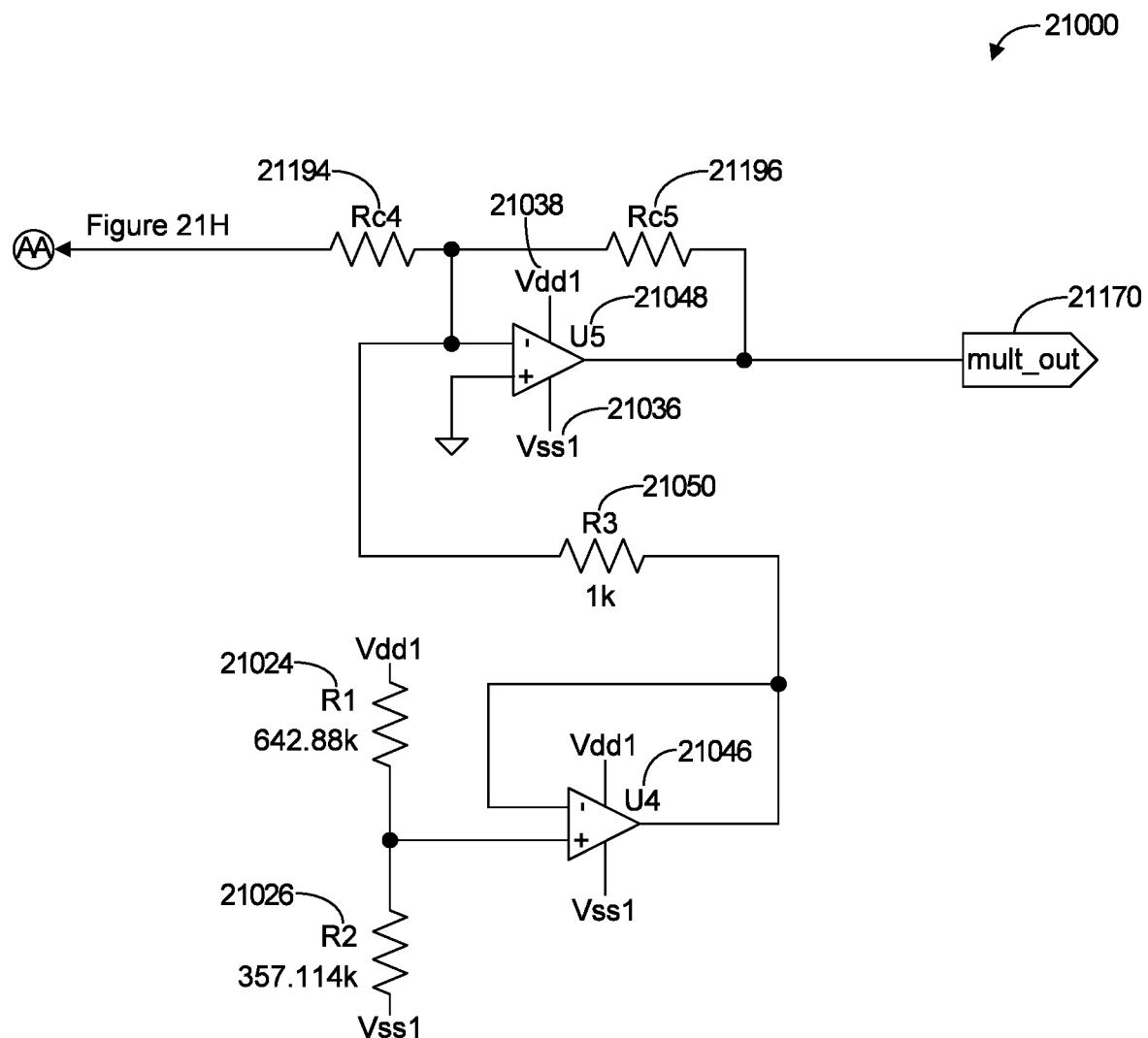

The current mirror (transistors M1 21052, M2 21053, M3 21054, and M4 21056) powers the portion of the four quadrant multiplier circuit shown on the left, made with transistors M5 21058, M6 21060, M7 21062, M8 21064, M9 21066, and M10 21068. Current mirrors (on transistors M25 21098, M26 21100, M27 21102, and M28 21104) power supply of the right portion of the four-quadrant multiplier, made with transistors M29 21106, M30 21108, M31 21110, M32 21112, M33 21114, and M34 21116. The multiplication result is taken from the resistor Ro 21022 enabled in parallel to the transistor M3 21054 and the resistor Ro 21188 enabled in parallel to the transistor M28 21104, supplied to the adder on U3 21044. The output of U3 21044 is supplied to an adder with a gain of 7,1, assembled on U5 21048, the second input of which is compensated by the reference voltage set by resistors R1 21024 and R2 21026 and the buffer U4 21046, as shown in FIG. 21I. The multiplication result is output via the Mult_Out output 21170 from the output of U5 21048.

FIG. 21J shows a table 21198 of description for the schematic shown in FIGS. 21A-21I, according to some implementations. U1-U5 are CMOS OpAmps. The N-Channel MOSFET transistors with explicit substrate connection include transistors M1, M2, M25, and M26 (with shutter ratio of length (L)=2.4 u, and shutter ratio of width (W)=1.26 u), transistors M5, M6, M29, and M30 (with L=0.36 u, and W=7.2 u), transistors M7, M8, M31, and M32 (with L=0.36 u, and W=199.98 u), transistors M11-M14, M19-M22, M35-M38, and M41-M44 (with L=0.36 u and W=0.4 u), and transistors M17, M47, M51, M53, M57, M59, M43, and M64 (with L=0.36 u and W=0.72 u). The P-Channel MOSFET transistors with explicit substrate connection include transistors M3, M4, M27, and M28 (with shutter ratio of length (L)=2.4 u, and shutter ratio of width (W)=1.26 u), transistors M9, M10, M33, and M34 (with L=0.36 u, and W=7.2 u), transistors M18, M48, M49, M50, M52, M54, M55, M56, M58, M60, M61, M62, M64, M66, M67, and M68 (with L=0.36 u, and W=0.8 u), and transistors M15, M16, M23, M24, M39, M40, M45, and M46 (with L=0.36 u and W=0.72 u). Example resistor ratings include Ro=1 kΩ, Rin=1 kΩ, Rf=1 kΩ, Rc4=2 kΩ, and Rc5=2 kΩ, according to some implementations.

Example Scheme of a Sigmoid Block

Figure 22A:
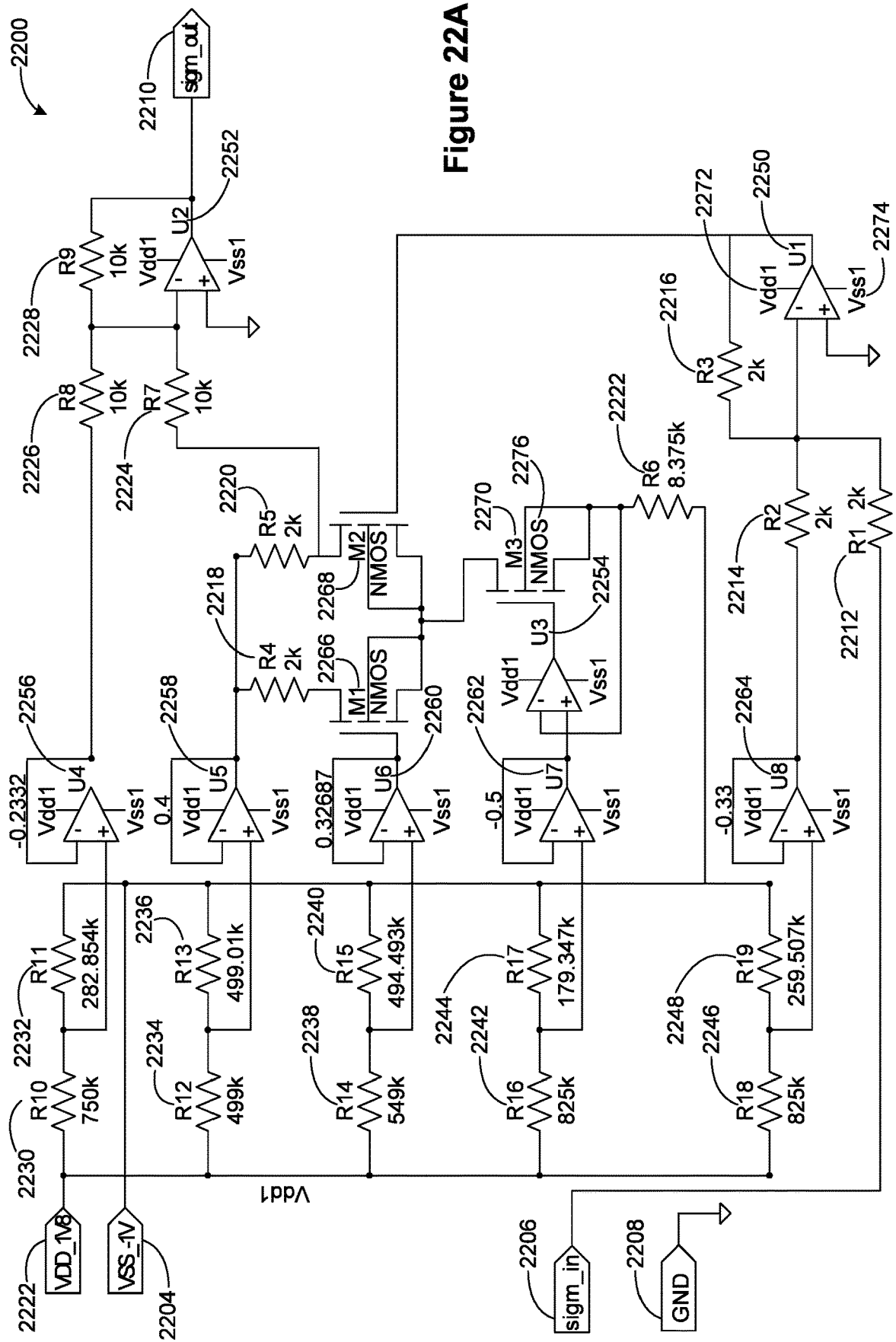
FIG. 22A shows a schematic diagram of a sigmoid neuron, according to some implementations.

FIG. 22A shows a schematic diagram of a sigmoid block 2200, according to some implementations. The sigmoid function (e.g., modules X1 20078, X3 20082, and X4 20084, described above in reference to FIGS. 20A-20F) is implemented using operational amplifiers U1 2250, U2 2252, U3 2254, U4 2256, U5 2258, U6 2260, U7 2262, and U8 2264, and NMOS transistors M1 2266, M2 2268, and M3 2270. Contact sigm_in 2206 is module input, contact Input Vdd1 2222 is positive supply voltage +1.8 V relative to GND 2208, and contact Vss1 2204 is negative supply voltage −1.0 V relative to GND. In this scheme, U4 2256 has a reference voltage source of −0.2332 V, and the voltage is set by the divider R10 2230 and R11 2232. The U5 2258 has a reference voltage source of 0.4 V, and the voltage is set by the divider R12 2234 and R13 2236. The U6 2260 has a reference voltage source of 0.32687 V, the voltage is set by the divider R14 2238 and R15 2240. The U7 2262 has a reference voltage source of −0.5 V, the voltage is set by the divider R16 2242 and R17 2244. The U8 2264 has a reference voltage source of −0.33 V, the voltage is set by the divider R18 2246 and R19 2248.

The sigmoid function is formed by adding the corresponding reference voltages on a differential module assembled on the transistors M1 2266 and M2 2268. A current mirror for a differential stage is assembled with active regulation operational amplifier U3 2254, and the NMOS transistor M3 2270. The signal from the differential stage is removed with the NMOS transistor M2 and resistor R5 2220 is input to the adder U2 2252. The output signal sigm_out 2210 is removed from the U2 adder 2252 output.

FIG. 22B shows a table 2278 of description for the schematic diagram shown in FIG. 22A, according to some implementations. U1-U8 are CMOS OpAmps. M1, M2, and M3 are N-Channel MOSFET transistors with a shutter ratio of length (L)=0.18 u, and shutter ration of width (W)=0.9 u, according to some implementations.

Example Scheme of a Hyperbolic Tangent Block

Figure 23A:
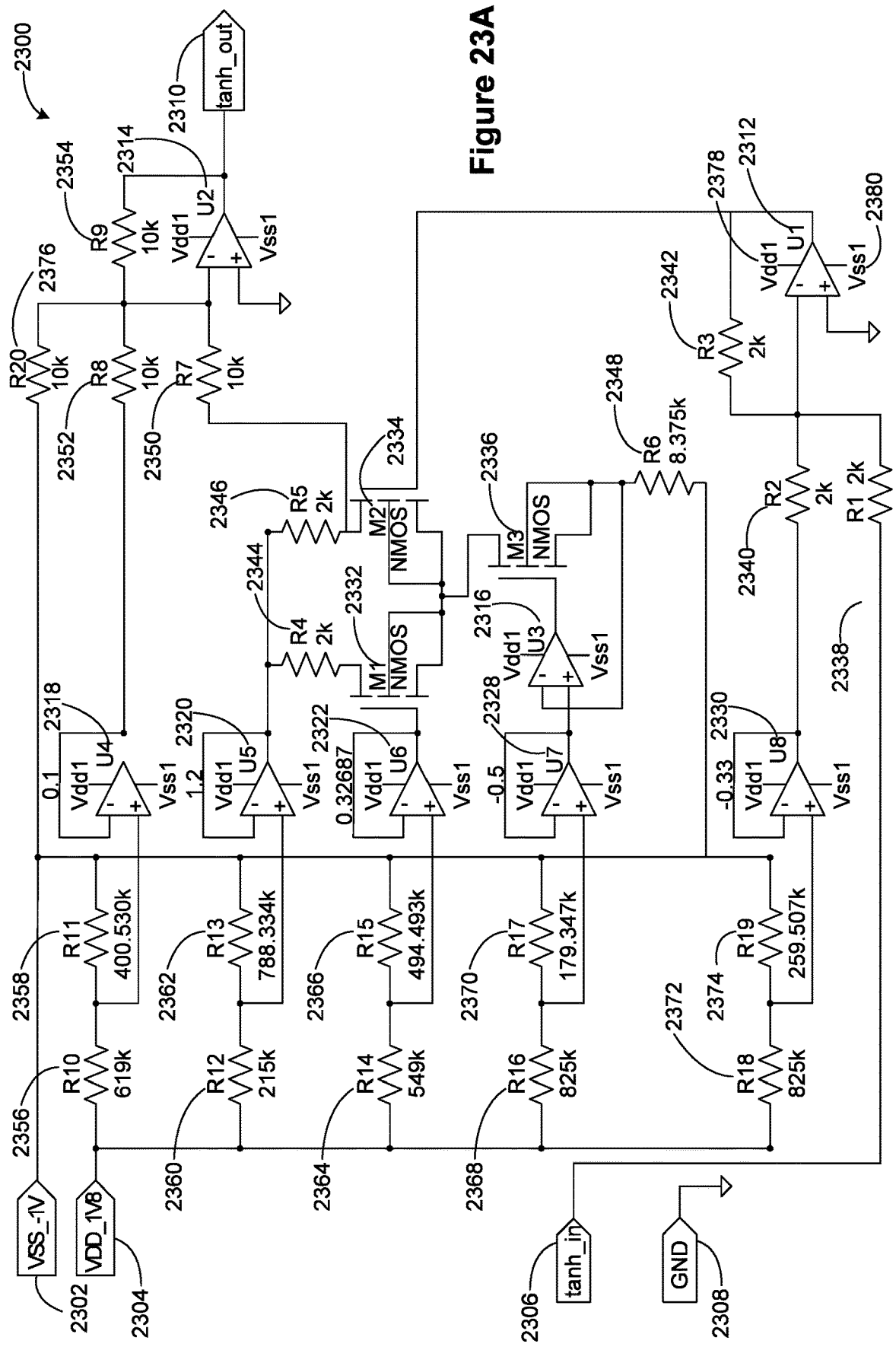
FIG. 23A shows a schematic diagram of a hyperbolic tangent function block, according to some implementations.

FIG. 23A shows a schematic diagram of a hyperbolic tangent function block 2300, according to some implementations. The hyperbolic tangent function (e.g., the modules X2 20080, and X7 20090 described above in reference to FIGS. 20A-20F) is implemented using operational amplifiers (U1 2312, U2 2314, U3 2316, U4 2318, U5 2320, U6 2322, U7 2328, and U8 2330) and NMOS transistors (M1 2332, M2 2334, and M3 2336). In this scheme, contact tanh in 2306 is module input, contact Input Vdd1 2304 is positive supply voltage +1.8 V relative to GND 2308, and contact Vss1 2302 is negative supply voltage −1.0 V relative to GND. Further, in this scheme, U4 2318 has a reference voltage source of −0.1 V, the voltage set by the divider R10 2356 and R11 2358. The U5 2320 has a reference voltage source of 1.2 V, the voltage set by the divider R12 2360 and R13 2362. The U6 2322 has a reference voltage source of 0.32687 V, the voltage set by the divider R14 2364 and R15 2366. The U7 2328 has a reference voltage source of −0.5 V, the voltage set by the divider R16 2368 and R17 2370. The U8 2330 has a reference voltage source of −0.33 V, the voltage set by the divider R18 2372 and R19 2374. The hyperbolic tangent function is formed by adding the corresponding reference voltages on a differential module made on transistors M1 2332 and M2 2334. A current mirror for a differential stage is obtained with active regulation operational amplifier U3 2316, and NMOS transistor M3 2336. With NMOS transistor M2 2334 and resistor R5 2346, the signal is removed from the differential stage and input to the adder U2 2314. The output signal tanh_out 2310 is removed from the U2 adder 2314 output.

FIG. 23B shows a table 2382 of description for the schematic diagram shown in FIG. 23A, according to some implementations. U1-U8 are CMOS OpAmps, and M1, M2, and M3 are N-Channel MOSFET transistors, with a shutter ratio of length (L)=0.18 u, and the shutter ratio of width (W)=0.9 u.

Example Scheme of a Single Neuron OP1 CMOS OpAmp

Figure 24A:
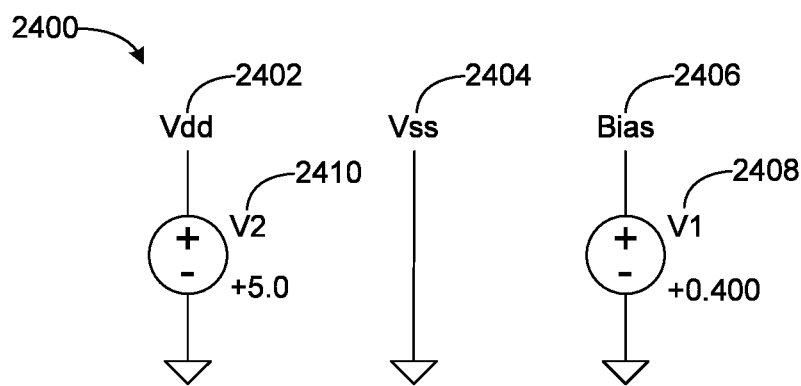
Figure 24B:
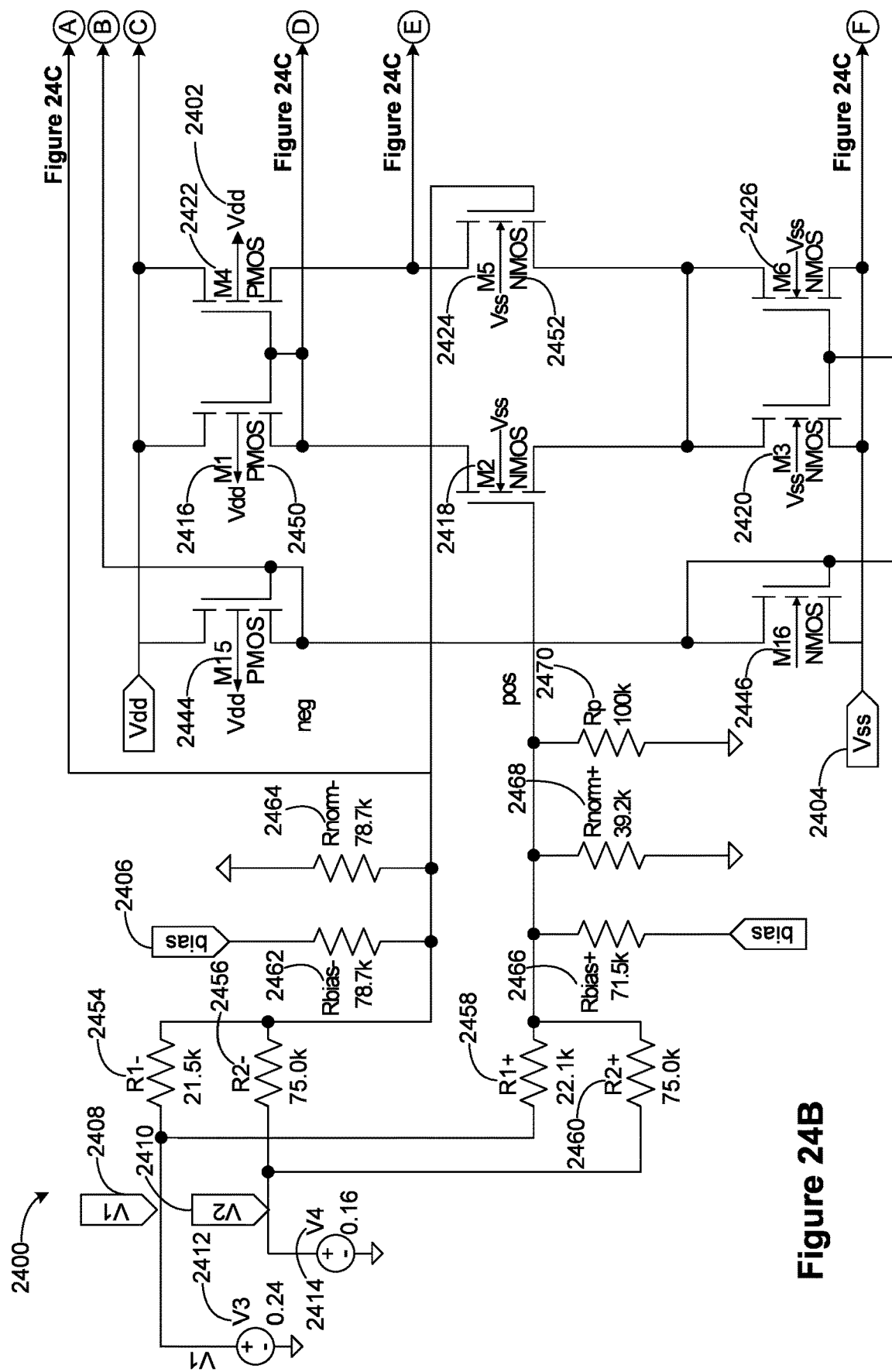

FIGS. 24A-24C show a schematic diagram of a single neuron OP1 CMOS OpAmp 2400, according to some implementations. The example is a variant of a single neuron on an operational amplifier, made on CMOS according to an OP1 scheme described herein. In this scheme, contacts V1 2410 and V2 2408 are inputs of a single neuron, contact bias 2406 is voltage +0.4 V relative to GND, contact Input Vdd 2402 is positive supply voltage +5.0 V relative to GND, contact Vss 2404 is GND, and contact Out 2474 is output of a single neuron. Parameters of CMOS transistors are determined by the ratio of geometric dimensions: L (the length of the gate channel), and W (the width of the gate channel). This Op Amp has two current mirrors. The current mirror on NMOS transistors M3 2420, M6 2426, and M13 2440 provides the offset current of the differential pair on NMOS transistors M2 2418 and M5 2424. The current mirror in the PMOS transistors M7 2428, M8 2430, and M15 2444 provides the offset current of the differential pair on the PMOS transistors M9 2432 and M10 2434. In the first differential amplifier stage, NMOS transistors M2 2418 and M5 2424 are amplifying, and PMOS transistors M1 2416 and M4 2422 play the role of active current load. From the M5 2424 transistor, the signal is output to the PMOS gate of the transistor M13 2440. From the M2 2418 transistor, the signal is output to the right input of the second differential amplifier stage on PMOS transistors M9 2432 and M10 2434. NMOS transistors M11 2436 and M12 2438 play the role of active current load for the M9 2432 and M10 2434 transistors. The M17 2448 transistor is switched on according to the scheme with a common source for a positive half-wave of the signal. The M18 2450 transistor is switched on according to the scheme with a common source for the negative half-wave of the signal. To increase the overall load capacity of the Op Amp, an inverter on the M17 2448 and M18 2450 transistors is enabled at the output of the M13 2440 and M14 2442 transistors.

FIG. 24D shows a table 2476 of description for the schematic diagram shown in FIG. 24A-24C, according to some implementations. The weights of the connections of a single neuron (with two inputs and one output) are set by the resistor ratio: w1=(Rp/R1+)−(Rn/R1−); w2=(Rp/R2+)−(Rn/R2−); w bias=(Rp/Rbias+)−(Rn/Rbias−). Normalizing resistors (Rnorm− and Rnorm+) are necessary to obtain exact equality: (Rn/R1−)+(Rn/R2−)+(Rn/Rbias−)+(Rn/Rnorm−)= (Rp/R1+)+(Rp/R2+)+(Rp/Rbias+)+(Rp/Rnorm+). N-Channel MOSFET transistors with explicit substrate connection include transistors M2 and M5 with L=0.36 u and W=3.6 u, transistors M3, M6, M11, M12, M14, and M16 with L=0.36 u and W=1.8 u, and transistor M18 with L=0.36 u and W=18 u. P-Channel MOSFET transistors with explicit substrate connection include transistors M1, M4, M7, M8, M13, and M15 with L=0.36 u and W=3.96 u, transistors M9 and M10 with L=0.36 u and W=11.88 u, and transistor M17 with L=0.36 u and W=39.6 u.

Example Scheme of a Single Neuron OP3 CMOS OpAmp

FIGS. 25A-25D show a schematic diagram of a variant of a single neuron 25000 on operational amplifiers, made on CMOS according to an OP3 scheme, according to some implementations. The single neuron consists of three simple operational amplifiers (OpAmps), according to some implementations. The unit Neuron adder is performed on two Opamps with bipolar power supply and the RELU activation function is performed on an OpAmp with unipolar power supply and with a gain of =10. Transistors M1 25028-M16 25058 are used for summation of negative connections of the neuron. Transistors M17 25060-M32 25090 are used for adding the positive connections of the neuron. The RELU activation function is performed on the transistors M3 325092-M46 25118. In the scheme, contacts V1 25008 and V2 25010 are inputs of the single neuron, contact bias 25002 is voltage +0.4 V relative to GND, contact Input Vdd 25004 is positive supply voltage +2.5 V relative to GND, contact Vss 25006 is negative supply voltage −2.5 V, and contact Out 25134 is output of the single neuron. Parameters of CMOS transistors used in a single neuron are determined by the ratio of geometric dimensions: L (the length of the gate channel) and W (the width of the gate channel). Consider the operation of the simplest OpAmp included in a single neuron. Each op amp has two current mirrors. The current mirror on NMOS transistors M3 25032 (M19 25064, M35 25096), M6 25038 (M22 25070, M38 25102) and M16 25058 (M32 25090, M48 25122) provides the offset current of the differential pair on NMOS transistors M2 25030 (M18 25062, M34 25094) and M5 25036 (M21 25068, M35 25096). The current mirror in PMOS transistors M7 25040 (M23 25072, M39 25104), M8 25042 (M24 25074, M40 25106) and M15 25056 (M3 12588) provides the offset current of the differential pair on PMOS transistors M9 25044 (M25 25076, M41 25108) and M10 25046 (M26 25078, M42 25110). In the first differential amplifier stage, NMOS transistors M2 25030 (M18 25062, M34 25094) and M5 25036 (M21 25068, M37 25100) are amplifying, and PMOS transistors M1 25028 (M17 25060, M33 25092) and M4 25034 (M20 25066, M36 25098) play the role of active current load. From the transistor M5 25036 (M21 25068, M37 25100), the signal is input to the PMOS gate of the transistor M13 25052 (M29 25084, M45 25116). From the transistor M2 25030 (M18 25062, M34 25094), the signal is input to the right input of the second differential amplifier stage on PMOS transistors M9 25044 (M25 25076, M41 25108) and M10 25046 (M26 25078, M42 25110). NMOS transistors M11 25048 (M27 25080, M43 25112) and M12 25048 (M28 25080, M44 25114) play the role of active current load for transistors M9 25044 (M25 25076, M41 25108) and M10 25046 (M26 25078, M42 25110). Transistor M13 25052 (M29 25082, M45 25116) is included in the scheme with a common source for a positive half-wave signal. The transistor M14 25054 (M30 25084, M46 25118) is switched on according to the scheme with a common source for the negative half-wave of the signal.

The weights of the connections of a single neuron (with two inputs and one output) are set by the resistor ratio: w1=(R feedback/R1+)−(R feedback/R1−); w2=(R feedback/R2+)−(R feedback/R2−); wbias=(R feedback/Rbias+)−(R feedback/Rbias−); w1=(R p*K amp/R1+)−(R n*K amp/R1−); w2=(R p*K amp/R2+)−(R n*K amp/R2−); wbias=(R p*K amp/Rbias+)−(R n*K amp/Rbias−), where K amp=R1ReLU/R2ReLU. R feedback=100 k—used only for calculating w1, w2, wbias. According to some implementations, example values include: R feedback=100 k, Rn=Rp=Rcom=10 k, K amp ReLU=1+90 k/10 k=10, w1= (10 k*10/22.1 k)−(10 k*10/21.5 k)=−0.126276, w2=(10 k*10/75 k)−(10 k*10/71.5 k)=−0.065268, wbias=(10 k*10/71.5 k)−(10 k*10/78.7 k)=0.127953.

The input of the negative link adder of the neuron (M1-M17) is received from the positive link adder of the neuron (M17-M32) through the Rcom resistor.

Figure 25A:
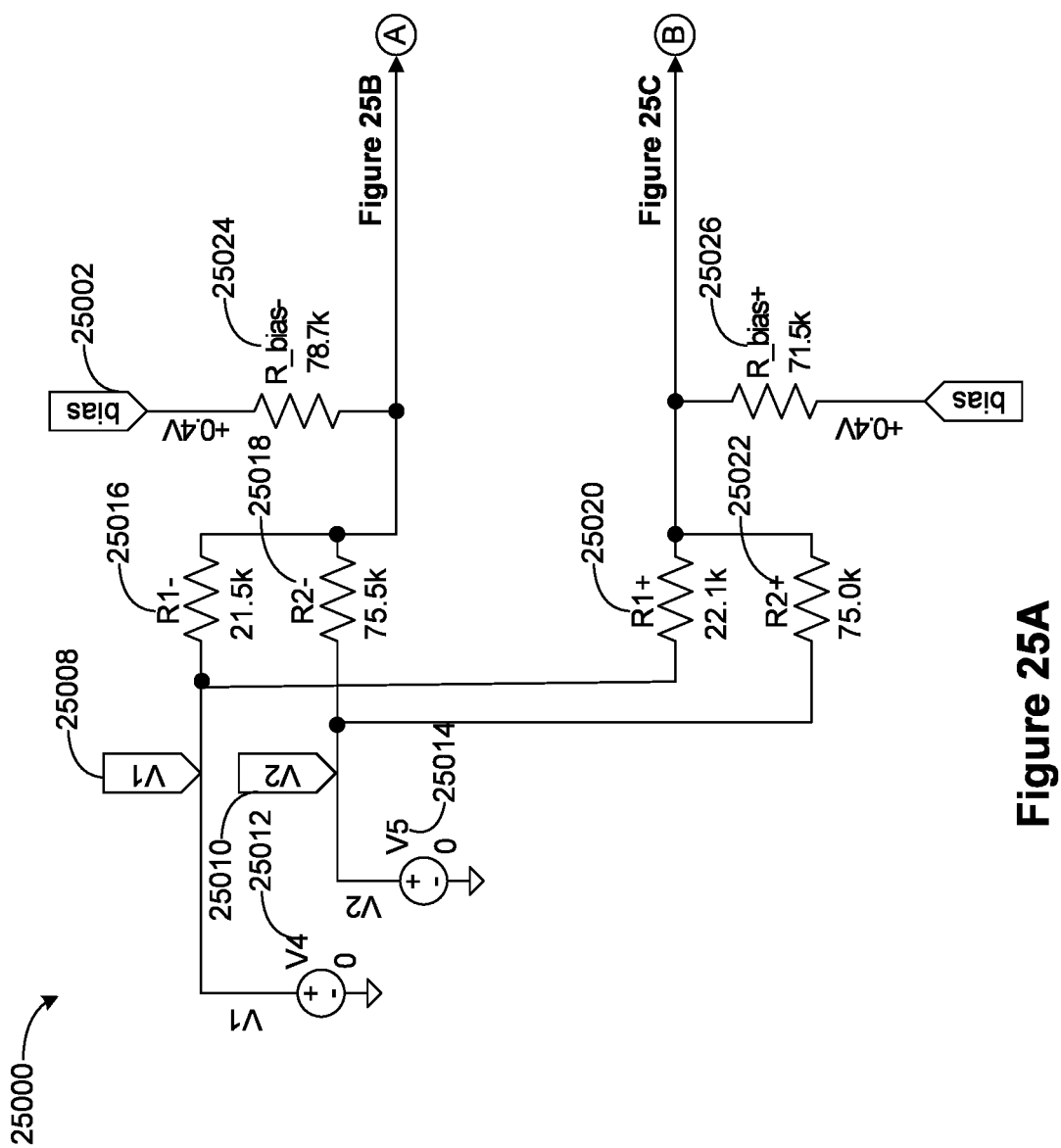
FIGS. 25A-25D show a schematic diagram of a variant of a single neuron CMOS operational amplifiers according to some implementations.
Figure 25B:
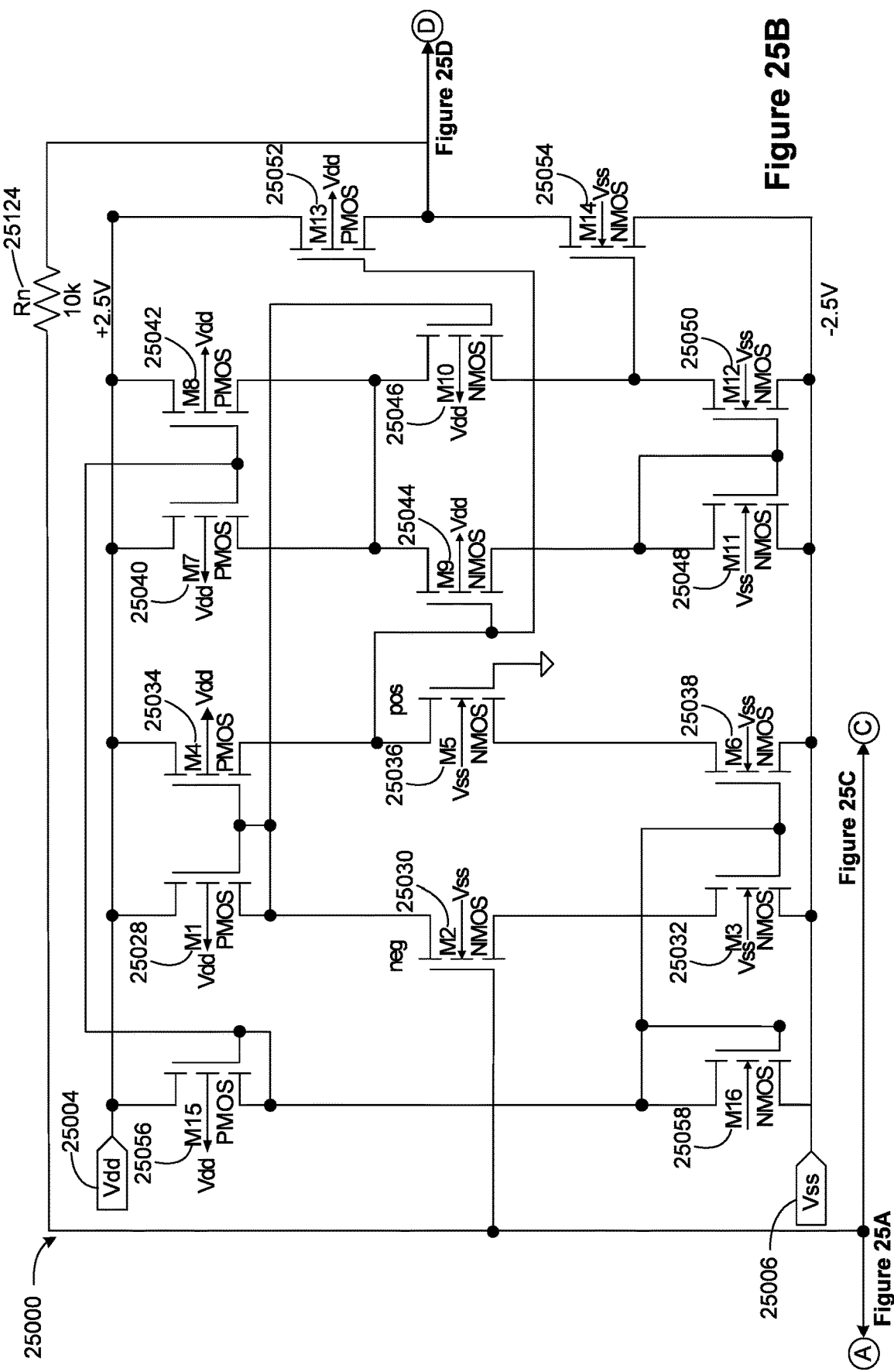
Figure 25C:
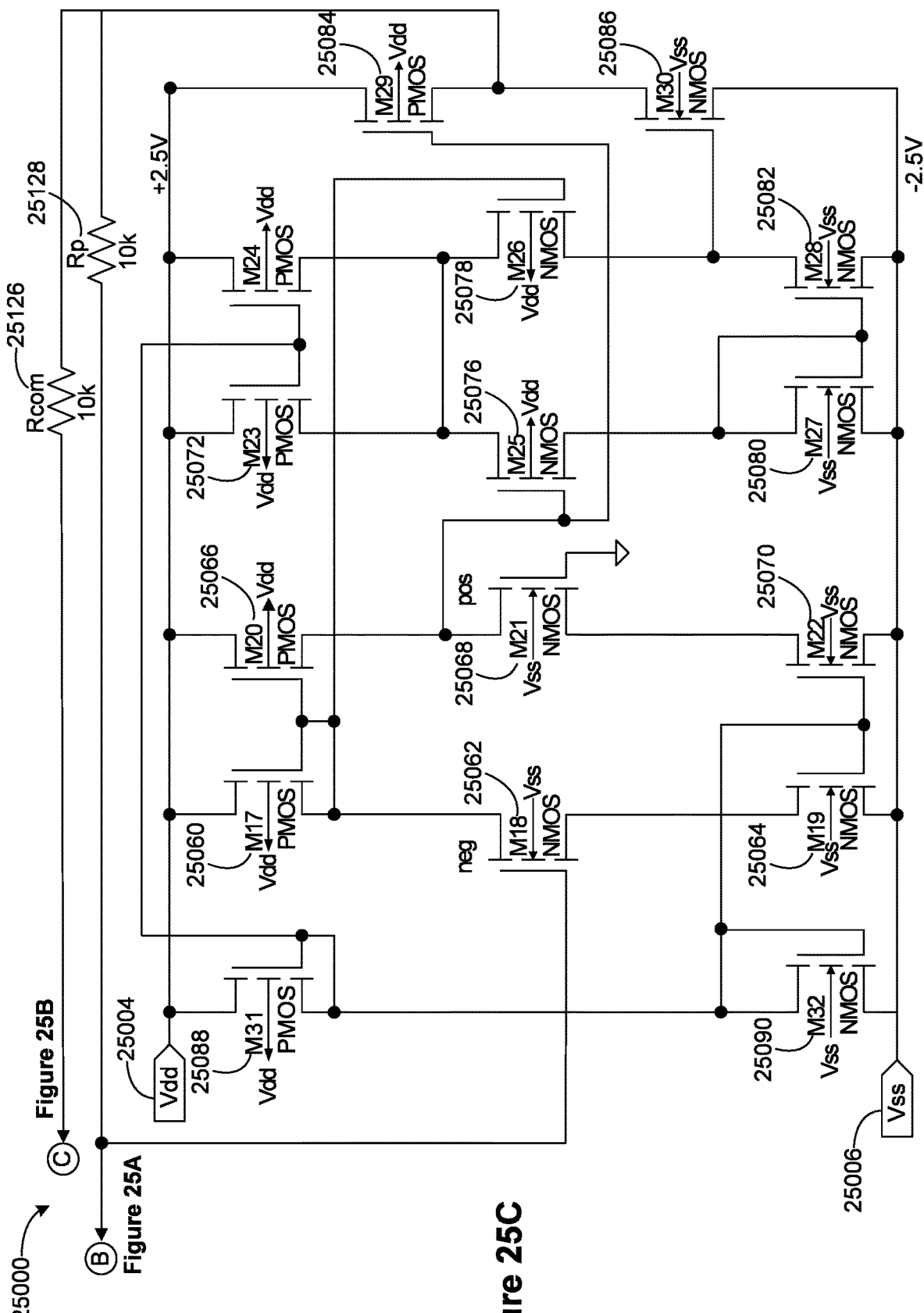
Figure 25D:
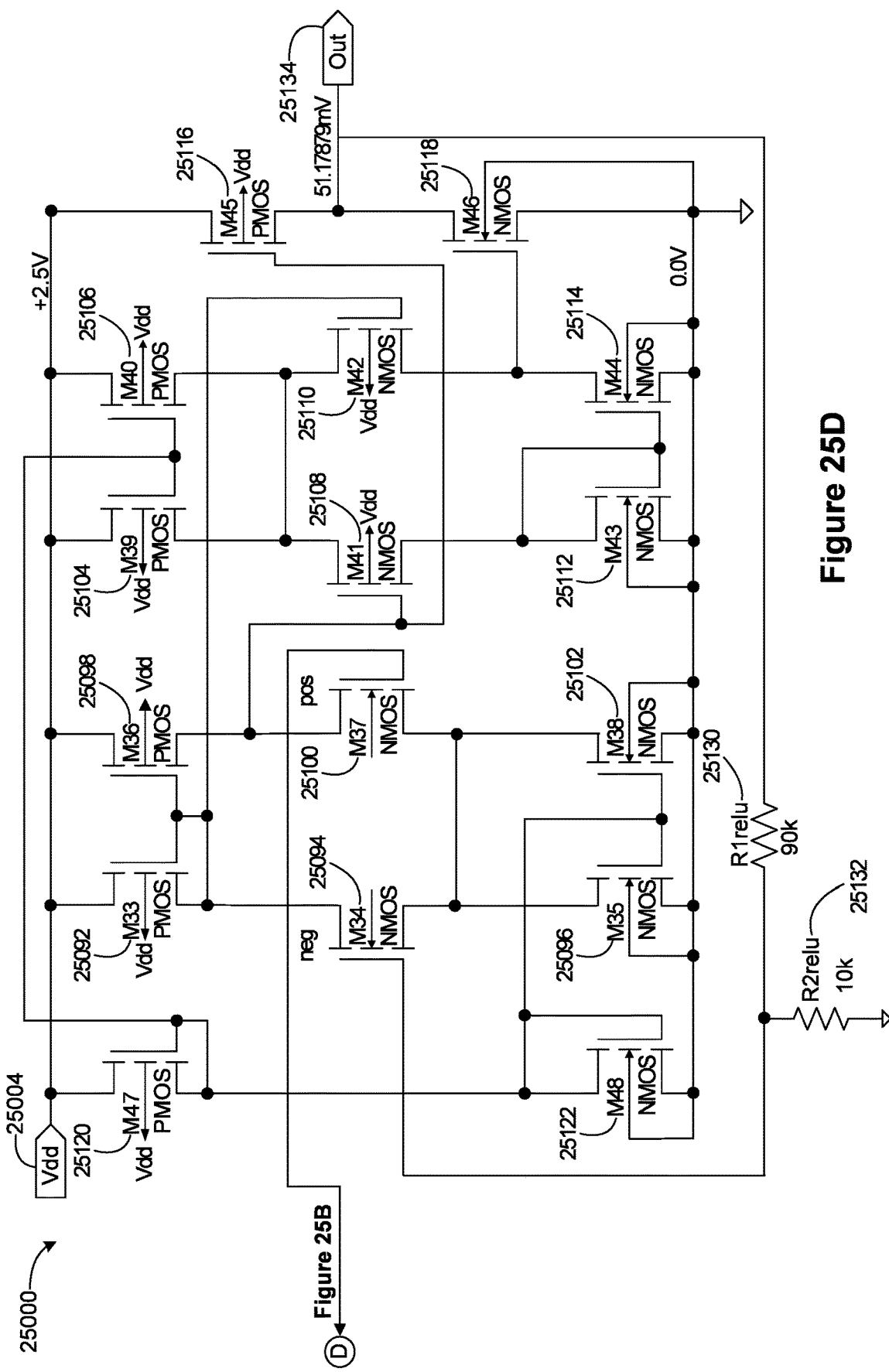
Figure 26A:
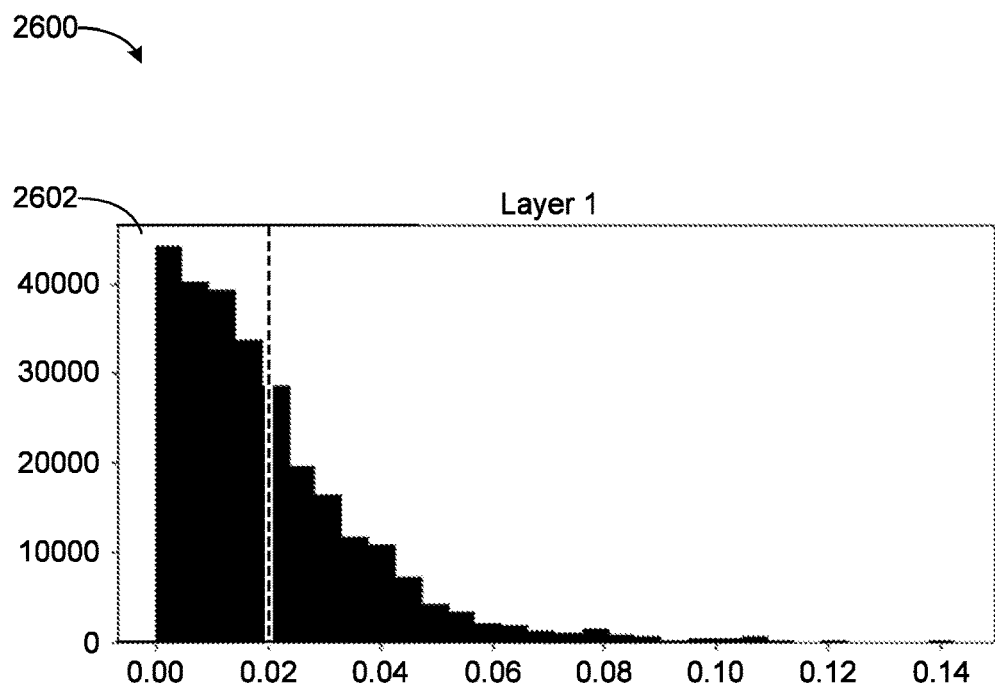
FIGS. 26A-26K show example weight distribution histograms, according to some implementations.
Figure 26B:
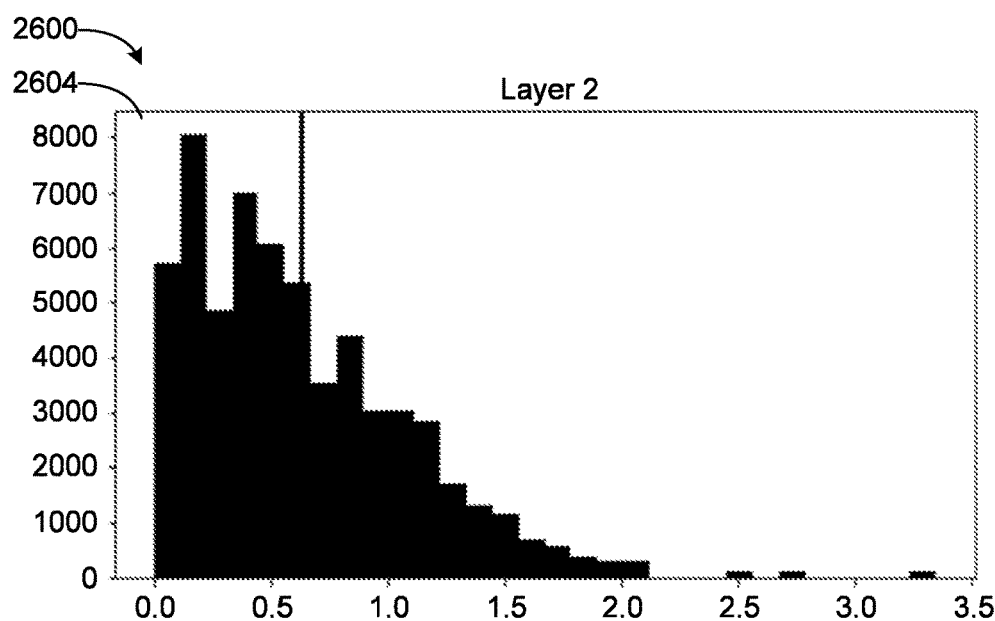
Figure 26C:
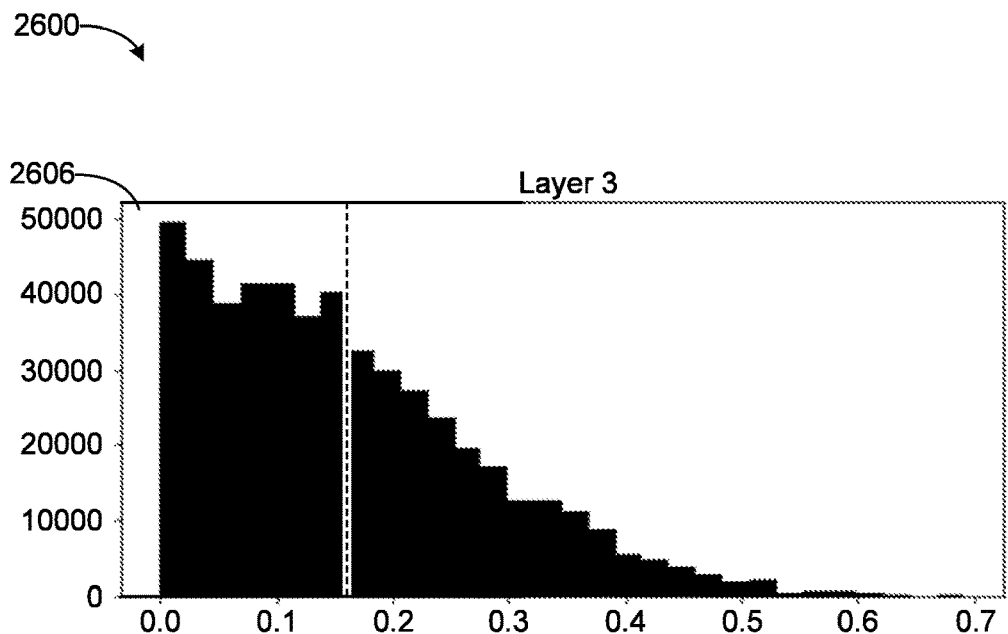
Figure 26D:
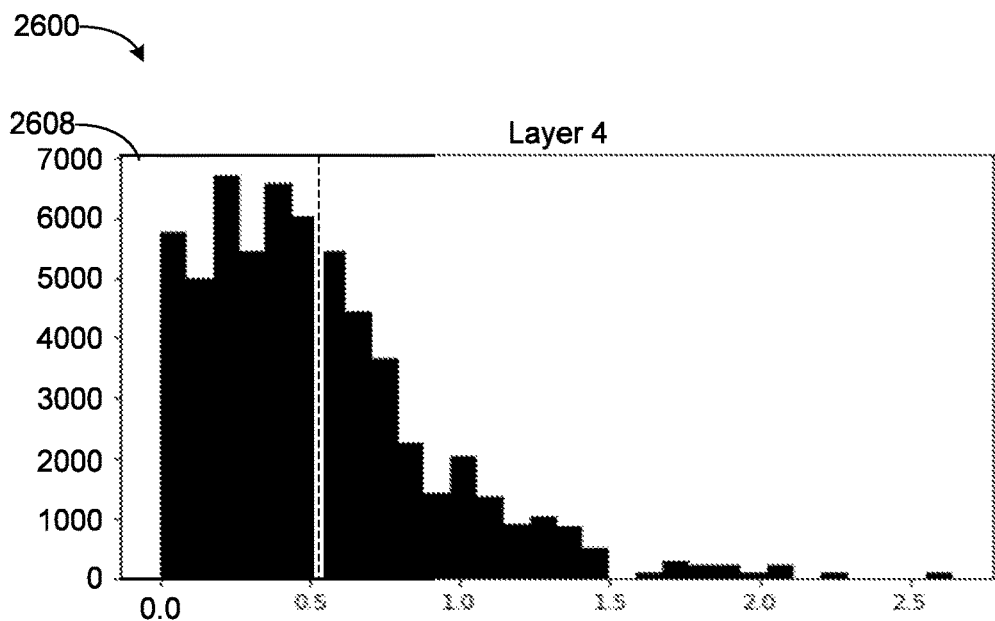
Figure 26E:
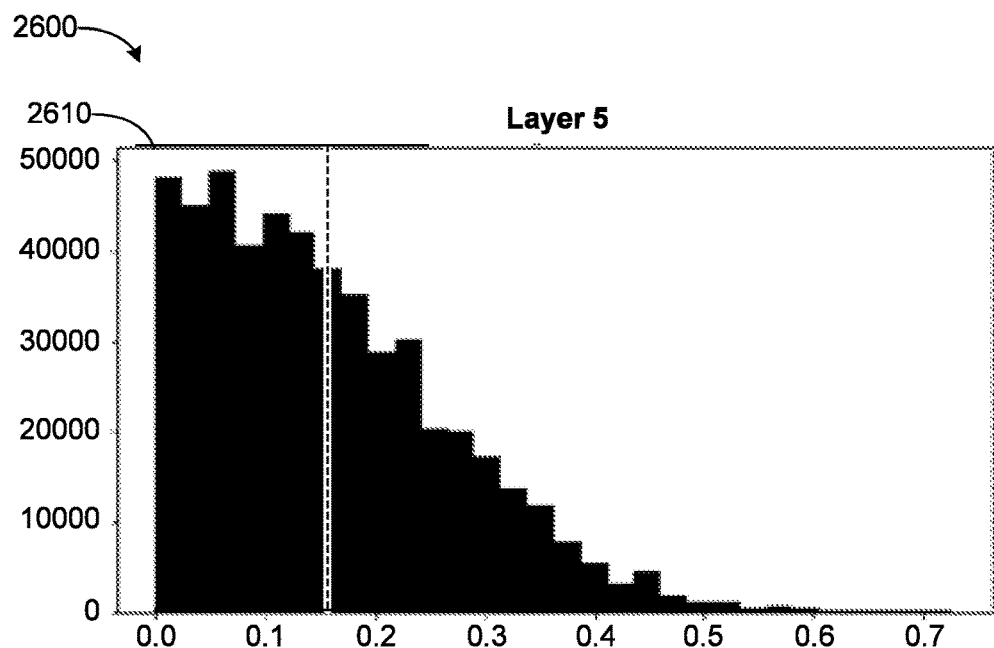
Figure 26F:
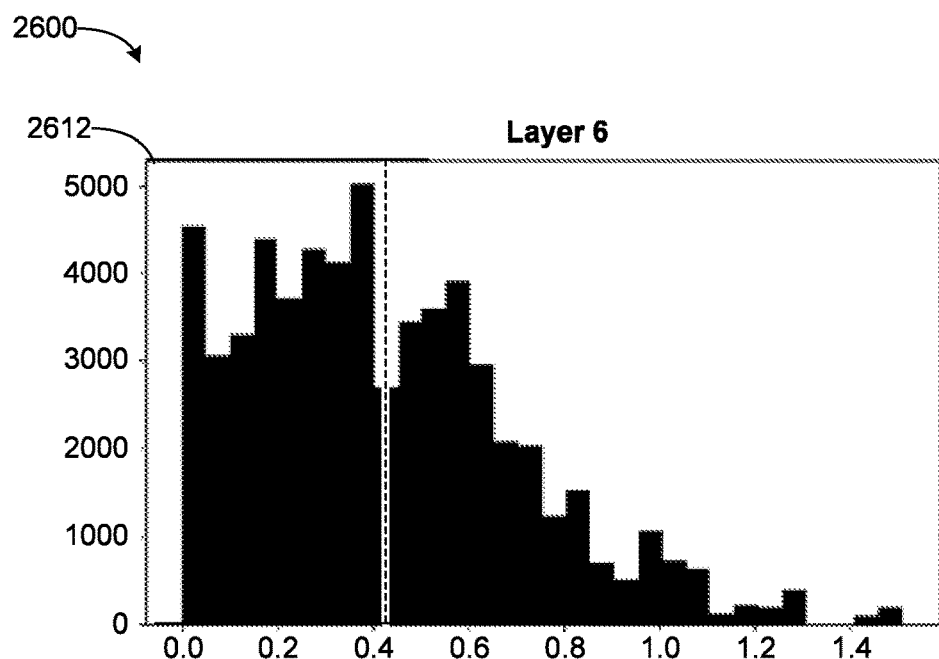
Figure 26G:
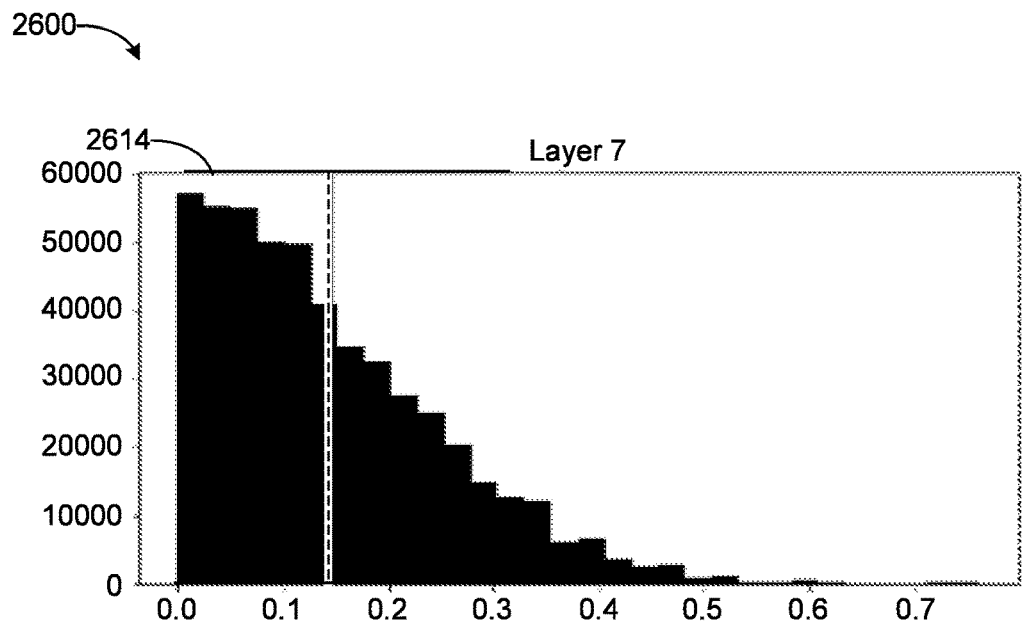
Figure 26H:
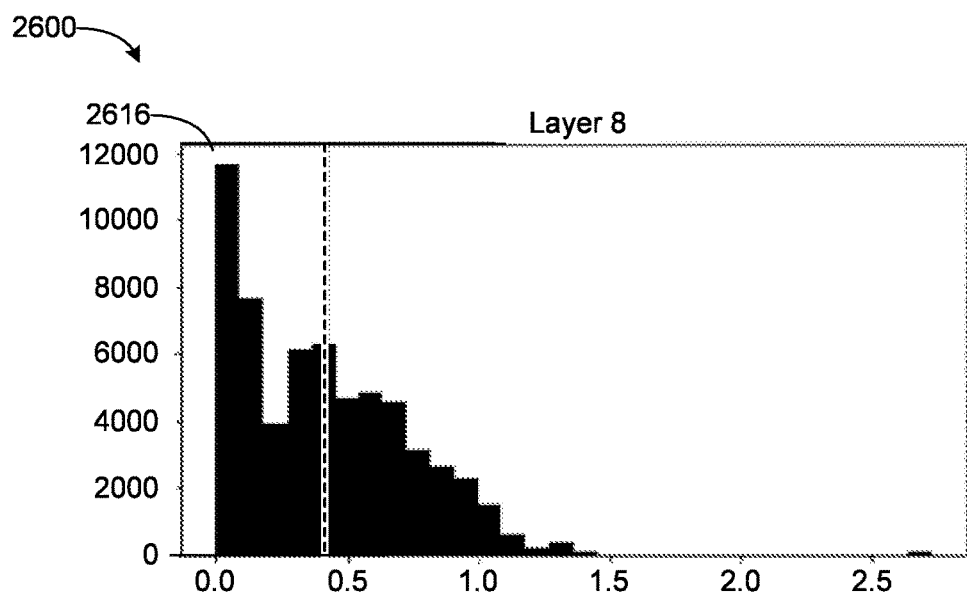
Figure 26I:
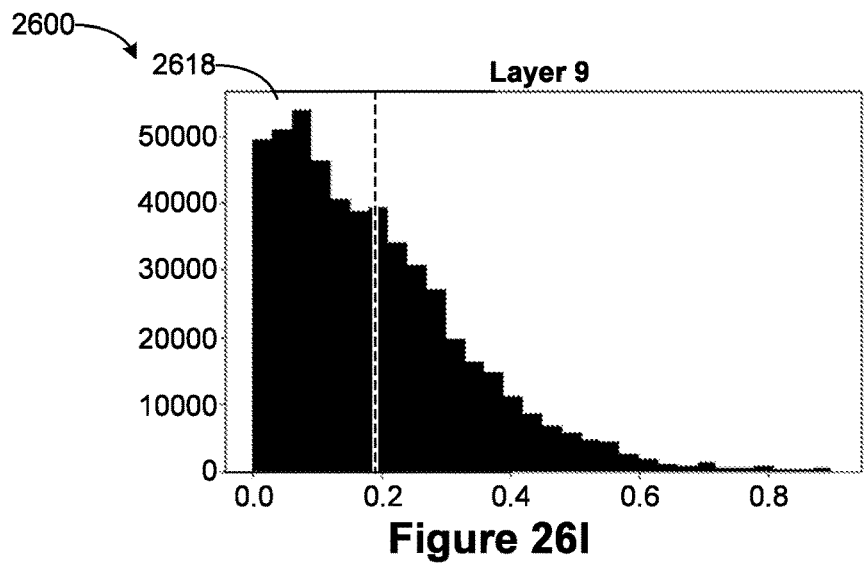
Figure 26J:
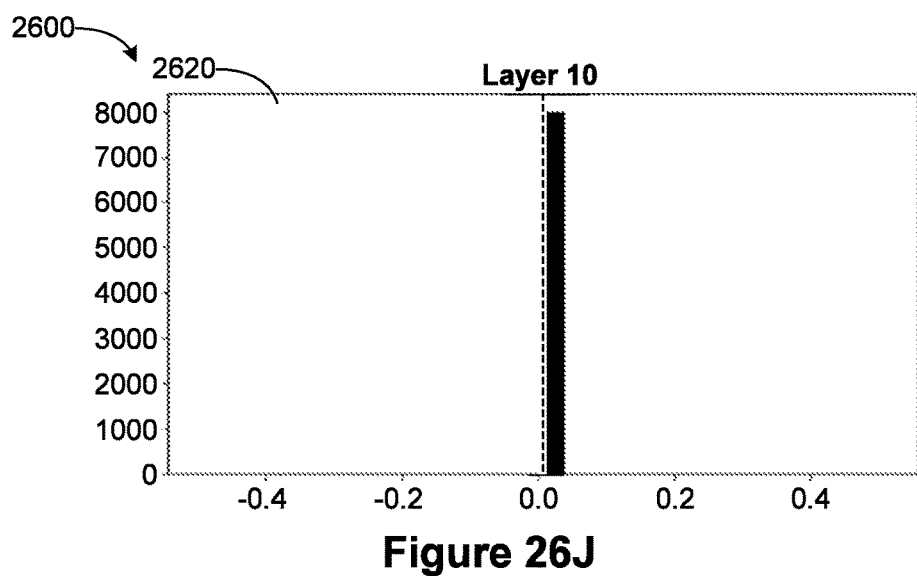
Figure 26K:
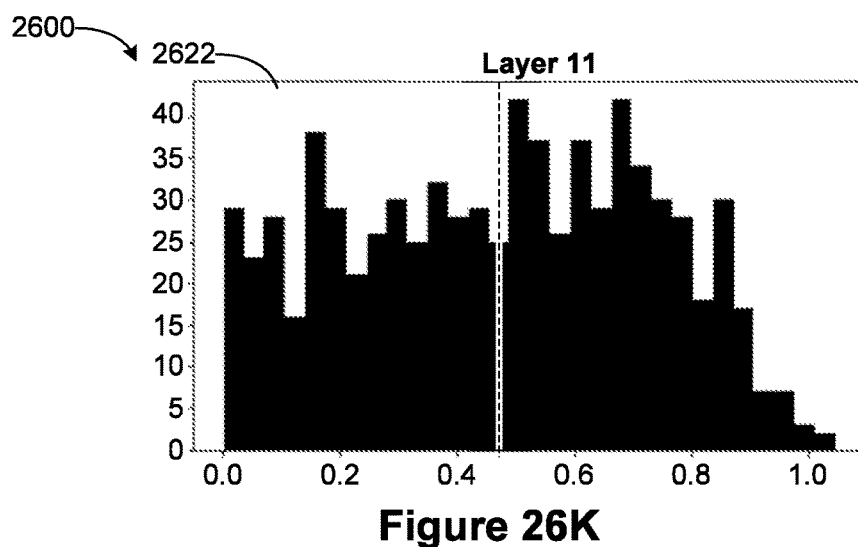

FIG. 25E shows a table 25136 of description for the schematic diagram shown in FIG. 25A-25D, according to some implementations. N-Channel MOSFET transistors with explicit substrate connection include transistors M2, M5, M18, M21, M34, and M37, with L=0.36 u and W=3.6 u, transistors M3, M6, M11, M12, M14, M16, M19, M22, M27, M28, M32, M38, M35, M38, M43, M44, M46, and M48, with L=0.36 u and W=1.8 u. P-Channel MOSFET transistors with explicit substrate connection include transistors M1, M4, M7, M8, M13, M15, M17, M20, M23, M24, M29, M31, M33, M36, M39, M40, M45, and M47 with L=0.36 u and W=3.96 u, and transistor M9, M10, M25, M26, M41, and M42, with L=0.36 u and W=11.88 u.

Example Methods for Analog Hardware Realization of Trained Neural Networks

FIGS. 27A-27J show a flowchart of a method 2700 for hardware realization (2702) of neural networks, according to some implementations. The method is performed (2704) at the computing device 200 (e.g., using the neural network transformation module 226) having one or more processors 202, and memory 214 storing one or more programs configured for execution by the one or more processors 202. The method includes obtaining (2706) a neural network topology (e.g., the topology 224) and weights (e.g., the weights 222) of a trained neural network (e.g., the networks 220). In some implementations, the trained neural network is trained (2708) using software simulations to generate the weights.

The method also includes transforming (2710) the neural network topology to an equivalent analog network of analog components. Referring next to FIG. 27C, in some implementations, the neural network topology includes (2724) one or more layers of neurons. Each layer of neurons computing respective outputs based on a respective mathematical function. In such cases, transforming the neural network topology to the equivalent analog network of analog components includes, performing (2726) a sequence of steps for each layer of the one or more layers of neurons. The sequence of steps include identifying (2728) one or more function blocks, based on the respective mathematical function, for the respective layer. Each function block has a respective schematic implementation with block outputs that conform to outputs of a respective mathematical function. In some implementations, identifying the one or more function blocks includes selecting (2730) the one or more function blocks based on a type of the respective layer. For example, a layer can consist of neurons, and the layer's output is a linear superposition of its inputs. Selecting the one or more function blocks is based on this identification of a layer type, if a layer's output is a linear superposition, or similar pattern identification. Some implementations determine if number of output >1, then use either a trapezium or a pyramid transformation.

Figure 27A:
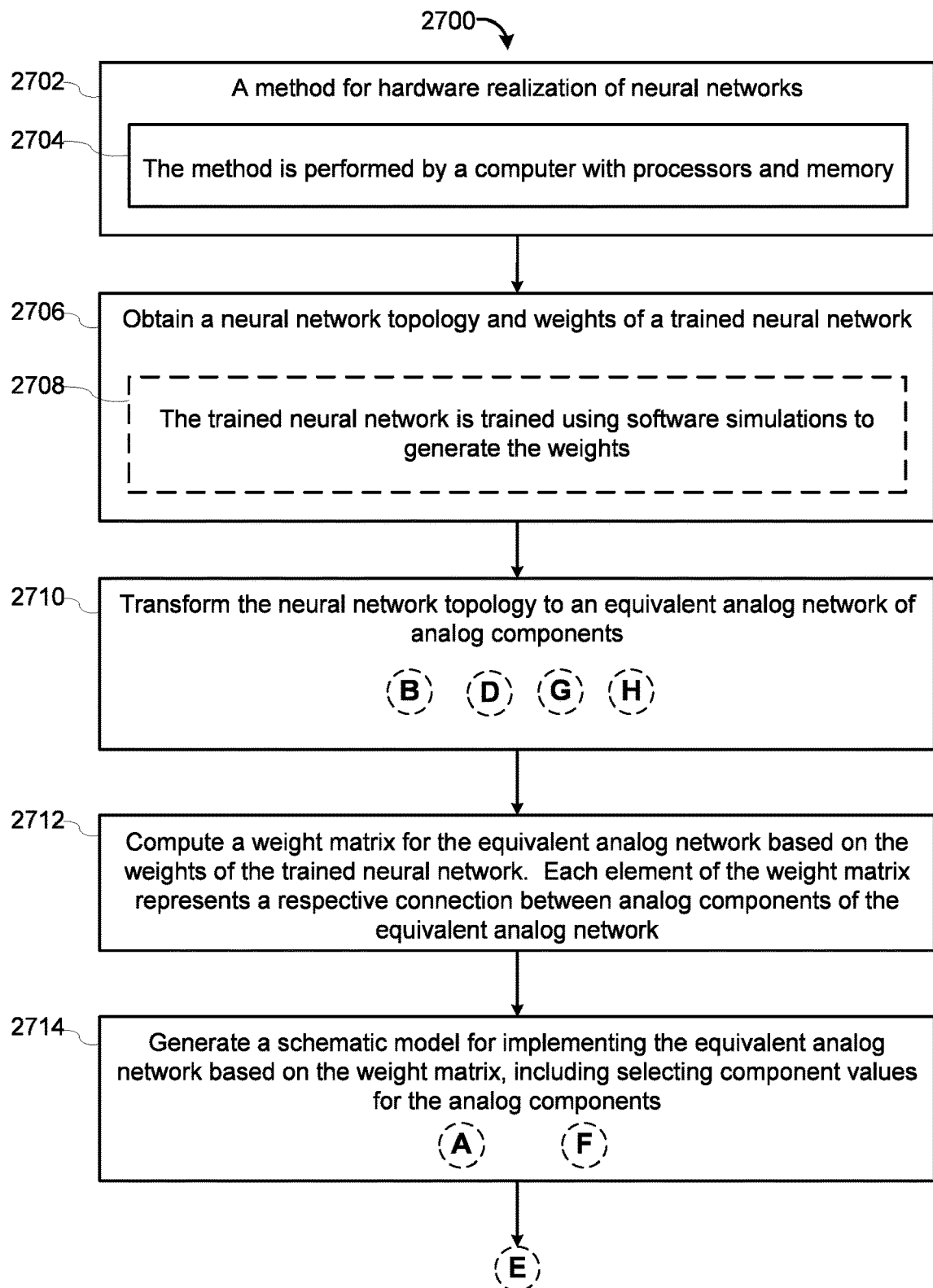
FIGS. 27A-27J show a flowchart of a method for hardware realization of neural networks, according to some implementations.
Figure 27B:
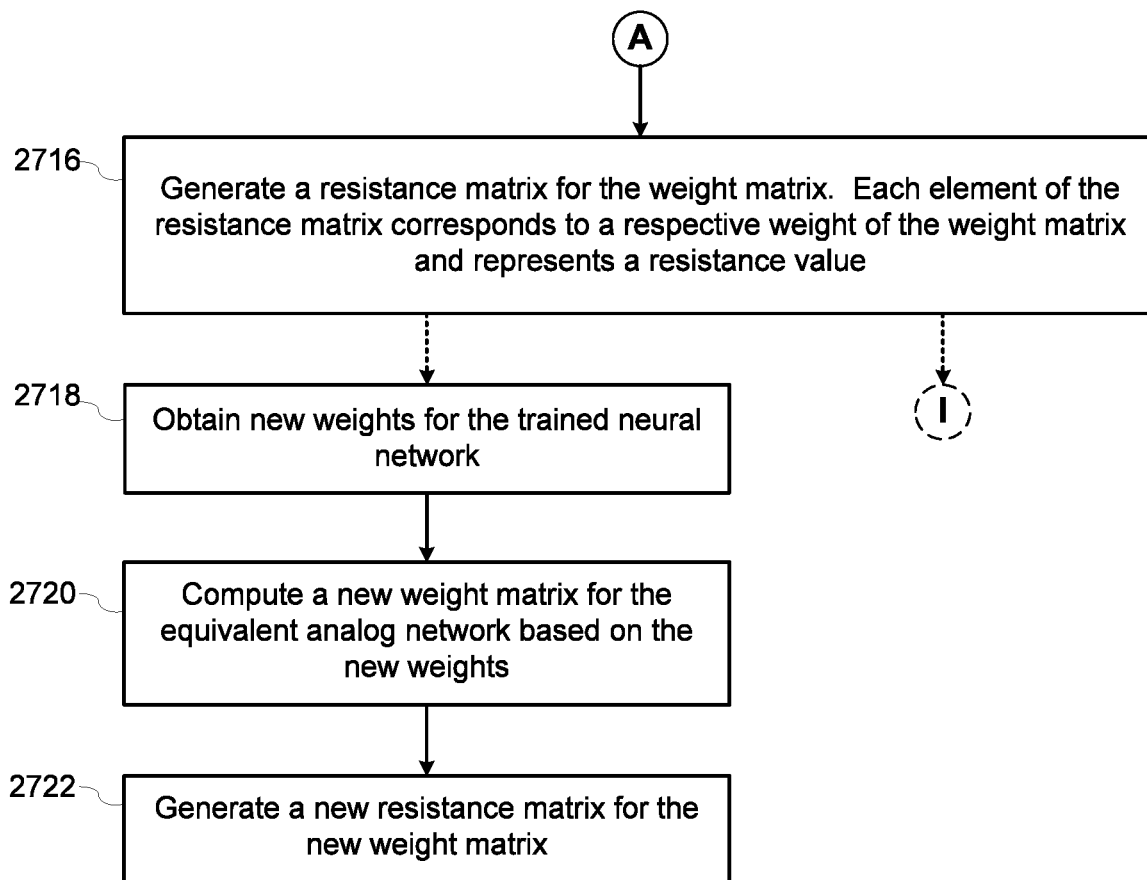
Figure 27C:
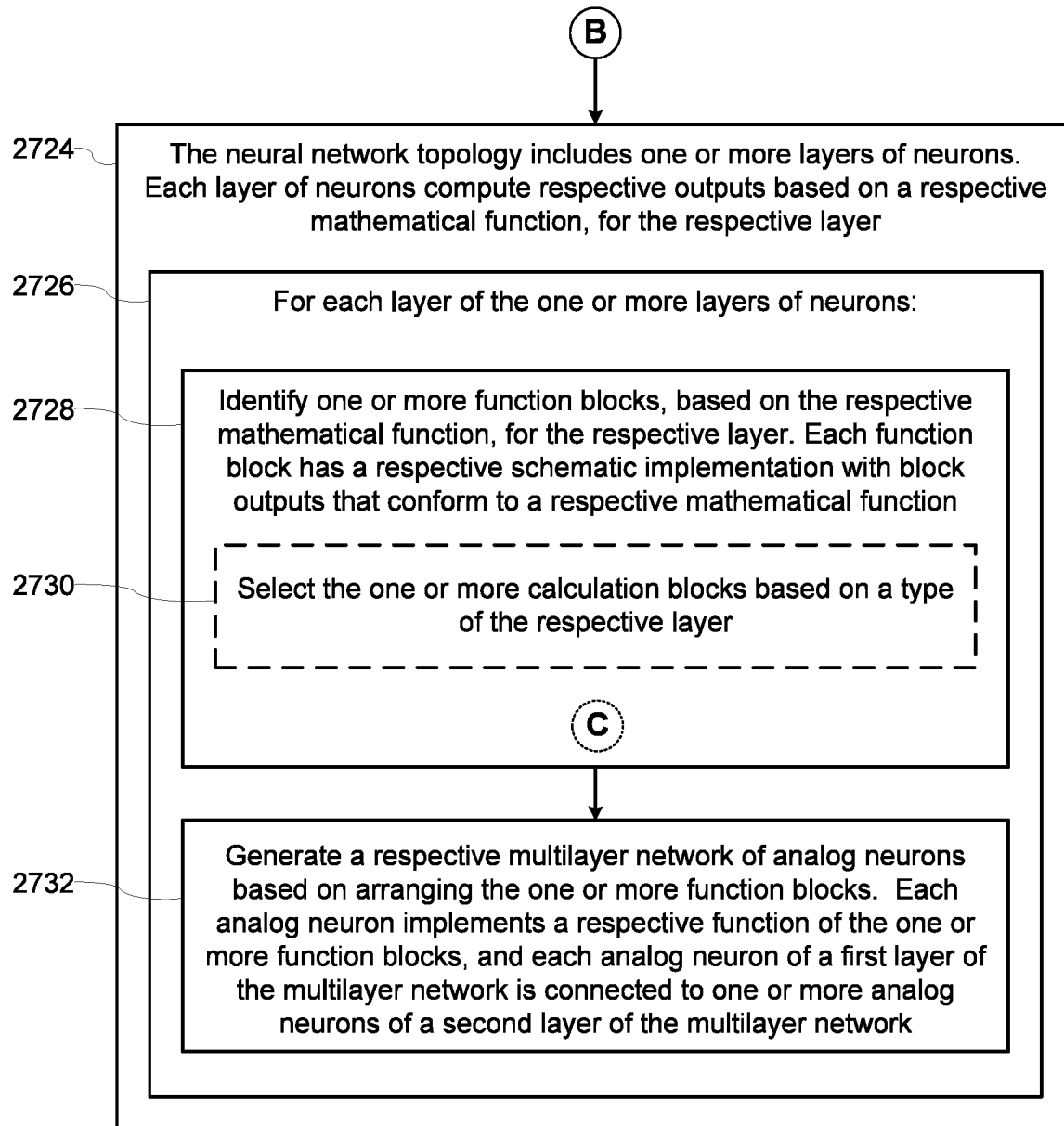
Figure 27D:
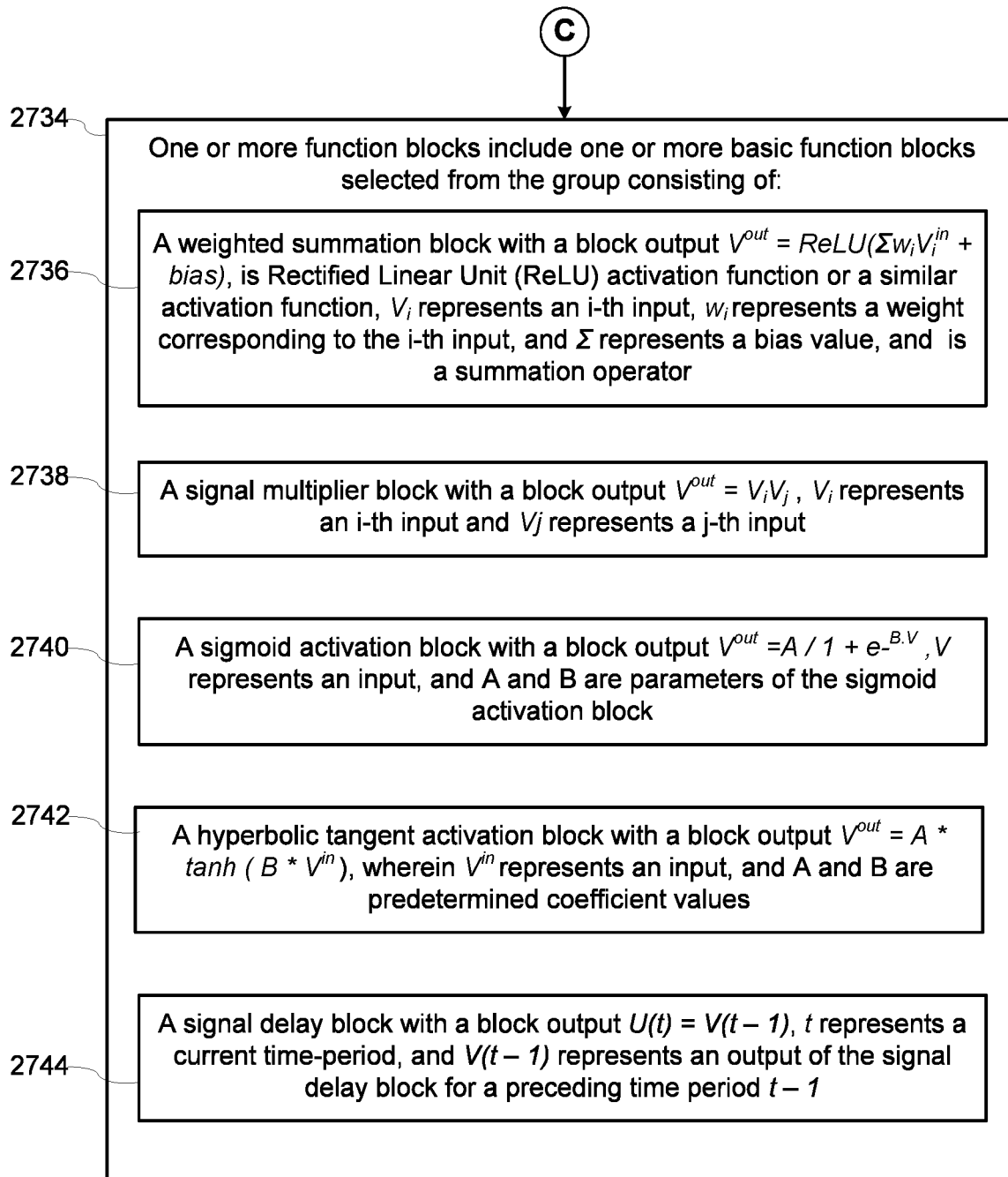

Referring next to FIG. 27D, in some implementations, the one or more function blocks include one or more basic function blocks (e.g., the basic function blocks 232) selected (2734) from the group consisting of: (i) a weighted summation block (2736) with a block output $V^{out}=ReLU(\Sigma w_i \cdot V_i^{in} +$ bias). ReLU is Rectified Linear Unit (ReLU) activation function or a similar activation function (e.g., ReLU with a threshold), $V_i$ represents an i-th input, $w_i$ represents a weight corresponding to the i-th input, and bias represents a bias value, and $\Sigma$ is a summation operator; (ii) a signal multiplier block (2738) with a block output $V^{out}=\text{coeff}\cdot V_i \cdot V_j$. $V_i$ represents an i-th input and $V_j$ represents a j-th input, and coeff is a predetermined coefficient; (iii) a sigmoid activation block (2740) with a block output $$V^{out} = \frac{A}{1+e^{-B\cdot V}}.$$

V represents an input, and A and B are predetermined coefficient values (e.g., A=−0.1; B=11.3) of the sigmoid activation block; (iv) a hyperbolic tangent activation block (2742) with a block output $V^{out}=A*\tanh(B*V^{in})$. $V^{in}$ represents an input, and A and B are predetermined coefficient values (e.g., A=0.1, B=−10.1); and a signal delay block (2744) with a block output U(t)=V(t−dt). t represents a current time-period, V(t−1) represents an output of the signal delay block for a preceding time period t−1, and dt is a delay value.

Referring now back to FIG. 27C, the sequence of steps also includes generating (2732) a respective multilayer network of analog neurons based on arranging the one or more function blocks. Each analog neuron implements a respective function of the one or more function blocks, and each analog neuron of a first layer of the multilayer network is connected to one or more analog neurons of a second layer of the multilayer network.

Figure 27E:
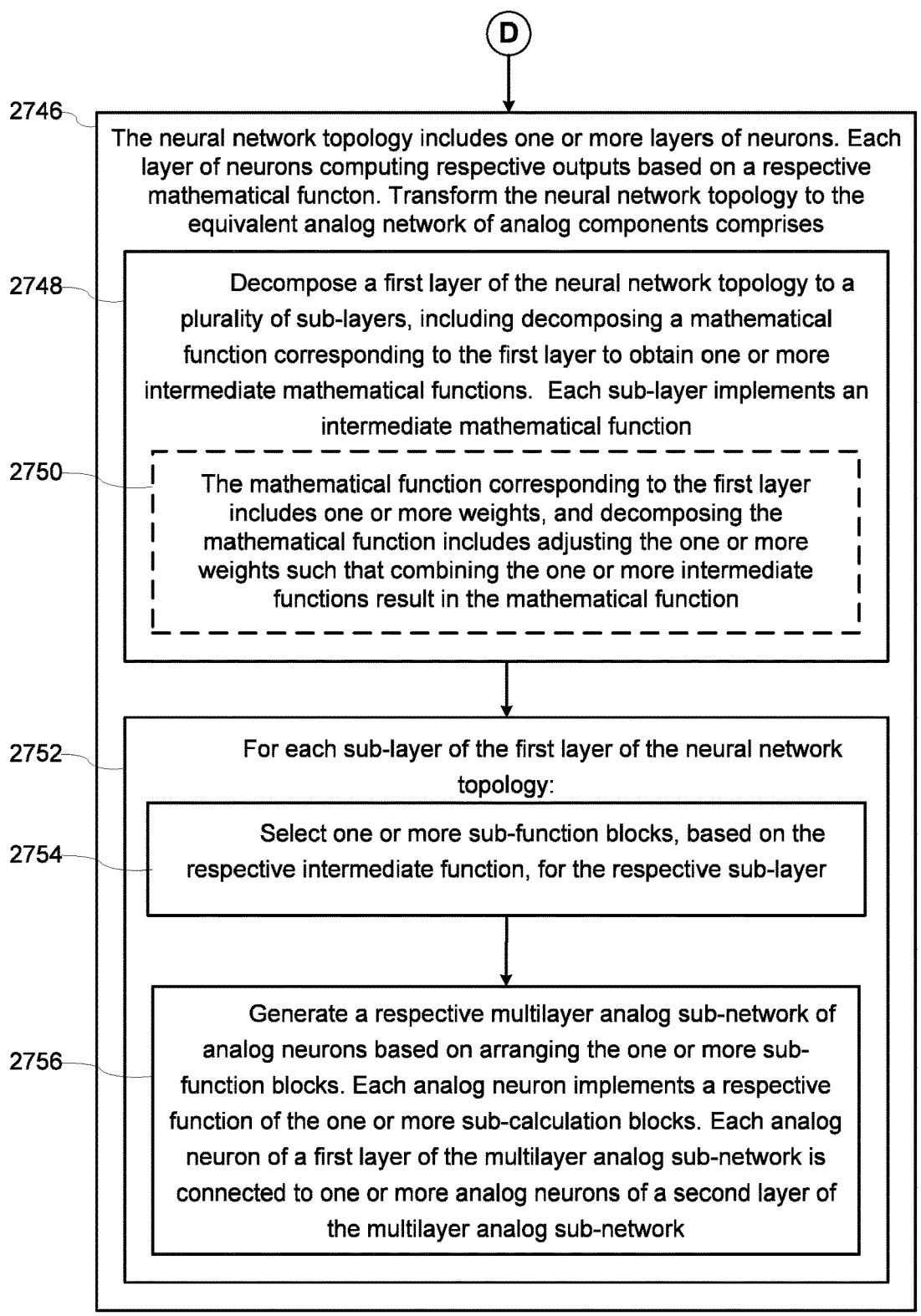

Referring now back to FIG. 27A, for some networks, such as GRU and LSTM, transforming (2710) the neural network topology to an equivalent analog network of analog components requires more complex processing, according to some implementations. Referring next to FIG. 27E, suppose the neural network topology includes (2746) one or more layers of neurons. Suppose further that each layer of neurons computes respective outputs based on a respective mathematical function. In such cases, transforming the neural network topology to the equivalent analog network of analog components includes: (i) decomposing (2748) a first layer of the neural network topology to a plurality of sub-layers, including decomposing a mathematical function corresponding to the first layer to obtain one or more intermediate mathematical functions. Each sub-layer implements an intermediate mathematical function. In some implementations, the mathematical function corresponding to the first layer includes one or more weights, and decomposing the mathematical function includes adjusting (2750) the one or more weights such that combining the one or more intermediate functions results in the mathematical function; and (ii) performing (2752) a sequence of steps for each sub-layer of the first layer of the neural network topology. The sequence of steps includes selecting (2754) one or more sub-function blocks, based on a respective intermediate mathematical function, for the respective sub-layer; and generating (2756) a respective multilayer analog sub-network of analog neurons based on arranging the one or more sub-function blocks. Each analog neuron implements a respective function of the one or more sub-function blocks, and each analog neuron of a first layer of the multilayer analog sub-network is connected to one or more analog neurons of a second layer of the multilayer analog sub-network.

Figure 27F:
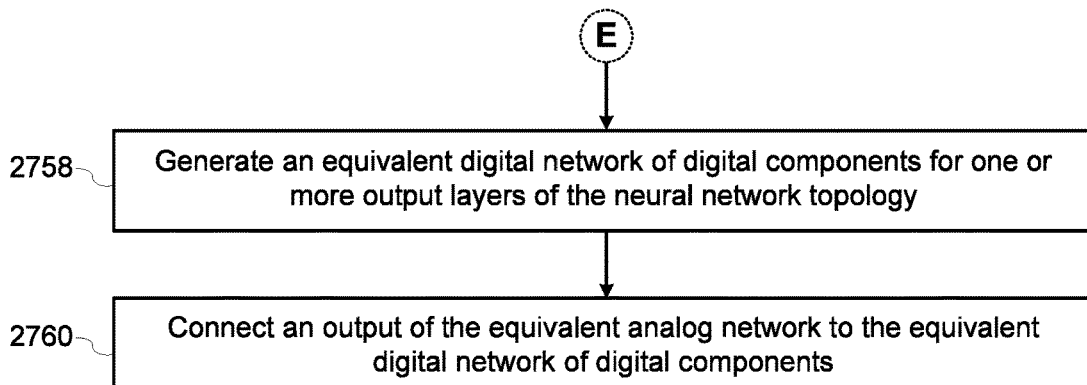
Figure 27G:
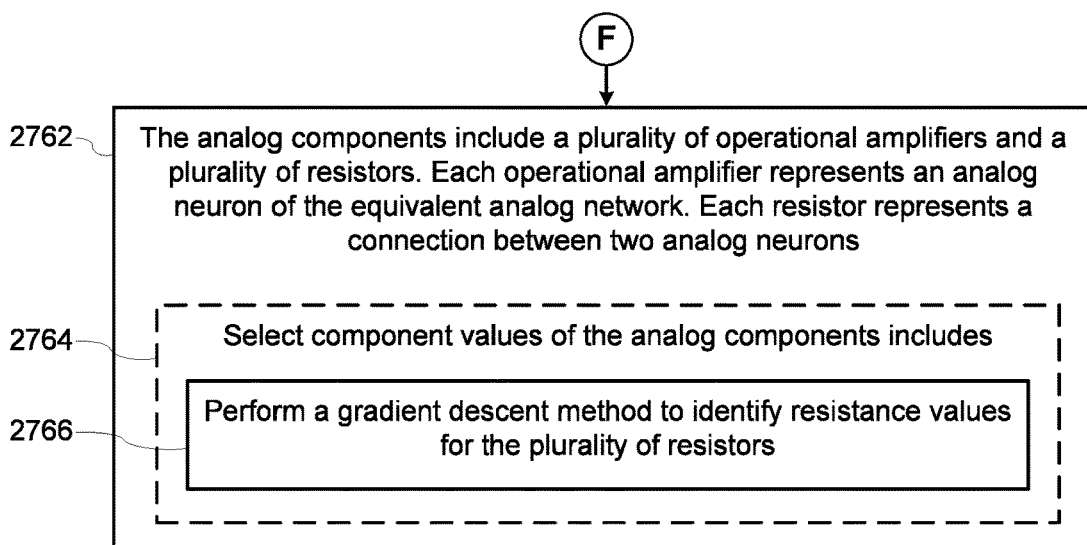
Figure 27H:
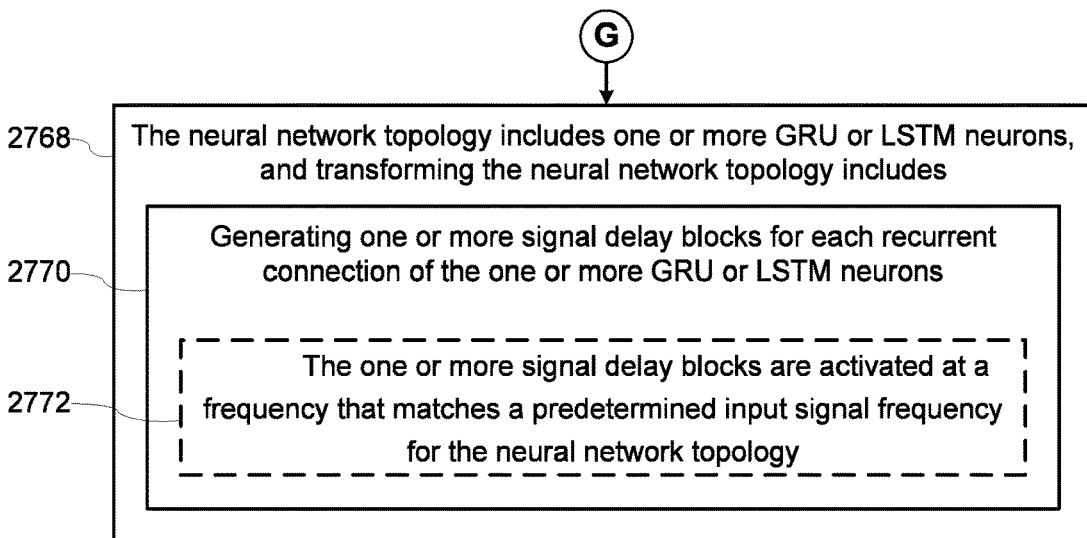

Referring next to FIG. 27H, suppose the neural network topology includes (2768) one or more GRU or LSTM neurons. In that case, transforming the neural network topology includes generating (2770) one or more signal delay blocks for each recurrent connection of the one or more GRU or LSTM neurons. In some implementations, an external cycle timer activates the one or more signal delay blocks with a constant time period (e.g., 1, 5, or 10 time steps). Some implementations use multiple delay blocks over one signal for producing additive time shift. In some implementations, the activation frequency of the one or more signal delay blocks is/are synchronized to network input signal frequency. In some implementations, the one or more signal delay blocks are activated (2772) at a frequency that matches a predetermined input signal frequency for the neural network topology. In some implementations, this predetermined input signal frequency may be dependent on the application, such as Human Activity Recognition (HAR) or PPG. For example, the predetermined input signal frequency is 30-60 Hz for video processing, around 100 Hz for HAR and PPG, 16 KHz for sound processing, and around 1-3 Hz for battery management. Some implementations activate different signal delay blocks activate at different frequencies.

Figure 27I:
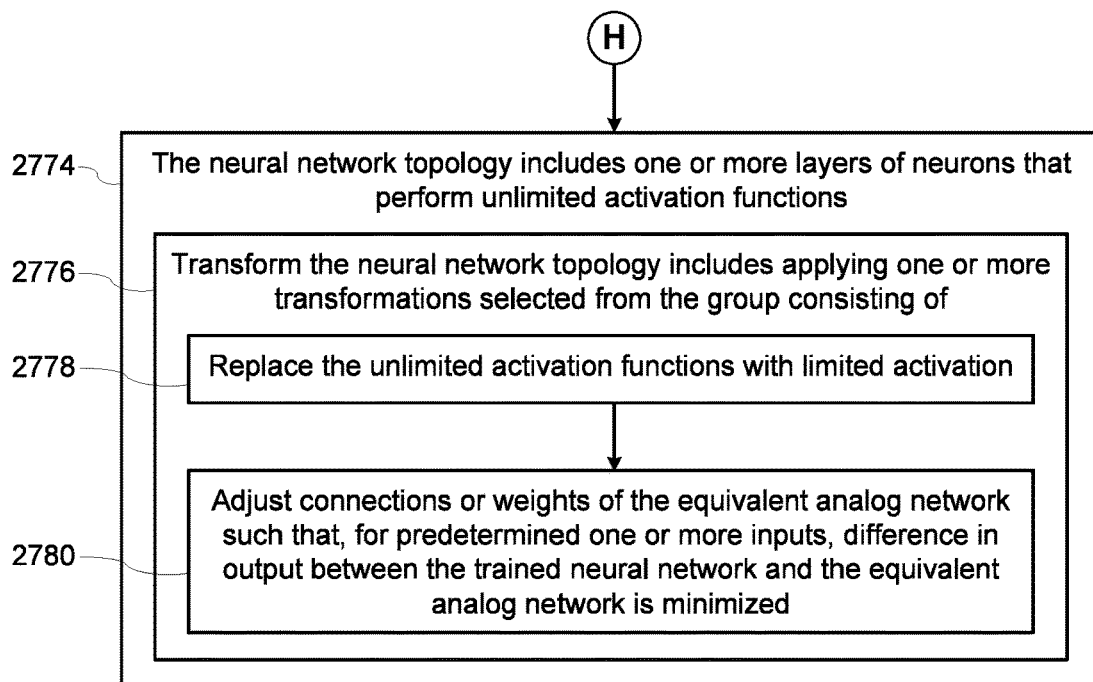

Referring next to FIG. 27I, suppose the neural network topology includes (2774) one or more layers of neurons that perform unlimited activation functions. In some implementations, in such cases, transforming the neural network topology includes applying (2776) one or more transformations selected from the group consisting of: replacing (2778) the unlimited activation functions with limited activation (e.g., replacing ReLU with a threshold ReLU); and adjusting (2780) connections or weights of the equivalent analog network such that, for predetermined one or more inputs, difference in output between the trained neural network and the equivalent analog network is minimized.

Referring now back to FIG. 27A, the method also includes computing (2712) a weight matrix for the equivalent analog network based on the weights of the trained neural network. Each element of the weight matrix represents a respective connection between analog components of the equivalent analog network.

The method also includes generating (2714) a schematic model for implementing the equivalent analog network based on the weight matrix, including selecting component values for the analog components. Referring next to FIG. 27B, in some implementations, generating the schematic model includes generating (2716) a resistance matrix for the weight matrix. Each element of the resistance matrix corresponds to a respective weight of the weight matrix and represents a resistance value. In some implementations, the method includes regenerating just the resistance matrix for the resistors for a retrained network. In some implementations, the method further includes obtaining (2718) new weights for the trained neural network, computing (2720) a new weight matrix for the equivalent analog network based on the new weights, and generating (2722) a new resistance matrix for the new weight matrix.

Figure 27J:
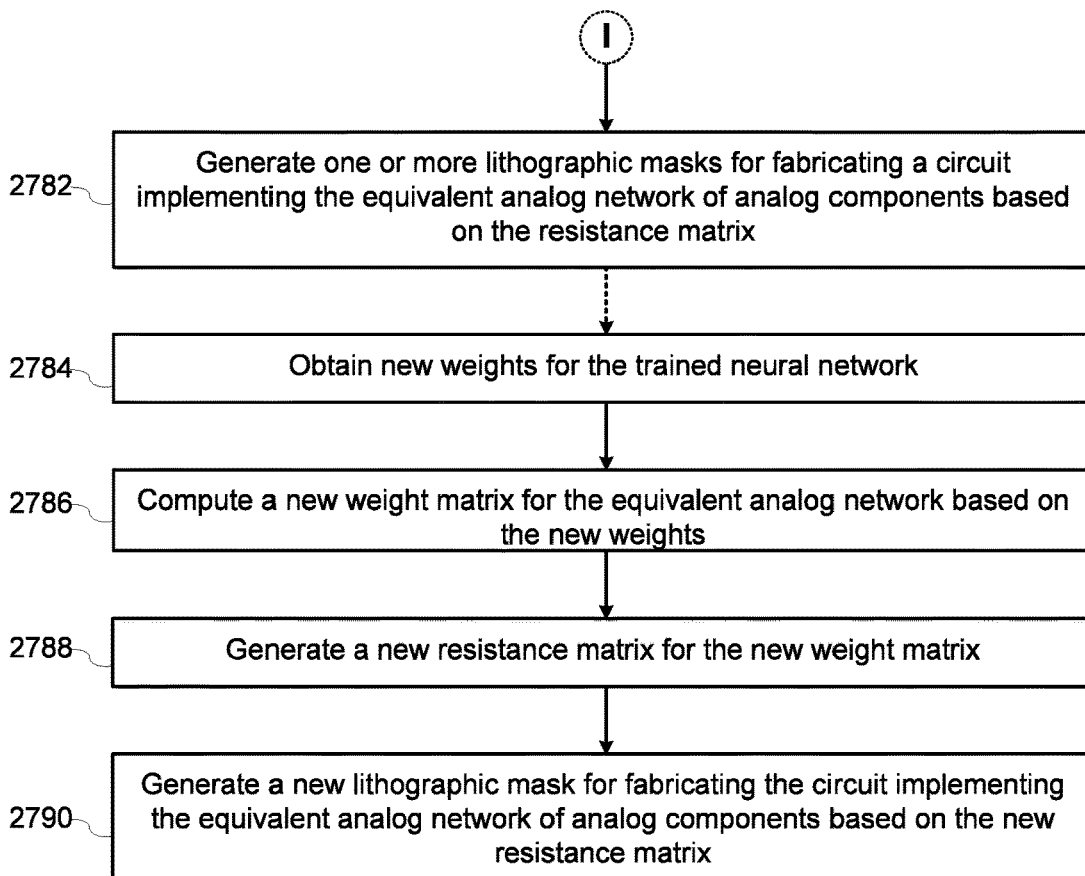

Referring next to FIG. 27J, in some implementations, the method further includes generating (2782) one or more lithographic masks (e.g., generating the masks 250 and/or 252 using the mask generation module 248) for fabricating a circuit implementing the equivalent analog network of analog components based on the resistance matrix. In some implementations, the method includes regenerating just the masks for resistors (e.g., the masks 250) for retrained networks. In some implementations, the method further includes: (i) obtaining (2784) new weights for the trained neural network; (ii) computing (2786) a new weight matrix for the equivalent analog network based on the new weights; (iii) generating (2788) a new resistance matrix for the new weight matrix; and (iv) generating (2790) a new lithographic mask for fabricating the circuit implementing the equivalent analog network of analog components based on the new resistance matrix.

Referring now back to FIG. 27G, the analog components include (2762) a plurality of operational amplifiers and a plurality of resistors. Each operational amplifier represents an analog neuron of the equivalent analog network, and each resistor represents a connection between two analog neurons. Some implementations include other analog components, such as four-quadrant multipliers, sigmoid and hyperbolic tangent function circuits, delay lines, summers, and/or dividers. In some implementations, selecting (2764) component values of the analog components includes performing (2766) a gradient descent method and/or other weight quantization methods to identify possible resistance values for the plurality of resistors.

Referring now back to FIG. 27F, in some implementations, the method further includes implementing certain activation functions (e.g., Softmax) in output layer in digital. In some implementations, the method further includes generating (2758) equivalent digital network of digital components for one or more output layers of the neural network topology, and connecting (2760) output of one or more layers of the equivalent analog network to the equivalent digital network of digital components.

Example Methods for Constrained Analog Hardware Realization of Neural Networks

Figure 28A:
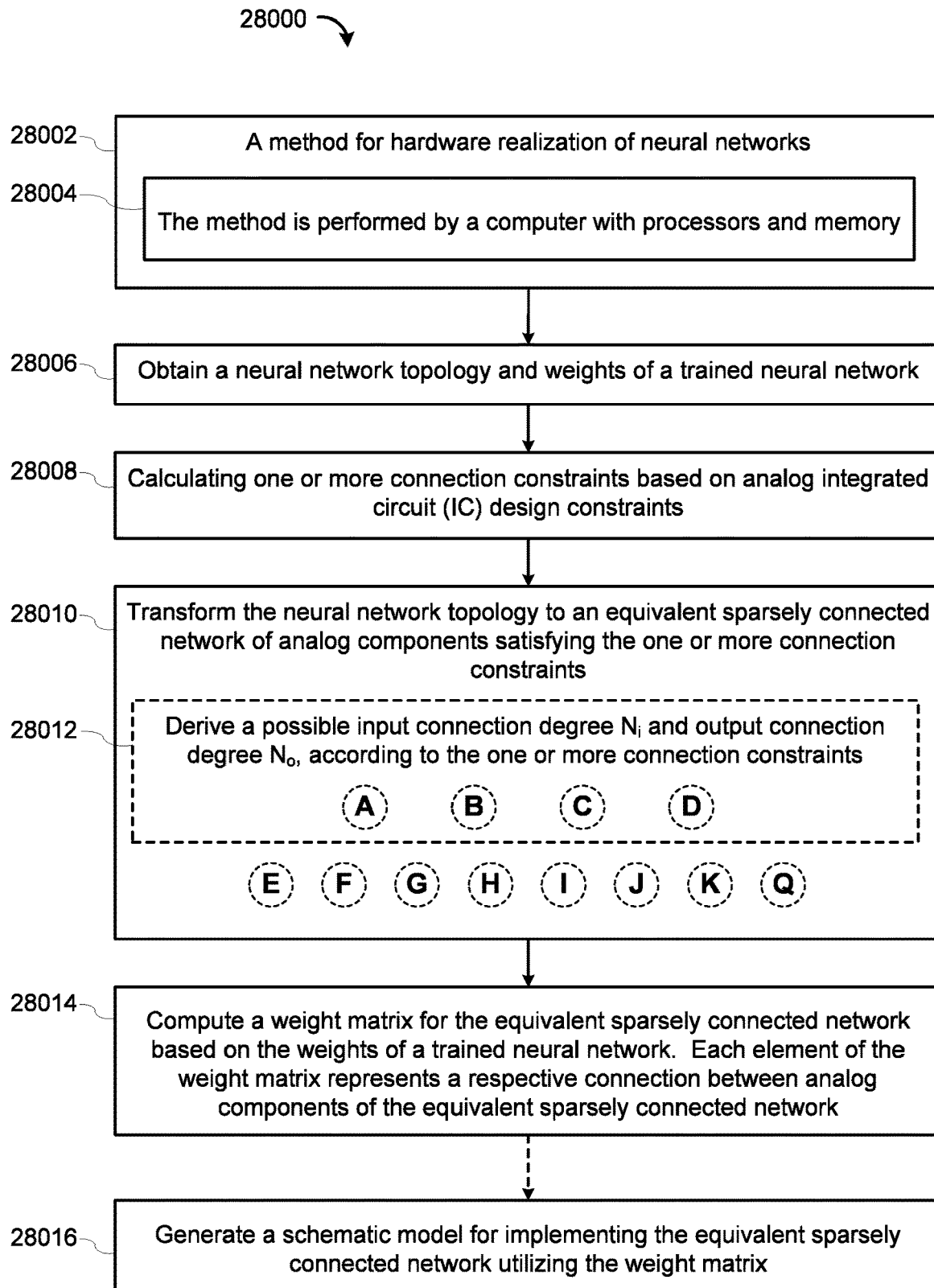
FIGS. 28A-28S show a flowchart of a method for hardware realization of neural networks according to hardware design constraints, according to some implementations.
Figure 28B:
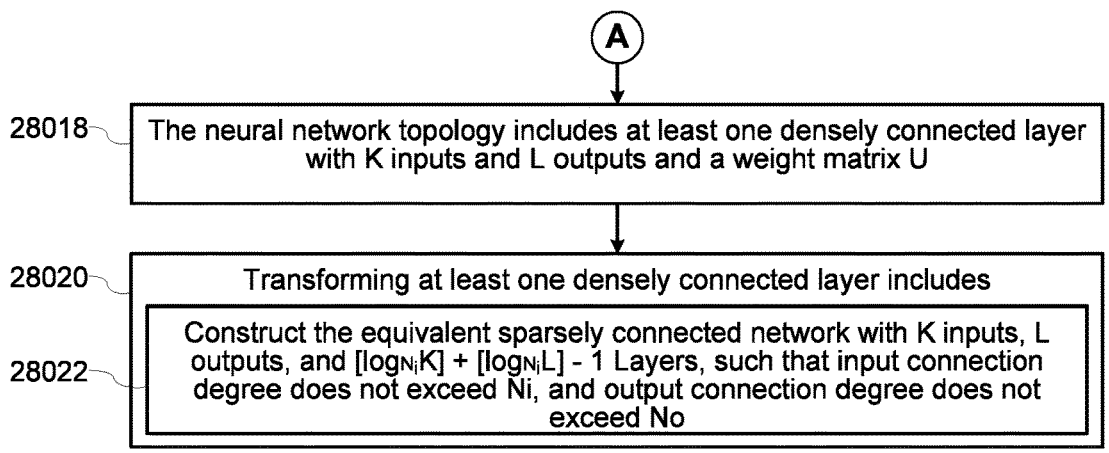
Figure 28C:
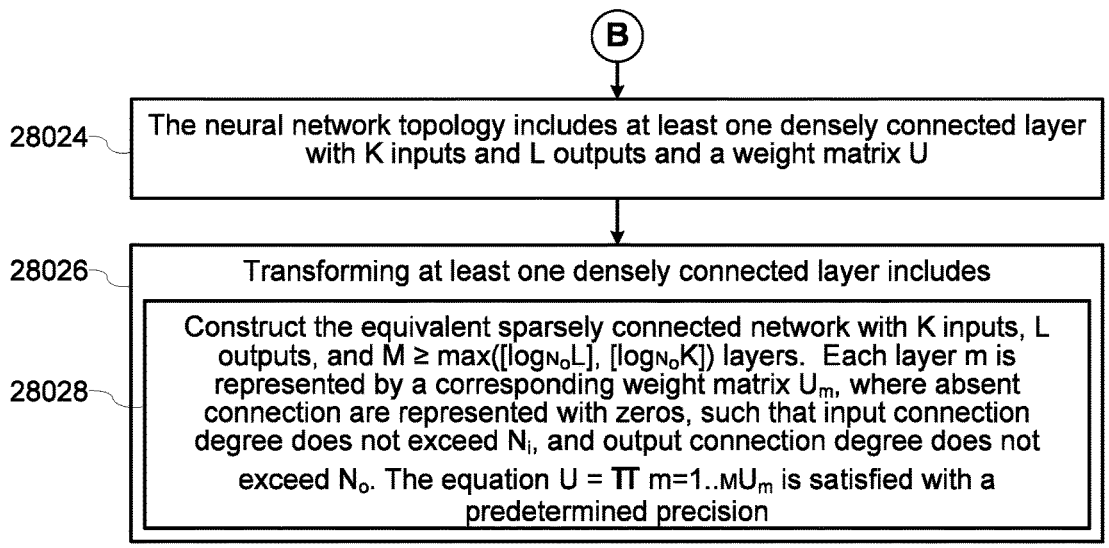
Figure 28D:
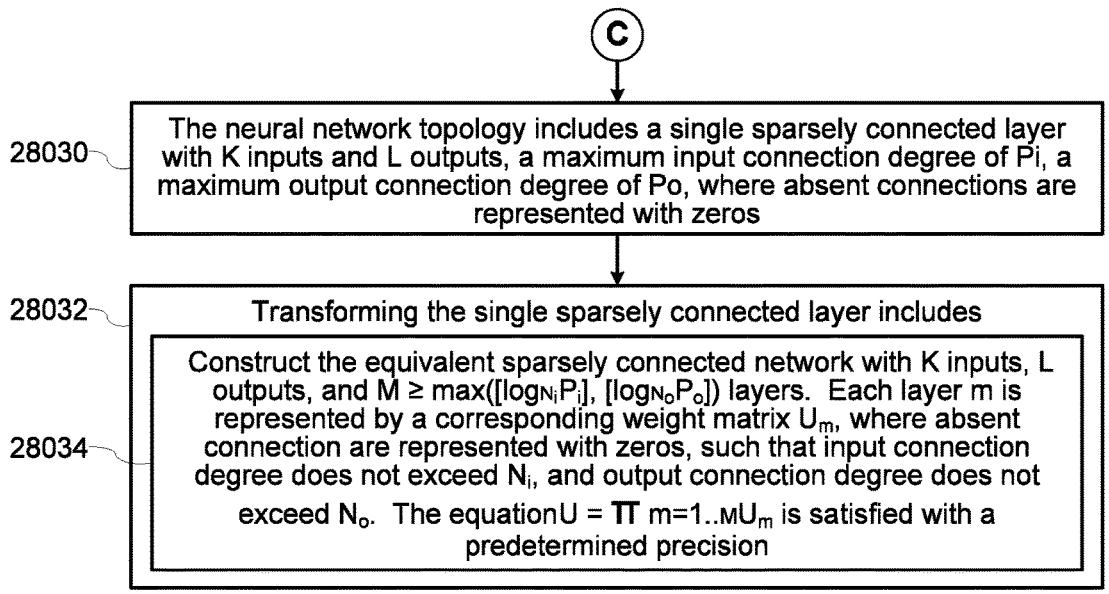
Figure 28E:
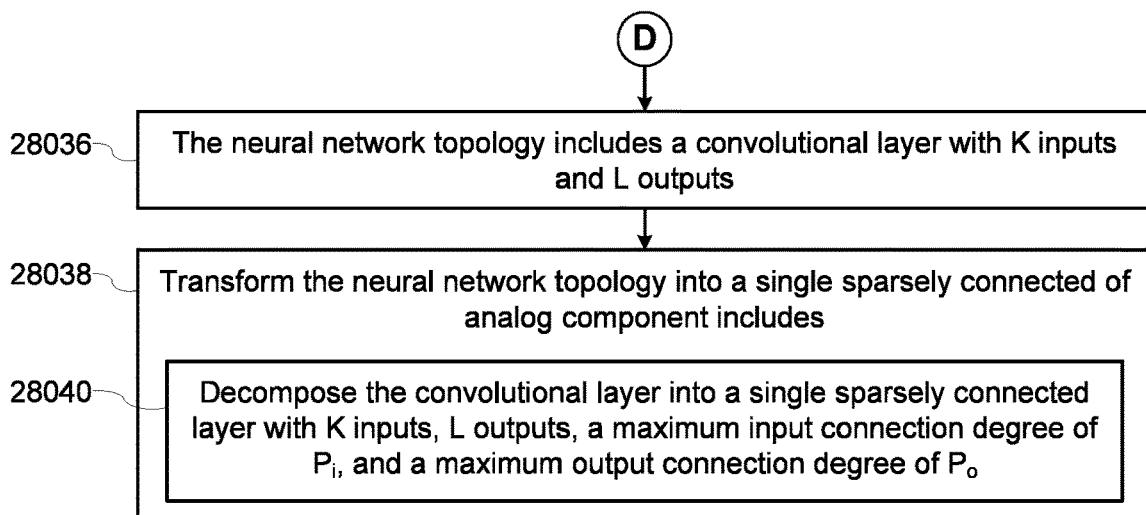
Figure 28F:
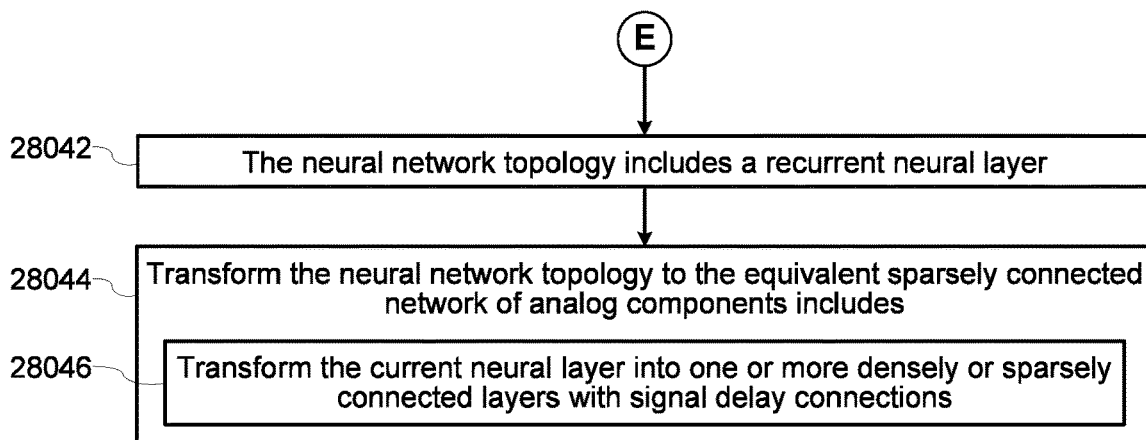
Figure 28G:
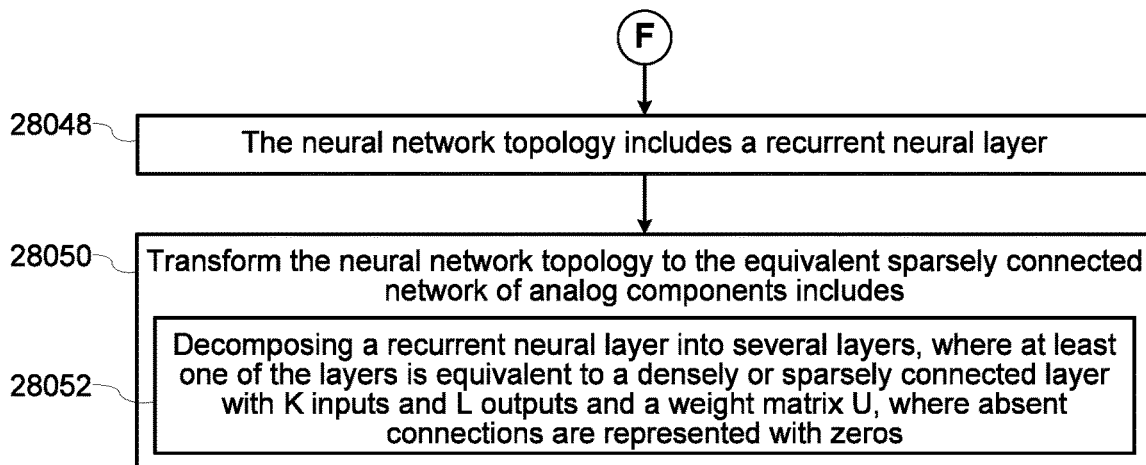
Figure 28H:
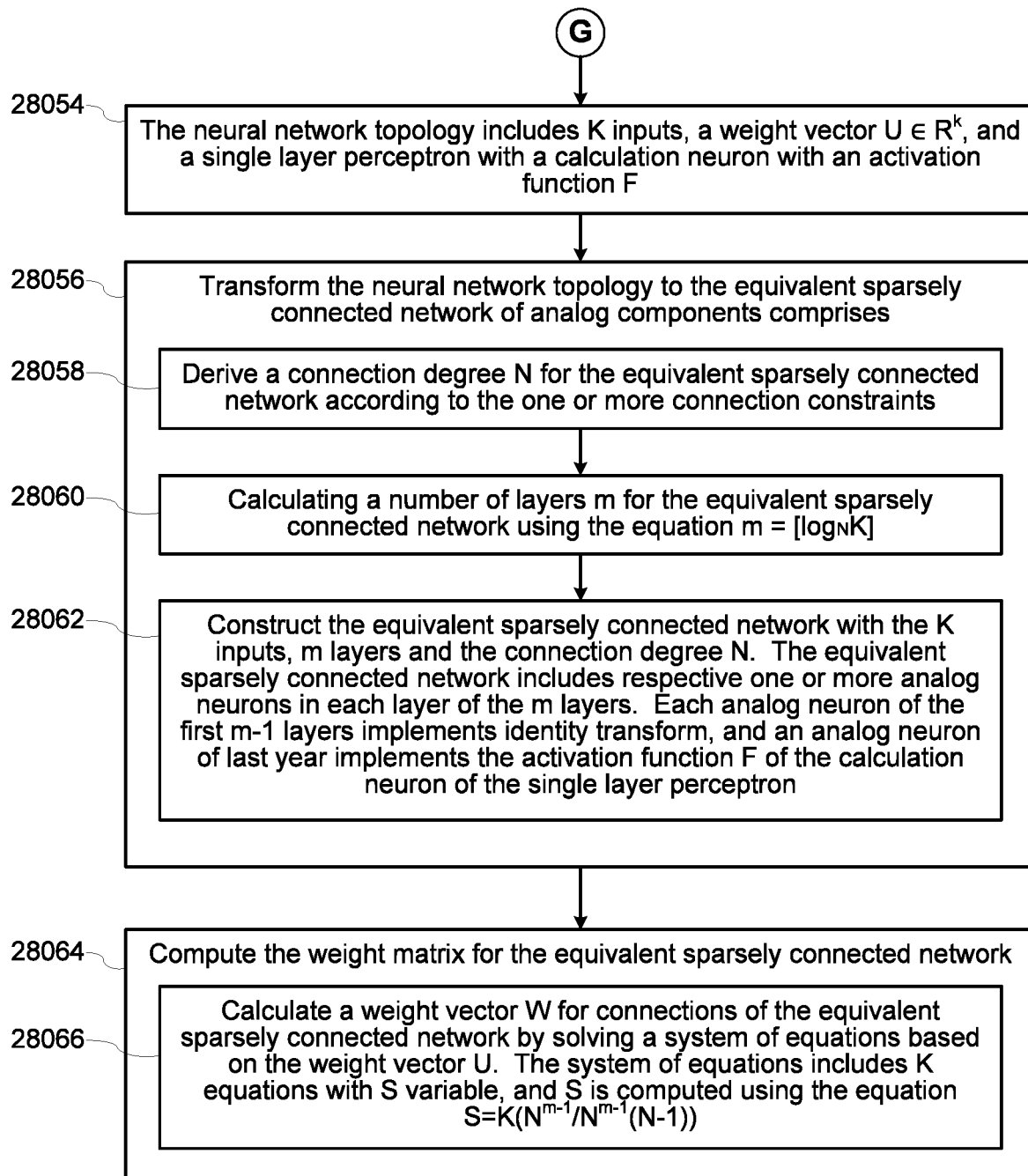
Figure 28I:
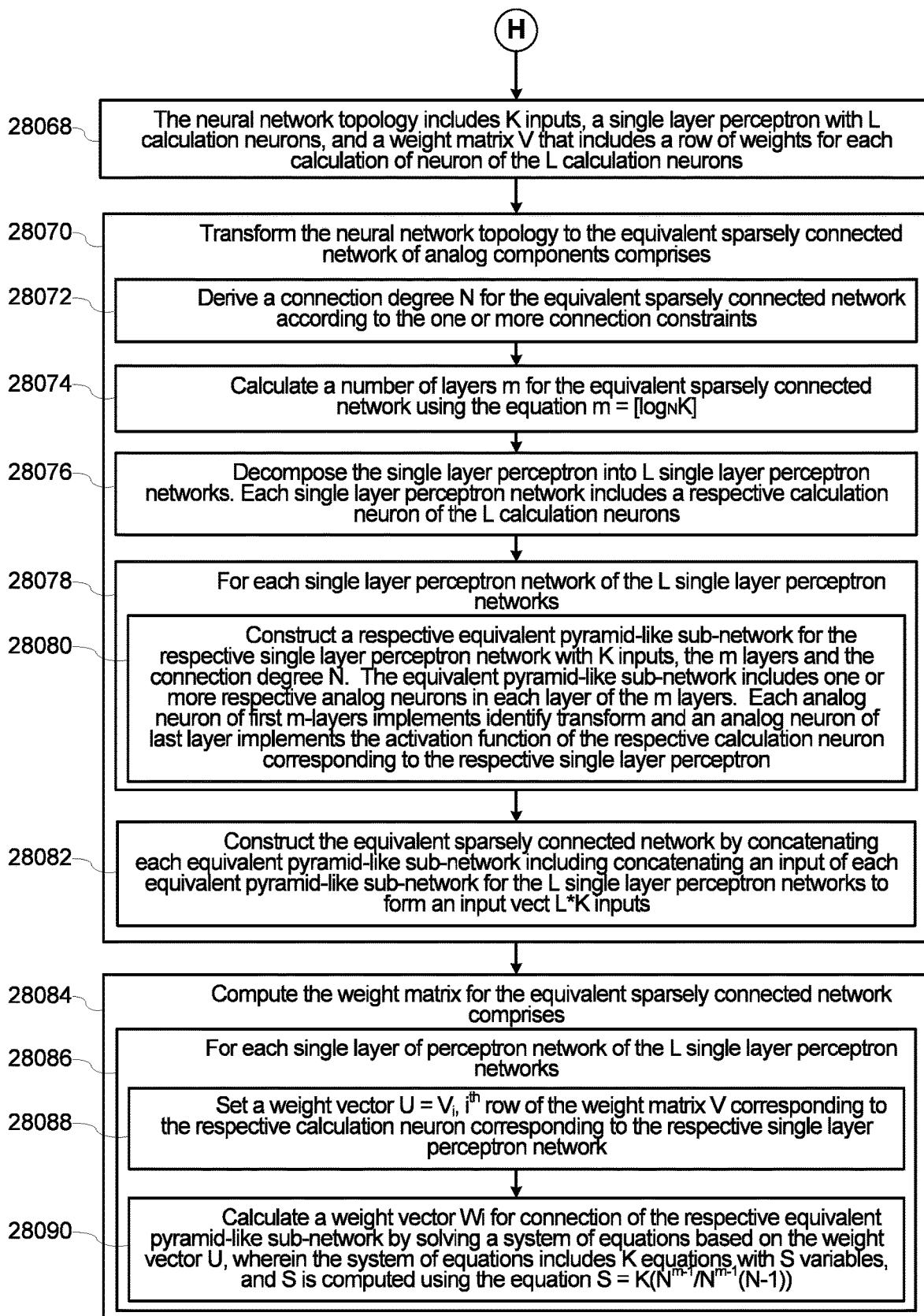
Figure 28J:
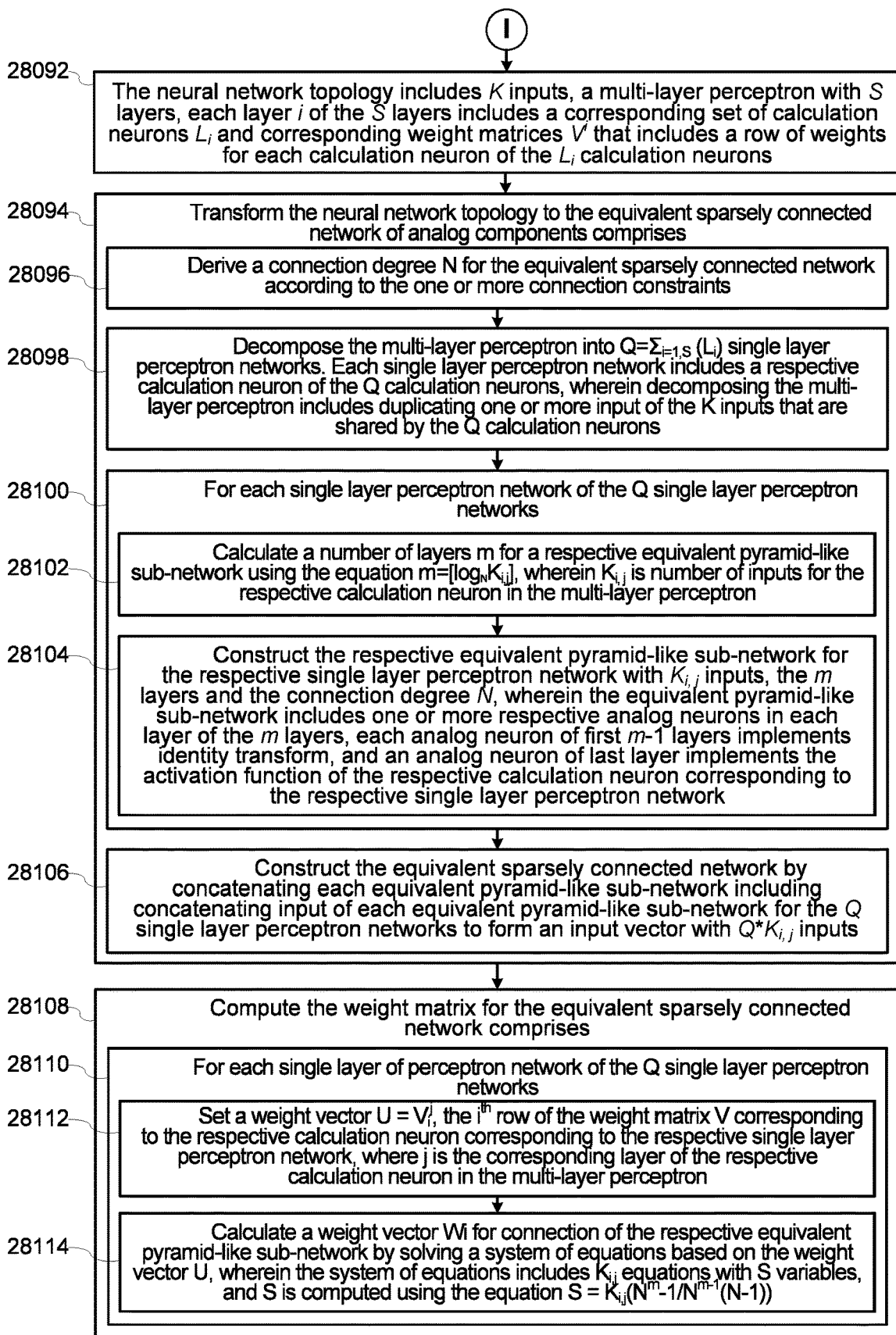
Figure 28K:
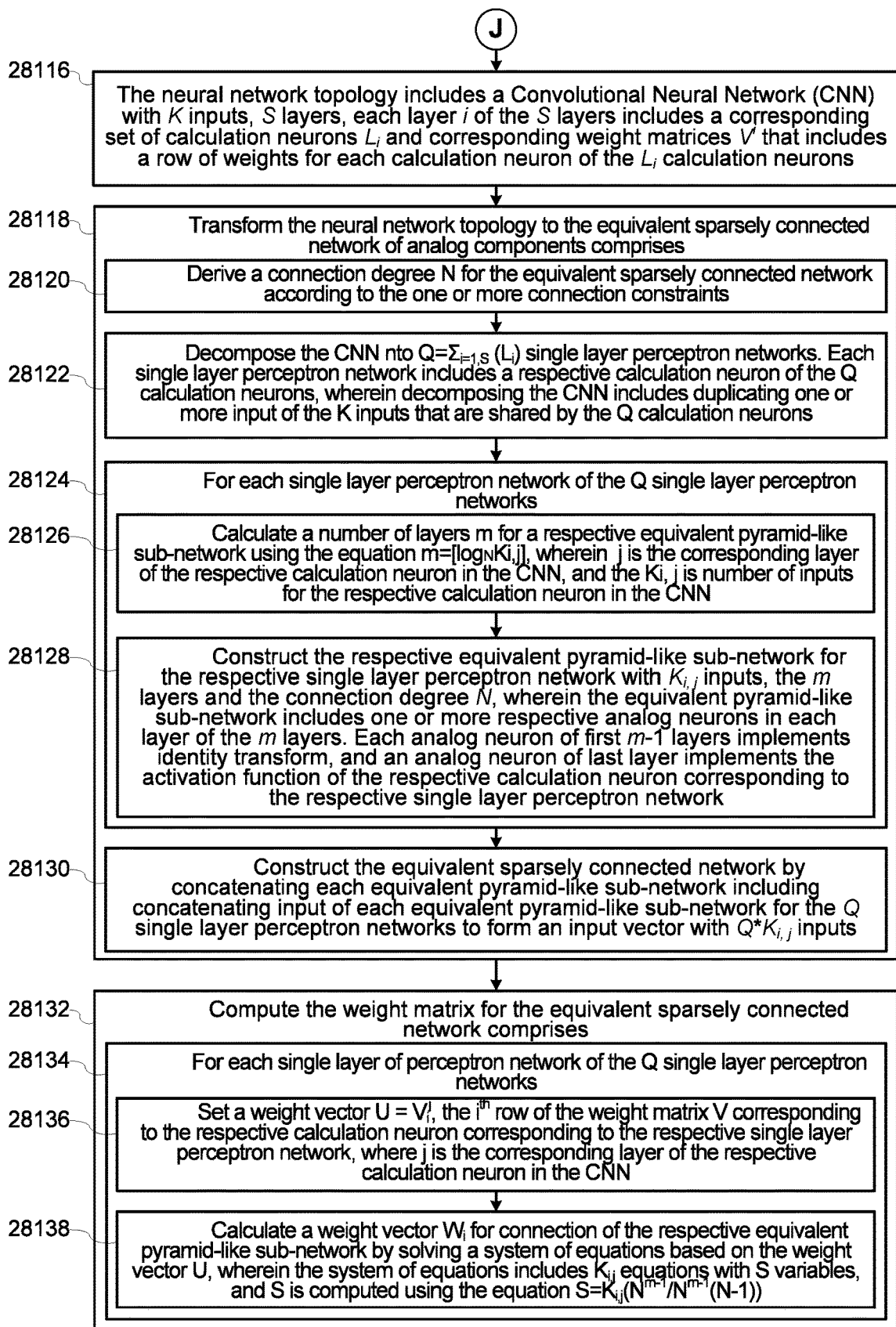
Figure 28L:
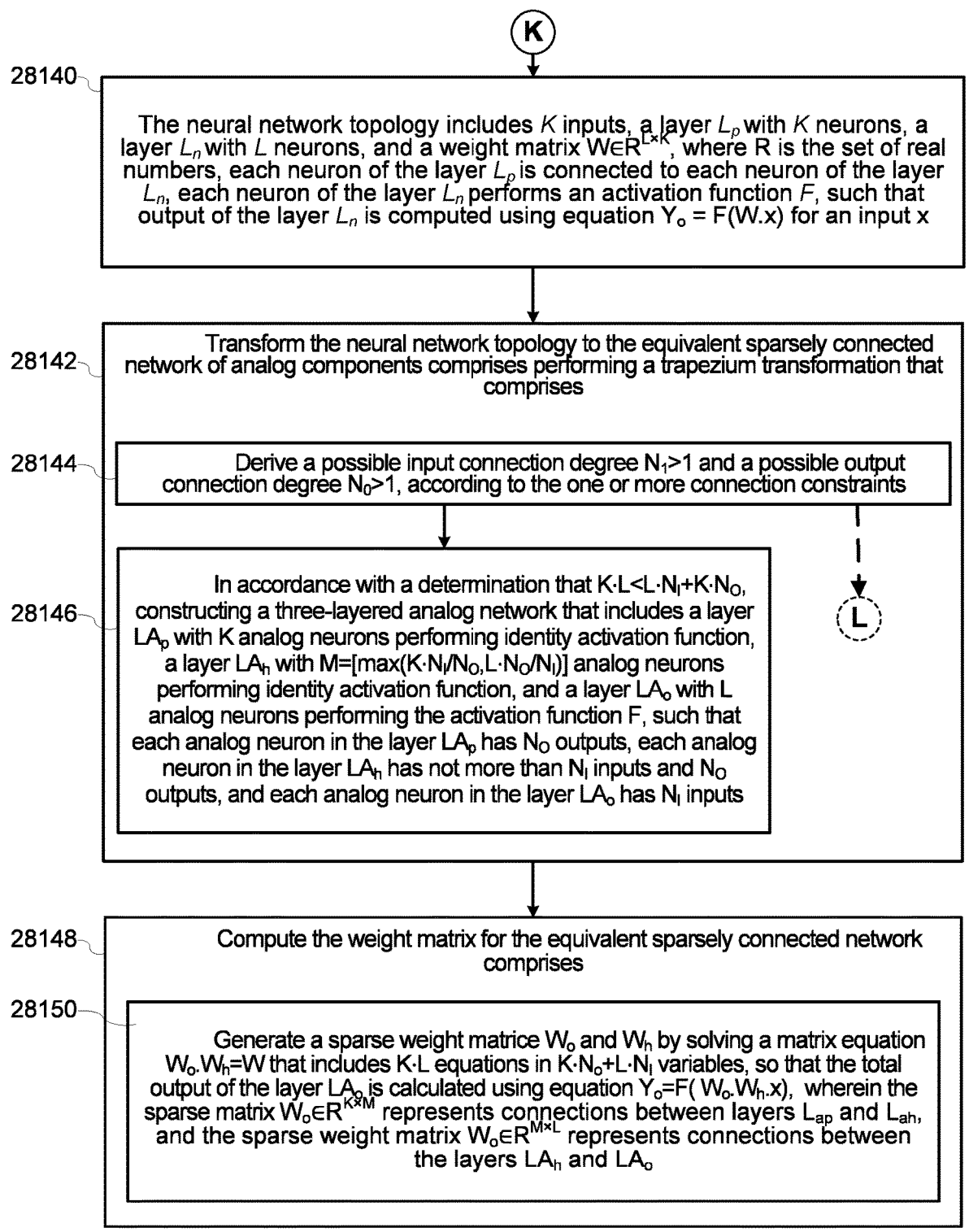
Figure 28M:
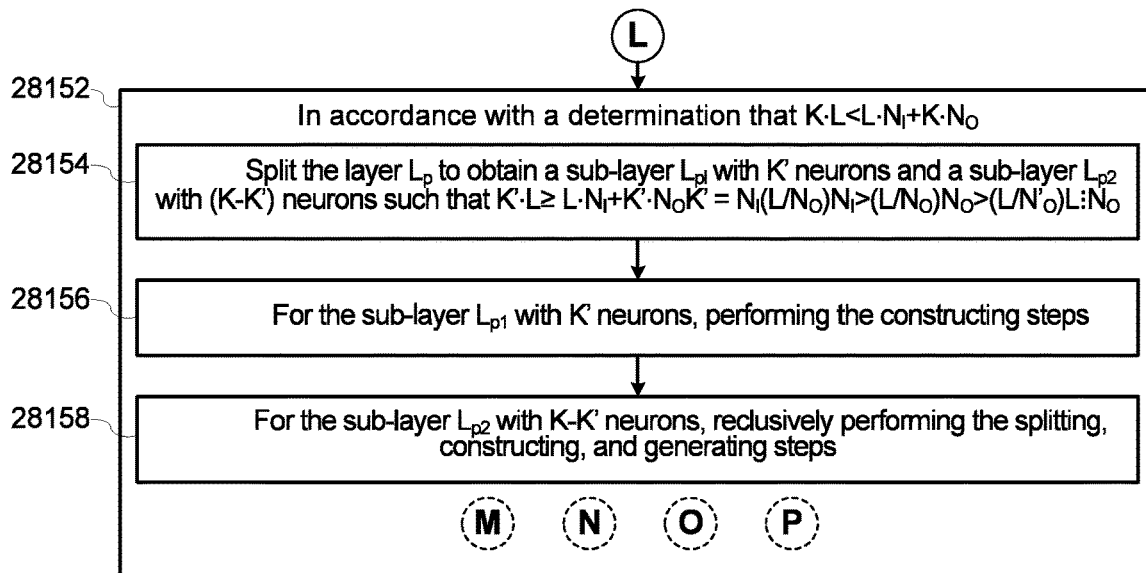
Figure 28N:
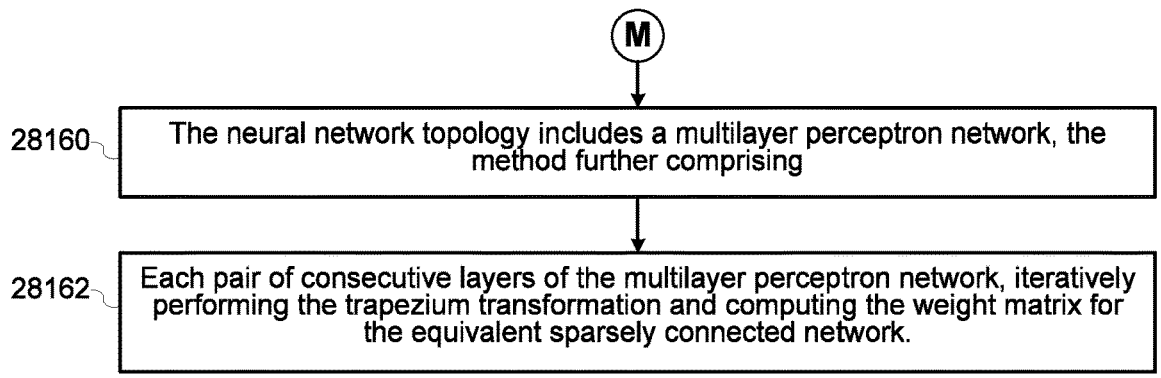
Figure 28O:
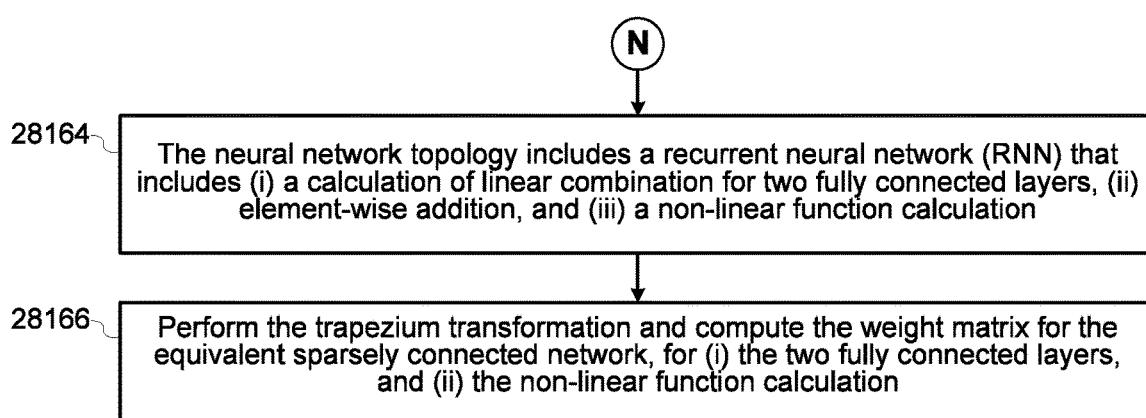
Figure 28P:
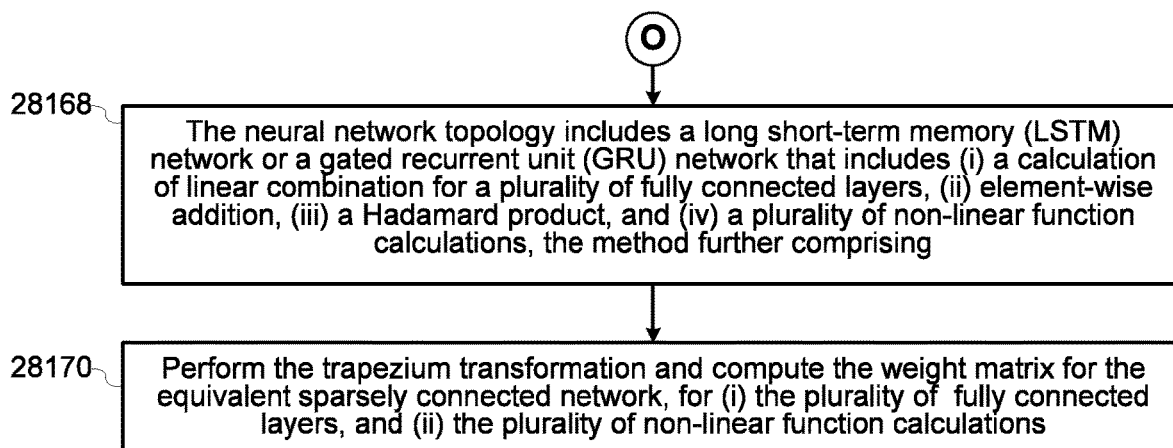
Figure 28Q:
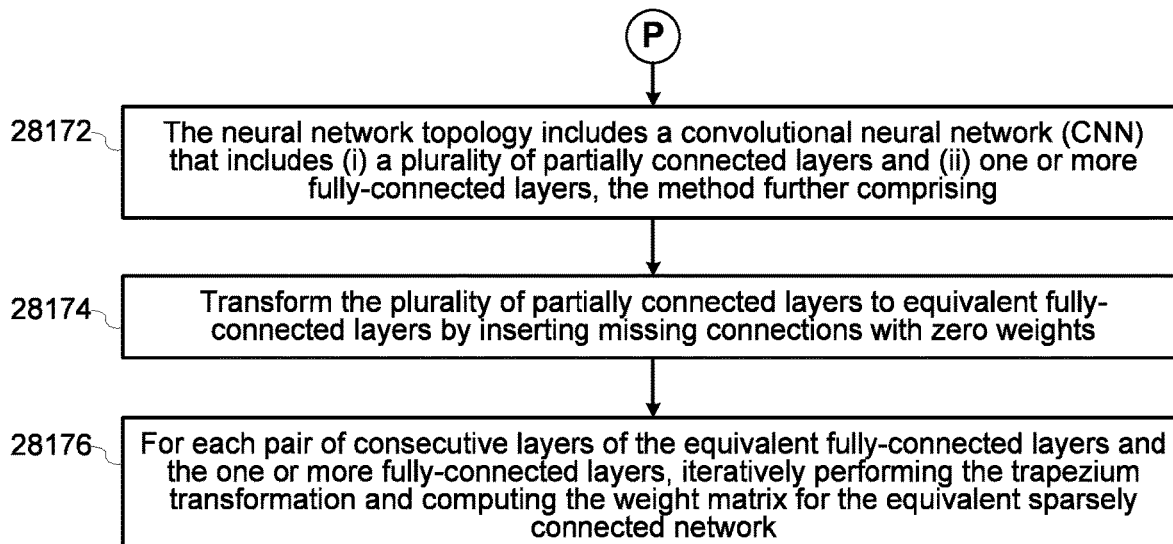
Figure 28R:
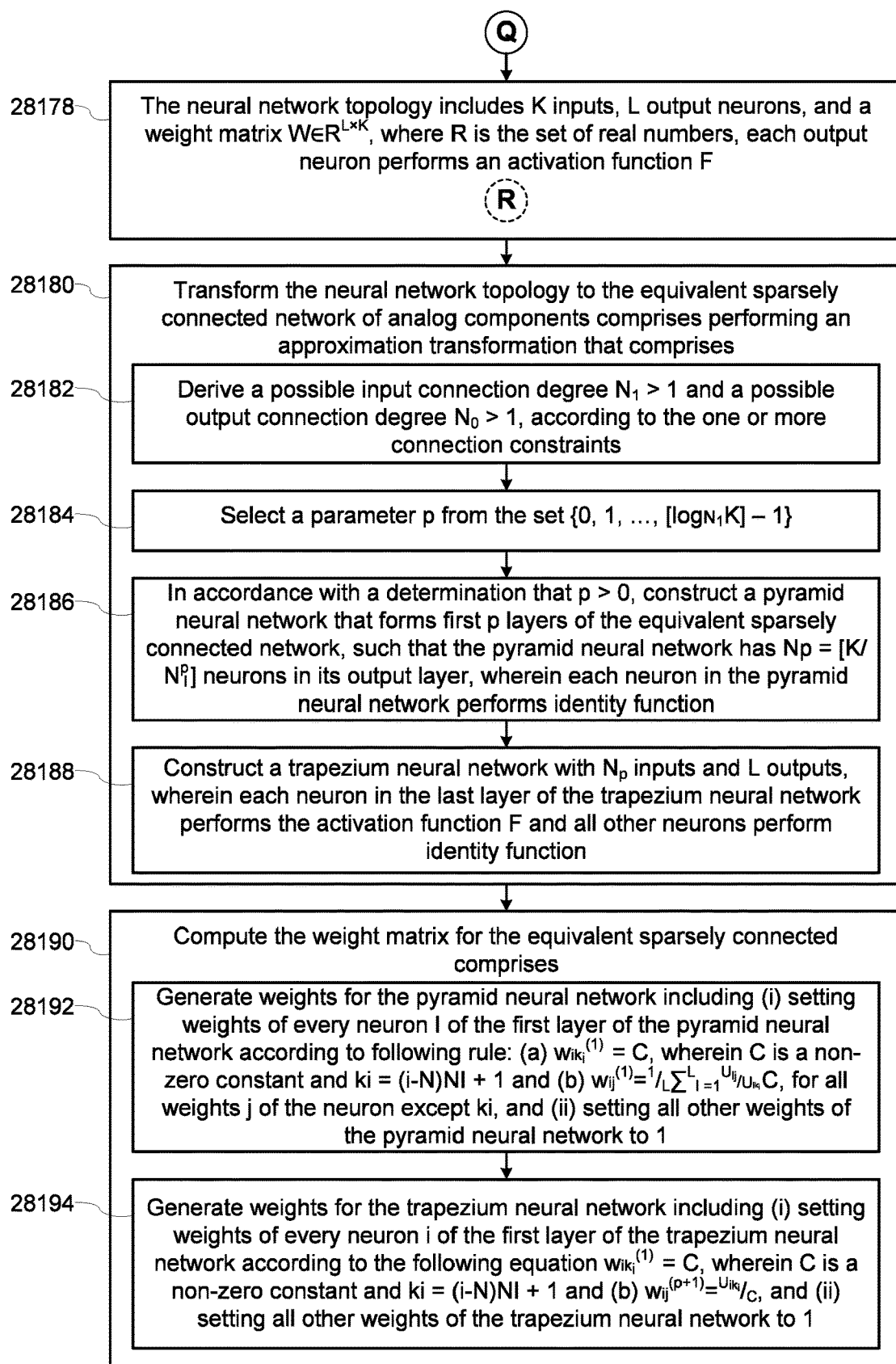
Figure 28S:
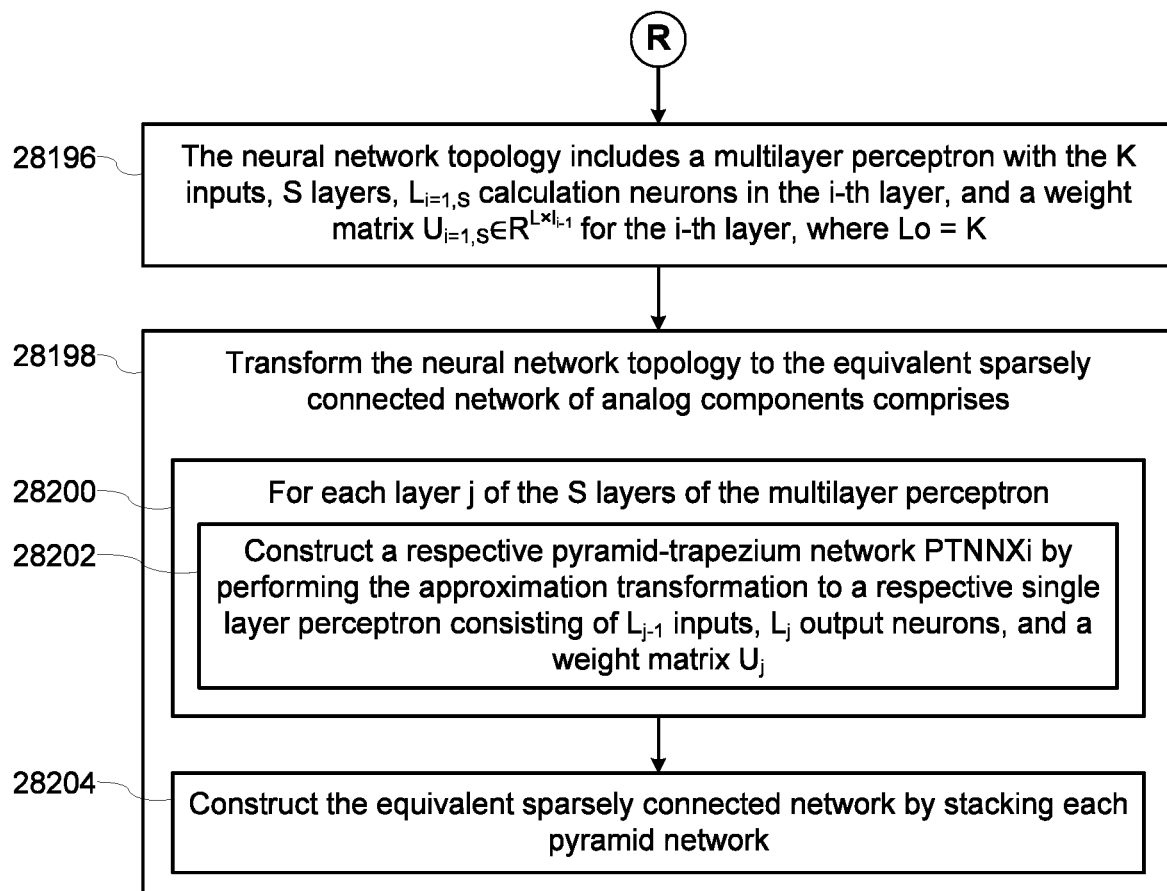

FIGS. 28A-28S show a flowchart of a method 28000 for hardware realization (28002) of neural networks according to hardware design constraints, according to some implementations The method is performed (28004) at the computing device 200 (e.g., using the neural network transformation module 226) having one or more processors 202, and memory 214 storing one or more programs configured for execution by the one or more processors 202. The method includes obtaining (28006) a neural network topology (e.g., the topology 224) and weights (e.g., the weights 222) of a trained neural network (e.g., the networks 220).

The method also includes calculating (28008) one or more connection constraints based on analog integrated circuit (IC) design constraints (e.g., the constraints 236). For example, IC design constraints can set the current limit (e.g., 1A), and neuron schematics and operational amplifier (OpAmp) design can set the OpAmp output current in the range [0-10 mA], so this limits output neuron connections to 100. This means that the neuron has 100 outputs which allow the current to flow to the next layer through 100 connections, but current at the output of the operational amplifier is limited to 10 mA, so some implementations use a maximum of 100 outputs (0.1 mA times 100=10 mA). Without this constraint, some implementations use current repeaters to increase number of outputs to more than 100, for example.

The method also includes transforming (28010) the neural network topology (e.g., using the neural network transformation module 226) to an equivalent sparsely connected network of analog components satisfying the one or more connection constraints.

In some implementations, transforming the neural network topology includes deriving (28012) a possible input connection degree $N_i$ and output connection degree $N_o$, according to the one or more connection constraints.

Referring next to FIG. 28B, in some implementations, the neural network topology includes (28018) at least one densely connected layer with K inputs (neurons in previous layer) and L outputs (neurons in current layer) and a weight matrix U, and transforming (28020) the at least one densely connected layer includes constructing (28022) the equivalent sparsely connected network with K inputs, L outputs, and $\lceil \log_{N_i} K \rceil + \lceil \log_{N_o} L \rceil - 1$ layers, such that input connection degree does not exceed $N_i$, and output connection degree does not exceed $N_o$.

Referring next to FIG. 28C, in some implementations, the neural network topology includes (28024) at least one densely connected layer with K inputs (neurons in previous layer) and L outputs (neurons in current layer) and a weight matrix U, and transforming (28026) the at least one densely connected layer includes: constructing (28028) the equivalent sparsely connected network with K inputs, L outputs, and $M \geq \max(\lceil \log_{N_i} L \rceil, \lceil \log_{N_o} K \rceil)$ layers. Each layer m is represented by a corresponding weight matrix $U_m$, where absent connections are represented with zeros, such that input connection degree does not exceed $N_i$, and output connection degree does not exceed $N_o$. The equation $U = \Pi_{m=1 \ldots M} U_m$ is satisfied with a predetermined precision. The predetermined precision is a reasonable precision value that statistically guarantees that altered networks output differs from referent network output by no more than allowed error value, and this error value is task-dependent (typically between 0.1% and 1%).

Referring next to FIG. 28D, in some implementations, the neural network topology includes (28030) a single sparsely connected layer with K inputs and L outputs, a maximum input connection degree of $P_i$, a maximum output connection degree of $P_o$, and a weight matrix of U, where absent connections are represented with zeros. In such cases, transforming (28032) the single sparsely connected layer includes constructing (28034) the equivalent sparsely connected network with K inputs, L outputs, $M \geq \max(\lceil \log_{N_i} P_i \rceil, \lceil \log_{N_o} P_o \rceil)$ layers. Each layer m is represented by a corresponding weight matrix $U_m$, where absent connections are represented with zeros, such that input connection degree does not exceed $N_i$, and output connection degree does not exceed $N_o$, and the equation $U = \Pi_{m=1 \ldots M} U_m$ is satisfied with a predetermined precision.

Referring next to FIG. 28E, in some implementations, the neural network topology includes (28036) a convolutional layer (e.g., a Depthwise convolutional layer, or a Separable convolutional layer) with K inputs (neurons in previous layer) and L outputs (neurons in current layer). In such cases, transforming (28038) the neural network topology to the equivalent sparsely connected network of analog components includes decomposing (28040) the convolutional layer into a single sparsely connected layer with K inputs, L outputs, a maximum input connection degree of $P_i$, and a maximum output connection degree of $P_o$, where $P_i \leq N_i$ and $P_o \leq N_o$.

Referring back to FIG. 28A, the method also includes computing (28014) a weight matrix for the equivalent sparsely connected network based on the weights of the trained neural network. Each element of the weight matrix represents a respective connection between analog components of the equivalent sparsely connected network.

Referring now to FIG. 28F, in some implementations, the neural network topology includes (28042) a recurrent neural layer, and transforming (28044) the neural network topology to the equivalent sparsely connected network of analog components includes transforming (28046) the recurrent neural layer into one or more densely or sparsely connected layers with signal delay connections.

Referring next to FIG. 28G, in some implementations, the neural network topology includes a recurrent neural layer (e.g., a long short-term memory (LSTM) layer or a gated recurrent unit (GRU) layer), and transforming the neural network topology to the equivalent sparsely connected network of analog components includes decomposing the recurrent neural layer into several layers, where at least one of the layers is equivalent to a densely or sparsely connected layer with K inputs (neurons in previous layer) and L outputs (neurons in current layer) and a weight matrix U, where absent connections are represented with zeros.

Referring next to FIG. 28H, in some implementations, the method includes performing a transformation of a single layer perceptron with one calculation neurons. In some implementations, the neural network topology includes (28054) K inputs, a weight vector $U \in R^K$, and a single layer perceptron with a calculation neuron with an activation function F. In such cases, transforming (28056) the neural network topology to the equivalent sparsely connected network of analog components includes: (i) deriving (28058) a connection degree N for the equivalent sparsely connected network according to the one or more connection constraints; (ii) calculating (28060) a number of layers m for the equivalent sparsely connected network using the equation $m = \lceil \log_N K \rceil$; and (iii) constructing (28062) the equivalent sparsely connected network with the K inputs, m layers and the connection degree N. The equivalent sparsely connected network includes respective one or more analog neurons in each layer of the m layers. Each analog neuron of first m−1 layers implements identity transform, and an analog neuron of last layer implements the activation function F of the calculation neuron of the single layer perceptron. Furthermore, in such cases, computing (28064) the weight matrix for the equivalent sparsely connected network includes calculating (28066) a weight vector W for connections of the equivalent sparsely connected network by solving a system of equations based on the weight vector U. The system of equations includes K equations with S variables, and S is computed using the equation $$S = K\left(\frac{N^m - 1}{N^{m-1}(N-1)}\right).$$

Referring next to FIG. 28I, in some implementations, the method includes performing a transformation of a single layer perceptron with L calculation neurons. In some implementations, the neural network topology includes (28068) K inputs, a single layer perceptron with L calculation neurons, and a weight matrix V that includes a row of weights for each calculation neuron of the L calculation neurons. In such cases, transforming (28070) the neural network topology to the equivalent sparsely connected network of analog components includes: (i) deriving (28072) a connection degree N for the equivalent sparsely connected network according to the one or more connection constraints; (ii) calculating (28074) number of layers m for the equivalent sparsely connected network using the equation $m = \lceil \log_N K \rceil$; (iii) decomposing (28076) the single layer perceptron into L single layer perceptron networks. Each single layer perceptron network includes a respective calculation neuron of the L calculation neurons; (iv) for each single layer perceptron network (28078) of the L single layer perceptron networks, constructing (28080) a respective equivalent pyramid-like sub-network for the respective single layer perceptron network with the K inputs, the m layers and the connection degree N. The equivalent pyramid-like sub-network includes one or more respective analog neurons in each layer of the m layers, each analog neuron of first m−1 layers implements identity transform, and an analog neuron of last layer implements the activation function of the respective calculation neuron corresponding to the respective single layer perceptron; and (v) constructing (28082) the equivalent sparsely connected network by concatenating each equivalent pyramid-like sub-network including concatenating an input of each equivalent pyramid-like sub-network for the L single layer perceptron networks to form an input vector with L*K inputs. Furthermore, in such cases, computing (28084) the weight matrix for the equivalent sparsely connected network includes, for each single layer perceptron network (28086) of the L single layer perceptron networks, (i) setting (28088) a weight vector $U = V_i$, $i^{th}$ row of the weight matrix V corresponding to the respective calculation neuron corresponding to the respective single layer perceptron network, and (ii) calculating (28090) a weight vector $W_i$ for connections of the respective equivalent pyramid-like sub-network by solving a system of equations based on the weight vector U. The system of equations includes K equations with S variables, and S is computed using the equation $$S = K\left(\frac{N^m - 1}{N^{m-1}(N-1)}\right).$$

Referring next to FIG. 28J, in some implementations, the method includes performing a transformation algorithm for multi-layer perceptron. In some implementations, the neural network topology includes (28092) K inputs, a multi-layer perceptron with S layers, each layer i of the S layers includes a corresponding set of calculation neurons $L_i$ and corresponding weight matrices V that includes a row of weights for each calculation neuron of the $L_i$ calculation neurons. In such cases, transforming (28094) the neural network topology to the equivalent sparsely connected network of analog components includes: (i) deriving (28096) a connection degree N for the equivalent sparsely connected network according to the one or more connection constraints; (ii) decomposing (28098) the multi-layer perceptron into $Q = \Sigma_{i=1,S}(L_i)$ single layer perceptron networks. Each single layer perceptron network includes a respective calculation neuron of the Q calculation neurons. Decomposing the multi-layer perceptron includes duplicating one or more input of the K inputs that are shared by the Q calculation neurons; (iii) for each single layer perceptron network (28100) of the Q single layer perceptron networks, (a) calculating (28102) a number of layers m for a respective equivalent pyramid-like sub-network using the equation $m = \lceil \log_N K_{i,j} \rceil$. $K_{i,j}$ is number of inputs for the respective calculation neuron in the multi-layer perceptron, and (b) constructing (28104) the respective equivalent pyramid-like sub-network for the respective single layer perceptron network with $K_{i,j}$ inputs, the m layers and the connection degree N. The equivalent pyramid-like sub-network includes one or more respective analog neurons in each layer of the m layers, each analog neuron of first m−1 layers implements identity transform, and an analog neuron of last layer implements the activation function of the respective calculation neuron corresponding to the respective single layer perceptron network; and (iv) constructing (28106) the equivalent sparsely connected network by concatenating each equivalent pyramid-like sub-network including concatenating input of each equivalent pyramid-like sub-network for the Q single layer perceptron networks to form an input vector with $Q*K_{i,j}$ inputs. In such cases, computing (28108) the weight matrix for the equivalent sparsely connected network includes: for each single layer perceptron network (28110) of the Q single layer perceptron networks, (i) setting (28112) a weight vector $U=V_i^j$, the $i^{th}$ row of the weight matrix V corresponding to the respective calculation neuron corresponding to the respective single layer perceptron network, where j is the corresponding layer of the respective calculation neuron in the multi-layer perceptron; and (ii) calculating (28114) a weight vector $W_i$ for connections of the respective equivalent pyramid-like sub-network by solving a system of equations based on the weight vector U. The system of equations includes $K_{i,j}$ equations with S variables, and S is computed using the equation $$S = K_{i,j}\left(\frac{N^m - 1}{N^{m-1}(N-1)}\right).$$

Referring next to FIG. 28K, in some implementations, the neural network topology includes (28116) a Convolutional Neural Network (CNN) with K inputs, S layers, each layer i of the S layers includes a corresponding set of calculation neurons $L_i$ and corresponding weight matrices V that includes a row of weights for each calculation neuron of the $L_i$ calculation neurons. In such cases, transforming (28118) the neural network topology to the equivalent sparsely connected network of analog components includes: (i) deriving (28120) a connection degree N for the equivalent sparsely connected network according to the one or more connection constraints; (ii) decomposing (28122) the CNN into $Q=\Sigma_{i=1,S}(L_i)$ single layer perceptron networks. Each single layer perceptron network includes a respective calculation neuron of the Q calculation neurons. Decomposing the CNN includes duplicating one or more input of the K inputs that are shared by the Q calculation neurons; (iii) for each single layer perceptron network of the Q single layer perceptron networks: (a) calculating number of layers m for a respective equivalent pyramid-like sub-network using the equation $m=\lceil \log_N K_{i,j}\rceil$. j is the corresponding layer of the respective calculation neuron in the CNN, and $K_{i,j}$ is number of inputs for the respective calculation neuron in the CNN; and (b) constructing the respective equivalent pyramid-like sub-network for the respective single layer perceptron network with $K_{i,j}$ inputs, the m layers and the connection degree N. The equivalent pyramid-like sub-network includes one or more respective analog neurons in each layer of the m layers, each analog neuron of first m−1 layers implements identity transform, and an analog neuron of last layer implements the activation function of the respective calculation neuron corresponding to the respective single layer perceptron network; and (iv) constructing (28130) the equivalent sparsely connected network by concatenating each equivalent pyramid-like sub-network including concatenating input of each equivalent pyramid-like sub-network for the Q single layer perceptron networks to form an input vector with $Q*K_{i,j}$ inputs. In such cases, computing (28132) the weight matrix for the equivalent sparsely connected network includes, for each single layer perceptron network (28134) of the Q single layer perceptron networks: (i) setting a weight vector $U=V_i^j$, the $i^{th}$ row of the weight matrix V corresponding to the respective calculation neuron corresponding to the respective single layer perceptron network, where j is the corresponding layer of the respective calculation neuron in the CNN; and (ii) calculating weight vector $W_i$ for connections of the respective equivalent pyramid-like sub-network by solving a system of equations based on the weight vector U. The system of equations includes $K_{i,j}$ equations with S variables, and S is computed using the equations $$S = K_{i,j}\left(\frac{N^m - 1}{N^{m-1}(N-1)}\right).$$

Referring next to FIG. 28L, in some implementations, the method includes transforming two layers to trapezium-based network. In some implementations, the neural network topology includes (28140) K inputs, a layer $L_p$ with K neurons, a layer $L_n$ with L neurons, and a weight matrix $W \in R^{L \times K}$, where R is the set of real numbers, each neuron of the layer $L_p$ is connected to each neuron of the layer $L_n$, and each neuron of the layer $L_n$ performs an activation function F, such that output of the layer $L_n$ is computed using the equation $Y_o = F(W \cdot x)$ for an input x. In such cases, transforming (28142) the neural network topology to the equivalent sparsely connected network of analog components includes performing a trapezium transformation that includes: (i) deriving (28144) a possible input connection degree $N_I > 1$ and a possible output connection degree $N_O > 1$, according to the one or more connection constraints; and (ii) in accordance with a determination that $K \cdot L < L \cdot N_I + K \cdot N_O$, constructing (28146) a three-layered analog network that includes a layer $LA_p$ with K analog neurons performing identity activation function, a layer $LA_h$ with $$M = \left\lceil \max\left(\frac{K \cdot N_I}{No}, \frac{L \cdot No}{N_I}\right)\right\rceil$$

analog neurons performing identity activation function, and a layer $LA_o$ with L analog neurons performing the activation function F, such that each analog neuron in the layer $LA_p$ has $N_O$ outputs, each analog neuron in the layer $LA_h$ has not more than $N_I$ inputs and $N_O$ outputs, and each analog neuron in the layer $LA_o$ has $N_I$ inputs. In some such cases, computing (28148) the weight matrix for the equivalent sparsely connected network includes generating (2850) a sparse weight matrices $W_o$ and $W_h$ by solving a matrix equation $W_o \cdot W_h = W$ that includes $K \cdot L$ equations in $K \cdot N_O + L \cdot N_I$ variables, so that the total output of the layer $LA_o$ is calculated using the equation $Y_o = F(W_o \cdot W_h \cdot x)$. The sparse weight matrix $W_o \in R^{M \times L}$ represents connections between the layers $LA_p$ and $LA_h$, and the sparse weight matrix $W_h \in R^{M \times L}$ represents connections between the layers $LA_h$ and $LA_o$.

Referring next to FIG. 28M, in some implementations, performing the trapezium transformation further includes: in accordance with a determination that $K \cdot L \geq L \cdot N_I + K \cdot N_O$: (i) splitting (28154) the layer $L_p$ to obtain a sub-layer $L_{p1}$ with K' neurons and a sub-layer $L_{p2}$ with (K−K') neurons such that $K' \cdot L \geq L \cdot N_I + K' \cdot N_O$; (ii) for the sub-layer $L_{p1}$ with K' neurons, performing (28156) the constructing, and generating steps; and (iii) for the sub-layer $L_{p2}$ with K−K' neurons, recursively performing (28158) the splitting, constructing, and generating steps.

Referring next to FIG. 28N, the method includes transforming multilayer perceptron to trapezium-based network. In some implementations, the neural network topology includes (28160) a multilayer perceptron network, the method further includes, for each pair of consecutive layers of the multilayer perceptron network, iteratively performing (28162) the trapezium transformation and computing the weight matrix for the equivalent sparsely connected network.

Referring next to FIG. 28O, the method includes transforming recurrent neural network to trapezium-based network. In some implementations, the neural network topology includes (28164) a recurrent neural network (RNN) that includes (i) a calculation of linear combination for two fully connected layers, (ii) element-wise addition, and (iii) a non-linear function calculation. In such cases, the method further includes performing (28166) the trapezium transformation and computing the weight matrix for the equivalent sparsely connected network, for (i) the two fully connected layers, and (ii) the non-linear function calculation. Element-wise addition is a common operation that can be implemented in networks of any structure, examples of which are provided above. Non-linear function calculation is a neuron-wise operation that is independent of the No and Ni restrictions, and are usually calculated with 'sigmoid' or 'tank' block on each neuron separately.

Referring next to FIG. 28P, the neural network topology includes (28168) a long short-term memory (LSTM) network or a gated recurrent unit (GRU) network that includes (i) a calculation of linear combination for a plurality of fully connected layers, (ii) element-wise addition, (iii) a Hadamard product, and (iv) a plurality of non-linear function calculations (sigmoid and hyperbolic tangent operations). In such cases, the method further includes performing (28170) the trapezium transformation and computing the weight matrix for the equivalent sparsely connected network, for (i) the plurality of fully connected layers, and (ii) the plurality of non-linear function calculations. Element-wise addition and Hadamard products are common operations that can be implemented in networks of any structure described above.

Referring next to FIG. 28Q, the neural network topology includes (28172) a convolutional neural network (CNN) that includes (i) a plurality of partially connected layers (e.g., sequence of convolutional and pooling layers; each pooling layer is assumed to be a convolutional later with stride larger than 1) and (ii) one or more fully-connected layers (the sequence ends in the fully-connected layers). In such cases, the method further includes (i) transforming (28174) the plurality of partially connected layers to equivalent fully-connected layers by inserting missing connections with zero weights; and for each pair of consecutive layers of the equivalent fully-connected layers and the one or more fully-connected layers, iteratively performing (28176) the trapezium transformation and computing the weight matrix for the equivalent sparsely connected network.

Referring next to FIG. 28R, the neural network topology includes (28178) K inputs, L output neurons, and a weight matrix $U \in R^{L \times K}$, where R is the set of real numbers, each output neuron performs an activation function F. In such cases, transforming (28180) the neural network topology to the equivalent sparsely connected network of analog components includes performing an approximation transformation that includes: (i) deriving (28182) a possible input connection degree $N_I > 1$ and a possible output connection degree $N_O > 1$, according to the one or more connection constraints; (ii) selecting (28184) a parameter p from the set $\{0, 1, \ldots, \lceil \log_{N_I} K \rceil - 1\}$; (iii) in accordance with a determination that p>0, constructing (28186) a pyramid neural network that forms first p layers of the equivalent sparsely connected network, such that the pyramid neural network has $N_p = \lceil K/N_I^p \rceil$ neurons in its output layer. Each neuron in the pyramid neural network performs identity function; and (iv) constructing (28188) a trapezium neural network with $N_p$ inputs and L outputs. Each neuron in the last layer of the trapezium neural network performs the activation function F and all other neurons perform identity function. Also, in such cases, computing (28190) the weight matrix for the equivalent sparsely connected network includes: (i) generating (28192) weights for the pyramid neural network including (i) setting weights of every neuron i of the first layer of the pyramid neural network according to following rule: (a) $w_{ik_i}^{(1)} = C$. C is a non-zero constant and $k_i = (i-1)N_I + 1$; and $$w_{ij}^{(1)} = \frac{1}{L} \sum_{i=1}^{L} \frac{U_{lj}}{U_{lk_i}} C, \qquad (b)$$

for all weights j of the neuron except $k_i$; and (ii) setting all other weights of the pyramid neural network to 1; and (ii) generating (28194) weights for the trapezium neural network including (i) setting weights of each neuron i of the first layer of the trapezium neural network (considering the whole net, this is (p+1)th layer) according to the equation $$w_{ik_i}^{(p+1)} = \frac{U_{ik_i}}{C};$$

and (ii) setting other weights of the trapezium neural network to 1.

Referring next to FIG. 28S, in some implementations, the neural network topology includes (28196) a multilayer perceptron with the K inputs, S layers, and $L_{i=1,S}$ calculation neurons in i-th layer, and a weight matrix $U_{i=1,S} \in R^{L_i \times L_{i-1}}$ for the i-th layer, where $L_0 = K$. In such cases, transforming (28198) the neural network topology to the equivalent sparsely connected network of analog components includes: for each layer j (28200) of the S layers of the multilayer perceptron, constructing (28202) a respective pyramid-trapezium network $PTNNX_j$ by performing the approximation transformation to a respective single layer perceptron consisting of $L_{i-1}$ inputs, $L_1$ output neurons, and a weight matrix $U_1$; and (ii) constructing (28204) the equivalent sparsely connected network by stacking each pyramid trapezium network (e.g., output of a pyramid trapezium network PTNNXj−1 is set as an input for PTNNXj).

Referring back to FIG. 28A, In some implementations, the method further includes generating (28016) a schematic model for implementing the equivalent sparsely connected network utilizing the weight matrix.

Example Methods of Calculating Resistance Values for Analog Hardware Realization of Trained Neural Networks FIGS. 29A-29F show a flowchart of a method 2900 for hardware realization (2902) of neural networks according to hardware design constraints, according to some implementations. The method is performed (2904) at the computing device 200 (e.g., using the weight quantization module 238) having one or more processors 202, and memory 214 storing one or more programs configured for execution by the one or more processors 202.

The method includes obtaining (2906) a neural network topology (e.g., the topology 224) and weights (e.g., the weights 222) of a trained neural network (e.g., the networks 220). In some implementations, weight quantization is performed during training. In some implementations, the trained neural network is trained (2908) so that each layer of the neural network topology has quantized weights (e.g., a particular value from a list of discrete values; e.g., each layer has only 3 weight values of +1, 0, −1).

The method also includes transforming (2910) the neural network topology (e.g., using the neural network transformation module 226) to an equivalent analog network of analog components including a plurality of operational amplifiers and a plurality of resistors. Each operational amplifier represents an analog neuron of the equivalent analog network, and each resistor represents a connection between two analog neurons.

The method also includes computing (2912) a weight matrix for the equivalent analog network based on the weights of the trained neural network. Each element of the weight matrix represents a respective connection.

The method also includes generating (2914) a resistance matrix for the weight matrix. Each element of the resistance matrix corresponds to a respective weight of the weight matrix and represents a resistance value.

Figure 29A:
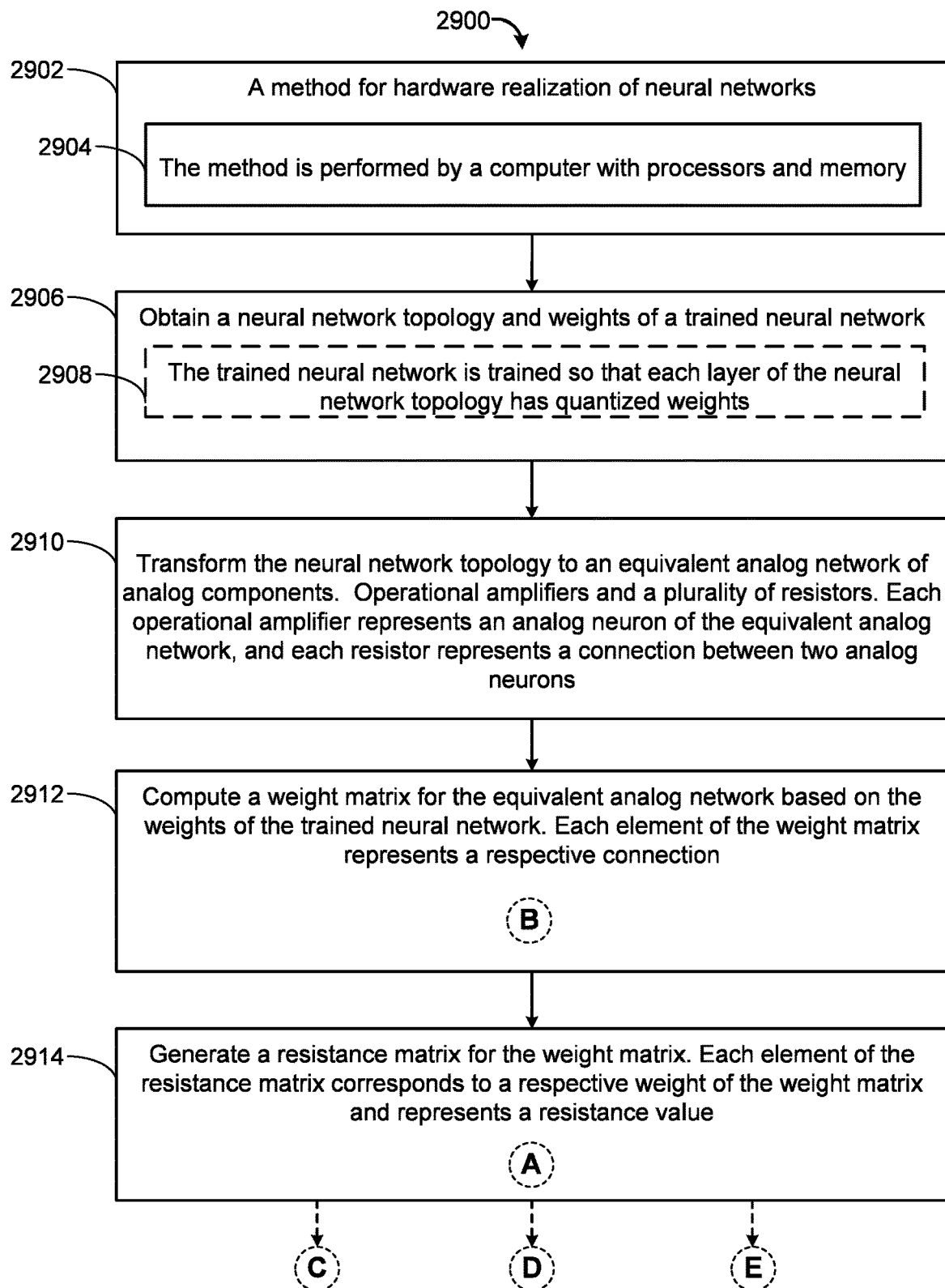
FIGS. 29A-29F show a flowchart of a method for hardware realization of neural networks according to hardware design constraints, according to some implementations.
Figure 29B:
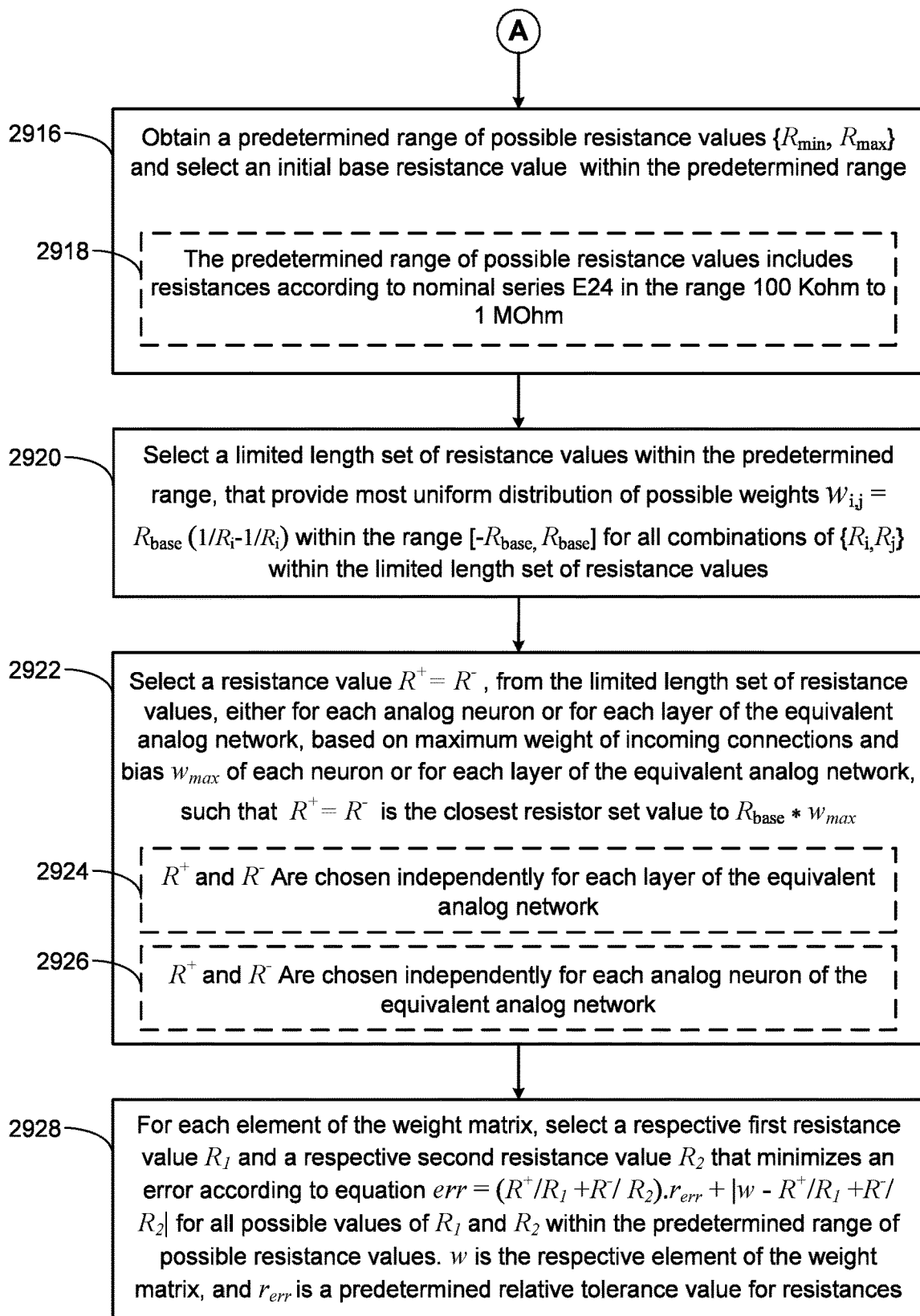

Referring next to FIG. 29B, in some implementations, generating the resistance matrix for the weight matrix includes a simplified gradient-descent based iterative method to find a resistor set. In some implementations, generating the resistance matrix for the weight matrix includes: (i) obtaining (2916) a predetermined range of possible resistance values $\{R_{min}, R_{max}\}$ and selecting an initial base resistance value $R_{base}$ within the predetermined range. For example, the range and the base resistance are selected according to values of elements of the weight matrix; the values are determined by the manufacturing process; ranges—resistors that can be actually manufactured; large resistors are not preferred; quantization of what can be actually manufactured. In some implementations, the predetermined range of possible resistance values includes (2918) resistances according to nominal series E24 in the range 100 KΩ to 1 MΩ; (ii) selecting (2920) a limited length set of resistance values, within the predetermined range, that provide most uniform distribution of possible weights $$w_{i,j} = R_{base}\left(\frac{1}{R_i} - \frac{1}{R_j}\right)$$

within the range $[-R_{base}, R_{base}]$ for all combinations of $\{R_i, R_j\}$ within the limited length set of resistance values. In some implementations, weight values are outside this range, but the square average distance between weights within this range is minimum; (iii) selecting (2922) a resistance value $R^+=R^-$, from the limited length set of resistance values, either for each analog neuron or for each layer of the equivalent analog network, based on maximum weight of incoming connections and bias $w_{max}$ of each neuron or for each layer of the equivalent analog network, such that $R^+=R^-$ is the closest resistor set value to $R_{base}*w_{max}$. In some implementations, $R^+$ and $R^-$ are chosen (2924) independently for each layer of the equivalent analog network. In some implementations, $R^+$ and $R^-$ are chosen (2926) independently for each analog neuron of the equivalent analog network; and (iv) for each element of the weight matrix, selecting (2928) a respective first resistance value $R_1$ and a respective second resistance value $R_2$ that minimizes an error according to equation $$err = \left(\frac{R^+}{R_1} + \frac{R^-}{R_2}\right) \cdot r_{err} + \left|w - \frac{R^+}{R_1} + \frac{R^-}{R_2}\right|$$

for all possible values of $R_1$ and $R_2$ within the predetermined range of possible resistance values. w is the respective element of the weight matrix, and $r_{err}$ is a predetermined relative tolerance value for the possible resistance values.

Figure 29C:
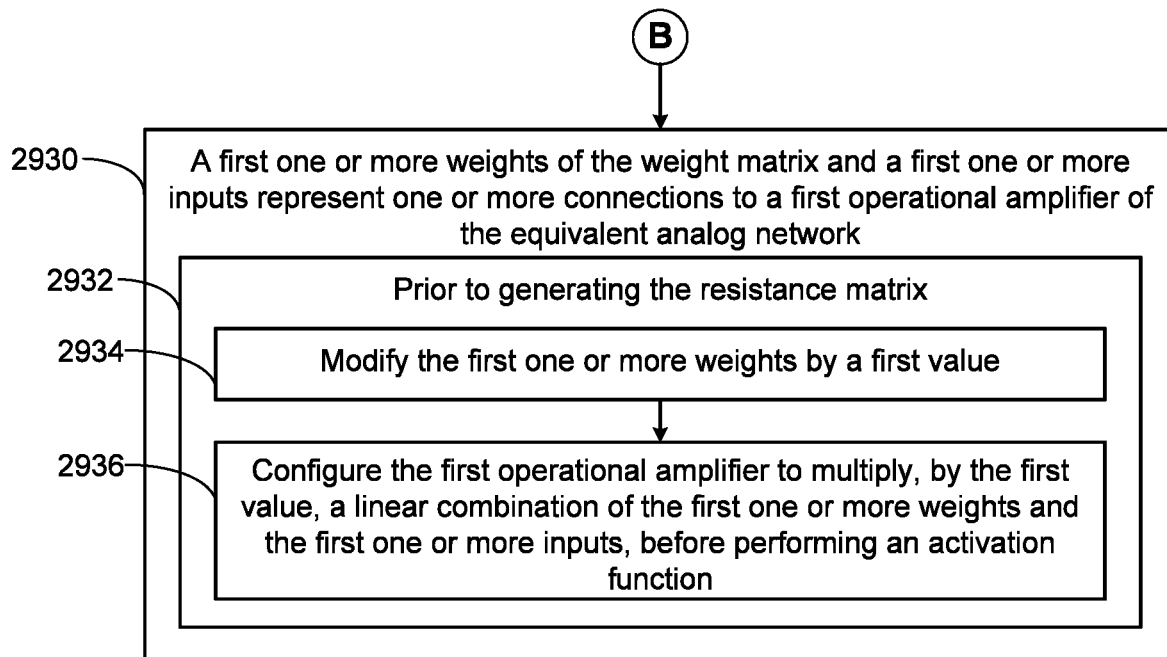

Referring next to FIG. 29C, some implementations perform weight reduction. In some implementations, a first one or more weights of the weight matrix and a first one or more inputs represent (2930) one or more connections to a first operational amplifier of the equivalent analog network. The method further includes: prior to generating (2932) the resistance matrix, (i) modifying (2934) the first one or more weights by a first value (e.g., dividing the first one or more weights by the first value to reduce weight range, or multiplying the first one or more weights by the first value to increase weight range); and (ii) configuring (2936) the first operational amplifier to multiply, by the first value, a linear combination of the first one or more weights and the first one or more inputs, before performing an activation function. Some implementations perform the weight reduction so as to change multiplication factor of one or more operational amplifiers. In some implementations, the resistor values set produce weights of some range, and in some parts of this range the error will be higher than in others. Suppose there are only 2 nominals (e.g., 1Ω and 4Ω), these resistors can produce weights [−3; −0.75; 0; 0.75; 3]. Suppose the first layer of a neural network has weights of {0, 9} and the second layer has weights of {0, 1}, some implementations divide the first layer's weights by 3 and multiply the second layer's weights by 3 to reduce overall error. Some implementations consider restricting weight values during training, by adjusting loss function (e.g., using l1 or l2 regularizer), so that resulting network does not have weights too large for the resistor set.

Figure 29D:
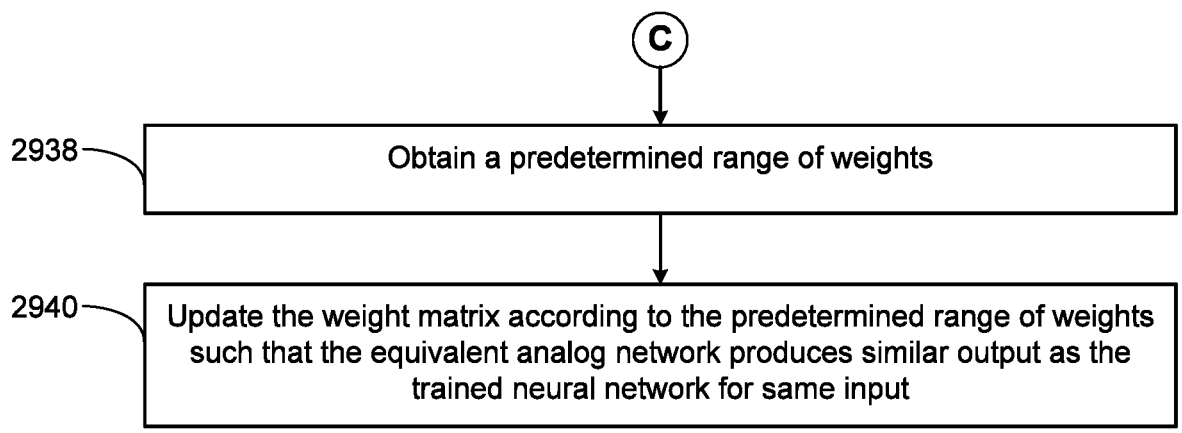

Referring next to FIG. 29D, the method further includes restricting weights to intervals. For example, the method further includes obtaining (2938) a predetermined range of weights, and updating (2940) the weight matrix according to the predetermined range of weights such that the equivalent analog network produces similar output as the trained neural network for same input.

Figure 29E:
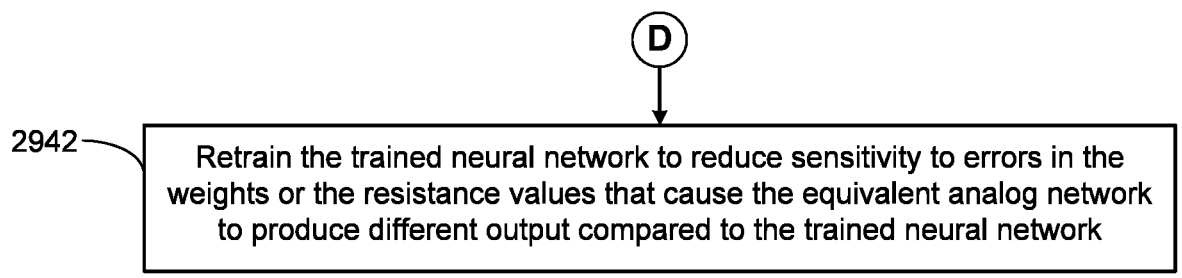

Referring next to FIG. 29E, the method further includes reducing weight sensitivity of network. For example, the method further includes retraining (2942) the trained neural network to reduce sensitivity to errors in the weights or the resistance values that cause the equivalent analog network to produce different output compared to the trained neural network. In other words, some implementations include additional training for an already trained neural network in order to give it less sensitivity to small randomly distributed weight errors. Quantization and resistor manufacturing produce small weight errors. Some implementations transform networks so that the resultant network is less sensitive to each particular weight value. In some implementations, this is performed by adding a small relative random value to each signal in at least some of the layers during training (e.g., similar to a dropout layer).

Figure 29F:
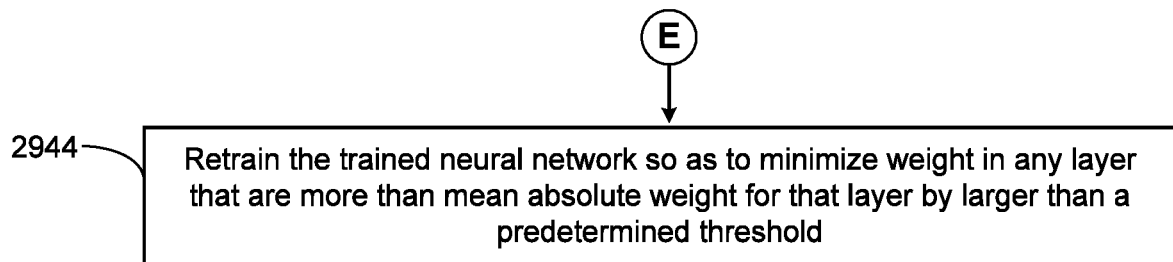

Referring next to FIG. 29F, some implementations include reducing weight distribution range. Some implementations include retraining (2944) the trained neural network so as to minimize weight in any layer that are more than mean absolute weight for that layer by larger than a predetermined threshold. Some implementations perform this step via retraining. Example penalty function include a sum over all layers (e.g., A*max(abs(w))/mean(abs(w)), where max and mean are calculated over a layer. Another example include order of magnitude higher and above. In some implementations, this function impacts weight quantization and network weight sensitivity. For e.g., small relative changes of weights due to quantization might cause high output error. Example techniques include introducing some penalty functions during training that penalize network when it has such weight outcasts.

Example Methods of Optimizations for Analog Hardware Realization of Trained Neural Networks FIGS. 30A-30M show a flowchart of a method 3000 for hardware realization (3002) of neural networks according to hardware design constraints, according to some implementations. The method is performed (3004) at the computing device 200 (e.g., using the analog neural network optimization module 246) having one or more processors 202, and memory 214 storing one or more programs configured for execution by the one or more processors 202.

The method includes obtaining (3006) a neural network topology (e.g., the topology 224) and weights (e.g., the weights 222) of a trained neural network (e.g., the networks 220).

The method also includes transforming (3008) the neural network topology (e.g., using the neural network transformation module 226) to an equivalent analog network of analog components including a plurality of operational amplifiers and a plurality of resistors. Each operational amplifier represents an analog neuron of the equivalent analog network, and each resistor represents a connection between two analog neurons.

Figure 30A:
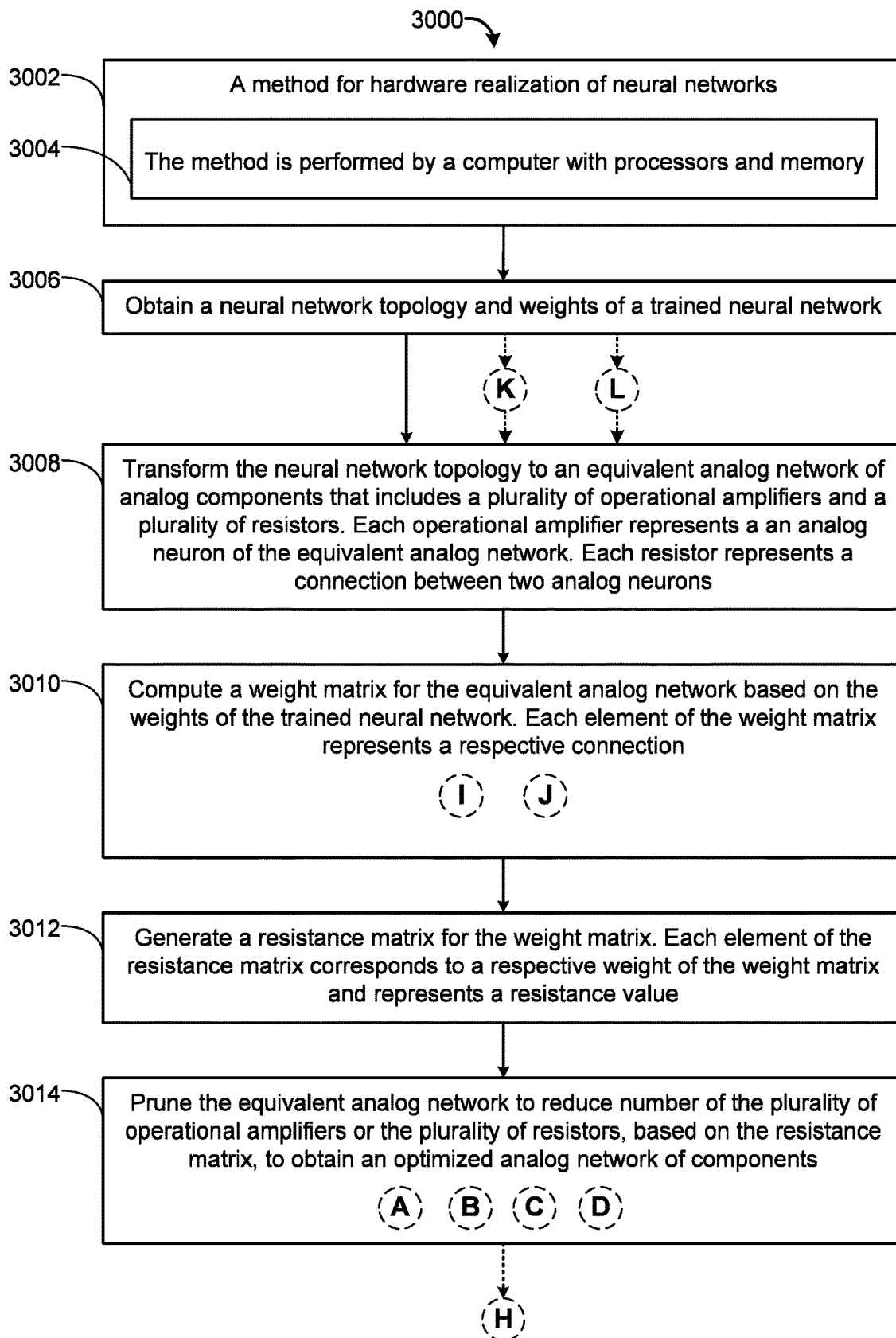
FIGS. 30A-30M show a flowchart of a method for hardware realization of neural networks according to hardware design constraints, according to some implementations.
Figure 30B:
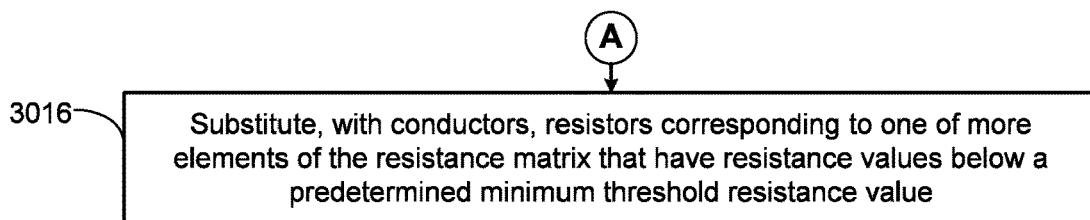
Figure 30C:
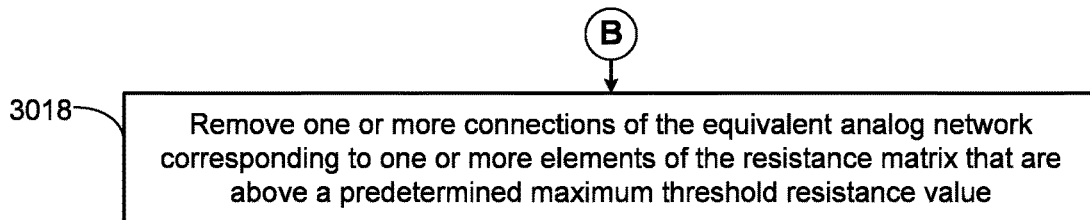
Figure 30D:
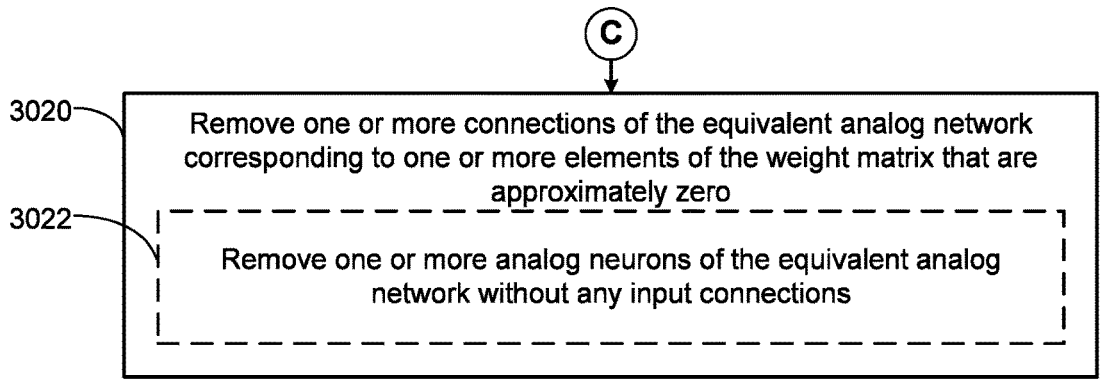
Figure 30E:
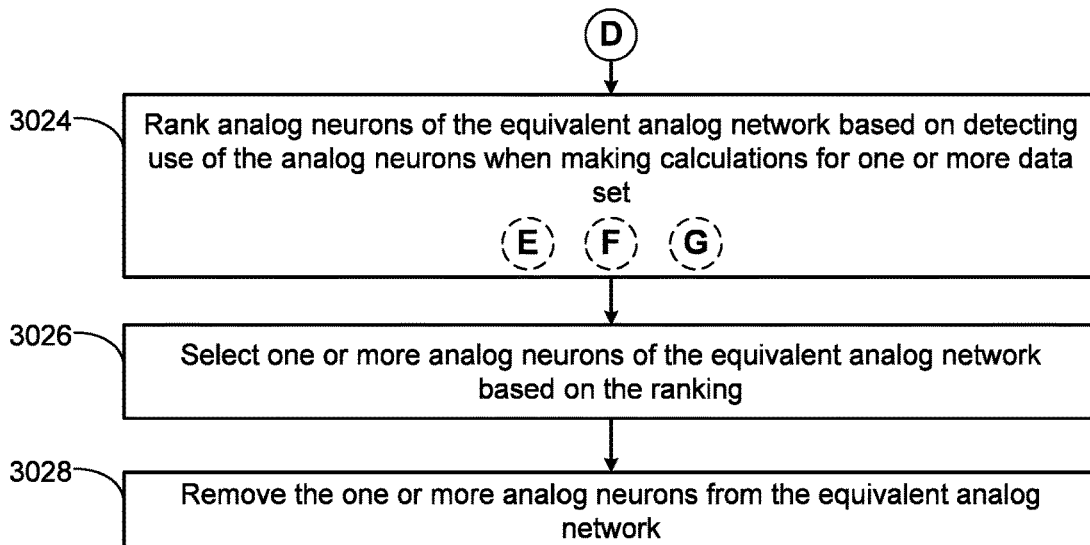
Figure 30F:
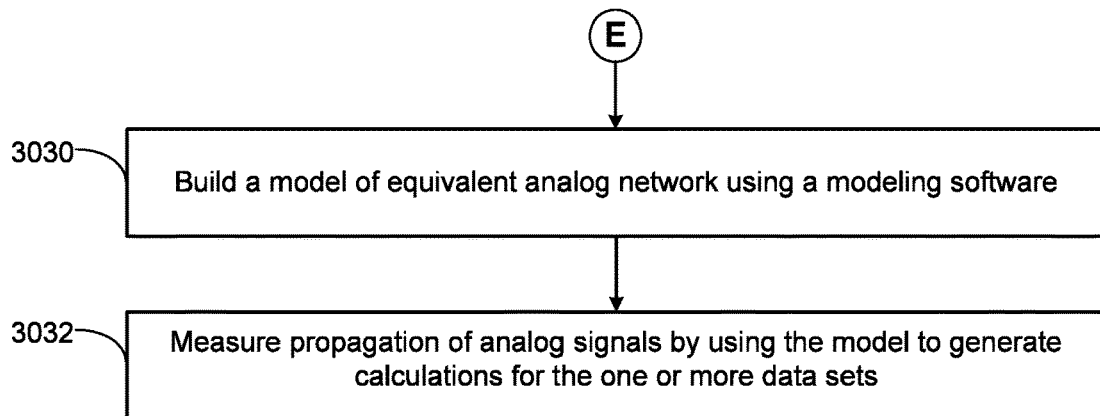
Figure 30G:
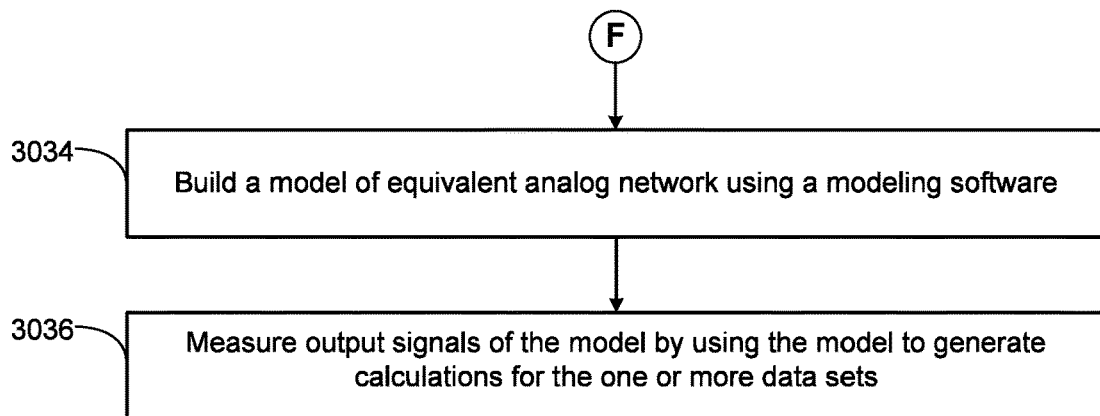
Figure 30H:
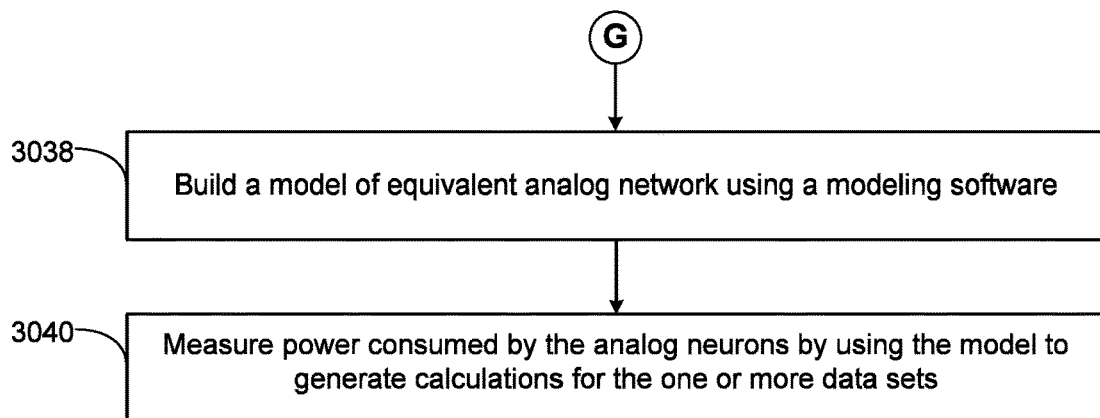
Figure 30I:
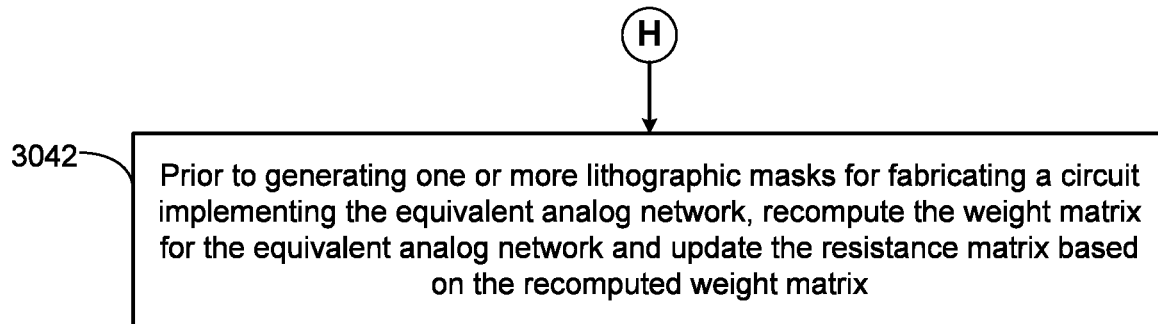
Figure 30J:
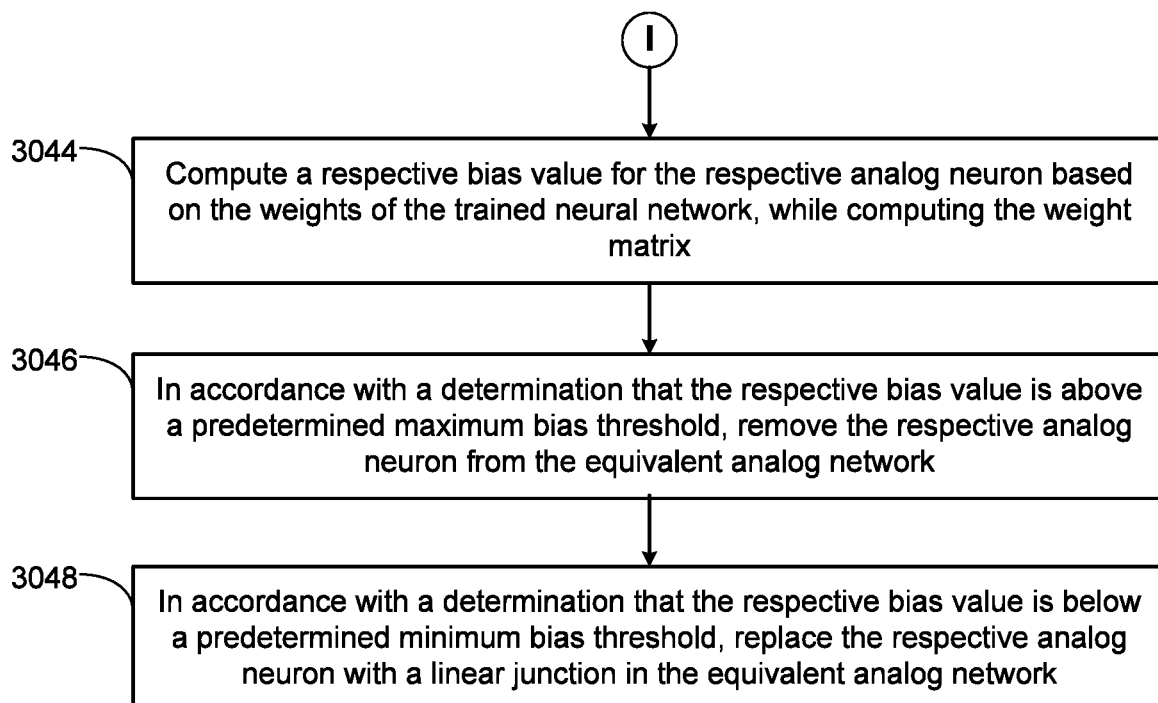
Figure 30K:
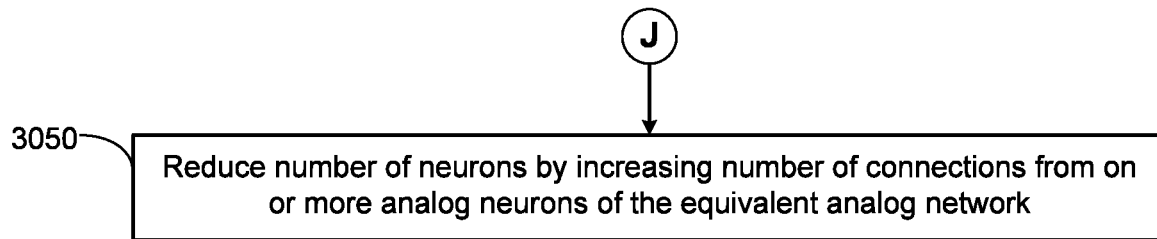
Figure 30L:
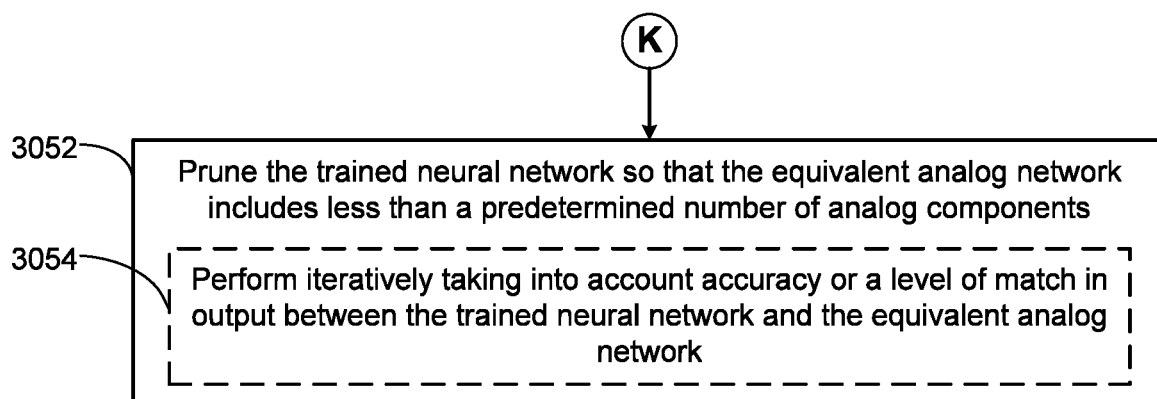

Referring next to FIG. 30L, in some implementations, the method further includes pruning the trained neural network. In some implementations, the method further includes pruning (3052) the trained neural network to update the neural network topology and the weights of the trained neural network, prior to transforming the neural network topology, using pruning techniques for neural networks, so that the equivalent analog network includes less than a predetermined number of analog components. In some implementations, the pruning is performed (3054) iteratively taking into account accuracy or a level of match in output between the trained neural network and the equivalent analog network.

Figure 30M:
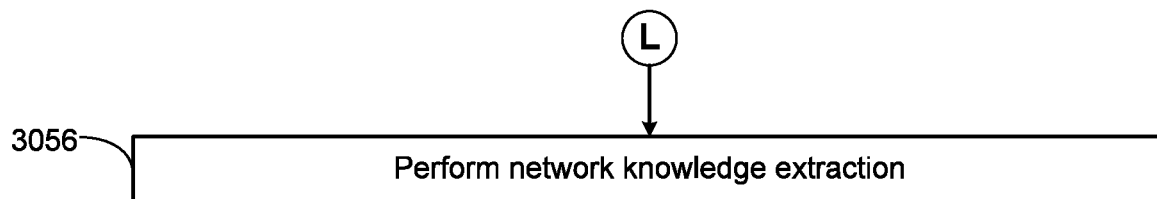

Referring next to FIG. 30M, in some implementations, the method further includes, prior to transforming the neural network topology to the equivalent analog network, performing (3056) network knowledge extraction. Knowledge extraction is unlike stochastic/learning like pruning, but more deterministic than pruning. In some implementations, knowledge extraction is performed independent of the pruning step. In some implementations, prior to transforming the neural network topology to the equivalent analog network, connection weights are adjusted according to predetermined optimality criteria (such as preferring zero weights, or weights in a particular range, over other weights) through methods of knowledge extraction, by derivation of causal relationships between inputs and outputs of hidden neurons. Conceptually, in a single neuron or a set of neurons, on particular data set, there might be causal relationships between inputs and outputs which allows readjustment of weights in such a manner, that (1) new set of weights produces the same network output, and (2) new set of weights is easier to implement with resistors (e.g., more uniformly distributed values, more zero values or no connection). For example, if some neuron output is always 1 on some dataset, some implementations remove this neuron's output connections (and the neuron as a whole), and instead adjust bias weight of the neurons following the neuron. In this way, knowledge extraction step is different to pruning, because pruning requires re-learning after removing a neuron, and learning is stochastic, while knowledge extraction is deterministic.

Referring back to FIG. 30A, the method also includes computing (3010) a weight matrix for the equivalent analog network based on the weights of the trained neural network. Each element of the weight matrix represents a respective connection.

Referring next to FIG. 30J, in some implementations, the method further includes removing or transforming neurons based on bias values. In some implementations, the method further includes, for each analog neuron of the equivalent analog network: (i) computing (3044) a respective bias value for the respective analog neuron based on the weights of the trained neural network, while computing the weight matrix; (ii) in accordance with a determination that the respective bias value is above a predetermined maximum bias threshold, removing (3046) the respective analog neuron from the equivalent analog network; and (iii) in accordance with a determination that the respective bias value is below a predetermined minimum bias threshold, replacing (3048) the respective analog neuron with a linear junction in the equivalent analog network.

Referring next to FIG. 30K, in some implementations, the method further includes minimizing number of neurons or compacting the network. In some implementations, the method further includes reducing (3050) number of neurons of the equivalent analog network, prior to generating the weight matrix, by increasing number of connections (inputs and outputs) from one or more analog neurons of the equivalent analog network.

Referring back to FIG. 30A, the method also includes generating (3012) a resistance matrix for the weight matrix. Each element of the resistance matrix corresponds to a respective weight of the weight matrix.

The method also includes pruning (3014) the equivalent analog network to reduce number of the plurality of operational amplifiers or the plurality of resistors, based on the resistance matrix, to obtain an optimized analog network of analog components.

Referring next to FIG. 30B, in some implementations, the method includes substituting insignificant resistances with conductors. In some implementations, pruning the equivalent analog network includes substituting (3016), with conductors, resistors corresponding to one or more elements of the resistance matrix that have resistance values below a predetermined minimum threshold resistance value.

Referring next to FIG. 30C, in some implementations, the method further includes removing connections with very high resistances. In some implementations, pruning the equivalent analog network includes removing (3018) one or more connections of the equivalent analog network corresponding to one or more elements of the resistance matrix that are above a predetermined maximum threshold resistance value.

Referring next to FIG. 30D, in some implementations, pruning the equivalent analog network includes removing (3020) one or more connections of the equivalent analog network corresponding to one or more elements of the weight matrix that are approximately zero. In some implementations, pruning the equivalent analog network further includes removing (3022) one or more analog neurons of the equivalent analog network without any input connections.

Referring next to FIG. 30E, in some implementations, the method includes removing unimportant neurons. In some implementations, pruning the equivalent analog network includes (i) ranking (3024) analog neurons of the equivalent analog network based on detecting use of the analog neurons when making calculations for one or more data sets. For example, training data set used to train the trained neural network; typical data sets; data sets developed for pruning procedure. Some implementations perform ranking of neurons for pruning based on frequency of use of given neuron or block of neurons when subjected to training data set. For example, (a) if there is no signal at given neuron never, when using test data set—meaning this neuron or block of neurons was never in use and are pruned; (b) if the frequency of use of the neuron is very low, then the neuron is pruned without significant loss of accuracy; and (c) the neuron is always in use, then the neuron cannot be pruned); (ii) selecting (3026) one or more analog neurons of the equivalent analog network based on the ranking; and (iii) removing (3028) the one or more analog neurons from the equivalent analog network.

Referring next to FIG. 30F, in some implementations, detecting use of the analog neurons includes: (i) building (3030) a model of the equivalent analog network using a modelling software (e.g., SPICe or similar software); and (ii) measuring (3032) propagation of analog signals (currents) by using the model (remove the blocks where the signal is not propagating when using special training sets) to generate calculations for the one or more data sets.

Referring next to FIG. 30G, in some implementations, detecting use of the analog neurons includes: (i) building (3034) a model of the equivalent analog network using a modelling software (e.g., SPICe or similar software); and (ii) measuring (3036) output signals (currents or voltages) of the model (e.g., signals at outputs of some blocks or amplifiers in SPICe model or in real circuit, and deleting the areas where output signal for training set is always zero volts) by using the model to generate calculations for the one or more data sets.

Referring next to FIG. 30H, in some implementations, detecting use of the analog neurons includes: (i) building (3038) a model of the equivalent analog network using a modelling software (e.g., SPICe or similar software); and (ii) measuring (3040) power consumed by the analog neurons (e.g., power consumed by certain neurons or blocks of neurons, represented by operational amplifiers either in a SPICE model or in real circuit and deleting the neurons or blocks of neurons which did not consume any power) by using the model to generate calculations for the one or more data sets.

Referring next to FIG. 30I, in some implementations, the method further includes, subsequent to pruning the equivalent analog network, and prior to generating one or more lithographic masks for fabricating a circuit implementing the equivalent analog network, recomputing (3042) the weight matrix for the equivalent analog network and updating the resistance matrix based on the recomputed weight matrix.

Example Analog Neuromorphic Integrated Circuits and Fabrication Methods

Example Methods for Fabricating Analog Integrated Circuits for Neural Networks

Figure 31A:
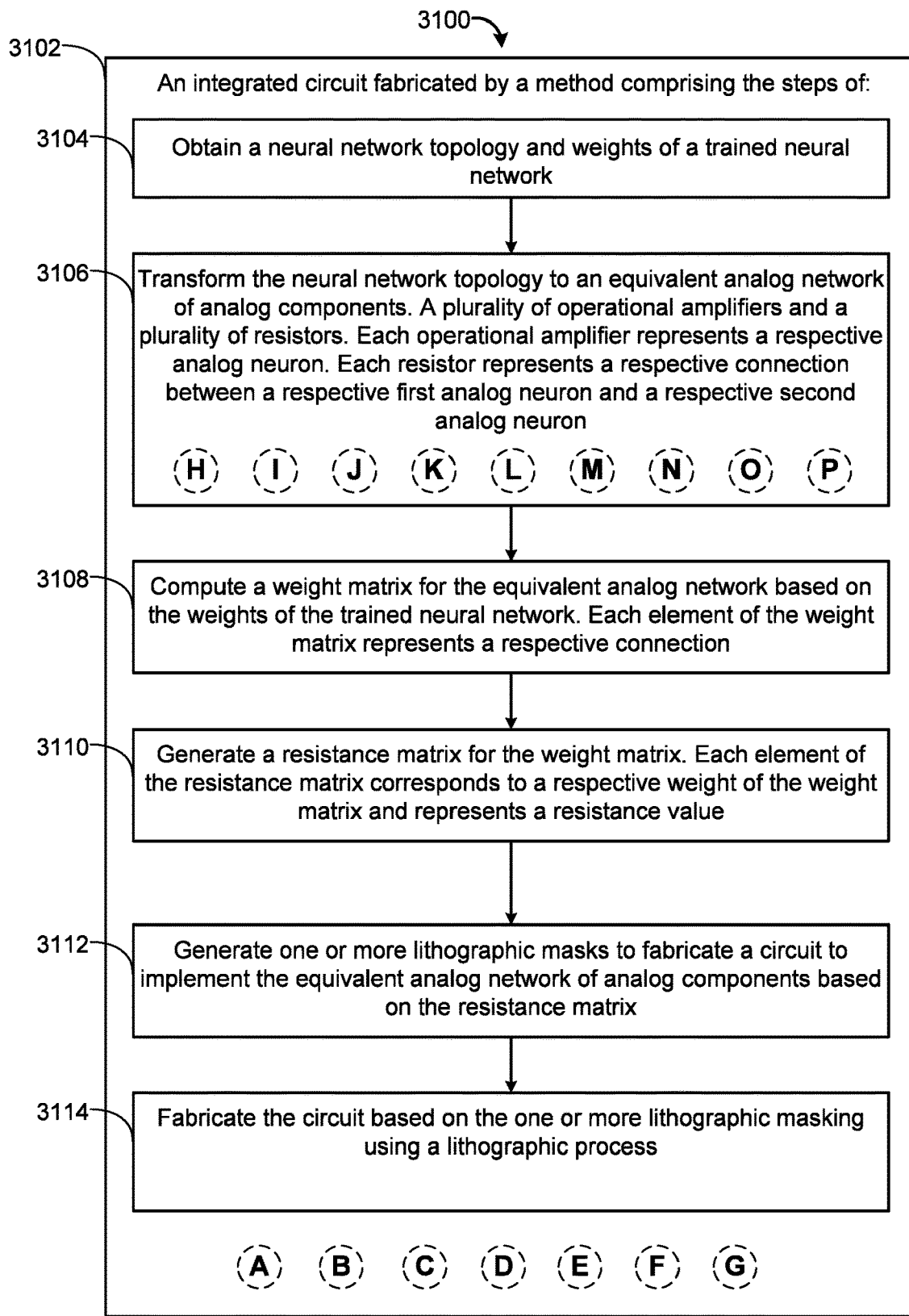
FIGS. 31A-31Q show a flowchart of a method for fabricating an integrated circuit that includes an analog network of analog components, according to some implementations.
Figure 31G:
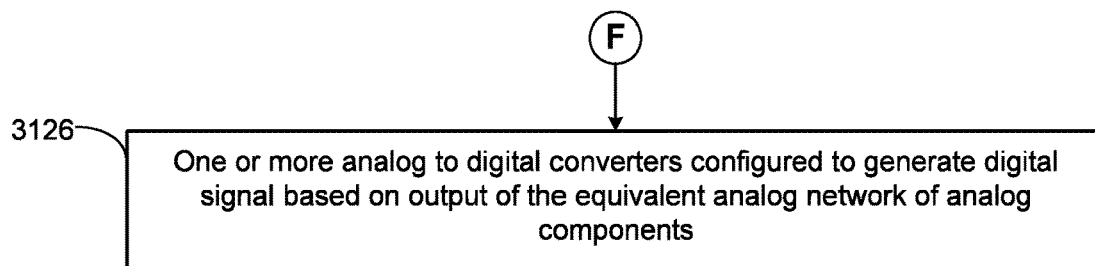
Figure 31H:
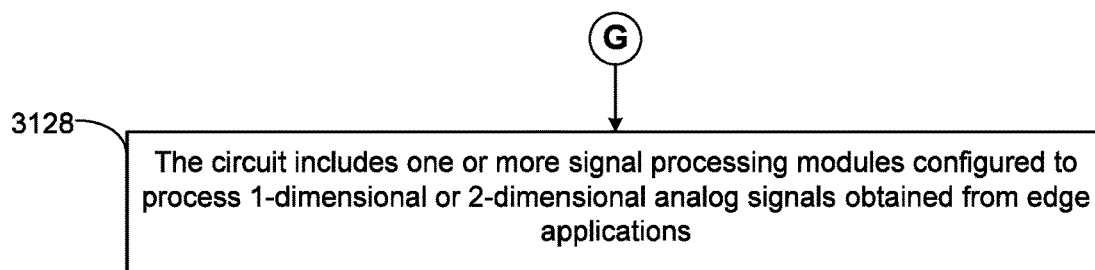
Figure 31I:
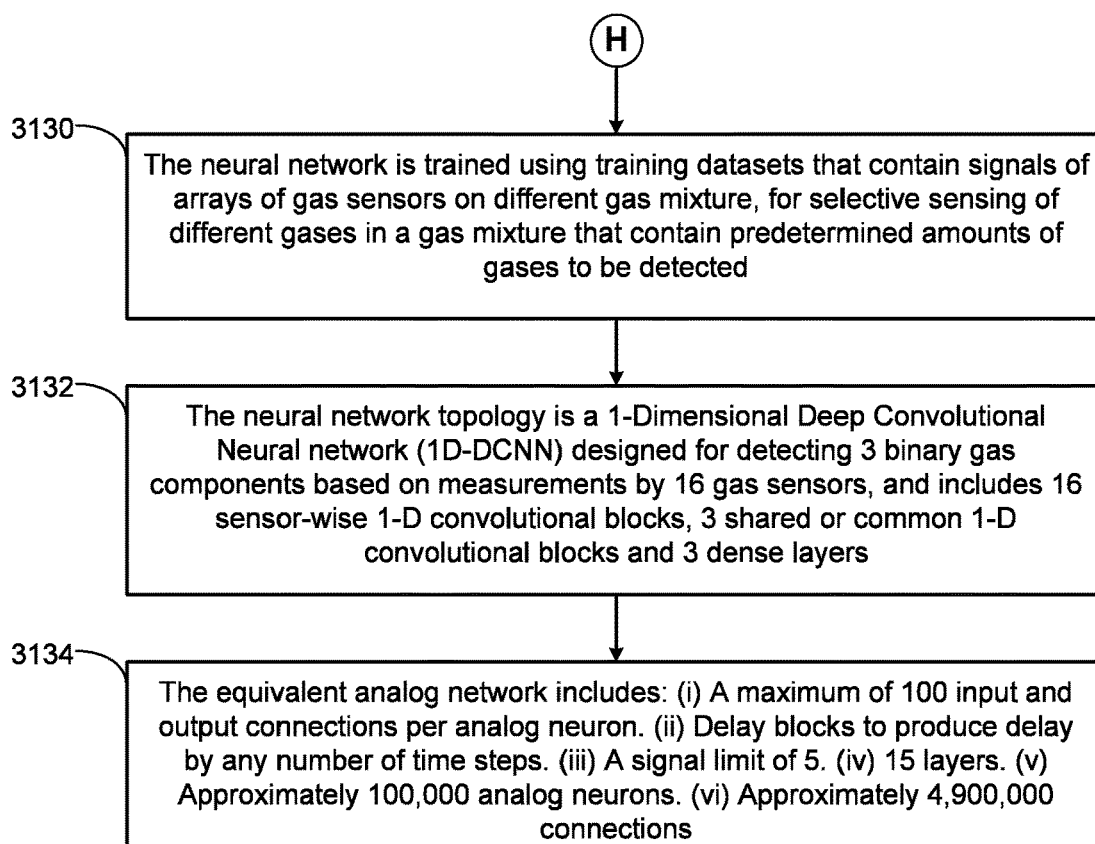
Figure 31J:
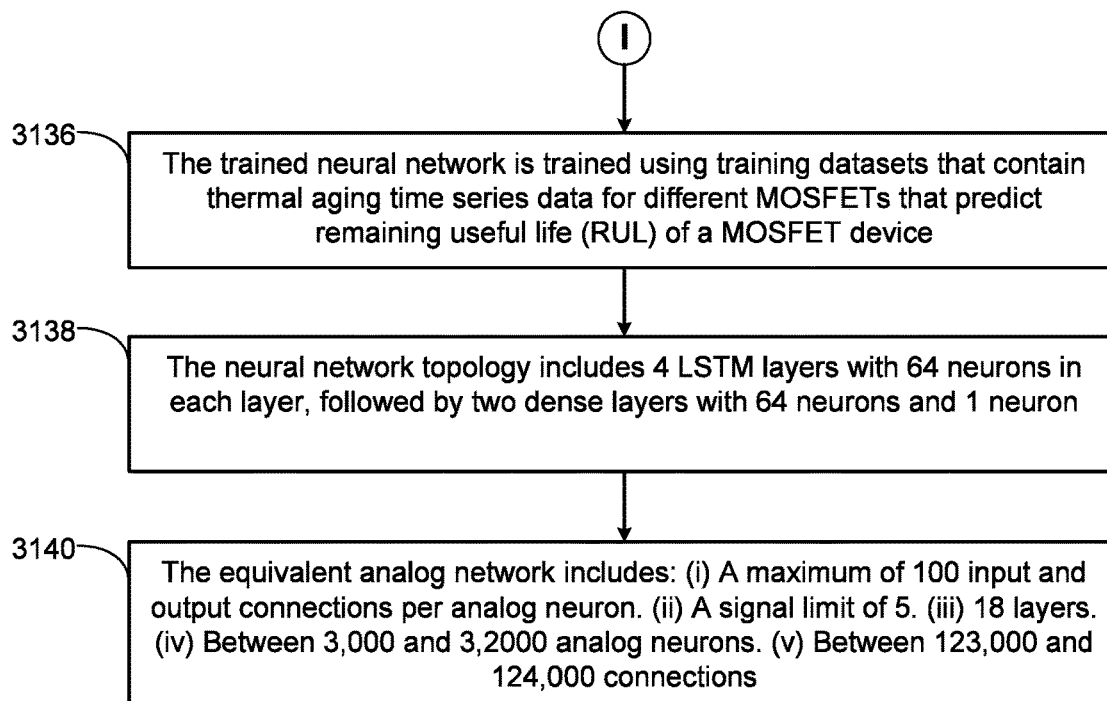
Figure 31K:
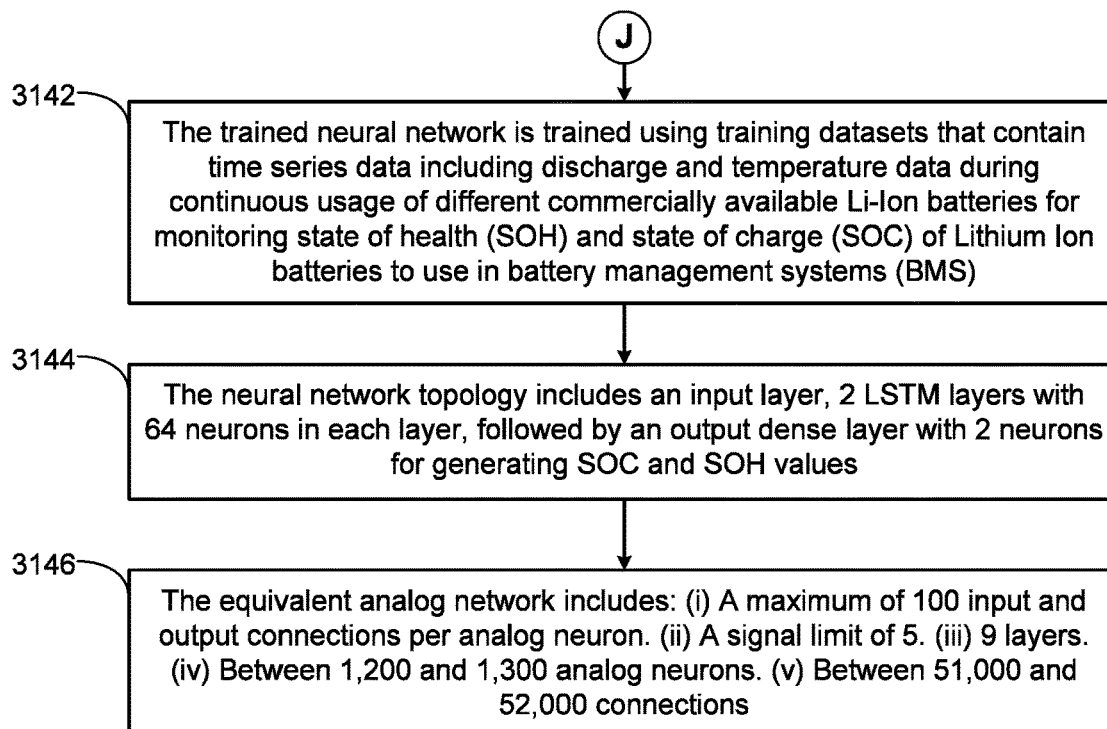
Figure 31L:
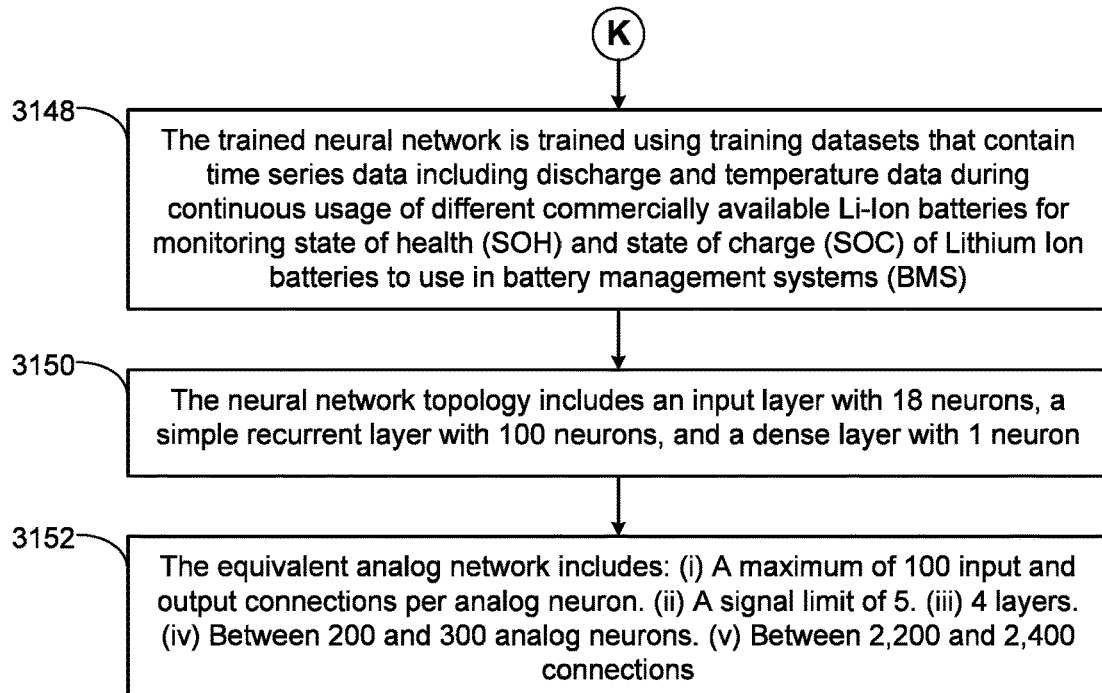
Figure 31M:
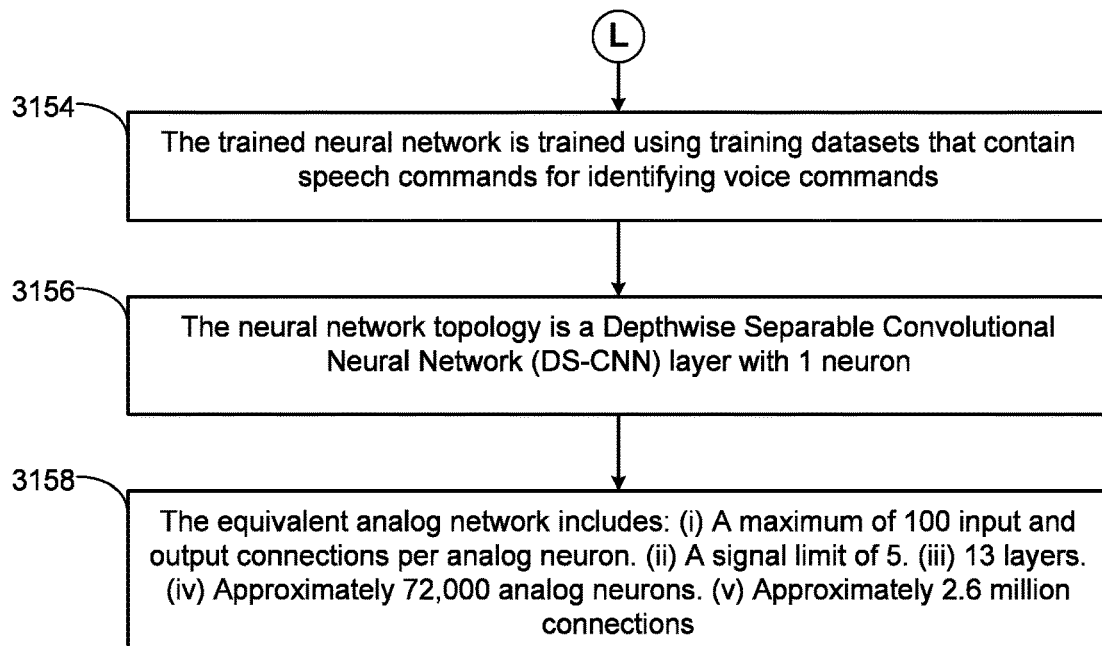
Figure 31N:
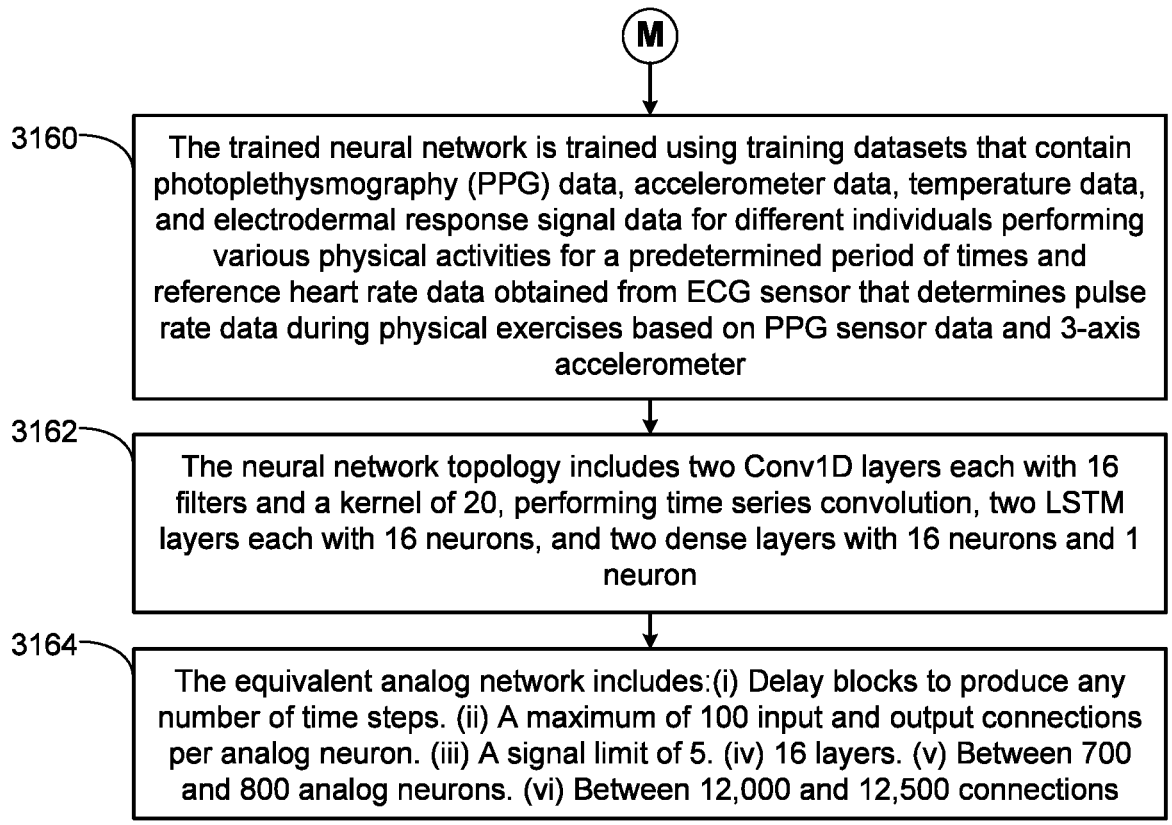
Figure 31O:
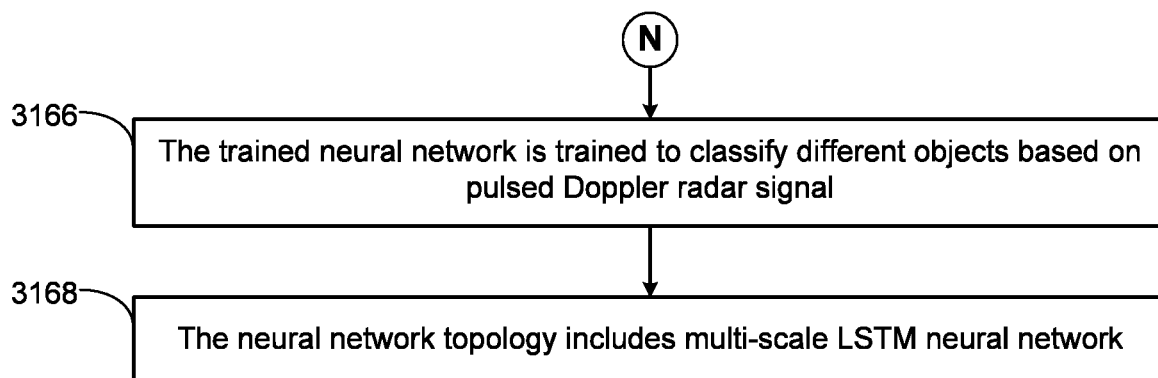
Figure 31P:
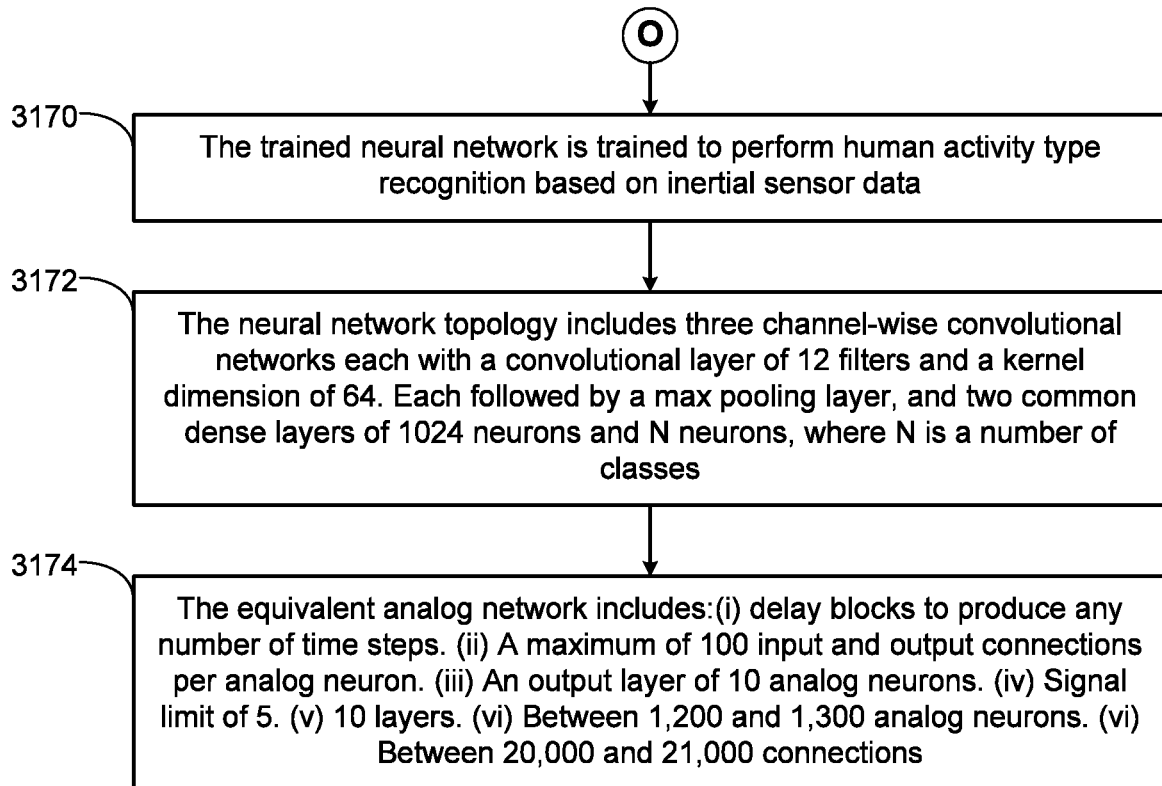
Figure 31Q:
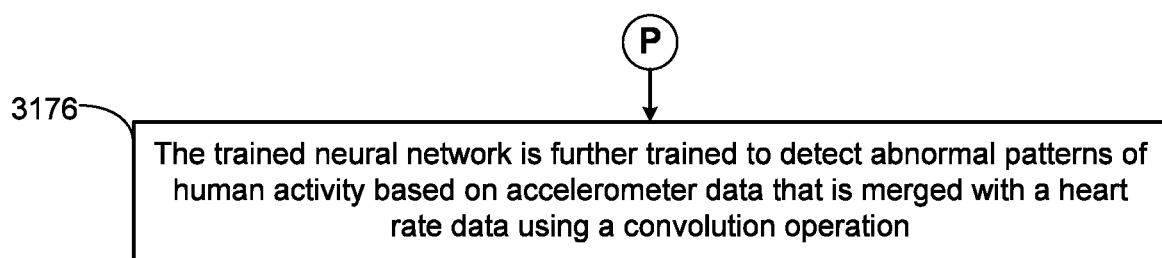

FIGS. 31A-31Q show a flowchart of a method 3100 for fabricating an integrated circuit 3102 that includes an analog network of analog components, according to some implementations. The method is performed at the computing device 200 (e.g., using the IC fabrication module 258) having one or more processors 202, and memory 214 storing one or more programs configured for execution by the one or more processors 202. The method includes obtaining (3104) a neural network topology and weights of a trained neural network.

The method also includes transforming (3106) the neural network topology (e.g., using the neural network transformation module 226) to an equivalent analog network of analog components including a plurality of operational amplifiers and a plurality of resistors (for recurrent neural networks, also use signal delay lines, multipliers, Tanh analog block, Sigmoid Analog Block). Each operational amplifier represents a respective analog neuron, and each resistor represents a respective connection between a respective first analog neuron and a respective second analog neuron.

The method also includes computing (3108) a weight matrix for the equivalent analog network based on the weights of the trained neural network. Each element of the weight matrix represents a respective connection.

The method also includes generating (3110) a resistance matrix for the weight matrix. ach element of the resistance matrix corresponds to a respective weight of the weight matrix.

The method also includes generating (3112) one or more lithographic masks (e.g., generating the masks 250 and/or 252 using the mask generation module 248) for fabricating a circuit implementing the equivalent analog network of analog components based on the resistance matrix, and fabricating (3114) the circuit (e.g., the ICs 262) based on the one or more lithographic masks using a lithographic process.

Referring next to FIG. 31B, in some implementations, the integrated circuit further includes one or more digital to analog converters (3116) (e.g., the DAC converters 260) configured to generate analog input for the equivalent analog network of analog components based on one or more digital signals (e.g., signals from one or more CCD/CMOS image sensors).

Referring next to FIG. 31C, in some implementations, the integrated circuit further includes an analog signal sampling module (3118) configured to process 1-dimensional or 2-dimensional analog inputs with a sampling frequency based on number of inferences of the integrated circuit (number of inferences for the IC is determined by product Spec—we know sampling rate from Neural Network operation and exact task the chip is intended to solve).

Referring next to FIG. 31D, in some implementations, the integrated circuit further includes a voltage converter module (3120) to scale down or scale up analog signals to match operational range of the plurality of operational amplifiers.

Referring next to FIG. 31E, in some implementations, the integrated circuit further includes a tact signal processing module (3122) configured to process one or more frames obtained from a CCD camera.

Referring next to FIG. 31F, in some implementations, the trained neural network is a long short-term memory (LSTM) network, AND the integrated circuit further includes one or more clock modules to synchronize signal tacts and to allow time series processing.

Referring next to FIG. 31G, in some implementations, the integrated circuit further includes one or more analog to digital converters (3126) (e.g., the ADC converters 260) configured to generate digital signal based on output of the equivalent analog network of analog components.

Referring next to FIG. 31H, in some implementations, the integrated circuit includes one or more signal processing modules (3128) configured to process 1-dimensional or 2-dimensional analog signals obtained from edge applications.

Referring next to FIG. 31I, the trained neural network is trained (3130), using training datasets containing signals of arrays of gas sensors (e.g., 2 to 25 sensors) on different gas mixture, for selective sensing of different gases in a gas mixture containing predetermined amounts of gases to be detected (in other words, the operation of trained chip is used to determine each of known to neural network gases in the gas mixture individually, despite the presence of other gases in the mixture). In some implementations, the neural network topology is a 1-Dimensional Deep Convolutional Neural network (1D-DCNN) designed for detecting 3 binary gas components based on measurements by 16 gas sensors, and includes (3132) 16 sensor-wise 1-D convolutional blocks, 3 shared or common 1-D convolutional blocks and 3 dense layers. In some implementations, the equivalent analog network includes (3134): (i) a maximum of 100 input and output connections per analog neuron, (ii) delay blocks to produce delay by any number of time steps, (iii) a signal limit of 5, (iv) 15 layers, (v) approximately 100,000 analog neurons, and (vi) approximately 4,900,000 connections.

Referring next to FIG. 31J, the trained neural network is trained (3136), using training datasets containing thermal aging time series data for different MOSFETs (e.g., NASA MOSFET dataset that contains thermal aging time series for 42 different MOSFETs; data is sampled every 400 ms and typically several hours of data for each device), for predicting remaining useful life (RUL) of a MOSFET device. In some implementations, the neural network topology includes (3138) 4 LSTM layers with 64 neurons in each layer, followed by two dense layers with 64 neurons and 1 neuron, respectively. In some implementations, the equivalent analog network includes (3140): (i) a maximum of 100 input and output connections per analog neuron, (ii) a signal limit of 5, (iii) 18 layers, (iv) between 3,000 and 3,200 analog neurons (e.g., 3137 analog neurons), and (v) between 123,000 and 124,000 connections (e.g., 123,200 connections).

Referring next to FIG. 31K, the trained neural network is trained (3142), using training datasets containing time series data including discharge and temperature data during continuous usage of different commercially available Li-Ion batteries (e.g., NASA battery usage dataset; the dataset presents data of continuous usage of 6 commercially available Li-Ion batteries; network operation is based on analysis of discharge curve of battery), for monitoring state of health (SOH) and state of charge (SOC) of Lithium Ion batteries to use in battery management systems (BMS). In some implementations, the neural network topology includes (3144) an input layer, 2 LSTM layers with 64 neurons in each layer, followed by an output dense layer with 2 neurons for generating SOC and SOH values. The equivalent analog network includes (3146): (i) a maximum of 100 input and output connections per analog neuron, (ii) a signal limit of 5, (iii) 9 layers, (iv) between 1,200 and 1,300 analog neurons (e.g., 1271 analog neurons), and (v) between 51,000 and 52,000 connections (e.g., 51,776 connections).

Referring next to FIG. 31L, the trained neural network is trained (3148), using training datasets containing time series data including discharge and temperature data during continuous usage of different commercially available Li-Ion batteries (e.g., NASA battery usage dataset; the dataset presents data of continuous usage of 6 commercially available Li-Ion batteries; network operation is based on analysis of discharge curve of battery), for monitoring state of health (SOH) of Lithium Ion batteries to use in battery management systems (BMS). In some implementations, the neural network topology includes (3150) an input layer with 18 neurons, a simple recurrent layer with 100 neurons, and a dense layer with 1 neuron. In some implementations, the equivalent analog network includes (3152): (i) a maximum of 100 input and output connections per analog neuron, (ii) a signal limit of 5, (iii) 4 layers, (iv) between 200 and 300 analog neurons (e.g., 201 analog neurons), and (v) between 2,200 and 2,400 connections (e.g., 2,300 connections).

Referring next to FIG. 31M, the trained neural network is trained (3154), using training datasets containing speech commands (e.g., Google Speech Commands Dataset), for identifying voice commands (e.g., 10 short spoken keywords, including "yes", "no", "up", "down", "left", "right", "on", "off", "stop", "go"). In some implementations, the neural network topology is (3156) a Depthwise Separable Convolutional Neural Network (DS-CNN) layer with 1 neuron. In some implementations, the equivalent analog network includes (3158): (i) a maximum of 100 input and output connections per analog neuron, (ii) a signal limit of 5, (iii) 13 layers, (iv) approximately 72,000 analog neurons, and (v) approximately 2.6 million connections.

Referring next to FIG. 31N, the trained neural network is trained (3160), using training datasets containing photoplethysmography (PPG) data, accelerometer data, temperature data, and electrodermal response signal data for different individuals performing various physical activities for a predetermined period of times and reference heart rate data obtained from ECG sensor (e.g., PPG data from the PPG-Dalia dataset (CHECK LICENSE). Data is collected for 15 individuals performing various physical activities during 1-4 hours each. Wrist-based sensor data contains PPG, 3-axis accelerometer, temperature and electrodermal response signals sampled from 4 to 64 Hz, and a reference heartrate data obtained from ECG sensor with sampling around 2 Hz. Original data was split into sequences of 1000 timesteps (around 15 seconds), with a shift of 500 timesteps, thus getting 16541 samples total. Dataset was split into 13233 training samples and 3308 test samples), for determining pulse rate during physical exercises (e.g., jogging, fitness exercises, climbing stairs) based on PPG sensor data and 3-axis accelerometer data. The neural network topology includes (3162) two Conv1D layers each with 16 filters and a kernel of 20, performing time series convolution, two LSTM layers each with 16 neurons, and two dense layers with 16 neurons and 1 neuron, respectively. In some implementations, the equivalent analog network includes (3164): (i) delay blocks to produce any number of time steps, (ii) a maximum of 100 input and output connections per analog neuron, (iii) a signal limit of 5, (iv) 16 layers, (v) between 700 and 800 analog neurons (e.g., 713 analog neurons), and (vi) between 12,000 and 12,500 connections (e.g., 12,072 connections).

Referring next to FIG. 31O, the trained neural network is trained (3166) to classify different objects (e.g., humans, cars, cyclists, scooters) based on pulsed Doppler radar signal (remove clutter and provide noise to Doppler radar signal), and the neural network topology includes (3168) multi-scale LSTM neural network.

Referring next to FIG. 31P, the trained neural network is trained (3170) to perform human activity type recognition (e.g., walking, running, sitting, climbing stairs, exercising, activity tracking), based on inertial sensor data (e.g., 3-axes accelerometers, magnetometers, or gyroscope data, from fitness tracking devices, smart watches or mobile phones; 3-axis accelerometer data as input, sampled at up to 96 Hz frequency. Network was trained on 3 different publicly available datasets, presenting such activities as "open then close the dishwasher", "drink while standing", "close left hand door", "jogging", "walking", "ascending stairs" etc.). In some implementations, the neural network topology includes (3172) three channel-wise convolutional networks each with a convolutional layer of 12 filters and a kernel dimension of 64, and each followed by a max pooling layer, and two common dense layers of 1024 neurons and N neurons, respectively, where N is a number of classes. In some implementations, the equivalent analog network includes (3174): (i) delay blocks to produce any number of time steps, (ii) a maximum of 100 input and output connections per analog neuron, (iii) an output layer of 10 analog neurons, (iv) signal limit of 5, (v) 10 layers, (vi) between 1,200 and 1,300 analog neurons (e.g., 1296 analog neurons), and (vi) between 20,000 and 21,000 connections (e.g., 20,022 connections).

Referring next to FIG. 31Q, the trained neural network is further trained (3176) to detect abnormal patterns of human activity based on accelerometer data that is merged with heart rate data using a convolution operation (so as to detect pre-stroke or pre-heart attack states or signal in case of sudden abnormal patterns, caused by injuries or malfunction due to medical reasons, like epilepsy, etc).

Some implementations include components that are not integrated into the chip (i.e., these are external elements, connected to the chip) selected from the group consisting of: voice recognition, video signal processing, image sensing, temperature sensing, pressure sensing, radar processing, LIDAR processing, battery management, MOSFET circuits current and voltage, accelerometers, gyroscopes, magnetic sensors, heart rate sensors, gas sensors, volume sensors, liquid level sensors, GPS satellite signal, human body conductance sensor, gas flow sensor, concentration sensor, pH meter, and IR vision sensors.

Examples of analog neuromorphic integrated circuits manufactured according to the processes described above are provided in the following section, according to some implementations.

Example Analog Neuromorphic IC for Selective Gas Detection

In some implementations, a neuromorphic IC is manufactured according to the processes described above. The neuromorphic IC is based on a Deep Convolutional Neural Network trained for selective sensing of different gases in the gas mixture containing some amounts of gases to be detected. The Deep Convolutional Neural Network is trained using training datasets, containing signals of arrays of gas sensors (e.g., 2 to 25 sensors) in response to different gas mixtures. The integrated circuit (or the chip manufactured according to the techniques described herein) can be used to determine one or more known gases in the gas mixture, despite the presence of other gases in the mixture.

In some implementations, the trained neural network is a Multi-label 1D-DCNN network used for Mixture Gases Classification. In some implementations, the network is designed for detecting 3 binary gas components based on measurements by 16 gas sensors. In some implementations, the 1D-DCNN includes sensor-wise 1D convolutional block (16 such blocks), 3 common 1D convolutional blocks, and 3 Dense layers. In some implementations, the 1D-DCNN network performance for this task is 96.3%.

In some implementations, the original network is T-transformed with following parameters: maximum input and output connections per neuron=100; delay blocks could produce delay by any number of time steps; and signal limit of 5.

In some implementations, the resulting T-network has the following properties: 15 layers, approximately 100,000 analog neurons, approximately 4,900,000 connections.

Example Analog Neuromorphic IC for MOSFET Failure Prediction

MOSFET on-resistance degradation due to thermal stress is a well-known serious problem in power electronics. In real-world applications, frequently, MOSFET device temperature changes over a short period of time. This temperature sweeps produce thermal degradation of a device, as a result of which the device might exhibit exponential. This effect is typically studied by power cycling that produces temperature gradients, which cause MOSFET degradation.

In some implementations, a neuromorphic IC is manufactured according to the processes described above. The neuromorphic IC is based on a network discussed in the article titled "Real-time Deep Learning at the Edge for Scalable Reliability Modeling of SI-MOSFET Power Electronics Converters" for predicting remaining useful life (RUL) of a MOSFET device. The neural network can be used to determine Remaining Useful Life (RUL) of a device, with an accuracy over 80%.

In some implementations, the network is trained on NASA MOSFET Dataset which contains thermal aging timeseries for 42 different MOSFETs. Data is sampled every 400 ms and typically includes several hours of data for each device. The network contains 4 LSTM layers of 64 neurons each, followed by 2 Dense layers of 64 and 1 neurons.

In some implementations, the network is T-transformed with following parameters: maximum input and output connections per neuron is 100; signal limit of 5, and the resulting T-network had following properties: 18 layers, approximately 3,000 neurons (e.g., 137 neurons), and approximately 120,000 connections (e.g., 123200 connections).

Example Analog Neuromorphic IC for Lithium Ion Battery Health and SoC Monitoring In some implementations, a neuromorphic IC is manufactured according to the processes described above. The neuromorphic IC can be used for predictive analytics of Lithium Ion batteries to use in Battery Management Systems (BMS). BMS device typically presents such functions as overcharge and over-discharge protection, monitoring State of Health (SOH) and State of Charge (SOC), and load balancing for several cells. SOH and SOC monitoring normally requires digital data processor, which adds to the cost of the device and consumes power. In some implementations, the Integration Circuit is used to obtain precise SOC and SOH data without implementing digital data processor on the device. In some implementations, the Integrated Circuit determines SOC with over 99% accuracy and determines SOH with over 98% accuracy.

In some implementations, network operation is based on analysis of the discharge curve of the battery, as well as temperature, and/or data is presented as a time series. Some implementations use data from NASA Battery Usage dataset. The dataset presents data of continuous usage of 6 commercially available Li-Ion batteries. In some implementations, the network includes an input layer, 2 LSTM layers of 64 neurons each, and an output dense layer of 2 neurons (SOC and SOH values).

In some implementations, the network is T-transformed with following parameters: maximum input and output connections per neuron=100, and a signal limit of 5. In some implementations, the resulting T-network include the following properties: 9 layers, approximately 1,200 neurons (e.g., 1,271 neurons), and approximately 50,000 connections (e.g., 51,776 connections). In some implementations, the network operation is based on analysis of the discharge curve of the battery, as well as temperature. The network is trained using Network IndRnn disclosed in the paper titled "State-of-Health Estimation of Li-ion Batteries in Electric Vehicle Using IndRNN under VariableLoad Condition" designed for processing data from NASA Battery Usage dataset. The dataset presents data of continuous usage of 6 commercially available Li-Ion batteries. The IndRnn network contains an input layer with 18 neurons, a simple recurrent layer of 100 neurons and a dense layer of 1 neuron.

In some implementations, the IndRnn network is T-transformed with following parameters: maximum input and output connections per neuron=100 and signal limit of 5. In some implementations, the resulting T-network had following properties: 4 layers, approximately 200 neurons (e.g., 201 neurons), and approximately 2,000 connections (e.g., 2,300 connections). Some implementations output only SOH with an estimation error of 1.3%. In some implementations, the SOC is obtained similar to how the SOH is obtained.

Example Analog Neuromorphic IC for Keyword spotting

In some implementations, a neuromorphic IC is manufactured according to the processes described above. The neuromorphic IC can be used for keyword spotting.

The input network is a neural network with 2-D Convolutional and 2-D Depthwise Convolutional layers, with input audio mel-spectrogram of size 49 times 10. In some implementations, the network includes 5 convolutional layers, 4 depthwise convolutional layers, an average pooling layer, and a final dense layer.

In some implementations, the networks are pre-trained to recognize 10 short spoken keywords ("yes", "no", "up", "down", "left", "right", "on", "off", "stop", "go") from Google Speech Commands Dataset, with a recognition accuracy of 94.4%.

In some implementations, the Integration Circuit is manufactured based on Depthwise Separable Convolutional Neural Network (DS-CNN) for the voice command identification. In some implementations, the original DS-CNN network is T-transformed with following parameters: maximum input and output connections per neuron=100, signal limit of 5. In some implementations, the resulting T-network had following properties: 13 layers, approximately 72,000 neurons, and approximately 2.6 million connections.

Example DS-CNN Keyword Spotting Network

In one instance, a keyword spotting network is transformed to a T-network, according to some implementations. The network is a neural network of 2-D Convolutional and 2-D Depthwise Convolutional layers, with input audio spectrogram of size 49×10. Network consists of 5 convolutional layers, 4 depthwise convolutional layers, average pooling layer and final dense layer. Network is pre-trained to recognize 10 short spoken keywords ("yes", "no", "up", "down", "left", "right", "on", "off", "stop", "go") from Google Speech Commands Dataset https://ai.googleblog.com/2017/08/launching-speech-commands-dataset.html. There are 2 additional classes which correspond to 'silence' and 'unknown'. Network output is a softmax of length 12.

The trained neural network (input to the transformation) had a recognition accuracy of 94.4%, according to some implementations. In the neural network topology, each convolutional layer is followed with BatchNorm layer and ReLU layer, and ReLU activations are unbounded, and included around 2.5 million multiply-add operations.

After transformation, the transformed analog network was tested with a test set of 1000 samples (100 of each spoken command). All test samples are also used as test samples in the original dataset. Original DS-CNN network gave close to 5.7% recognition error for this test set. Network was converted to a T-network of trivial neurons. BatchNormalization layers in 'test' mode produce simple linear signal transformation, so can be interpreted as weight multiplier+ some additional bias. Convolutional, AveragePooling and Dense layers are T-transformed quite straightforwardly. Softmax activation function was not implemented in T-network and was applied to T-network output separately.

Resulting T-network had 12 layers including an Input layer, approximately 72,000 neurons and approximately 2.5 million connections.

FIGS. 26A-26K show example histograms 2600 for absolute weights for the layers 1 through 11, respectively, according to some implementations. The weight distribution histogram (for absolute weights) was calculated for each layer. The dashed lines in the charts correspond to a mean absolute weight value for the respective layer. After conversion (i.e., T transformation), the average output absolute error (calculated over test set) of converted network vs original is calculated to be 4.1e−9.

Various examples for setting network limitations for the transformed network are described herein, according to some implementations. For signal limit, as ReLU activations used in the network are unbounded, and some implementations use a signal limit on each layer. This could potentially affect mathematical equivalence. For this, some implementations use a signal limit of 5 on all layers which corresponds to power voltage of 5 in relation to input signal range.

For quantizing the weights, some implementations use a nominal set of 30 resistors [0.001, 0.003, 0.01, 0.03, 0.1, 0.324, 0.353, 0.436, 0.508, 0.542, 0.544, 0.596, 0.73, 0.767, 0.914, 0.985, 0.989, 1.043, 1.101, 1.149, 1.157, 1.253, 1.329, 1.432, 1.501, 1.597, 1.896, 2.233, 2.582, 2.844].

Some implementations select R− and R+ values (see description above) separately for each layer. For each layer, some implementations select a value which delivers most weight accuracy. In some implementations, subsequently all the weights (including bias) in the T-network are quantized (e.g., set to the closest value which can be achieved with the input or chosen resistors).

Some implementations convert the output layer as follows. Output layer is a dense layer that does not have ReLU activation. The layer has softmax activation which is not implemented in T-conversion and is left for digital part, according to some implementations. Some implementations perform no additional conversion.

Example Analog Neuromorphic IC for Obtaining Heartrate

PPG is an optically obtained plethysmogram that can be used to detect blood volume changes in the microvascular bed of tissue. A PPG is often obtained by using a pulse oximeter which illuminates the skin and measures changes in light absorption. PPG is often processed to determine heart rate in devices, such as fitness trackers. Deriving heart rate (HR) from PPG signal is an essential task in edge devices computing. PPG data obtained from device located on wrist usually allows to obtain reliable heartrate only when the device is stable. If a person is involved in physical exercise, obtaining heartrate from PPG data produces poor results unless combined with inertial sensor data.

In some implementations, an Integrated Circuit, based on combination of Convolutional Neural Network and LSTM layers, can be used to precisely determine the pulse rate, basing on the data from photoplethysmography (PPG) sensor and 3-axis accelerometer. The integrated circuit can be used to suppress motion artifacts of PPG data and to determine the pulse rate during physical exercise, such as jogging, fitness exercises, and climbing stairs, with an accuracy exceeding 90%

In some implementations, the input network is trained with PPG data from the PPG-Dalia dataset. Data is collected for 15 individuals performing various physical activities for a predetermined duration (e.g., 1-4 hours each). The training data included wrist-based sensor data contains PPG, 3-axis accelerometer, temperature and electro-dermal response signals sampled from 4 to 64 Hz, and a reference heartrate data obtained from an ECG sensor with sampling around 2 Hz. The original data was split into sequences of 1000 time steps (around 15 seconds), with a shift of 500 time steps, thus producing 16541 samples total. The dataset was split into 13233 training samples and 3308 test samples.

In some implementations, the input network included 2 Conv1D layers with 16 filters each, performing time series convolution, 2 LSTM layers of 16 neurons each, and 2 dense layers of 16 and 1 neurons. In some implementations, the network produces MSE error of less than 6 beats per minute over the test set.

In some implementations, the network is T-transformed with following parameters: delay blocks could produce delay by any number of time steps, maximum input and output connections per neuron=100, and signal limit of 5. In some implementations, the resulting T-network had following properties: 15 layers, approximately 700 neurons (e.g., 713 neurons), and approximately 12,000 connections (e.g., 12072 connections).

Example Processing PPG Data with T-Converted LSTM Network

As described above, for recurrent neurons, some implementations use signal delay block which is added to each recurrent connection of GRU and LSTM neurons. In some implementations, the delay block has an external cycle timer (e.g., a digital timer) which activates the delay block with a constant period of time dt. This activation produces an output of x(t−dt) where x(t) is input signal of delay block. Such activation frequency can, for instance, correspond to network input signal frequency (e.g., output frequency of analog sensors processed by a T-converted network). Typically, all delay blocks are activated simultaneously with the same activation signal. Some blocks can be activated simultaneously on one frequency, and other blocks can be activated on another frequency. In some implementations, these frequencies have common multiplier, and signals are synchronized. In some implementations, multiple delay blocks are used over one signal producing additive time shift. Examples of delay blocks are described above in reference to FIG. 13B shows two examples of delay blocks, according to some implementations.

The network for processing PPG data uses one or more LSTM neurons, according to some implementations. Examples of LSTM neuron implementations are described above in reference to FIG. 13A, according to some implementations.

The network also uses Conv1D, a convolution performed over time coordinate. Examples of Conv1D implementations are described above in reference to FIGS. 15A and 15B, according to some implementations.

Details of PPG data are described herein, according to some implementations. PPG is an optically obtained plethysmogram that can be used to detect blood volume changes in the microvascular bed of tissue. A PPG is often obtained by using a pulse oximeter which illuminates the skin and measures changes in light absorption. PPG is often processed to determine heart rate in devices such as fitness trackers. Deriving heart rate (HR) from PPG signal is an essential task in edge devices computing.

Some implementations use PPG data from the Capnobase PPG dataset. The data contains raw PPG signal for 42 individuals of 8 min duration each, sampling 300 samples per second, and a reference heartrate data obtained from ECG sensor with sampling around 1 sample per second. For training and evaluation, some implementations split the original data into sequences of 6000 time steps, with a shift of 1000 time steps, thus getting a total set of 5838 samples total.

In some implementations, the input trained neural network NN-based allows for 1-3% accuracy in obtaining heartrate (HR) from PPG data.

This section describes a relatively simple neural network in order to demonstrate how T-conversion and analog processing can deal with this task. This description is provided as an example, according to some implementations.

In some implementations, dataset is split into 4,670 training samples and 1,168 test samples. The network included: 1 Conv1D layer with 16 filters and kernel of 20, 2 LSTM layers with 24 neurons each, 2 dense layers (with 24 and 1 neurons each). In some implementations, after training this network for 200 epochs, test accuracy was found to be 2.1%.

In some implementations, the input network was T-transformed with following parameters: delay block with periods of 1, 5 and 10 time steps, and the following properties: 17 layers, 15,448 connections, and 329 neurons (OP3 neurons and multiplier blocks, not counting delay blocks).

Example Analog Neuromorphic Integrated Circuit for Object Recognition Based on Pulsed Doppler Radar Signal In some implementations, an Integration Circuit is manufactured, based on a multi-scale LSTM neural network, that can be used to classify the objects, based on pulse Doppler Radar signal. The IC can be used to classify different objects, like humans, cars, cyclists, scooters, based on Doppler radar signal, removes clutter, and provides the noise to Doppler radar signal. In some implementations, the accuracy of classification of object with multi-scale LSTM network exceeded 90%.

Example Analog Neuromorphic IC for Human Activity Type Recognition Based on Inertial Sensor Data In some implementations, a neuromorphic Integrated Circuit is manufactured, and can be used for human activity type recognition based on multi-channel convolutional neural networks, which have input signals from 3-axes accelerometers and possibly magnetometers and/or gyroscopes of fitness tracking devices, smart watches or mobile phones. The multi-channel convolutional neural network can be used to distinguish between different types of human activities, such as walking, running, sitting, climbing stairs, exercising and can be used for activity tracking. The IC can be used for detection of abnormal patterns of human activity, based on accelerometer data, convolutionally merged with heart rate data. Such IC can detect pre-stroke or pre heart attack states or signal in case of sudden abnormal patterns, caused by injuries or malfunction due to medical reasons, like epilepsy and others, according to some implementations.

In some implementations, the IC is based on a channel-wise 1D convolutional network discussed in the article "Convolutional Neural Networks for Human Activity Recognition using Mobile Sensors." In some implementations, this network accepts 3-axis accelerometer data as input, sampled at up to 96 Hz frequency. In some implementations, the network is trained on 3 different publicly available datasets, presenting such activities as "open then close the dishwasher", "drink while standing", "close left hand door", "jogging", "walking", "ascending stairs," etc. In some implementations, the network included 3 channel-wise Cony networks with Cony layer of 12 filters and kernel of 64, followed by MaxPooling (4) layer each, and 2 common Dense layers of 1024 and N neurons respectively, where N is a number of classes. In some implementations, the activity classification was performed with a low error rate (e.g., 3.12% error).

In some implementations, the network is T-transformed with following parameters: delay blocks could produce delay by any number of time steps, maximum input and output connections per neuron=100, an output layer of 10 neurons, and a signal limit of 5. In some implementations, the resulting T-network had following properties: 10 layers, approximately 1,200 neurons (e.g., 1296 neurons), and approximately 20,000 connections (e.g., 20022 connections).

Example Transformation of Modular Net Structure for Generating Libraries

A modular structure of converted neural networks is described herein, according to some implementations. Each module of a modular type neural network is obtained after transformation of (a whole or a part of) one or more trained neural network. In some implementations, the one or more trained neural networks is subdivided into parts, and then subsequently transformed into an equivalent analog network. Modular structure is typical for some of the currently used neural networks, and modular division of neural networks corresponds to a trend in neural network development. Each module can have an arbitrary number of inputs or connections of input neurons to output neurons of a connected module, and an arbitrary number of outputs connected to input layers of a subsequent module. In some implementations, a library of preliminary (or a seed list of) transformed modules is developed, including lithographic masks for manufacture of each module. A final chip design is obtained as a combination of (or by connecting) preliminary developed modules. Some implementations perform commutation between the modules. In some implementations, the neurons and connections within the module are translated into chip design using ready-made module design templates. This significantly simplifies the manufacture of the chip, accomplished by just connecting corresponding modules.

Some implementations generate libraries of ready-made T-converted neural networks and/or T-converted modules. For example, a layer of CNN network is a modular building block, LSTM chain is another building block, etc. Larger neural networks NNs also have modular structure (e.g., LSTM module and CNN module). In some implementations, libraries of neural networks are more than by-products of the example processes, and can be sold independently. For example, a third-party can manufacture a neural network starting with the analog circuits, schematics, or designs in the library (e.g., using CADENCE circuits, files and/or lithography masks). Some implementations generate T-converted neural networks (e.g., networks transformable to CADENCE or similar software) for typical neural networks, and the converted neural networks (or the associated information) are sold to a third-party. In some instances, a third-party chooses not to disclose structure and/or purpose of the initial neural network, but uses the conversion software (e.g., SDK described above) to converts the initial network into trapezia-like networks and passes the transformed networks to a manufacturer to the fabricate the transformed network, with a matrix of weights obtained using one of the processes described above, according to some implementations. As another example, where the library of ready-made networks are generated according to the processes described herein, corresponding lithographic masks are generated and a customer can train one of the available network architectures for his task, perform lossless transformation (sometimes called T transformation) and provide the weights to a manufacturer for fabricating a chip for the trained neural networks.

In some implementations, the modular structure concept is also used in the manufacture of multi-chip systems or the multi-level 3D chips, where each layer of the 3D chip represents one module. The connections of outputs of modules to the inputs of connected modules in case of 3D chips will be made by standard interconnects that provide ohmic contacts of different layers in multi-layer 3D chip systems. In some implementations, the analog outputs of certain modules is connected to analog inputs of connected modules through interlayer interconnects. In some implementations, the modular structure is used to make multi-chip processor systems as well. A distinctive feature of such multi-chip assemblies is the analog signal data lines between different chips. The analog commutation schemes, typical for compressing several analog signals into one data line and corresponding de-commutation of analog signals at receiver chip, is accomplished using standard schemes of analog signal commutation and de-commutation, developed in analog circuitry.

One main advantage of a chip manufactured according to the techniques described above, is that analog signal propagation can be broadened to multi-layer chips or multi-chip assemblies, where all signal interconnects and data lines transfer analog signals, without a need for analog-to-digital or digital-to-analog conversion. In this way, the analog signal transfer and processing can be extended to 3D multi-layer chips or multi-chip assemblies.

Example Methods for Generating Libraries for Hardware Realization of Neural Networks FIGS. 32A-32E show a flowchart of a method 3200 for generating (3202) libraries for hardware realization of neural networks, according to some implementations. The method is performed (3204) at the computing device 200 (e.g., using the library generation module 254) having one or more processors 202, and memory 214 storing one or more programs configured for execution by the one or more processors 202.

The method includes obtaining (3206) a plurality of neural network topologies (e.g., the topologies 224), each neural network topology corresponding to a respective neural network (e.g., a neural network 220).

The method also includes transforming (3208) each neural network topology (e.g., using the neural network transformation module 226) to a respective equivalent analog network of analog components.

Figure 32A:
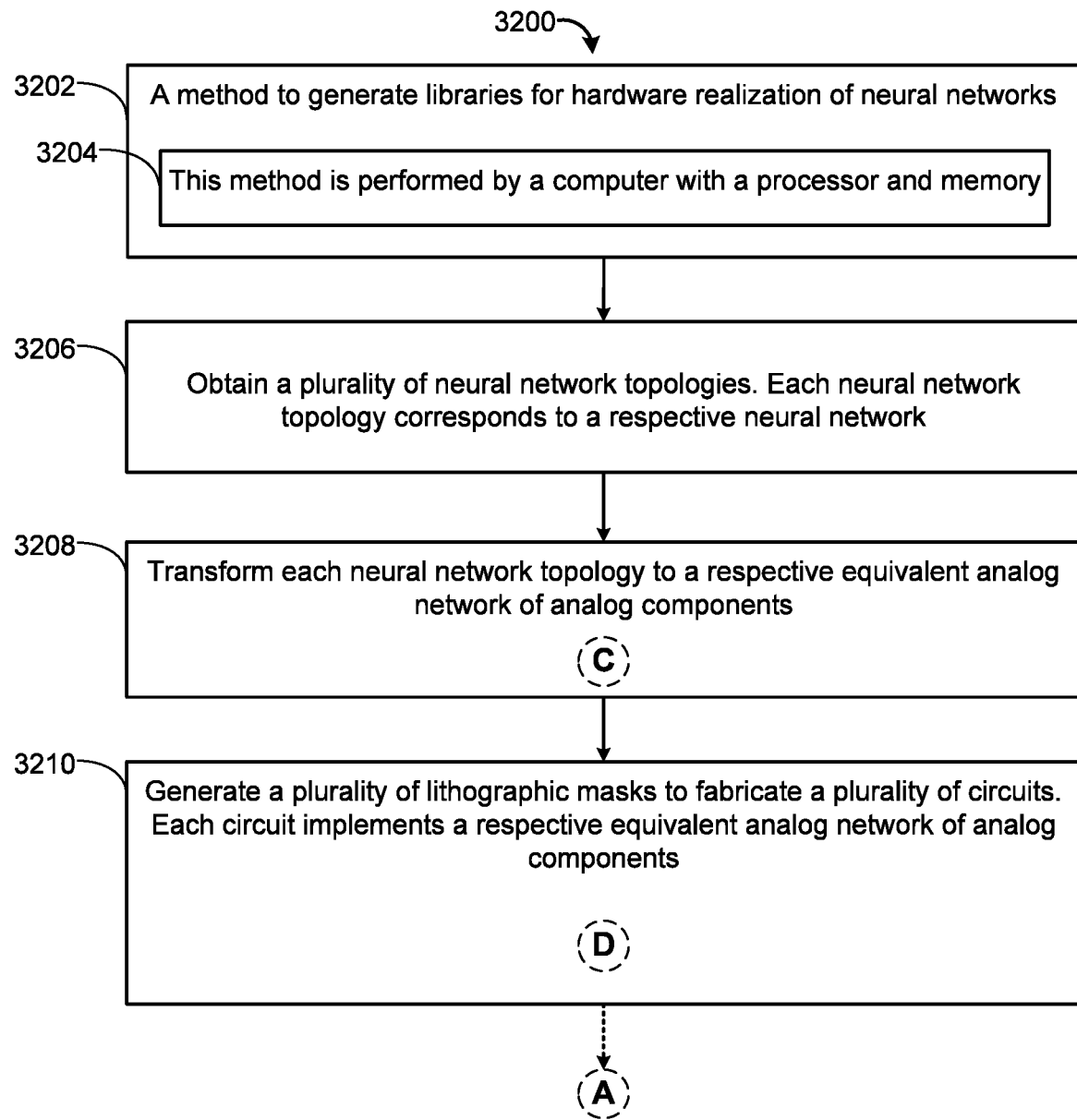
FIGS. 32A-32E show a flowchart of a method for generating libraries for hardware realization of neural networks, according to some implementations.
Figure 32B:
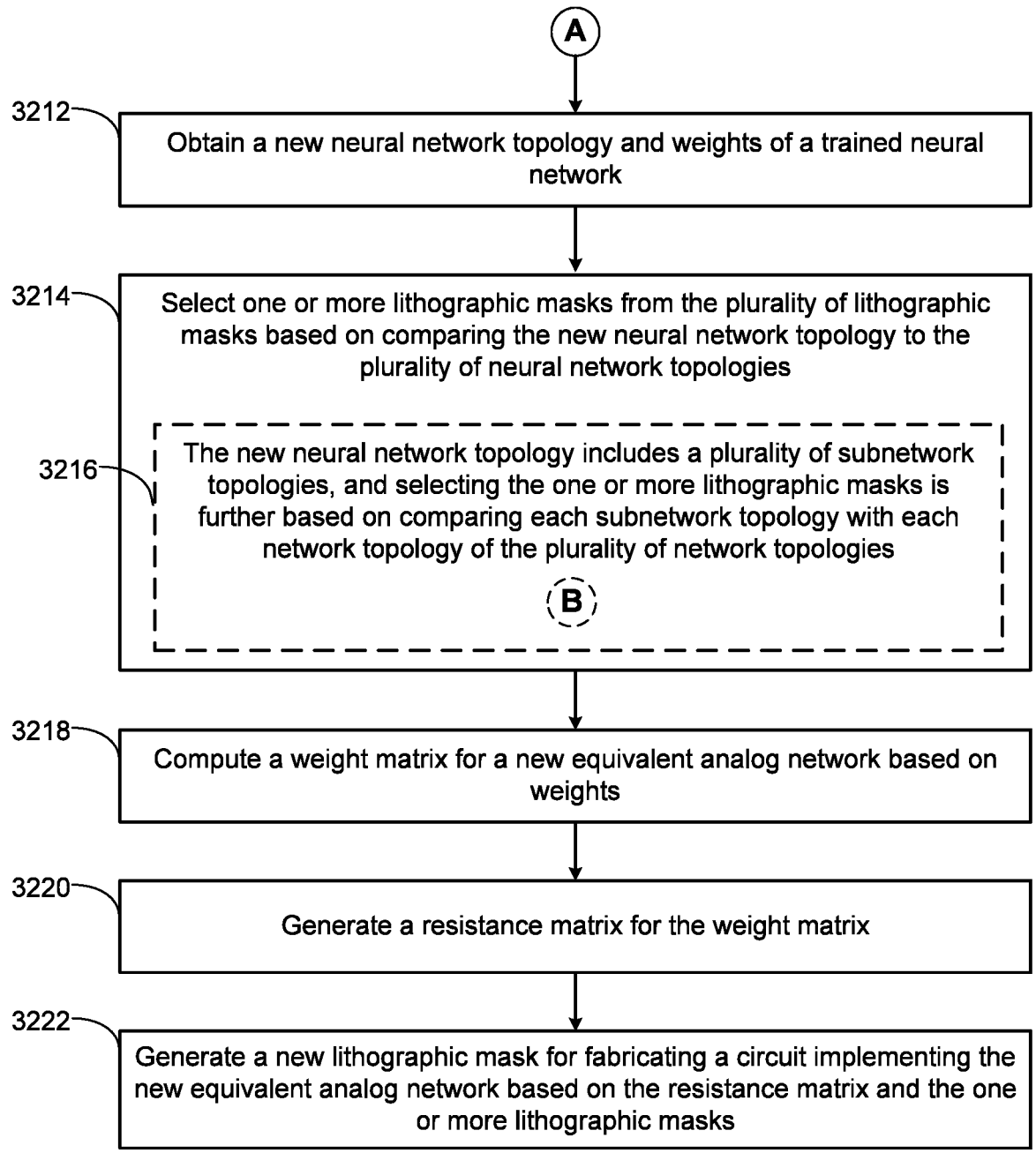
Figure 32C:
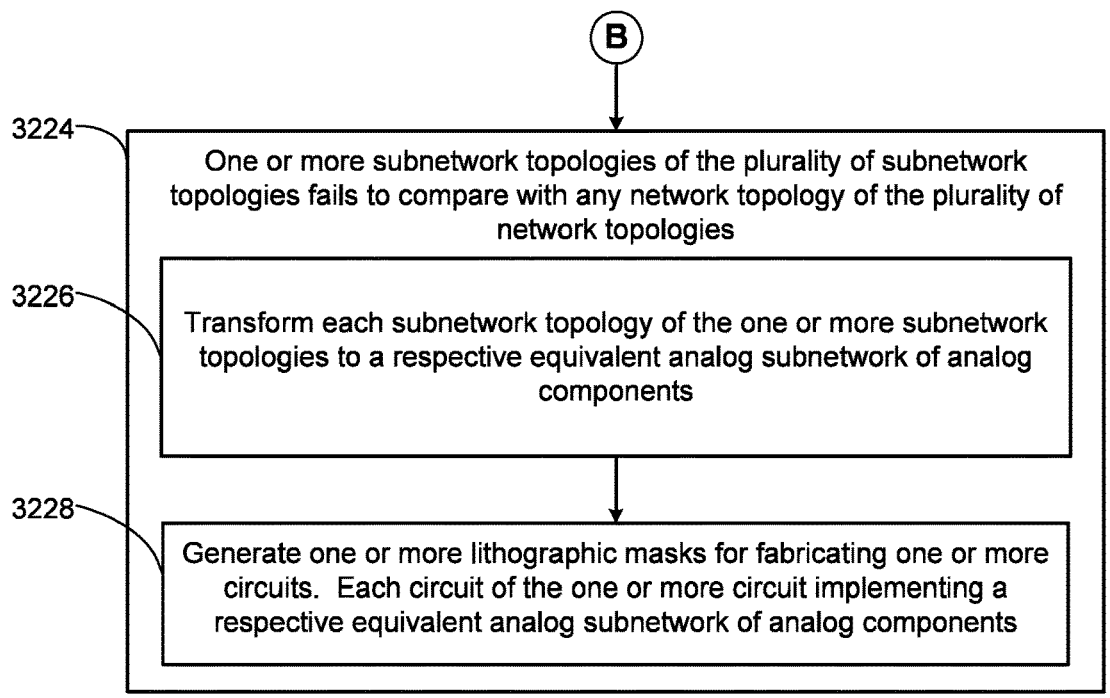
Figure 32D:
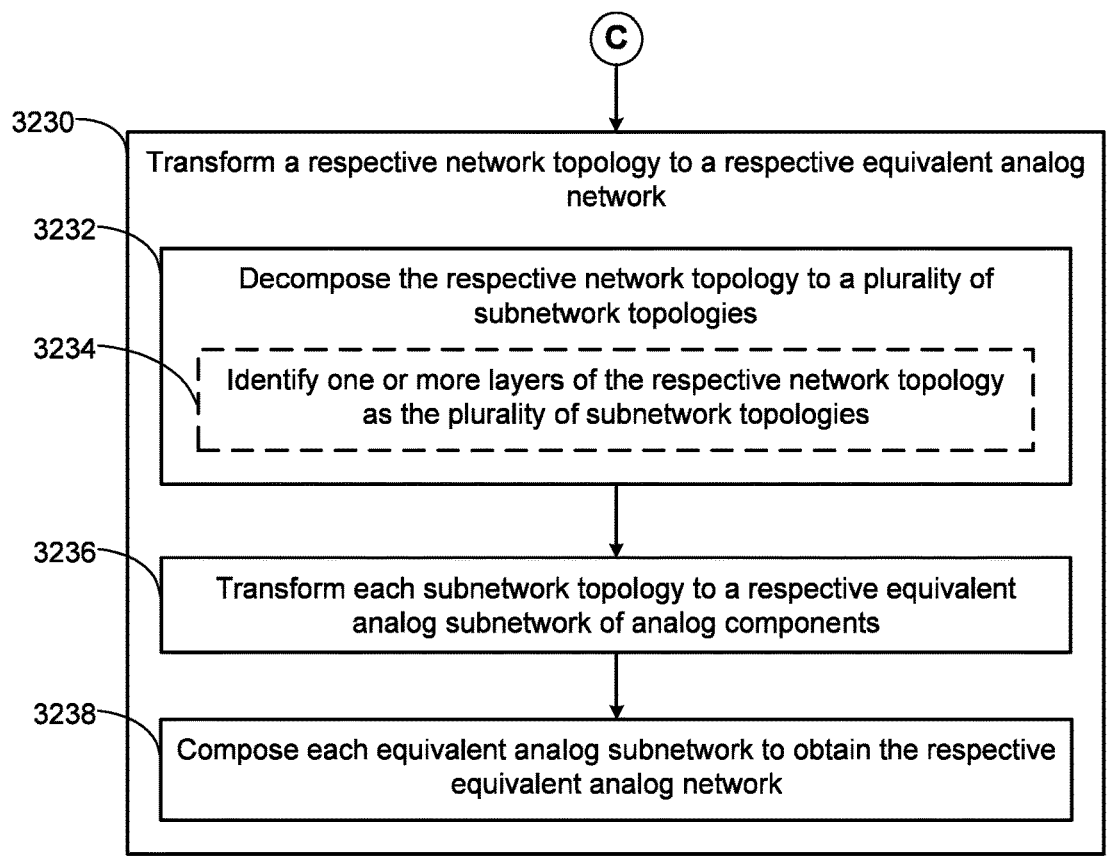

Referring next to FIG. 32D, in some implementations, transforming (3230) a respective network topology to a respective equivalent analog network includes: (i) decomposing (3232) the respective network topology to a plurality of subnetwork topologies. In some implementations, decomposing the respective network topology includes identifying (3234) one or more layers (e.g., LSTM layer, fully connected layer) of the respective network topology as the plurality of subnetwork topologies; (ii) transforming (3236) each subnetwork topology to a respective equivalent analog subnetwork of analog components; and (iii) composing (3238) each equivalent analog subnetwork to obtain the respective equivalent analog network.

Referring back to FIG. 32A, the method also includes generating (3210) a plurality of lithographic masks (e.g., the masks 256) for fabricating a plurality of circuits, each circuit implementing a respective equivalent analog network of analog components.

Figure 32E:
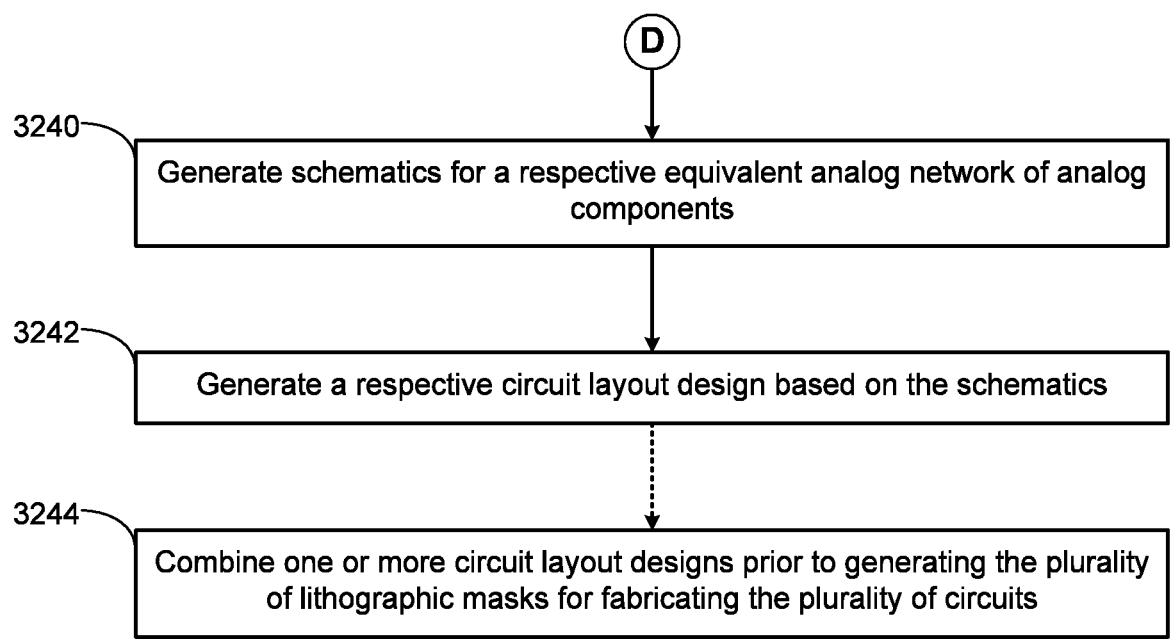

Referring next to FIG. 32E, in some implementations, each circuit is obtained by: (i) generating (3240) schematics for a respective equivalent analog network of analog components; and (ii) generating (3242) a respective circuit layout design based on the schematics (using special software, e.g., CADENCE). In some implementations, the method further includes combining (3244) one or more circuit layout designs prior to generating the plurality of lithographic masks for fabricating the plurality of circuits.

Referring next to FIG. 32B, in some implementations, the method further includes: (i) obtaining (3212) a new neural network topology and weights of a trained neural network; (ii) selecting (3214) one or more lithographic masks from the plurality of lithographic masks based on comparing the new neural network topology to the plurality of neural network topologies. In some implementations, the new neural network topology includes a plurality of subnetwork topologies, and selecting the one or more lithographic masks is further based on comparing (3216) each subnetwork topology with each network topology of the plurality of network topologies; (iii) computing (3218) a weight matrix for a new equivalent analog network based on the weights; (iv) generating (3220) a resistance matrix for the weight matrix; and (v) generating (3222) a new lithographic mask for fabricating a circuit implementing the new equivalent analog network based on the resistance matrix and the one or more lithographic masks.

Referring next to FIG. 32C, one or more subnetwork topologies of the plurality of subnetwork topologies fails to compare (3224) with any network topology of the plurality of network topologies, and the method further includes: (i) transforming (3226) each subnetwork topology of the one or more subnetwork topologies to a respective equivalent analog subnetwork of analog components; and generating (3228) one or more lithographic masks for fabricating one or more circuits, each circuit of the one or more circuits implementing a respective equivalent analog subnetwork of analog components.

Example Methods for Optimizing Energy Efficiency of Neuromorphic Analog Integrated Circuits FIGS. 33A-33J show a flowchart of a method 3300 for optimizing (3302) energy efficiency of analog neuromorphic circuits (that model trained neural networks), according to some implementations. The method is performed (3204) at the computing device 200 (e.g., using the energy efficiency optimization module 264) having one or more processors 202, and memory 214 storing one or more programs configured for execution by the one or more processors 202.

The method includes obtaining (3306) an integrated circuit (e.g., the ICs 262) implementing an analog network (e.g., the transformed analog neural network 228) of analog components including a plurality of operational amplifiers and a plurality of resistors. The analog network represents a trained neural network (e.g., the neural networks 220), each operational amplifier represents a respective analog neuron, and each resistor represents a respective connection between a respective first analog neuron and a respective second analog neuron.

The method also includes generating (3308) inferences (e.g., using the inferencing module 266) using the integrated circuit for a plurality of test inputs, including simultaneously transferring signals from one layer to a subsequent layer of the analog network. In some implementations, the analog network has layered structure, with the signals simultaneously coming from previous layer to the next one. During inference process, the signals propagate through the circuit layer by layer; simulation at device level; time delays every minute.

The method also includes, while generating inferences using the integrated circuit, determining (3310) if a level of signal output of the plurality of operational amplifiers is equilibrated (e.g., using the signal monitoring module 268). Operational amplifiers go through a transient period (e.g., a period that lasts less than 1 millisecond from transient to plateau signal) after receiving inputs, after which the level of signal is equilibrated and does not change. In accordance with a determination that the level of signal output is equilibrated, the method also includes: (i) determining (3312) an active set of analog neurons of the analog network influencing signal formation for propagation of signals. The active set of neurons need not be part of a layer/layers. In other words, the determination step works regardless of whether the analog network includes layers of neurons; and (ii) turning off power (3314) (e.g., using the power optimization module 270) for one or more analog neurons of the analog network, distinct from the active set of analog neurons, for a predetermined period of time. For example, some implementations switch off power (e.g., using the power optimization module 270) of operational amplifiers which are in layers behind an active layer (to where signal propagated at the moment), and which do not influence the signal formation on the active layer. This can be calculated based on RC delays of signal propagation through the IC. So all the layers behind the operational one (or the active layer) are switched off to save power. So the propagation of signals through the chip is like surfing—the wave of signal formation propagate through chip, and all layers which are not influencing signal formation are switched off. In some implementations, for layer-by-layer networks, signal propagates layer to layer, and the method further includes decreasing power consumption before a layer corresponding to the active set of neurons because there is no need for amplification before the layer.

Figure 33A:
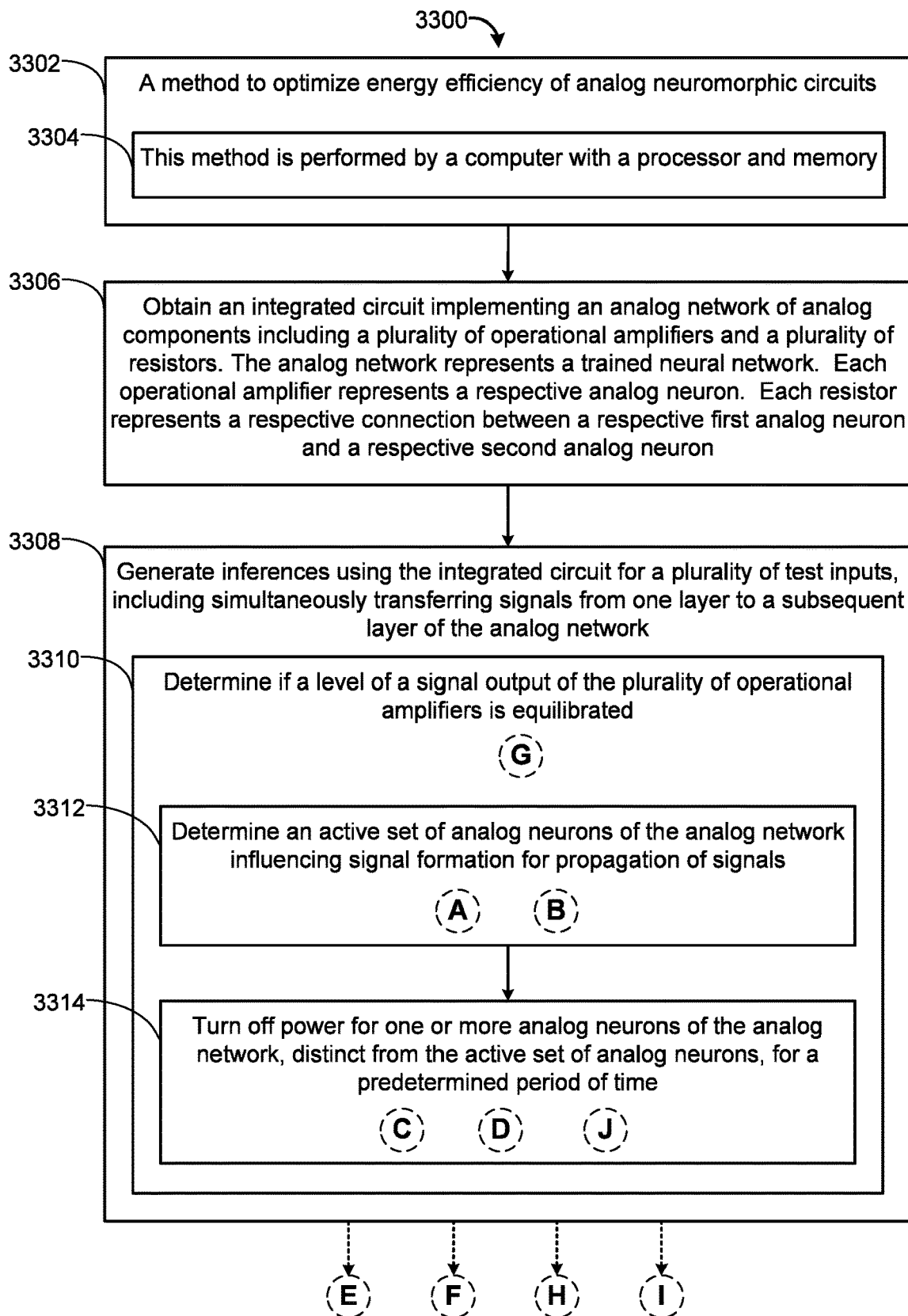
FIGS. 33A-33K show a flowchart of a method for optimizing energy efficiency of analog neuromorphic circuits (that model trained neural networks), according to some implementations.
Figure 33B:
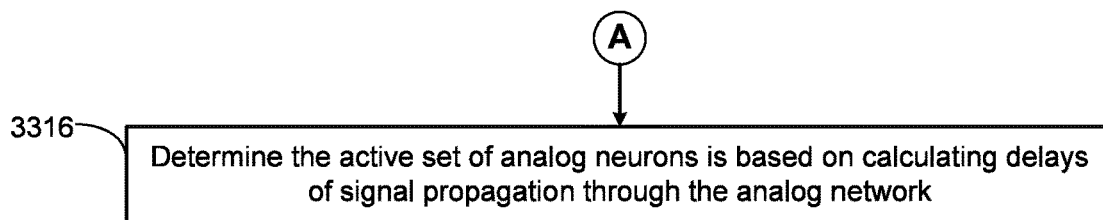
Figure 33C:
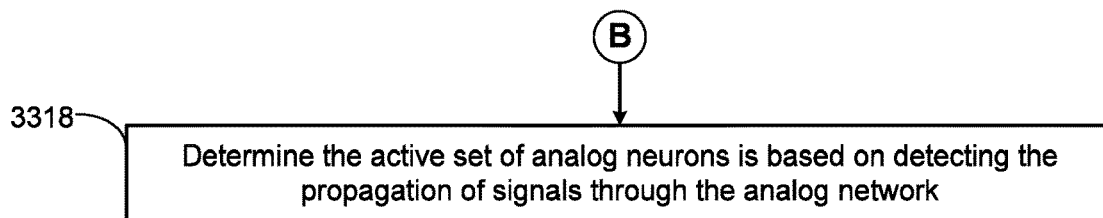

Referring next to FIG. 33B, in some implementations, in some implementations, determining the active set of analog neurons is based on calculating (3316) delays of signal propagation through the analog network. Referring next to FIG. 33C, in some implementations, determining the active set of analog neurons is based on detecting (3318) the propagation of signals through the analog network.

Figure 33D:
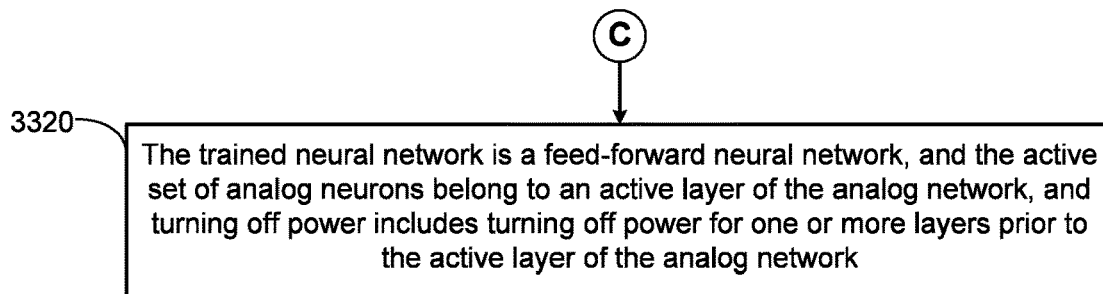

Referring next to FIG. 33D, in some implementations, the trained neural network is a feed-forward neural network, and the active set of analog neurons belong to an active layer of the analog network, and turning off power includes turning off power (3320) for one or more layers prior to the active layer of the analog network.

Figure 33E:
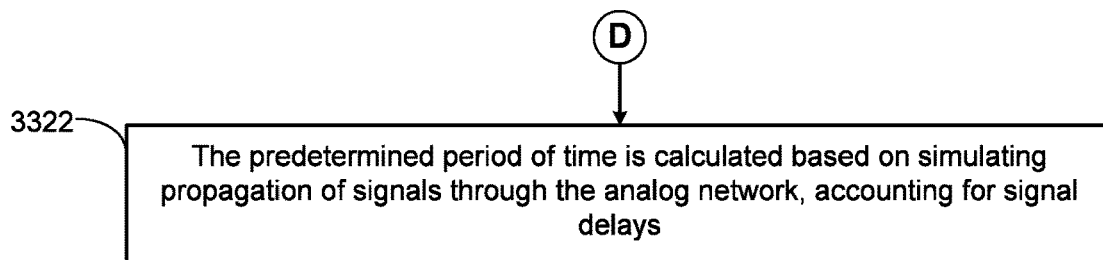

Referring next to FIG. 33E, in some implementations, the predetermined period of time is calculated (3322) based on simulating propagation of signals through the analog network, accounting for signal delays (using special software, e.g., CADENCE).

Figure 33F:
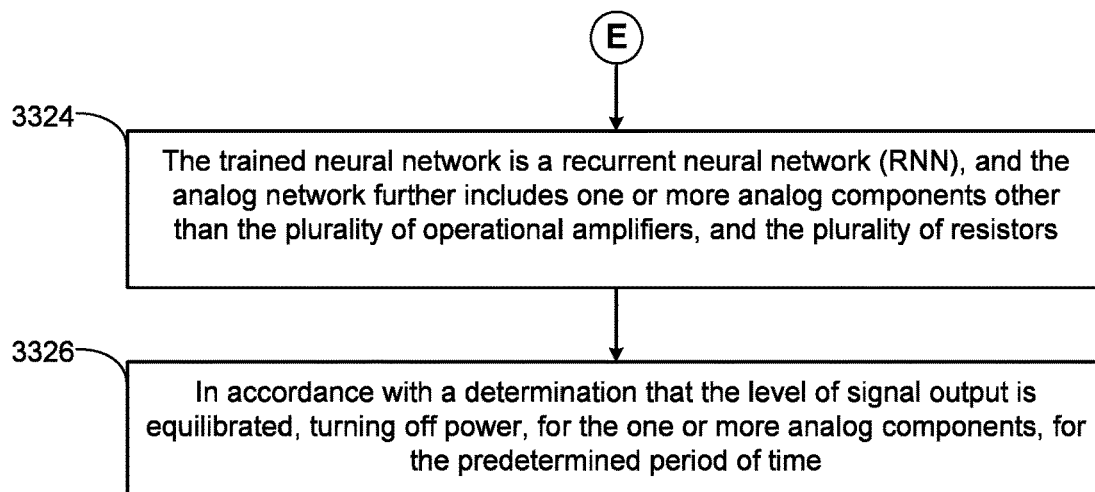

Referring next to FIG. 33F, in some implementations, the trained neural network is (3324) a recurrent neural network (RNN), and the analog network further includes one or more analog components other than the plurality of operational amplifiers, and the plurality of resistors. In such cases, the method further includes, in accordance with a determination that the level of signal output is equilibrated, turning off power (3326) (e.g., using the power optimization module 270), for the one or more analog components, for the predetermined period of time.

Figure 33G:
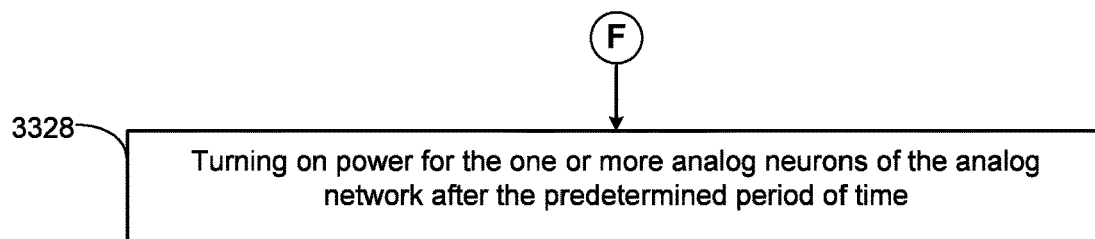

Referring next to FIG. 33G, in some implementations, the method further includes turning on power (3328)) (e.g., using the power optimization module 270) for the one or more analog neurons of the analog network after the predetermined period of time.

Figure 33H:
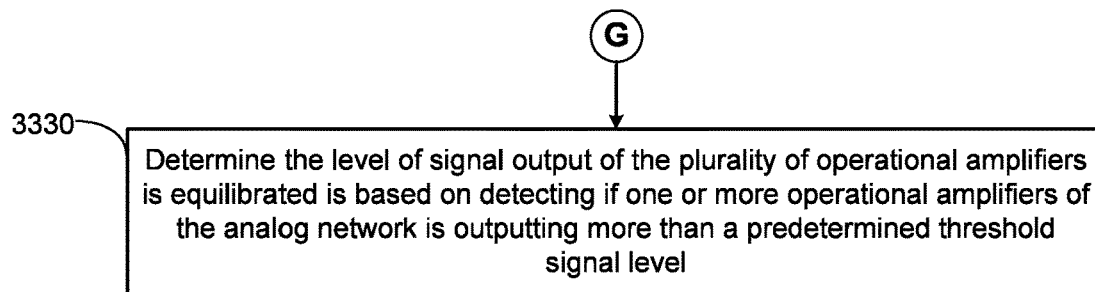

Referring next to FIG. 33H, in some implementations, determining if the level of signal output of the plurality of operational amplifiers is equilibrated is based on detecting (3330) if one or more operational amplifiers of the analog network is outputting more than a predetermined threshold signal level (e.g., power, current, or voltage).

Figure 33I:
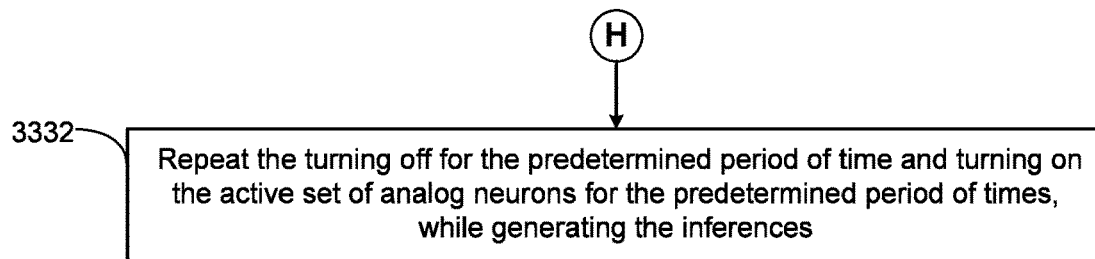

Referring next to FIG. 33I, in some implementations, the method further includes repeating (3332)) (e.g., by the power optimization module 270) the turning off for the predetermined period of time and turning on the active set of analog neurons for the predetermined period of time, while generating the inferences.

Figure 33J:
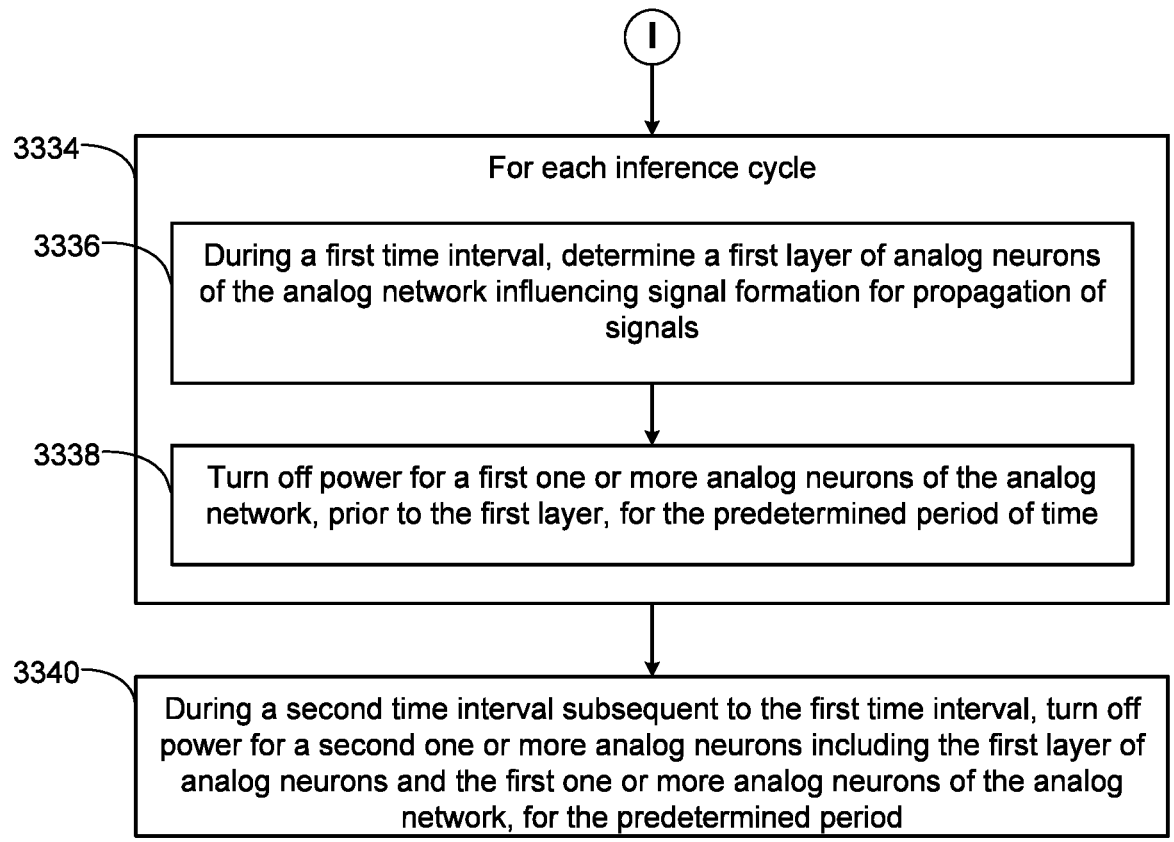

Referring next to FIG. 33J, in some implementations, the method further includes, in accordance with a determination that the level of signal output is equilibrated, for each inference cycle (3334): (i) during a first time interval, determining (3336) a first layer of analog neurons of the analog network influencing signal formation for propagation of signals; and (ii) turning off power (3338)) (e.g., using the power optimization module 270) for a first one or more analog neurons of the analog network, prior to the first layer, for the predetermined period of time; and during a second time interval subsequent to the first time interval, turning off power (3340)) (e.g., using the power optimization module 270) for a second one or more analog neurons including the first layer of analog neurons and the first one or more analog neurons of the analog network, for the predetermined period.

Figure 33K:
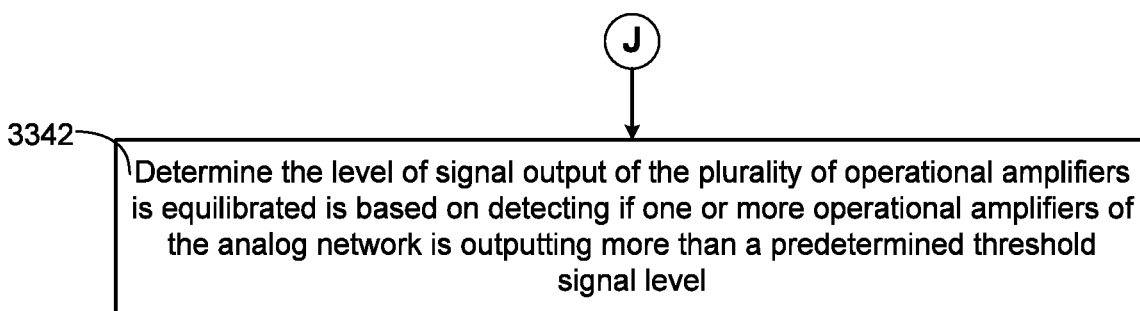

Referring next to FIG. 33K, in some implementations, the one or more analog neurons consist (3342) of analog neurons of a first one or more layers of the analog network, and the active set of analog neurons consist of analog neurons of a second layer of the analog network, and the second layer of the analog network is distinct from layers of the first one or more layers.

Some implementations include means for delaying and/or controlling signal propagation from layer to layer of the resulting hardware-implemented neural network.

Example Transformation of MobileNet v.1

An example transformation of MobileNet v.1 into an equivalent analog network is described herein, according to some implementations. In some implementations, single analog neurons are generated, then converted into SPICE schematics with a transformation of weights from Mobile-Net into resistor values. MobileNet v1 architecture is depicted in the Table shown in FIG. 34. In the Table, the first column 3402 corresponds to type of layer and stride, the second column 3404 corresponds to filter shape for the corresponding layer, and the third column 3406 corresponds to input size for the corresponding layer. In MobileNet v.1, each convolutional layer is followed by a batch normalization layer and a ReLU 6 activation function (y=max(0, min(6, x)). The network consists of 27 convolutional layers, 1 dense layer, and has around 600 million multiply-accumulate operations for a 224×224×3 input image. Output values are the result of softmax activation function which means the values are distributed in the range [0, 1] and the sum is 1. Some implementations accept as input MobileNet 32×32 and alpha=1 for the transformation. In some implementations, the network is pre-trained for CIFAR-10 task (50,000 32×32×3 images divided into 10 non-intersecting classes). Batch normalization layers operate in 'test' mode to produce simple linear signal transformation, so the layers are interpreted as weight multiplier+some additional bias. Convolutional, AveragePooling and Dense layers are transformed using the techniques described above, according to some implementations. In some implementations, Softmax activation function is not implemented in transformed network but applied to output of the transformed network (or the equivalent analog network) separately.

In some implementations, the resulting transformed network included 30 layers including an input layer, approximately 104,000 analog neurons, and approximately 11 million connections. After transformation, the average output absolute error (calculated over 100 random samples) of transformed network versus MobileNet v.1 was 4.9e−8.

As every convolutional and other layers of MobileNet have an activation function ReLU6, output signal on each layer of transformed network is also limited by the value 6. As part of the transformation, the weights are brought into accordance with a resistor nominal set. Under each nominal set, different weight values are possible. Some implementations use resistor nominal sets e24, e48 and e96, within the range of [0.1-1] Mega Ohm. Given that the weight ranges for each layer vary, and for most layers weight values do not exceed 1-2, in order to achieve more weight accuracy, some implementations decrease R− and R+ values. In some implementations, the R− and R+ values are chosen separately for each layer from the set [0.05, 0.1, 0.2, 0.5, 1] Mega Ohm. In some implementations, for each layer, a value which delivers most weight accuracy is chosen. Then all the weights (including bias) in the transformed network are 'quantized', i.e., set to the closest value which can be achieved with used resistors. In some implementations, this reduced transformed network accuracy versus original MobileNet according to the Table shown below. The Table shows mean square error of transformed network, when using different resistor sets, according to some implementations.

| Resistor set | Mean Square Error |
|---|---|
| E24 0.1-1 MΩ | 0.01 |
| E24 0.1-5 MΩ | 0.004 |
| E48 0.1-1 MΩ | 0.007 |
| E96 0.1-1 MΩ | 0.003 |

The terminology used in the description of the invention herein is for the purpose of describing particular implementations only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A method for hardware realization of neural networks, comprising:
    obtaining a neural network topology and weights of a trained neural network;
    transforming the neural network topology to an equivalent analog network of analog components including a plurality of operational amplifiers and a plurality of resistors, wherein each operational amplifier represents an analog neuron of the equivalent analog network and each resistor represents a connection between two analog neurons;
    computing a weight matrix for the equivalent analog network based on the weights of the trained neural network, wherein each element of the weight matrix represents a respective connection;
    generating a resistance matrix for the weight matrix, wherein each element of the resistance matrix corresponds to a respective weight of the weight matrix;
    pruning the equivalent analog network to reduce number of the plurality of operational amplifiers or the plurality of resistors, based on the resistance matrix, to obtain an optimized analog network of analog components; and
    generating a schematic model for implementing the optimized analog network as electronic circuitry based on the resistance matrix, including:
        selecting component values for each individual operational amplifier and each individual resistor, and
        for each analog neuron of the equivalent analog network:
            computing a respective bias value for the respective analog neuron based on the weights of the trained neural network, while computing the weight matrix;
            in accordance with a determination that the respective bias value is above a predetermined maximum bias threshold, removing the respective analog neuron from the equivalent analog network; and
            in accordance with a determination that the respective bias value is below a predetermined minimum bias threshold, replacing the respective analog neuron with a linear junction in the equivalent analog network.

2. The method of claim 1, wherein pruning the equivalent analog network comprises:
    substituting, with conductors, resistors corresponding to one or more elements of the resistance matrix that have resistance values below a predetermined minimum threshold resistance value.

3. The method of claim 1, wherein pruning the equivalent analog network comprises:
    removing one or more connections of the equivalent analog network corresponding to one or more elements of the resistance matrix that are above a predetermined maximum threshold resistance value.

4. The method of claim 1, wherein pruning the equivalent analog network comprises:
    removing one or more connections of the equivalent analog network corresponding to one or more elements of the weight matrix that are approximately zero.

5. The method of claim 4, wherein pruning the equivalent analog network further comprises:
    removing one or more analog neurons of the equivalent analog network without any input connections.

6. The method of claim 1, wherein pruning the equivalent analog network comprises:
    ranking analog neurons of the equivalent analog network based on detecting use of the analog neurons when making calculations for one or more data sets;
    selecting one or more analog neurons of the equivalent analog network based on the ranking; and
    removing the one or more analog neurons from the equivalent analog network.

7. The method of claim 6, wherein detecting use of the analog neurons comprises:
    building a model of the equivalent analog network using a modelling software; and
    measuring propagation of analog signals by using the model to generate calculations for the one or more data sets.

8. The method of claim 6, wherein detecting use of the analog neurons comprises:
    building a model of the equivalent analog network using a modelling software; and
    measuring output signals of the model by using the model to generate calculations for the one or more data sets.

9. The method of claim 6, wherein detecting use of the analog neurons comprises:
    building a model of the equivalent analog network using a modelling software; and
    measuring power consumed by the analog neurons by using the model to generate calculations for the one or more data sets.

10. The method of claim 1, further comprising:
    subsequent to pruning the equivalent analog network and prior to generating one or more lithographic masks for fabricating a circuit implementing the equivalent analog network, recomputing the weight matrix for the equivalent analog network and updating the resistance matrix based on the recomputed weight matrix.

11. The method of claim 1, further comprising reducing number of neurons of the equivalent analog network, prior to generating the weight matrix, by increasing number of connections from one or more analog neurons of the equivalent analog network.

12. The method of claim 1, further comprising:
    prior to transforming the neural network topology, pruning the trained neural network to update the neural network topology and the weights of the trained neural network, using pruning techniques for neural networks, so that the equivalent analog network includes less than a predetermined number of analog components.

13. The method of claim 12, wherein the pruning is performed iteratively taking into account accuracy or a level of match in output between the trained neural network and the equivalent analog network.

14. The method of claim 1, further comprising:
    prior to transforming the neural network topology to the equivalent analog network, performing network knowledge extraction.

15. A system for hardware realization of neural networks, comprising:
one or more processors; and
memory;
wherein the memory stores one or more programs configured for execution by the one or more processors, and the one or more programs comprise instructions for:
obtaining a neural network topology and weights of a trained neural network;
transforming the neural network topology to an equivalent analog network of analog components including a plurality of operational amplifiers and a plurality of resistors, wherein each operational amplifier represents an analog neuron of the equivalent analog network and each resistor represents a connection between two analog neurons;
computing a weight matrix for the equivalent analog network based on the weights of the trained neural network, wherein each element of the weight matrix represents a respective connection;
generating a resistance matrix for the weight matrix, wherein each element of the resistance matrix corresponds to a respective weight of the weight matrix;
pruning the equivalent analog network to reduce number of the plurality of operational amplifiers or the plurality of resistors, based on the resistance matrix, to obtain an optimized analog network of analog components; and
generating a schematic model for implementing the optimized analog network as electronic circuitry based on the resistance matrix, including:
selecting component values for each individual operational amplifier and each individual resistor; and
for each analog neuron of the equivalent analog network:
computing a respective bias value for the respective analog neuron based on the weights of the trained neural network, while computing the weight matrix;
in accordance with a determination that the respective bias value is above a predetermined maximum bias threshold, removing the respective analog neuron from the equivalent analog network; and
in accordance with a determination that the respective bias value is below a predetermined minimum bias threshold, replacing the respective analog neuron with a linear junction in the equivalent analog network.

16. The system of claim 15, wherein pruning the equivalent analog network comprises:
substituting, with conductors, resistors corresponding to one or more elements of the resistance matrix that have resistance values below a predetermined minimum threshold resistance value.

17. The system of claim 15, wherein pruning the equivalent analog network comprises:
removing one or more connections of the equivalent analog network corresponding to one or more elements of the resistance matrix that are above a predetermined maximum threshold resistance value.

18. The system of claim 15, wherein pruning the equivalent analog network comprises:
removing one or more connections of the equivalent analog network corresponding to one or more elements of the weight matrix that are approximately zero.

19. A non-transitory computer readable storage medium storing one or more programs configured for execution by a computer system having one or more processors, the one or more programs comprising instructions for:
obtaining a neural network topology and weights of a trained neural network;
transforming the neural network topology to an equivalent analog network of analog components including a plurality of operational amplifiers and a plurality of resistors, wherein each operational amplifier represents an analog neuron of the equivalent analog network and each resistor represents a connection between two analog neurons;
computing a weight matrix for the equivalent analog network based on the weights of the trained neural network, wherein each element of the weight matrix represents a respective connection;
generating a resistance matrix for the weight matrix, wherein each element of the resistance matrix corresponds to a respective weight of the weight matrix;
pruning the equivalent analog network to reduce number of the plurality of operational amplifiers or the plurality of resistors, based on the resistance matrix, to obtain an optimized analog network of analog components; and
generating a schematic model for implementing the optimized analog network as electronic circuitry based on the resistance matrix, including:
selecting component values for each individual operational amplifier and each individual resistor; and
for each analog neuron of the equivalent analog network:
computing a respective bias value for the respective analog neuron based on the weights of the trained neural network, while computing the weight matrix;
in accordance with a determination that the respective bias value is above a predetermined maximum bias threshold, removing the respective analog neuron from the equivalent analog network; and
in accordance with a determination that the respective bias value is below a predetermined minimum bias threshold, replacing the respective analog neuron with a linear junction in the equivalent analog network.

* * * * *